US012677587B2

(12) United States Patent
Lee et al.

(10) Patent No.: US 12,677,587 B2
(45) Date of Patent: Jul. 7, 2026

(54) LIGHT EMITTING ELEMENT AND ORGANOMETALLIC COMPOUND FOR THE SAME

(71) Applicant: SAMSUNG DISPLAY CO., LTD., Yongin-si (KR)

(72) Inventors: Eunyoung Lee, Sejong-si (KR); Iljoon Kang, Icheon-si (KR); Soo-Byung Ko, Yongin-si (KR); Sungbum Kim, Yongin-si (KR); Sujin Shin, Yongin-si (KR); Mina Jeon, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 784 days.

(21) Appl. No.: 18/148,324

(22) Filed: Dec. 29, 2022

(65) Prior Publication Data

US 2023/0269998 A1 Aug. 24, 2023

(30) Foreign Application Priority Data

Feb. 23, 2022 (KR) ........................ 10-2022-0023884

(51) Int. Cl.
*H10K 85/30* (2023.01)
*C07F 15/00* (2006.01)
(Continued)

(52) U.S. Cl.
CPC ......... *H10K 85/341* (2023.02); *C07F 15/006* (2013.01); *C09K 11/06* (2013.01);
(Continued)

(58) Field of Classification Search
CPC ................ H10K 85/341; C07F 15/006; C09K 2211/1044; C09K 2211/1059; C09K 2211/185
See application file for complete search history.

(56) References Cited

U.S. PATENT DOCUMENTS 7,381,479 B2 6/2008 Lamansky et al.
7,393,599 B2 7/2008 Thompson et al.
(Continued)

FOREIGN PATENT DOCUMENTS

CN 104370974 A 2/2015
CN 114213467 A * 3/2022 ............ C09K 11/06
(Continued)

OTHER PUBLICATIONS

Machine Translation of CN114213467A (Year: 2022).*

*Primary Examiner* — Jenna N Chandhok
(74) *Attorney, Agent, or Firm* — Womble Bond Dickinson (US) LLP

(57) ABSTRACT

A light emitting element that includes a first electrode, a second electrode on the first electrode, and an emission layer between the first electrode and the second electrode is provided. The emission layer includes an organometallic compound represented by Formula 1. The light emitting element has a reduced driving voltage, emits light having an increased color purity, and exhibits a high efficiency and a long lifespan.

(Continued)

Formula 1

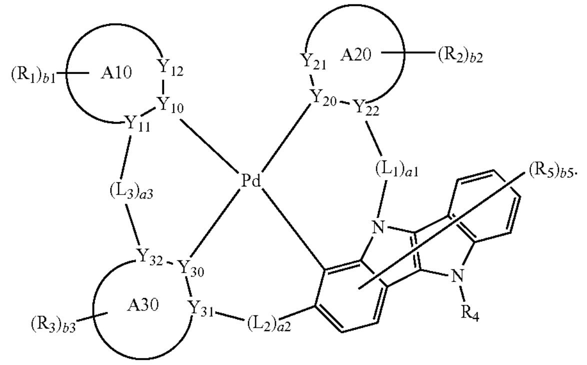

20 Claims, 8 Drawing Sheets

(51) Int. Cl.

| | |
|---|---|
| ***C09K 11/06*** | (2006.01) |
| ***H10K 50/12*** | (2023.01) |
| ***H10K 85/40*** | (2023.01) |
| ***H10K 101/00*** | (2023.01) |

(52) U.S. Cl.

CPC ...... *H10K 85/40* (2023.02); *C09K 2211/1044* (2013.01); *C09K 2211/1059* (2013.01); *C09K 2211/185* (2013.01); *H10K 50/12* (2023.02); *H10K 2101/90* (2023.02)

(56) References Cited

U.S. PATENT DOCUMENTS

| | | | |
|---|---|---|---|
| 7,585,573 B2 | 9/2009 | Lee et al. | |
| 7,776,458 B2 | 8/2010 | Ragini et al. | |
| 8,680,760 B2 | 3/2014 | Cheng et al. | |
| 9,051,344 B2 | 6/2015 | Lin et al. | |
| 9,972,793 B2 | 5/2018 | Wu et al. | |
| 10,566,553 B2 | 2/2020 | Li et al. | |
| 11,084,838 B2 | 8/2021 | Chen et al. | |
| 11,316,117 B2 | 4/2022 | Han et al. | |
| 2005/0287394 A1 | 12/2005 | Yang et al. | |
| 2008/0018221 A1 | 1/2008 | Egen et al. | |
| 2014/0309428 A1 | 10/2014 | Egen et al. | |
| 2018/0375036 A1 | 12/2018 | Chen et al. | |
| 2020/0119289 A1 | 4/2020 | Lin et al. | |
| 2020/0220089 A1 * | 7/2020 | Han ........................ | C09K 11/06 |
| 2020/0392172 A1 | 12/2020 | Tsai et al. | |
| 2021/0288270 A1 | 9/2021 | Lee et al. | |

FOREIGN PATENT DOCUMENTS

| | | |
|---|---|---|
| JP | 2007-045742 A | 2/2007 |
| JP | 2020-105341 A | 7/2020 |
| KR | 10-0730115 B1 | 6/2007 |
| KR | 10-2020-0061483 A | 6/2020 |
| KR | 10-2020-0143654 A | 12/2020 |
| KR | 10-2021-0112425 A | 9/2021 |
| WO | WO 2012/121936 A2 | 9/2012 |

* cited by examiner

LIGHT EMITTING ELEMENT AND ORGANOMETALLIC COMPOUND FOR THE SAME

CROSS-REFERENCE TO RELATED APPLICATION

This application claims priority to and the benefit of Korean Patent Application No. 10-2022-0023884, filed on Feb. 23, 2022, in the Korean Intellectual Property Office, the entire content of which is hereby incorporated by reference.

BACKGROUND

1. Field

Aspects of one or more embodiments of the present disclosure relate to a light emitting element and an organometallic compound utilized therein.

2. Description of Related Art

As image display devices, organic electroluminescence display devices and/or the like have recently been actively developed. The organic electroluminescence display devices and/or the like are display devices including self-luminescent light emitting elements in which holes and electrons injected from a first electrode and a second electrode recombine in an emission layer, and thus a luminescent material in the emission layer emits light to accomplish display (e.g., to display an image).

For application of light emitting elements to display devices, there is a demand or desire for high efficiency and long lifespan, and development of materials, for light emitting elements, capable of stably attaining such characteristics is being continuously required (sought).

SUMMARY

An aspect of one or more embodiments of the present disclosure is directed toward a light emitting element having an increased lifespan and efficiency.

An aspect of one or more embodiments of the present disclosure is directed toward an organometallic compound as a material for a light emitting element having a high efficiency and a long lifespan.

Additional aspects will be set forth in part in the description which follows and, in part, will be apparent from the description, or may be learned by practice of the presented embodiments of the disclosure.

An embodiment of the present disclosure provides a light emitting element including a first electrode, a second electrode on the first electrode, and an emission layer between the first electrode and the second electrode and containing an organometallic compound represented by Formula 1.

Formula 1

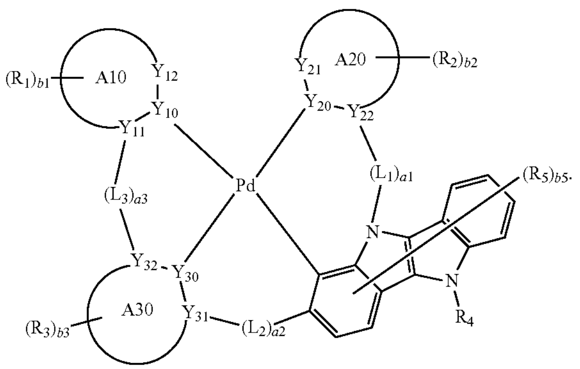

In Formula 1, $Y_{10}$ to $Y_{12}$, $Y_{20}$ to $Y_{22}$, and $Y_{30}$ to $Y_{32}$ may each independently be C or N, ring groups A10 to A30 may each independently be a substituted or unsubstituted hydrocarbon ring group having 5 to 60 ring-forming carbon atoms, a substituted or unsubstituted aryl group having 6 to 60 ring-forming carbon atoms, or a substituted or unsubstituted heterocyclic group having 2 to 60 ring-forming carbon atoms, a1 to a3 may each independently be an integer from 0 to 3, $L_1$ to $L_3$ may each independently be a direct linkage, O, S, O, S, —C($R_{a11}$)($R_{a12}$)—, —C($R_{a13}$)=, —C($R_{a14}$)=C($R_{a15}$)—, —C≡C—, —C(=O)—, —C(=S)—, —B($R_{a16}$)—, —N($R_{a17}$)—, —P($R_{a18}$)—, —Si($R_{a19}$)($R_{a20}$)—, or —Ge($R_{a21}$)($R_{a22}$)—, b1 to b3 may each independently be an integer from 0 to 8, b5 is an integer from 0 to 6, and $R_1$ to $R_5$ and $R_{a11}$ to $R_{a22}$ may each independently be a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring.

In an embodiment, Formula 1 may be represented by Formula 2.

Formula 2

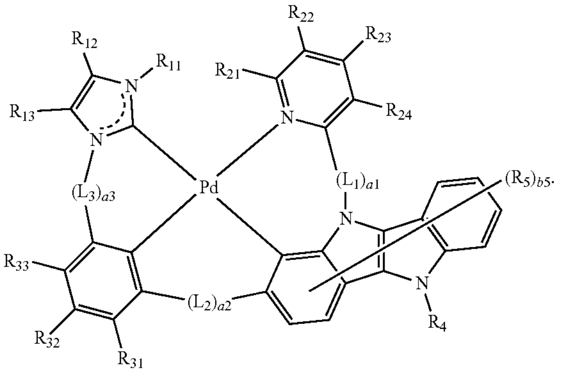

In Formula 2, $R_{11}$ to $R_{13}$, $R_{21}$ to $R_{24}$, and $R_{31}$ to $R_{33}$ may each independently be a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring, and a1 to a3, $L_1$ to $L_3$, b5, $R_4$, and $R_5$ may each independently be the same as defined in Formula 1.

In an embodiment, Formula 2 is represented by Formula 3.

Formula 3

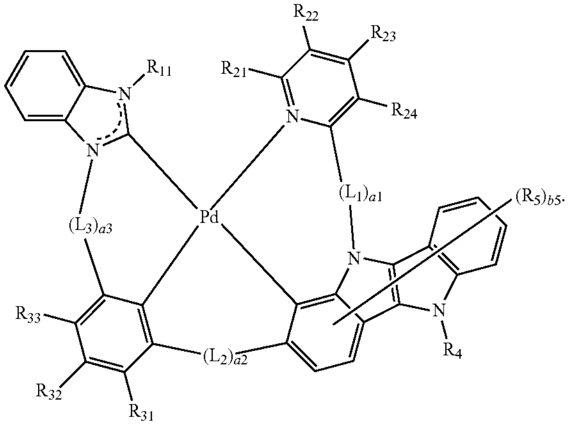

In Formula 3, a1 to a3, $L_1$ to $L_3$, b5, $R_4$, $R_5$, $R_{11}$, $R_{21}$ to $R_{24}$, and $R_{31}$ to $R_{33}$ may each independently be the same as defined in Formula 2.

In an embodiment, in Formula 1, $L_1$ and $L_3$ may each independently be a direct linkage, and $L_2$ may be O.

In an embodiment, in Formula 1, $R_1$ to $R_5$ may each independently be a hydrogen atom, a deuterium atom, a dimethylamine group, a trimethylsilyl group, a substituted or unsubstituted methyl group, a substituted or unsubstituted isopropyl group, a substituted or unsubstituted i-butyl group, a substituted or unsubstituted t-butyl group, or a substituted or unsubstituted phenyl group.

In an embodiment, in Formula 1, $R_1$ to $R_5$ may each independently be represented by any one selected from among R-1 to R-10.

R-1

*—$CH_3$

R-2

*—$CD_3$

R-3

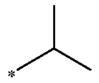

R-4

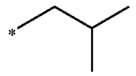

R-5

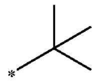

R-6

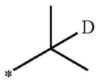

R-7

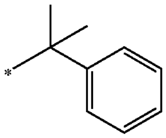

R-8

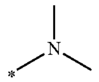

R-9

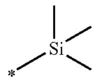

R-10

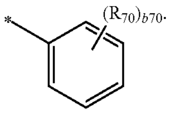

In R-2 and R-6, D is a deuterium atom, in R-10, b70 is an integer from 0 to 5, and $R_{70}$ is a hydrogen atom, a deuterium atom, a substituted or unsubstituted alkyl group having 1 to 10 carbon atoms or a substituted or unsubstituted aryl group having 6 to 30 ring-forming carbon atoms.

In an embodiment, in Formula 1, at least one of $R_1$ to $R_5$ may include a deuterium atom or a substituent containing a deuterium atom.

In an embodiment, the emission layer may include a hole transporting host, an electron transporting host, and a dopant, wherein the dopant may contain the organometallic compound.

In an embodiment, the hole transporting host may include a compound represented by Formula HT-1, and the electron transporting host may include a compound represented by Formula ET-1.

Formula HT-1

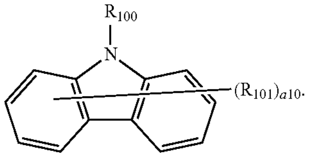

In Formula HT-1, a10 is an integer from 0 to 8, and $R_{100}$ and $R_{101}$ may each independently be a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms.

Formula ET-1

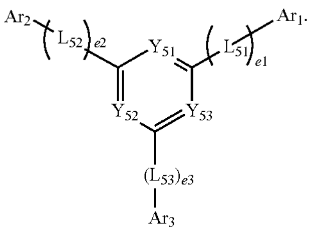

In Formula ET-1, at least one of $Y_{51}$ to $Y_{53}$ is N and the others (the substituents that are not N) are each $CR_a$, $R_a$ is a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, e1 to e3 may each independently be an integer from 0 to 10, $L_{51}$ to $L_{53}$ may each independently be a direct linkage, a substituted or unsubstituted arylene group having 6 to 30 ring-forming carbon atoms, or a substituted or unsubstituted heteroarylene group having 2 to 30 ring-forming carbon atoms, and $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In an embodiment, the dopant may further include a delayed fluorescent compound.

In an embodiment of the present disclosure, provided is an organometallic compound represented by Formula 1.

In an embodiment, in Formula 1, at least one of $R_1$ to $R_5$ may include a t-butyl group or a substituent containing a t-butyl group.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
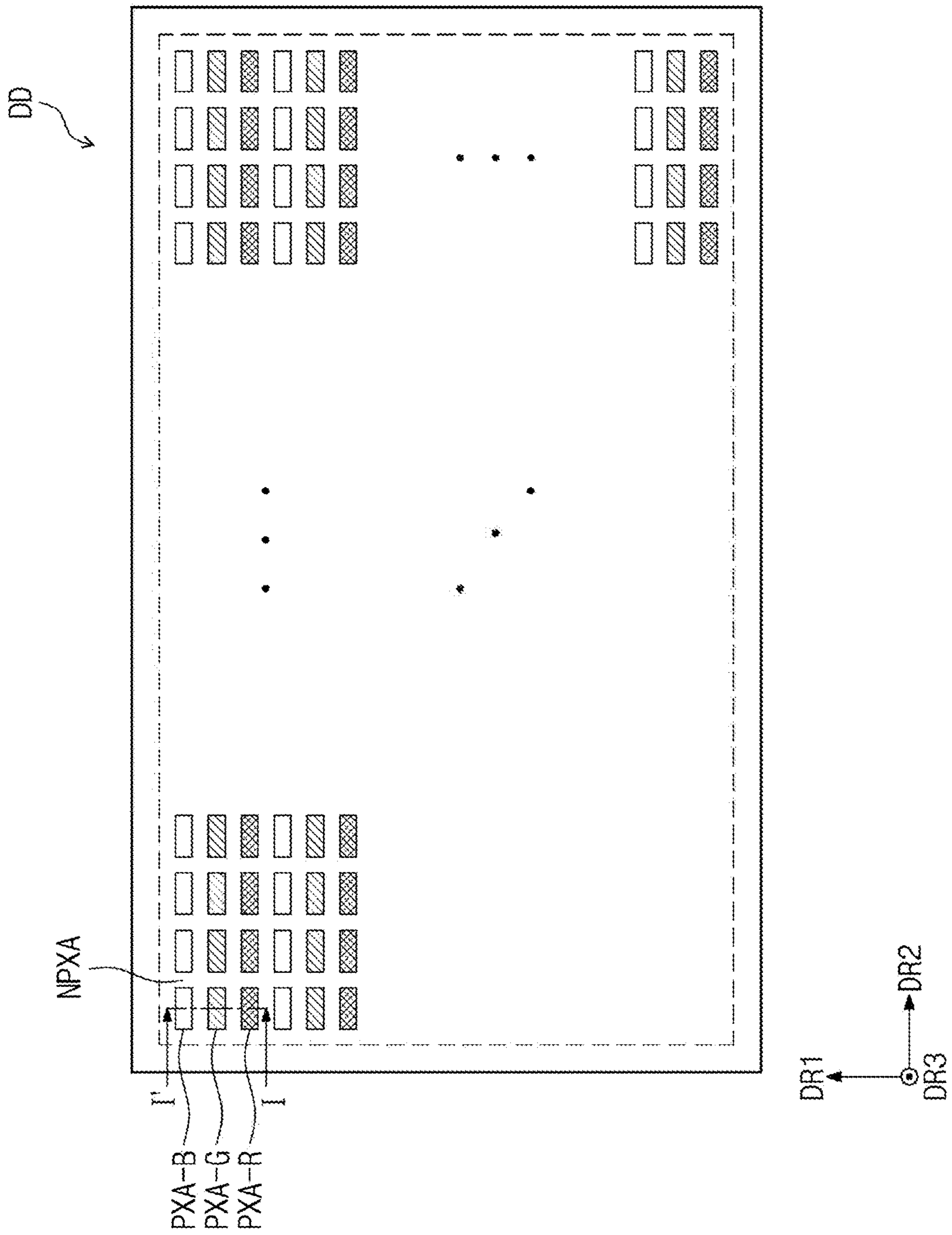
FIG. 1 is a plan view showing a display device according to an embodiment.

The present disclosure may be modified in many alternate forms, and thus specific embodiments will be exemplified in the drawings and described in more detail. It should be understood, however, that it is not intended to limit the present disclosure to the particular forms disclosed, but rather, is intended to cover all modifications, equivalents, and alternatives falling within the spirit and scope of the present disclosure.

In the present disclosure, when an element (or a region, a layer, a portion, etc.) is referred to as being "on," "connected to," or "coupled to" another element, it refers to that the element may be directly disposed on/connected to/coupled to the other element, or that a third element may be disposed therebetween.

Like reference numerals refer to like elements. In some embodiments, in the drawings, the thickness, the ratio, and the dimensions of elements may be exaggerated for an effective description of technical contents. The term "and/or," includes all combinations of one or more of which associated configurations may define.

It will be understood that, although the terms first, second, etc. may be utilized herein to describe one or more suitable elements, these elements should not be limited by these terms. These terms are only utilized to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

Also, terms of "below", "on lower side", "above", "on upper side", and/or the like may be utilized to describe the relationships of the components illustrated in the drawings. The terms are utilized as a relative concept and are described with reference to the direction indicated in the drawings.

It should be understood that the terms "comprise", include", or "have" are intended to specify the presence of stated features, integers, steps, operations, elements, components, or combinations thereof in the disclosure, but do not preclude the presence or addition of one or more other features, integers, steps, operations, elements, components, or combinations thereof. As used herein, the singular forms "a", "an" and "the" are intended to include the plural forms as well, unless the context clearly indicates otherwise.

Unless otherwise defined, all terms (including technical and scientific terms) utilized herein have the same meaning as commonly understood by one of ordinary skill in the art to which the present disclosure pertains. It is also to be understood that terms defined in commonly utilized dictionaries should be interpreted as having meanings consistent with the meanings in the context of the related art, and are expressly defined herein unless they are interpreted in an ideal or overly formal sense.

Figure 2:
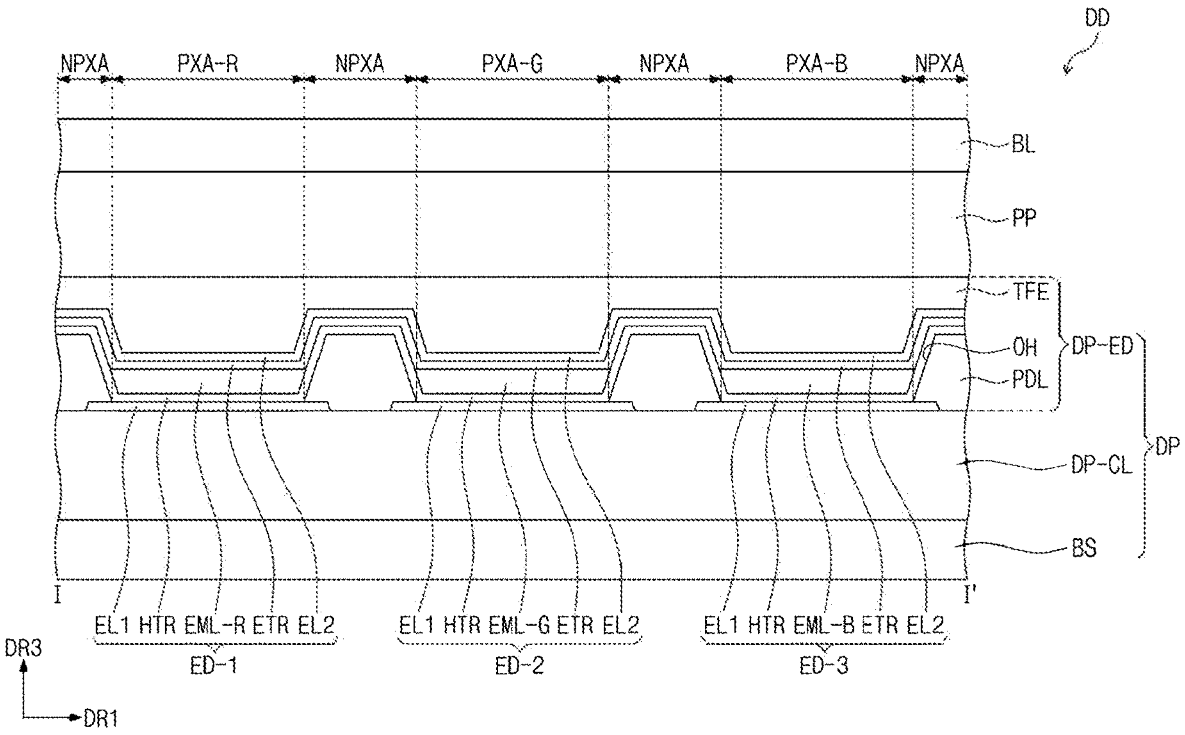
FIG. 2 is a cross-sectional view showing a portion corresponding to line I-I' of FIG. 1.

Hereinafter, embodiments of the present disclosure will be described with reference to the accompanying drawings. FIG. 1 is a plan view showing an embodiment of a display device DD. FIG. 2 is a cross-sectional view of a display device DD of an embodiment. FIG. 2 is a cross-sectional view showing a portion corresponding to line I-I' of FIG. 1.

The display device DD may include a display panel DP and an optical layer PP on the display panel DP. The display panel DP may include light emitting elements ED-1, ED-2, and ED-3. The display device DD may include a plurality of light emitting elements ED-1, ED-2, and ED-3. The optical layer PP may be on the display panel DP to control reflected light in the display panel DP due to external light. The optical layer PP may include, for example, a polarizing layer or a color filter layer. The optical layer PP may not be provided in the display device DD of an embodiment.

A base substrate BL may be on the optical layer PP. The base substrate BL may be a member providing a base surface on which the optical layer PP is disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. The base substrate BL may not be provided in an embodiment.

The display device DD according to an embodiment may further include a filling layer. The filling layer may be between a display element layer DP-ED and the base substrate BL. The filling layer may be an organic material layer. The filling layer may include at least one selected from among an acrylic resin, a silicone-based resin, and an epoxy-based resin.

The display panel DP may include a base layer BS, a circuit layer DP-CL provided on the base layer BS, and a display element layer DP-ED. The display element layer DP-ED may include pixel defining films PDL, a plurality of light emitting elements ED-1, ED-2, and ED-3 disposed between the pixel defining films PDL, and an encapsulation layer TFE on the plurality of light emitting elements ED-1, ED-2, and ED-3.

The base layer BS may be a member providing a base surface in which the display element layer DP-ED is disposed. The base layer BS may be a glass substrate, a metal substrate, a plastic substrate, etc. However, the embodiment of the present disclosure is not limited thereto, and the base layer BS may be an inorganic layer, an organic layer, or a composite material layer.

In an embodiment, the circuit layer DP-CL may be on the base layer BS, and the circuit layer DP-CL may include a plurality of transistors. The transistors may each include a control electrode, an input electrode, and an output electrode. For example, the circuit layer DP-CL may include a switching transistor and a driving transistor for driving the plurality of light emitting elements ED-1, ED-2 and ED-3 of the display element layer DP-ED.

The light emitting elements ED-1, ED-2, and ED-3 may each have a structure of a light emitting element ED of an embodiment of FIGS. 3 to 6, which will be described in more detail. The light emitting elements ED-1, ED-2, and ED-3 may each include a first electrode EL1, a hole transport region HTR, emission layers EML-R, EML-G, and EML-B, an electron transport region ETR, and a second electrode EL2.

FIG. 2 shows an embodiment in which the emission layers EML-R, EML-G, and EML-B of the light emitting elements ED-1, ED-2, and ED-3 are disposed in openings OH defined in the pixel defining films PDL, and the hole transport region HTR, the electron transport region ETR, and the second electrode EL2 are provided as a common layer throughout the light emitting elements ED-1, ED-2, and ED-3.

However, the embodiment of the present disclosure is not limited thereto, and in an embodiment, the hole transport region HTR and the electron transport region ETR may be provided to be patterned inside the openings OH defined in the pixel defining films PDL. For example, in an embodiment, the hole transport region HTR, the emission layers EML-R, EML-G, and EML-B, and the electron transport region ETR, etc., of the light emitting elements ED-1, ED-2, and ED-3 may be patterned and provided through an inkjet printing method.

An encapsulation layer TFE may cover the light emitting elements ED-1, ED-2, and ED-3. The encapsulation layer TFE may seal the display element layer DP-ED. The encapsulation layer TFE may be a thin film encapsulation layer. The encapsulation layer TFE may be a single layer or a laminated layer of a plurality of layers. The encapsulation layer may include at least one insulating layer. The encapsulation layer TFE according to an embodiment may include at least one inorganic film (hereinafter, an encapsulation inorganic film). In some embodiments, the encapsulation layer TFE may include at least one organic film (hereinafter, an encapsulation organic film) and at least one encapsulation inorganic film.

The encapsulation inorganic film may protect (or reduce) the display element layer DP-ED from moisture/oxygen, and the encapsulation organic film may protect (or reduce) the display element layer DP-ED from foreign substances such as dust particles. The encapsulation inorganic film may include silicon nitride, silicon oxy nitride, silicon oxide, titanium oxide, aluminum oxide, etc., but is not limited thereto. The encapsulation organic layer may include an acrylic compound, an epoxy-based compound, etc. The encapsulation organic layer may include a photopolymerizable organic material, and is not limited thereto.

The encapsulation layer TFE may be on the second electrode EL2, and may be disposed to fill the openings OH.

Referring to FIGS. 1 and 2, the display device DD may include non-light emitting regions NPXA and light emitting regions PXA-R, PXA-G, and PXA-B. The light emitting regions PXA-R, PXA-G, and PXA-B may each be a region emitting light generated from a corresponding one of the light emitting elements ED-1, ED-2, and ED-3. The light emitting regions PXA-R, PXA-G, and PXA-B may be spaced apart from (separated from) each other when viewed on a plane (e.g., in a plan view).

The light emitting regions PXA-R, PXA-G, and PXA-B may each be a region separated by the pixel defining films PDL. The non-light emitting regions NPXA may be regions between neighboring light emitting regions PXA-R, PXA-G, and PXA-B, and may correspond to the pixel defining films PDL. In some embodiments, in the present disclosure, the light emitting regions PXA-R, PXA-G, and PXA-B may each correspond to a pixel. The pixel defining films PDL may separate the light emitting elements ED-1, ED-2 and ED-3. The emission layers EML-R, EML-G, and EML-B of the light emitting elements ED-1, ED-2 and ED-3 may be disposed and separated in openings OH defined by the pixel defining films PDL.

The light emitting regions PXA-R, PXA-G, and PXA-B may be divided into a plurality of groups according to the color of light generated from the light emitting elements ED-1, ED-2, and ED-3. In the display device DD of an embodiment shown in FIGS. 1 and 2, three light emitting regions PXA-R, PXA-G, and PXA-B which emit red light, green light, and blue light, are illustrated as an example. For example, the display device DD of an embodiment may include a red light emitting region PXA-R, a green light emitting region PXA-G, and a blue light emitting region PXA-B, which are distinct from one another.

In the display device DD according to an embodiment, the plurality of light emitting elements ED-1, ED-2, and ED-3 may emit light having different wavelength ranges. For example, in an embodiment, the display device DD may include a first light emitting element ED-1 emitting red light, a second light emitting element ED-2 emitting green light, and a third light emitting element ED-3 emitting blue light. For example, the red light emitting region PXA-R, the green light emitting region PXA-G, and the blue light emitting region PXA-B of the display device DD may correspond to the first light emitting element ED-1, the second light emitting element ED-2, and the third light emitting element ED-3, respectively.

However, the embodiment of the present disclosure is not limited thereto, and the first to third light emitting elements ED-1, ED-2 and ED-3 may emit light in substantially (e.g., may each emit) the same wavelength range or emit light in one or more different wavelength ranges. For example, the first to third light emitting elements ED-1, ED-2, and ED-3 may all emit blue light.

The light emitting regions PXA-R, PXA-G, and PXA-B in the display device DD according to an embodiment may be arranged in the form of a stripe. Referring to FIG. 1, a plurality of red light emitting regions PXA-R may be arranged with each other along a second direction axis DR2, a plurality of green light emitting regions PXA-G may be arranged with each other along the second direction axis DR2, and a plurality of blue light emitting regions PXA-B may each be arranged with each other along the second direction axis DR2. In some embodiments, the red light emitting region PXA-R, the green light emitting region PXA-G, and the blue light emitting region PXA-B may be alternately arranged in turn along a first direction axis DR1. (DR3 is a third direction which is normal or perpendicular to the plane defined by the first direction DR1 and the second direction DR2).

FIGS. 1 and 2 illustrate that the light emitting regions PXA-R, PXA-G, and PXA-B are all similar in size, but the embodiment of the present disclosure is not limited thereto, and the light emitting regions PXA-R, PXA-G and PXA-B may be different in size from each other according to wavelength range of emitted light. In some embodiments, the areas of the light emitting regions PXA-R, PXA-G, and PXA-B may refer to areas when viewed on a plane defined by the first direction axis DR1 and the second direction axis DR2 (e.g., when viewed in a plan view).

In some embodiments, the arrangement of the light emitting regions PXA-R, PXA-G, and PXA-B is not limited to what is shown in FIG. 1, and the order in which the red light emitting region PXA-R, the green light emitting region PXA-G, and the blue light emitting region PXA-B are arranged with one or more suitable combinations according to display quality characteristics required for the display device DD. For example, the light emitting regions PXA-R, PXA-G, and PXA-B may be arranged in the form of a pentile (PENTILE™) (for example, an RGBG matrix, an RGBG structure, or RGBG matrix structure) or a diamond (Diamond Pixel™) (e.g., a display (e.g., an OLED display) containing red, blue, and green (RGB) light emitting regions arranged in the shape of diamonds. PENTILE™ is a trademark of Samsung Display Co., Ltd. Diamond Pixel™ is a trademark of Samsung Display Co., Ltd.

In some embodiments, areas of each of the light emitting regions PXA-R, PXA-G, and PXA-B may be different in size from one another. For example, in an embodiment, the green light emitting region PXA-G may be smaller than the blue light emitting region PXA-B in size, but the embodiment of the present disclosure is not limited thereto.

Hereinafter, FIGS. 3 to 6 are cross-sectional views schematically showing a light emitting element according to an embodiment. The light emitting element ED according to an embodiment may include a first electrode EL1, a hole transport region HTR, an emission layer EML, an electron transport region ETR, and a second electrode EL2.

Figure 3:
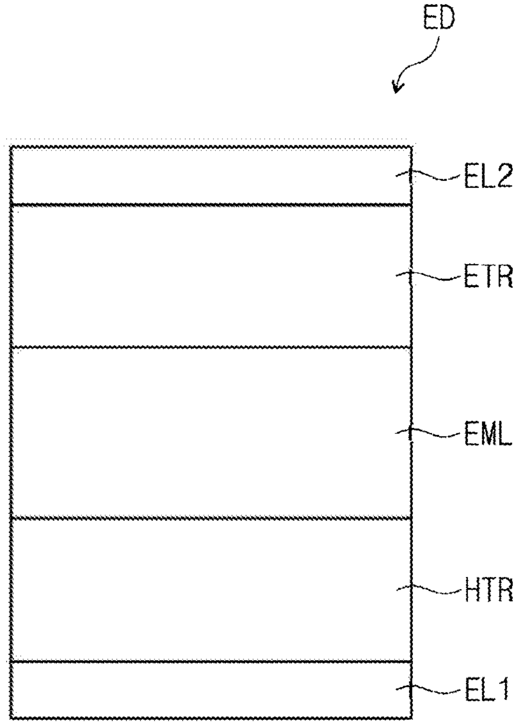
FIG. 3 is a cross-sectional view schematically showing a light emitting element according to an embodiment.
Figure 4:
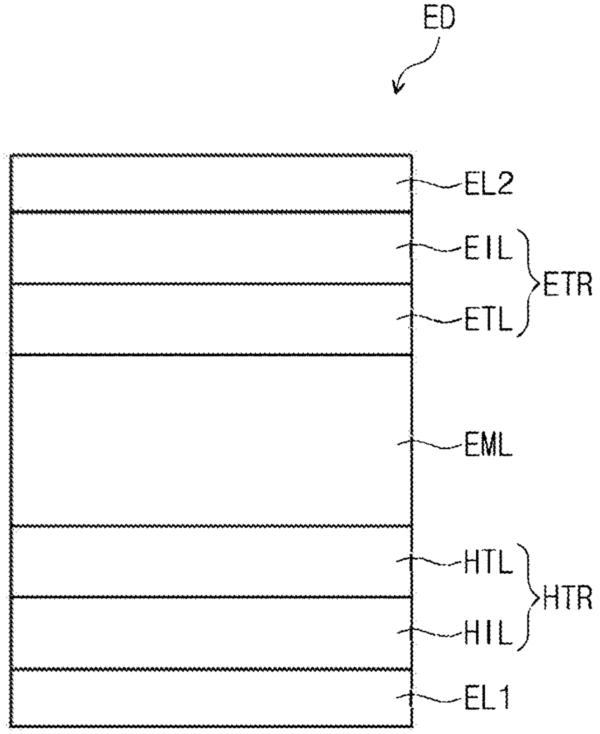
FIG. 4 is a cross-sectional view schematically showing a light emitting element according to an embodiment.
Figure 5:
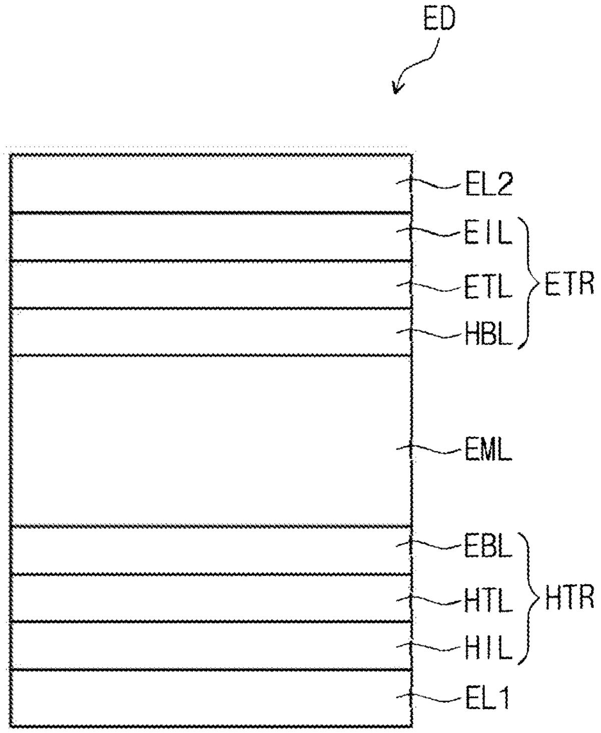
FIG. 5 is a cross-sectional view schematically showing a light emitting element according to an embodiment.
Figure 6:
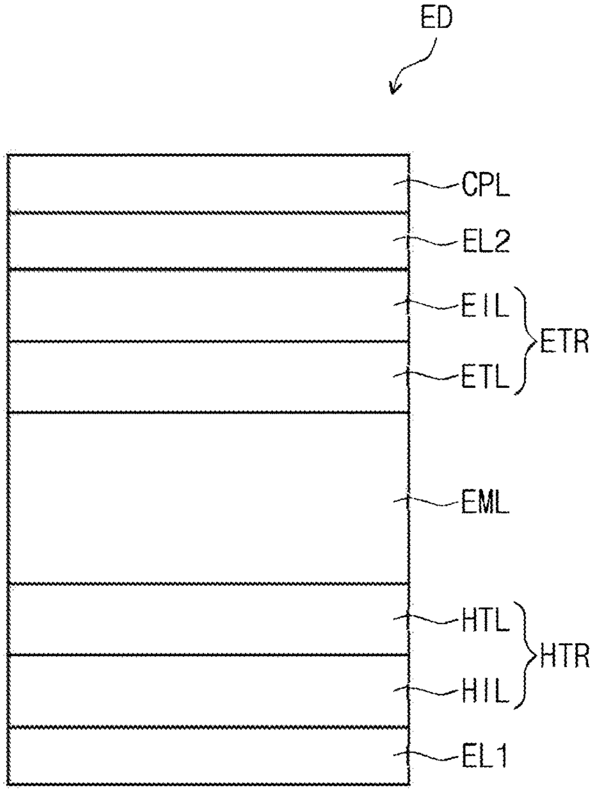
FIG. 6 is a cross-sectional view schematically showing a light emitting element according to an embodiment.

FIG. 4 shows, compared with FIG. 3, a cross-sectional view of a light emitting element ED of an embodiment in which the hole transport region HTR includes a hole injection layer HIL and a hole transport layer HTL, and the electron transport region ETR includes an electron injection layer EIL and an electron transport layer ETL. In some embodiments, FIG. 5 shows, compared with FIG. 3, a cross-sectional view of a light emitting element ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. FIG. 6 shows, compared with FIG. 4, a cross-sectional view of a light emitting element ED of an embodiment, in which a capping layer CPL on the second electrode EL2 is provided.

The emission layer EML may include an organometallic compound according to an embodiment. The organometallic compound according to an embodiment may include tetradentate ligands. The organometallic compound according to an embodiment may include Pd as a central metal and tetradentate ligands bonded to the central metal. The organometallic compound according to an embodiment may include a carbene imidazole group, a pyridine group, a phenyl group, and an indolo[3,2-b]indole group as tetradentate ligands.

In the present disclosure, the term "substituted or unsubstituted" may indicate that one is substituted or unsubstituted with at least one substituent selected from the group including (e.g., consisting of) a deuterium atom, a halogen atom, a cyano group, a nitro group, an amine group, an amidino group, a silyl group, oxy group, thio group, sulfinyl group, sulfonyl group, carbonyl group, a boron group, a phosphine group, a phosphine oxide group, a phosphine sulfide group, an alkyl group, an alkenyl group, an alkynyl group, a hydrocarbon ring group, an aryl group, and a heterocyclic group. In some embodiments, each of the substituents exemplified above may be substituted or unsubstituted. For example, a biphenyl group may be interpreted as an aryl group or as a phenyl group substituted with a phenyl group.

In the present disclosure, the term "linked to an adjacent group to form a ring" may indicate that one is linked to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and/or an aromatic heterocycle. The hydrocarbon ring and the heterocycle may be monocyclic or polycyclic. In some embodiments, the rings formed by being linked to each other may be connected to another ring to form a spiro structure.

In the present disclosure, the term "an adjacent group" may refer to a substituent substituted for an atom which is directly connected to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as mutually "adjacent groups" and two ethyl groups in 1,1-diethylcyclopentane may be interpreted as mutually "adjacent groups". In some embodiments, two methyl groups in 4,5-dimethylphenanthrene may be interpreted as mutually "adjacent groups".

In the present disclosure, examples of a halogen atom may include a fluorine atom, a chlorine atom, a bromine atom, and/or an iodine atom.

In the present disclosure, an alkyl group may be a linear, branched or cyclic type or kind. The number of carbon atoms in the alkyl group may be 1 to 60, 1 to 50, 1 to 30, 1 to 20, 1 to 10 or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but are not limited thereto.

In the present disclosure, an alkenyl group refers to a hydrocarbon group including at least one carbon double bond in the middle or end of an alkyl group having 2 or more carbon atoms. The alkenyl group may be linear, branched or cyclic. The number of carbon atoms is not particularly limited, but may be 2 to 60, 2 to 30, 2 to 20 or 2 to 10. Examples of the alkenyl group include a vinyl group, a 1-butenyl group, a 1-pentenyl group, a 1,3-butadienyl aryl group, a styrenyl group, a styryl vinyl group, a cyclobutenyl group, a cyclopentenyl group, etc., but are not limited thereto.

In the present disclosure, an alkynyl group refers to a hydrocarbon group including at least one carbon triple bond in the middle or end of an alkyl group having 2 or more carbon atoms. The alkynyl group may be linear or branched. The number of carbon atoms is not particularly limited, but may be 2 to 60, 2 to 30, 2 to 20 or 2 to 10. Examples of the alkynyl group may include an ethynyl group, a propynyl group, etc., but are not limited thereto.

In the present disclosure, a hydrocarbon ring group refers to any suitable functional group or substituent derived from an aliphatic hydrocarbon ring. The hydrocarbon ring group may be a saturated hydrocarbon ring group having 5 to 60, 5 to 30, or 5 to 20 ring-forming carbon atoms.

In the present disclosure, an aryl group refers to any suitable functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but are not limited thereto.

In the present disclosure, a heterocyclic group refers to any suitable functional groups or substituents derived from a ring containing at least one of B, O, N, P, Si, Ge or S as a hetero atom. The heterocyclic group includes an aliphatic heterocyclic group and/or an aromatic heterocyclic group. The aromatic heterocyclic group may be a heteroaryl group. The aliphatic heterocyclic group and the aromatic heterocyclic group may be monocyclic or polycyclic.

In the present disclosure, the heterocyclic group may contain at least one of B, O, N, P, Si, Ge or S as a hetero atom. When the heterocyclic group contains two or more hetero atoms, the two or more hetero atoms may be the same as or different from each other. The heterocyclic group may be a monocyclic heterocyclic group or a polycyclic heterocyclic group, and may include a heteroaryl group. The number of ring-forming carbon atoms in the heterocyclic group may be 2 to 60, 2 to 30, 2 to 20, or 2 to 10.

In the present disclosure, the aliphatic heterocyclic group may contain at least one of B, O, N, P, Si, Ge or S as a hetero atom. The number of ring-forming carbon atoms in the aliphatic heterocyclic group may be 2 to 60, 2 to 30, 2 to 20, or 2 to 10. In some embodiments, the aliphatic heterocyclic group may include double bonds of carbons which are ring-forming atoms. Examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc., but are not limited to thereto In the present disclosure, the heteroaryl group may contain at least one of B, O, N, P, Si, Ge or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 60, 2 to 30, 2 to 20, or 2 to 10. Examples of the heteroaryl group may include a thiophene group, a furan group, a pyrrole group, an imidazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but are not limited thereto.

In the present disclosure, the above description of the aryl group may be applied to an arylene group, except that the arylene group is a divalent group. The above description of the heteroaryl group may be applied to a heteroarylene group, except that the heteroarylene group is a divalent group.

In the present disclosure, a silyl group includes an alkyl silyl group and an aryl silyl group. Examples of the silyl group include a trimethylsilyl group, a triethylsilyl group, a t-butyldimethylsilyl group, an ethyldimethylsilyl group, a propyldimethylsilyl group, a triphenylsilyl group, a diphenylsilyl group, a phenylsilyl group, etc., but are not limited thereto.

In the present disclosure, the number of carbon atoms in a carbonyl group is not particularly limited, but may be 1 to 40, 1 to 30, or 1 to 20. For example, the carbonyl group may have the following structure, but is not limited thereto.

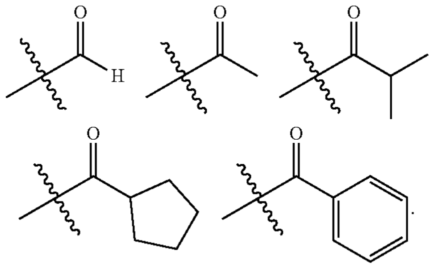

In the present disclosure, the number of carbon atoms in a sulfinyl group and a sulfonyl group is not limited, but may be 1 to 30. The sulfinyl group may include an alkyl sulfinyl group and an aryl sulfinyl group. The sulfonyl group may include an alkyl sulfonyl group and an aryl sulfonyl group.

In the present disclosure, a thio group may include an alkyl thio group, an aryl thio group, and a heteroaryl thio group. The thio group may indicate the one that a sulfur atom is bonded to an alkyl group, an aryl group, or a heteroaryl group as defined above. Examples of the thio group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., but are not limited to thereto.

In the present disclosure, an oxy group may refer to an oxygen atom that is bonded to an alkyl group, an aryl group, or a heteroaryl group as defined above. The oxy group may include an alkoxy group, an aryl oxy group, and/or a heteroaryl oxy group. The alkoxy group may be linear, branched or cyclic. The number of carbon atoms in the alkoxy group is not particularly limited, but may be, for example, 1 to 60, 1 to 30, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc., but are not limited thereto.

In the present disclosure, a boron group may refer to a boron atom that is bonded to an alkyl group or aryl group as defined above. The boron group includes an alkyl boron group and an aryl boron group. Examples of the boron group include a dimethylboron group, a diethylboron group, a t-butylmethylboron group, a diphenylboron group, a phenylboron group, etc., but are not limited thereto.

In the present disclosure, the number of carbon atoms in an amine group is not particularly limited, but may be 1 to 60 or 1 to 30. The amine group may include an alkyl amine group and an aryl amine group. Examples of the amine group include a hydrazino group, a hydrazono group, a methylamine group, a dimethylamine group, a phenylamine group, a diphenylamine group, a naphthylamine group, a 9-methyl-anthracenylamine group, a triphenylamine group, etc., but are not limited thereto.

In the present disclosure, examples of the alkyl group include an alkylthio group, an alkyl sulfoxy group, an alkyl oxy group, an alkyl amino group, an alkyl boron group, an alkyl silyl group, and/or an alkyl amine group.

In the present disclosure, examples of the aryl group include an aryloxy group, an arylthio group, an aryl sulfoxy group, an aryl amino group, an aryl boron group, an aryl silyl group, and/or an aryl amine group.

In the present disclosure, a direct linkage may refer to a single bond. In the present disclosure,  and ——* refer to positions to be connected.

The light emitting element ED according to an embodiment may include an organometallic compound according to an embodiment. The organometallic compound according to an embodiment may be represented by Formula 1.

Formula 1

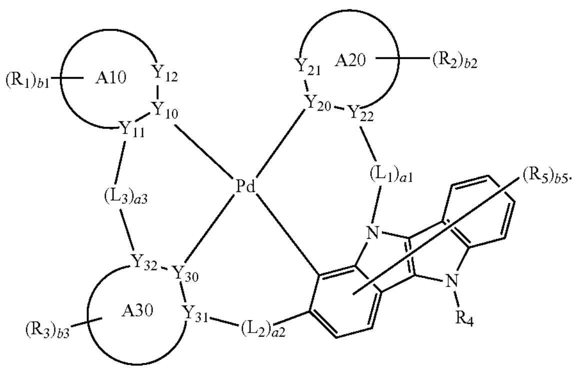

In Formula 1, $Y_{10}$ to $Y_{12}$, $Y_{20}$ to $Y_{22}$, and $Y_{30}$ to $Y_{32}$ may each independently be C or N. $Y_{10}$ to $Y_{12}$, $Y_{20}$ to $Y_{22}$, and $Y_{30}$ to $Y_{32}$ may be ring-forming atoms of ring groups A10 to A30. $Y_{10}$, $Y_{20}$, and $Y_{30}$ may be atoms directly bonded to a central metal, Pd. For example, at least one of $Y_{10}$ to $Y_{12}$, $Y_{20}$ to $Y_{22}$, or $Y_{30}$ to $Y_{32}$ may be N, and the others (the substituents that are not N) may each be C. At least one of $Y_{10}$ to $Y_{12}$ or $Y_{20}$ to $Y_{22}$ may be N, and the others may each be C. In $Y_{10}$ to $Y_{12}$, $Y_{20}$ to $Y_{22}$, or $Y_{30}$ to $Y_{32}$, $Y_{11}$, $Y_{12}$, and $Y_{20}$ may be N, and the others may each be C.

The ring groups A10 to A30 may each independently be a substituted or unsubstituted hydrocarbon ring group having 5 to 60 ring-forming carbon atoms, a substituted or unsubstituted aryl group having 6 to 60 ring-forming carbon atoms, or a substituted or unsubstituted heterocyclic group having 2 to 60 ring-forming carbon atoms. The ring groups A10 to A30 may each independently be polycyclic ring groups in which two or more rings are fused. For example, the ring groups A10 to A30 may each independently be a fused ring group of two rings, in which one heterocyclic group and one hydrocarbon ring group are fused. However, this is presented merely as an example, and the embodiment of the present disclosure is not limited thereto.

For example, when at least one of $Y_{10}$ to $Y_{12}$ is N, the ring group A10 may be a heterocyclic group containing at least one N as a ring-forming atom. When at least one of $Y_{20}$ to $Y_{22}$ is N, the ring group A20 may be a heterocyclic group containing at least one N as a ring-forming atom. For example, the ring group A10 may be a substituted or unsubstituted carbene imidazole group, and the ring group A20 may be a substituted or unsubstituted pyridine group.

In Formula 1, a1 to a3 may each independently be an integer from 0 to 3. When a1 is an integer of 2 or greater, a plurality of Lis may all be the same or at least one may be different from the others. When a2 is an integer of 2 or greater, a plurality of $L_2$s may all be the same or at least one may be different from the others. When a3 is an integer of 2 or greater, a plurality of $L_3$s may all be the same or at least one may be different from the others.

$L_1$ to $L_3$ may each independently be a direct linkage, O, S, $-C(R_{a11})(R_{a12})-$, $-C(R_{a13})=$, $-C(R_{a14})=C(R_{a15})-$, $-C\equiv C-$, $-C(=O)-$, $-C(=S)-$, $-B(R_{a16})-$, $-N(R_{a17})-$, $-P(R_{a18})-$, $-Si(R_{a19})(R_{a20})-$, or $-Ge(R_{a21})(R_{a22})-$. For example, a1 to a3 may be 1, $L_1$ and $L_3$ may be direct bonds, and $L_2$ may be O.

When $L_1$ is a direct bond, $Y_{11}$ as a ring-forming atom of the ring group A10 and $Y_{32}$ as a ring-forming atom of the ring group A30 may be directly bonded. When $L_3$ is a direct bond, $Y_{22}$ of the ring group A20 and a ring-forming nitrogen atom of an indolo[3,2-b]indole group may be directly bonded. When $L_2$ is O, $Y_{31}$ of the ring group A30 and a ring-forming carbon atom of an indolo[3,2-b]indole group may be bonded to O. In some embodiments, when a1 to a3 is an integer of 2 or greater, $L_1$ to $L_3$ may each independently be O, S, $-C(R_{a11})(R_{a12})-$, $-C(R_{a13})=$, $-C(R_{a14})=C(R_{a15})-$, $-C\equiv C-$, $-C(=O)-$, $-C(=S)-$, $-B(R_{a16})-$, $-N(R_{a17})-$, $-P(R_{a18})-$, $-Si(R_{a19})(R_{a20})-$, or $-Ge(R_{a21})(R_{a22})-$.

In Formula 1, b1 to b3 may each independently be an integer from 0 to 8. When b1 is an integer of 2 or greater, a plurality of $R_1$s may all be the same or at least one may be different from the others. When b2 is an integer of 2 or greater, a plurality of $R_2$s may all be the same or at least one may be different from the others. When b3 is an integer of 2 or greater, a plurality of $R_3$s may all be the same or at least one may be different from the others. For example, b1 to b3 may each independently be an integer from 0 to 5. For example, b1 to b3 may each independently be an integer from 0 to 2.

b5 may be an integer from 0 to 6. When b5 is an integer of 2 or greater, a plurality of $R_5$s may all be the same or at least one may be different from the others.

In Formula 1, $R_1$ to $R_5$ and $R_{a11}$ to $R_{a22}$ may each independently be a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring. For example, $R_4$ may be a hydrogen atom, a deuterium atom, or a substituted or unsubstituted phenyl group. $R_5$ may be a hydrogen atom.

In an embodiment, at least one of $R_1$ to $R_5$ may include a deuterium atom or a substituent containing a deuterium atom. At least one of $R_1$ to $R_5$ may include a t-butyl group or a substituent containing a t-butyl group. For example, at least one of $R_1$ to $R_5$ may be a deuterium atom, a t-butyl group, a methyl group substituted with a deuterium atom, a t-butyl group substituted with a deuterium atom, or a phenyl group substituted with a deuterium atom. However, this is presented merely as an example, and the embodiment of the present disclosure is not limited thereto.

$R_1$ to $R_5$ may each independently be a hydrogen atom, a deuterium atom, a substituted or unsubstituted silyl group, a substituted or unsubstituted amine group, a substituted or unsubstituted alkyl group having 1 to 5 carbon atoms, or a substituted or unsubstituted aryl group having 6 to 20 ring-forming carbon atoms. For example, $R_1$ to $R_5$ may each independently be a hydrogen atom, a deuterium atom, a dimethylamine group, a trimethylsilyl group, a substituted or unsubstituted methyl group, a substituted or unsubstituted isopropyl group, a substituted or unsubstituted i-butyl group, a substituted or unsubstituted t-butyl group, or a substituted or unsubstituted phenyl group.

In an embodiment, $R_1$ and $R_5$ may each independently be represented by any one selected from among R-1 to R-10. R-1 and R-2 indicate a substituted or unsubstituted methyl group. R-3 indicates an unsubstituted isopropyl group, and R-4 indicates an unsubstituted t-butyl group. R-5 to R-7 indicate a substituted or unsubstituted t-butyl group. R-8 indicates a dimethylamine group, and R-9 indicates a trimethylsilyl group. R-10 indicates a substituted or unsubstituted phenyl group. In R-2 and R-6, D is a deuterium atom.

R-1

$*-CH_3$

R-2

$*-CD_3$

R-3

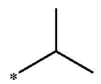

R-4

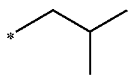

R-5

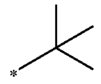

R-6

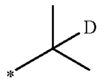

-continued

R-7

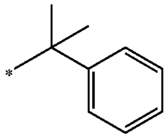

R-8

R-9

R-10

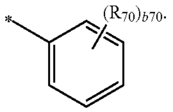

In R-10, b70 may be an integer from 0 to 5. When b3 is an integer of 2 or greater, a plurality of $R_{70}$s may all be the same or at least one may be different from the others. $R_{70}$ may be a hydrogen atom, a deuterium atom, a substituted or unsubstituted alkyl group having 1 to 10 carbon atoms or a substituted or unsubstituted aryl group having 6 to 30 ring-forming carbon atoms.

For example, R-10 may be represented by any one selected from among R-10a to R-10w. R-10a indicates an unsubstituted phenyl group, and R-10b indicates a phenyl group substituted with a deuterium atom. R-10c indicates a phenyl group substituted with an unsubstituted methyl group, and R-10d to R-10g indicate a phenyl group substituted with an unsubstituted t-butyl group. R-10h indicates an unsubstituted biphenyl group, and R-10i to R-1 Ow indicate a substituted or unsubstituted m-terphenyl group (meta-terphenyl group).

R-10a

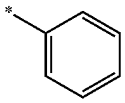

R-10b

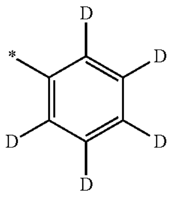

R-10c

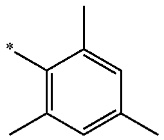

R-10d

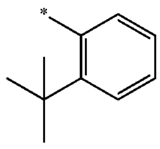

-continued

R-10e

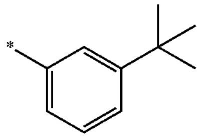

R-10f

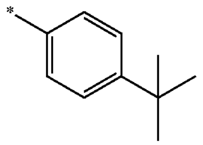

R-10g

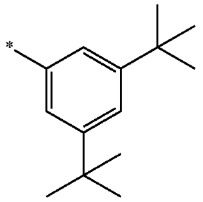

R-10h

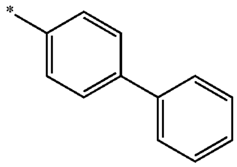

R-10i

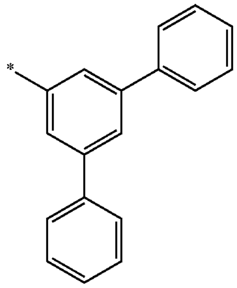

R-10j

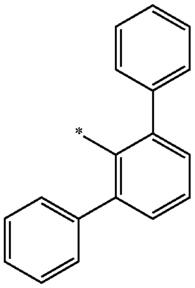

R-10k

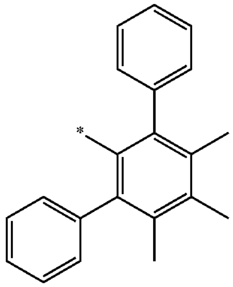

-continued
R-10l
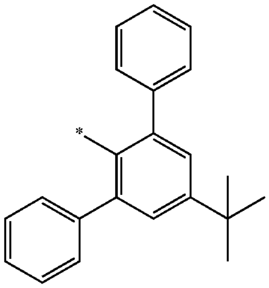
R-10m
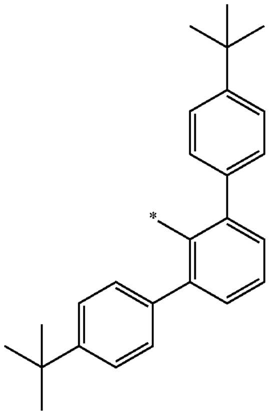
R-10n
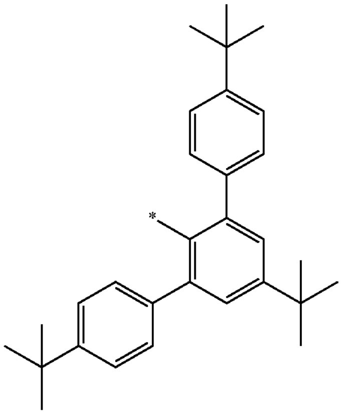
R-10o
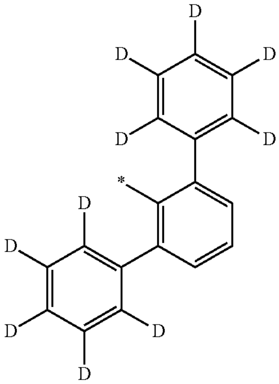
-continued
R-10p
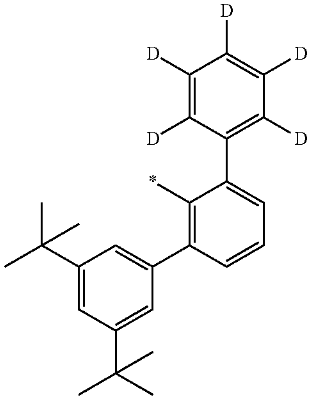
R-10q
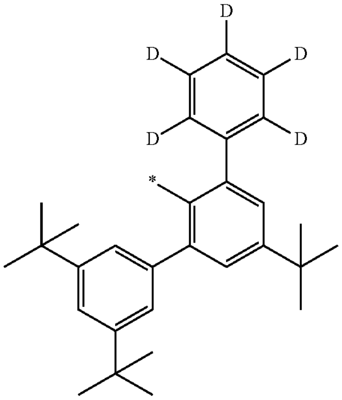
R-10r
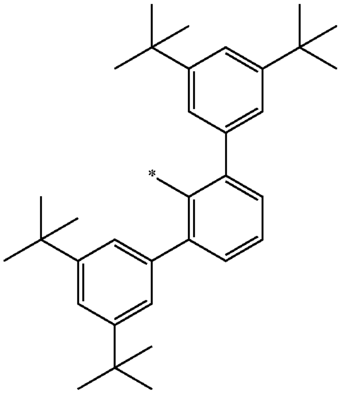
R-10s
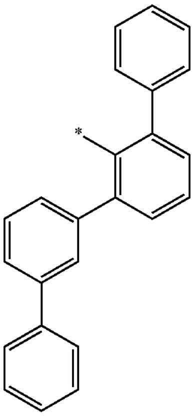

-continued

R-10t

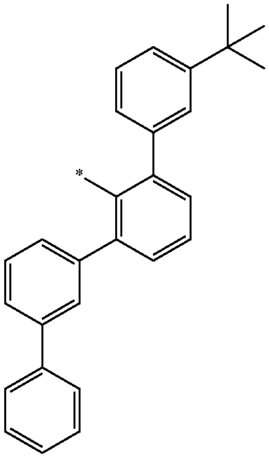

R-10u

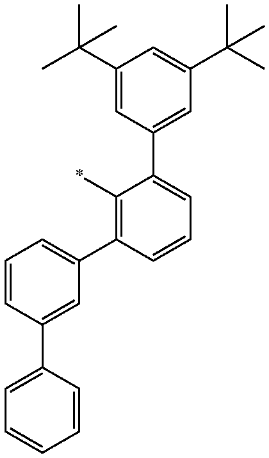

R-10v

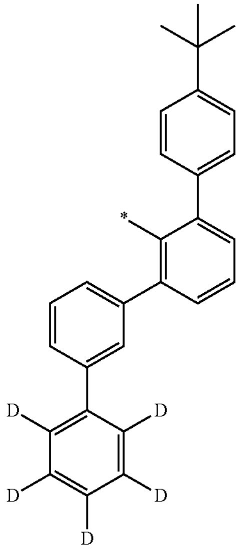

-continued

R-10w

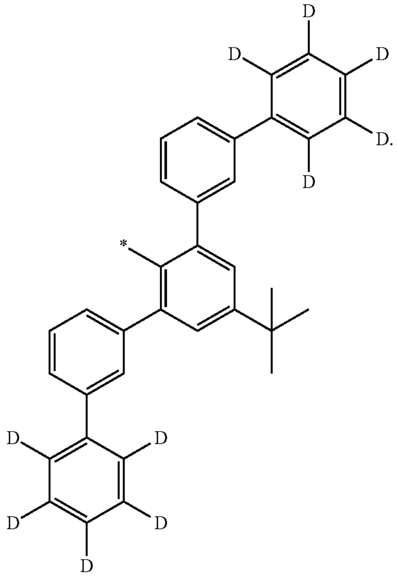

In an embodiment, Formula 1 may be represented by Formula 2. Formula 2 is an embodiment in which in Formula 1, the ring group A10 is a carbene imidazole group, the ring group A20 is a pyridine group, and the ring group A30 is a phenyl group. In some embodiments, Formula 2 is an embodiment in which in Formula 1, $Y_{11}$, $Y_{12}$, and $Y_{20}$ are N, and $Y_{10}$, $Y_{21}$, $Y_{22}$, and $Y_{30}$ to $Y_{32}$ are C.

Formula 2

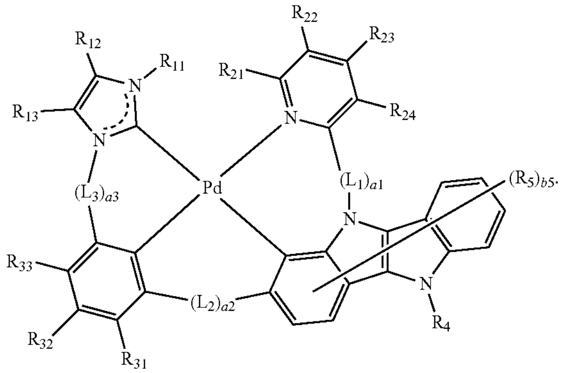

In Formula 2, the same descriptions as in Formula 1 may be applied to a1 to a3, $L_1$ to $L_3$, b5, $R_4$, and $R_5$.

In Formula 2, $R_{11}$ to $R_{13}$, $R_{21}$ to $R_{24}$, and $R_{31}$ to $R_{33}$ may each independently be a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring. For example, $R_{11}$ to $R_{13}$, $R_{21}$ to $R_{24}$, and $R_{31}$ to $R_{33}$ may each independently be a hydrogen atom, a deuterium atom, a substituted amine group, a substituted silyl group, a substituted or unsubstituted alkyl group having 1 to 10 carbon atoms, or a substituted or unsubstituted aryl group having 6 to 20 ring-forming carbon atoms.

For example, $R_{11}$ to $R_{13}$ may each independently be a substituted or unsubstituted methyl group, a substituted or unsubstituted ethyl group, or a substituted or unsubstituted phenyl group, and/or bonded to an adjacent group to form a ring. $R_{21}$ to $R_{24}$ may each independently be a deuterium atom, a substituted or unsubstituted methyl group, an unsubstituted isopropyl group, a substituted or unsubstituted i-butyl group, a substituted or unsubstituted t-butyl group, a substituted amine group, a substituted silyl group, or a substituted or unsubstituted phenyl group. $R_{31}$ to $R_{33}$ may each independently be an unsubstituted t-butyl group, or a substituted or unsubstituted phenyl group.

In Formula 2, $R_{11}$ to $R_{13}$, $R_{21}$ to $R_{24}$, and $R_{31}$ to $R_{33}$ may each independently be represented by any one selected from among R-1 to R-9 and R-10a to R-10w, which described above. For example, $R_{11}$ and $R_{12}$ may be hydrogen atoms, and $R_{13}$ may be represented by any one selected from among R-1, R-2, R-10a, R-10b, R-10d to R-10g, and R-101 to R-10w. $R_{21}$, $R_{22}$, and $R_{24}$ may be hydrogen atoms or deuterium atoms, and $R_{23}$ may be represented by any one selected from among R-1 to R-9, R-10a, and R-10b. In some embodiments, $R_{21}$ and $R_{24}$ may be hydrogen atoms or deuterium atoms, and $R_{22}$ and $R_{23}$ may each independently be represented by any one selected from among R-1 to R-9, R-10a, R-10b, and R-10h. $R_{31}$ and $R_{33}$ may be hydrogen atoms or deuterium atoms, and $R_{32}$ may be represented by any one selected from among R-5, R-10a, and R-10c.

In an embodiment, Formula 2 is represented by Formula 3. Formula 3 is an embodiment in which in Formula 2, $R_{12}$ and $R_{13}$ are unsubstituted ethyl groups, and $R_{12}$ and $R_{13}$ are bonded to each other to form a ring group. For example, Formula 3 is an embodiment in which in Formula 2, $R_{12}$ and $R_{13}$ are bonded to each other to form a carbene imidazole group in which a benzene ring is fused. Formula 3 may be an embodiment in which in Formula 1, the ring group A10 is a carbene imidazole group in which a benzene ring is fused.

Formula 3

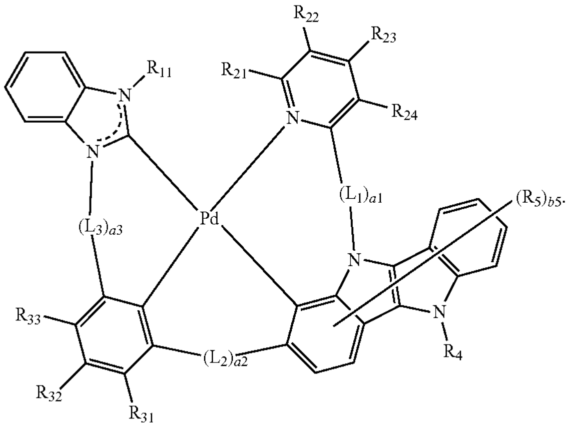

In Formula 3, the same descriptions as in Formula 2 may be applied to a1 to a3, $L_1$ to $L_3$, b5, $R_4$, $R_5$, $R_{11}$, $R_{21}$ to $R_{24}$, and $R_{31}$ to $R_{33}$.

Formula 2 may be represented by Formula 2-1. Formula 3 may be represented by Formula 3-1. Formula 2-1 is an embodiment in which in Formula 2, a1 to a3 are 1, $L_1$ and $L_3$ are direct bonds, and $L_2$ is O. Formula 3-1 is an embodiment in which in Formula 3, a1 to a3 are 1, $L_1$ and $L_3$ are direct bonds, and $L_2$ is O.

Formula 2-1

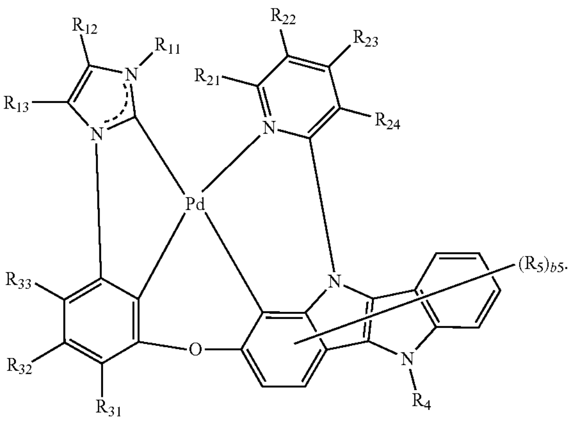

Formula 3-1

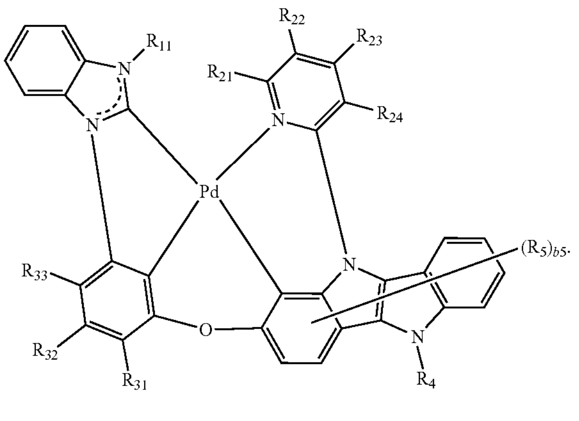

In Formulas 2-1 and 3-1, the same descriptions as in Formulas 2 and 3 may be applied to a1 to b5, $R_4$, $R_5$, $R_{11}$, $R_{21}$ to $R_{24}$, and $R_{31}$ to $R_{33}$.

An organometallic compound according to an embodiment may be represented by any one selected from among compounds of Compound Group 1. A light emitting element ED according to an embodiment may include one or more of the compounds of Compound Group 1. In Compound Group 1, D is a deuterium atom.

Compound Group 1
1
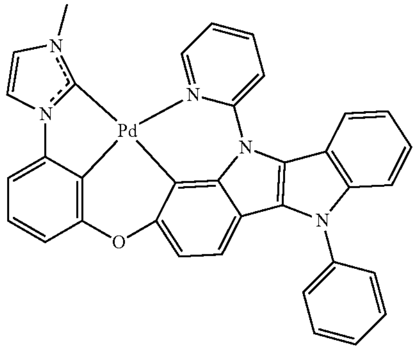
2
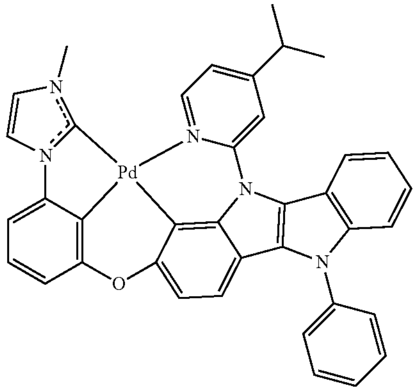
3
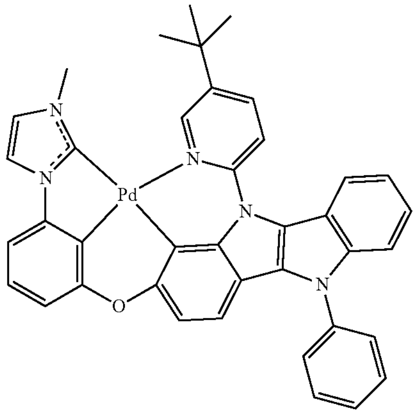
4
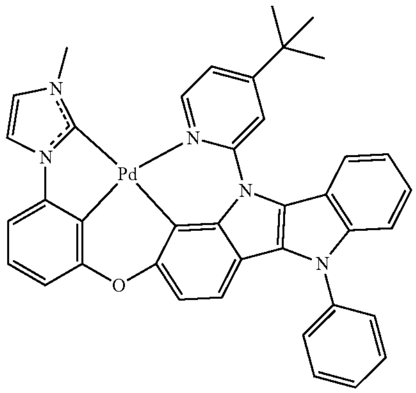
-continued
5
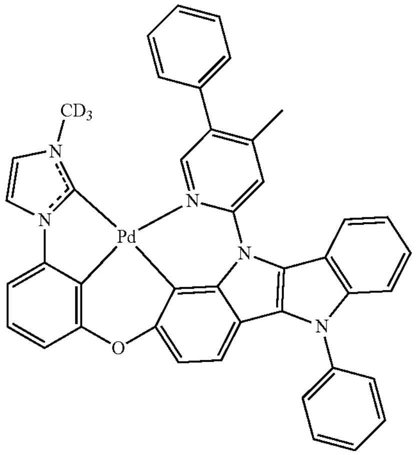
6
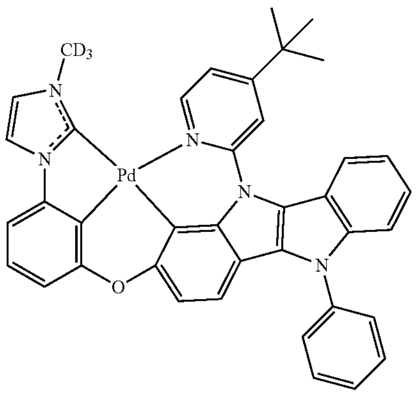
7
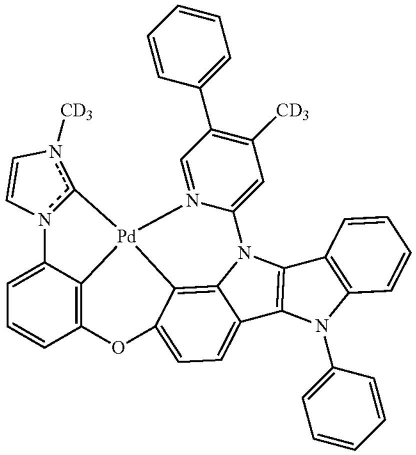

-continued
8
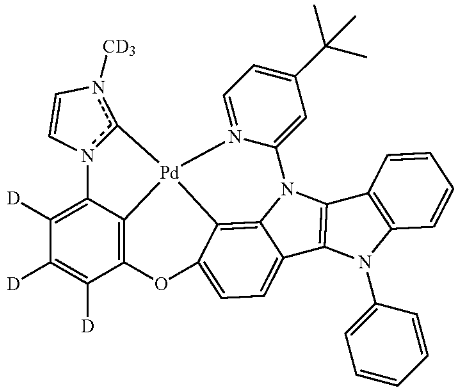
9
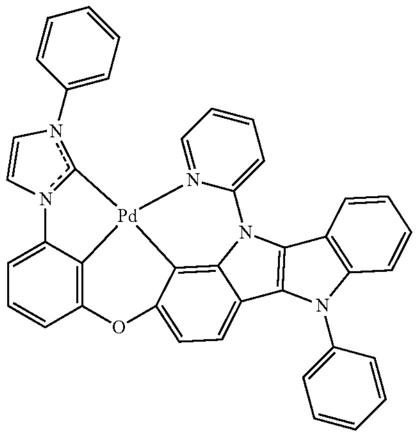
10
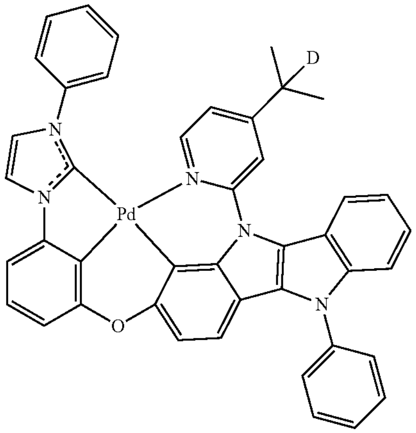
-continued
11
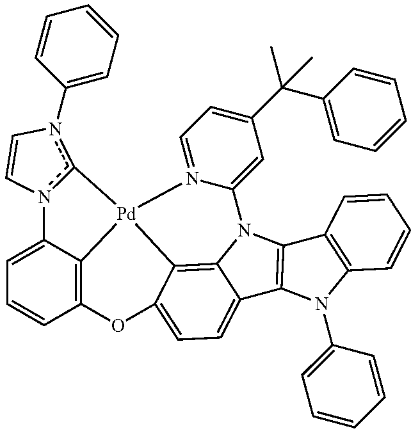
12
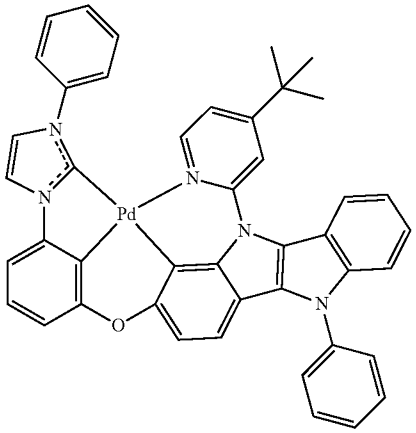
13
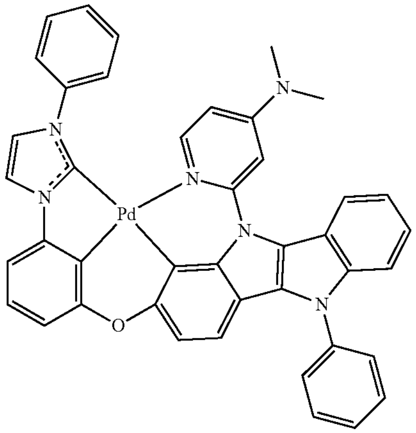

-continued
14
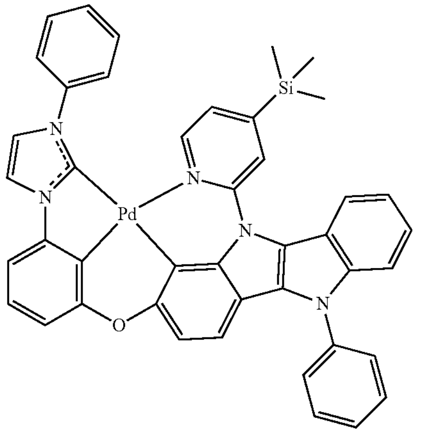
15
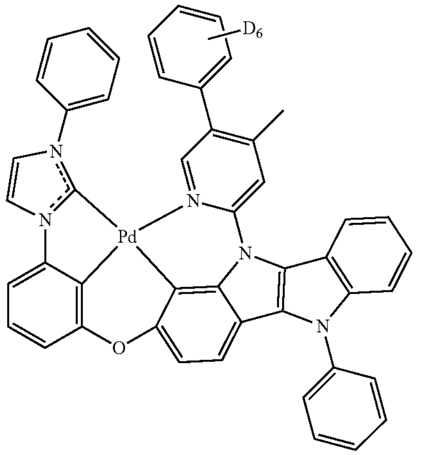
16
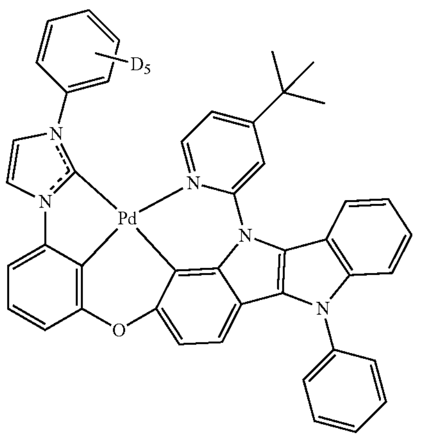
-continued
17
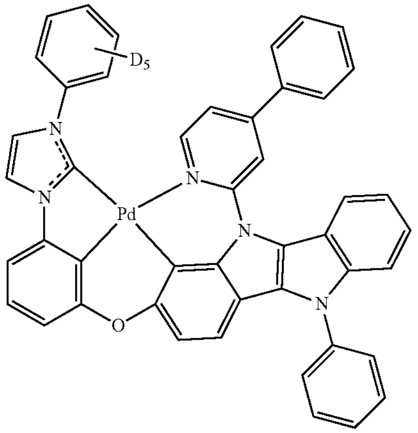
18
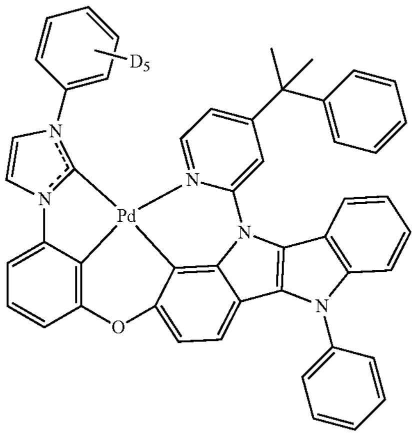
19
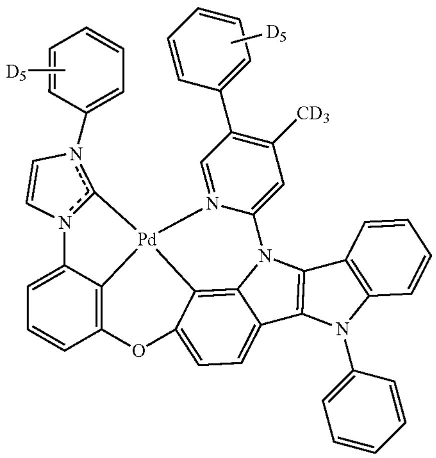

-continued
20
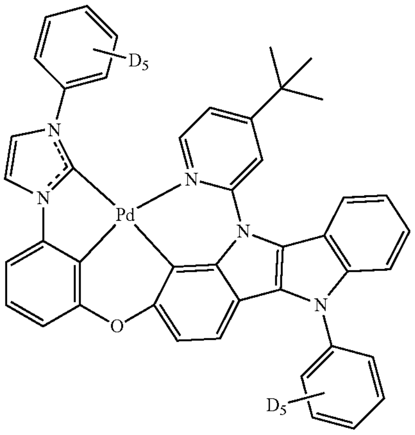
21
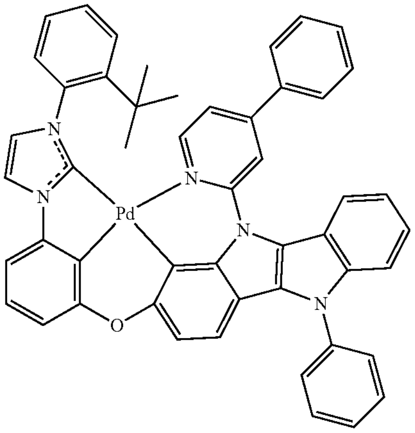
22
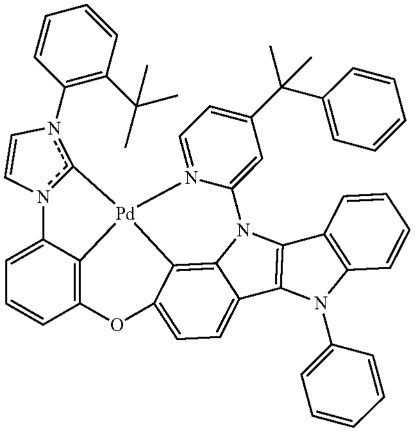
-continued
23
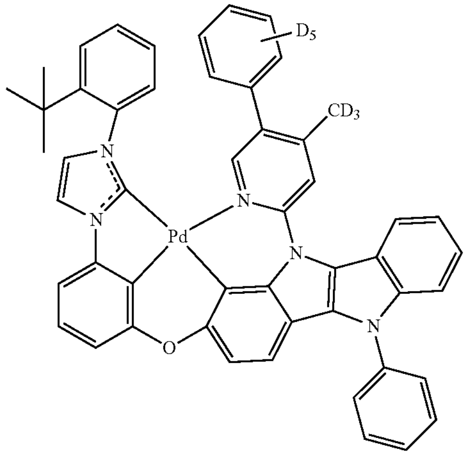
24
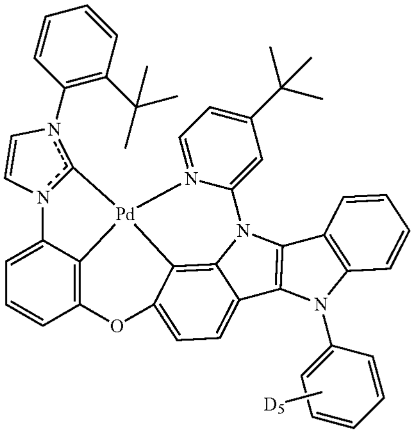
25
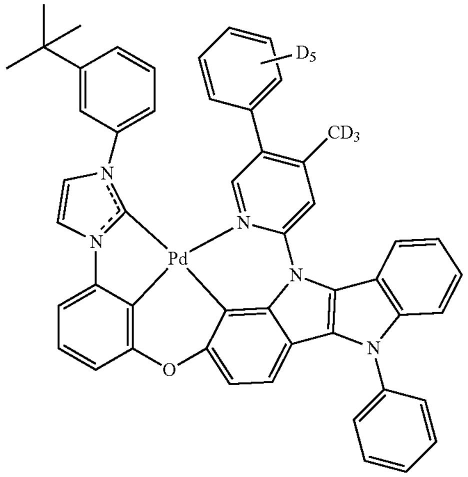

-continued
26
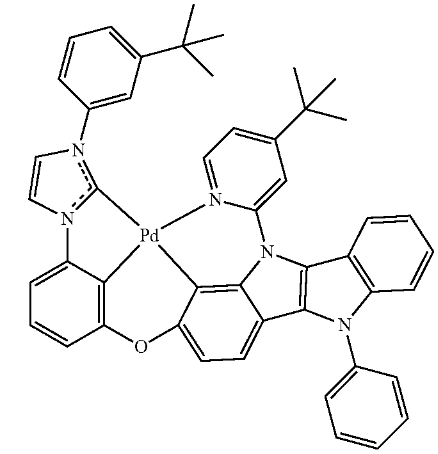
27
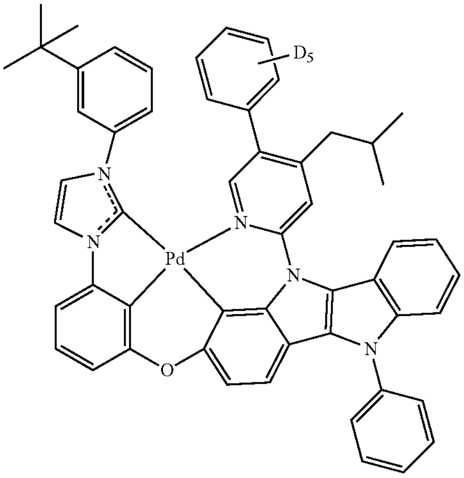
28
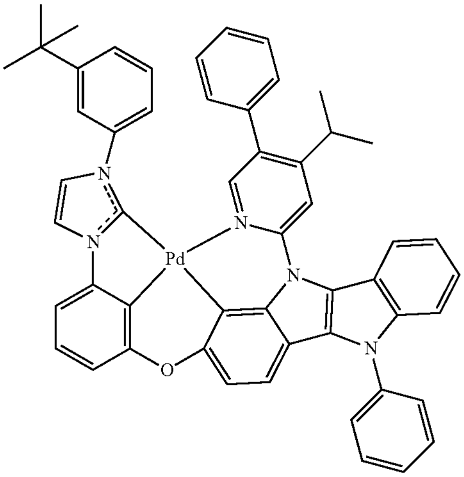
-continued
29
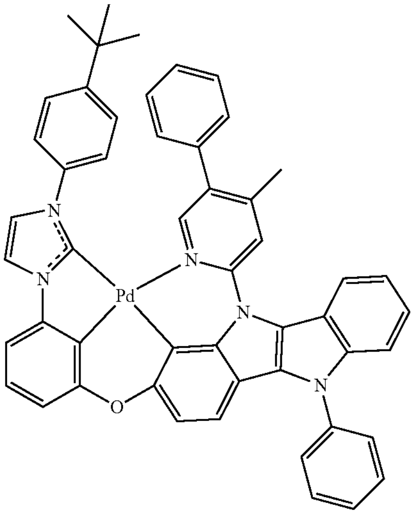
30
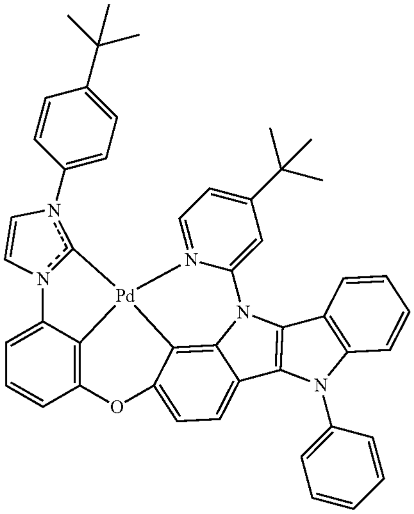
31
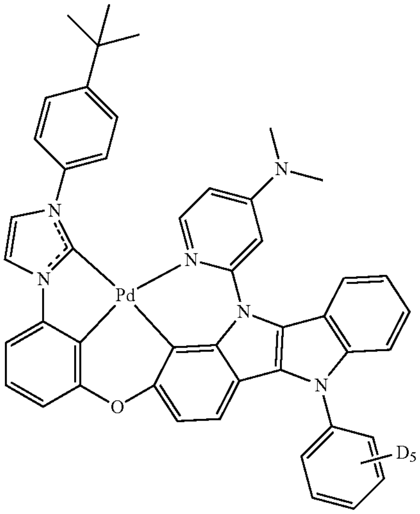

-continued
32
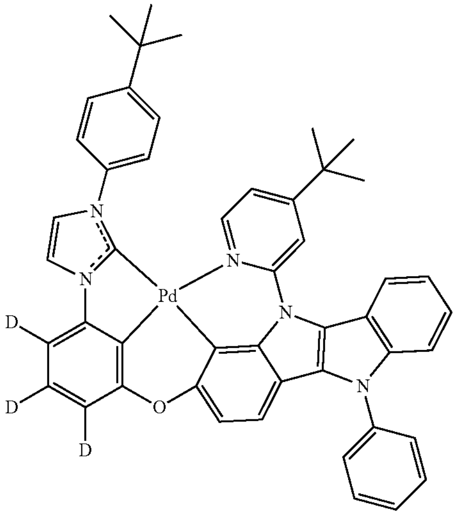
33
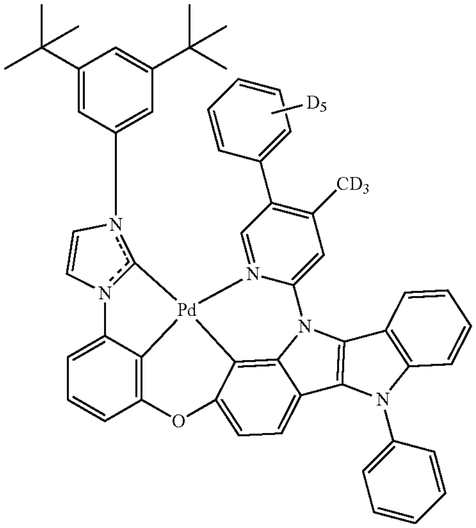
34
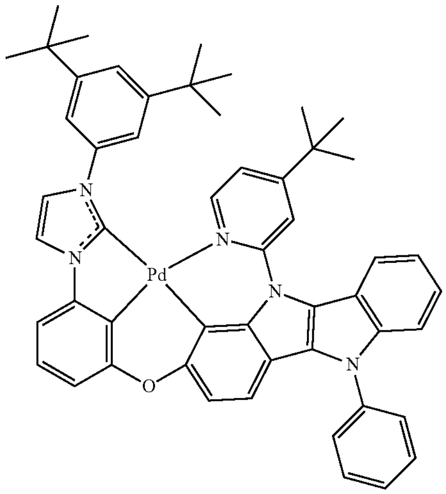
-continued
35
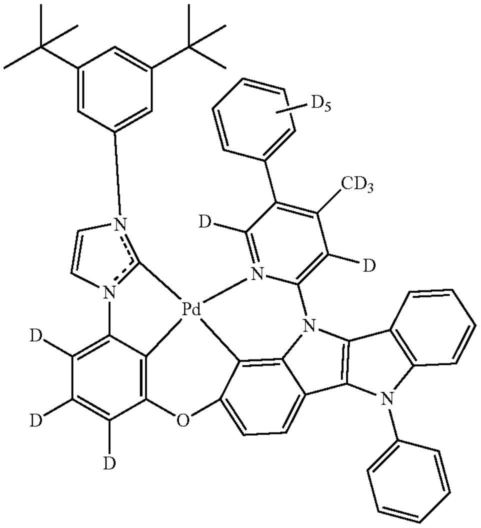
36
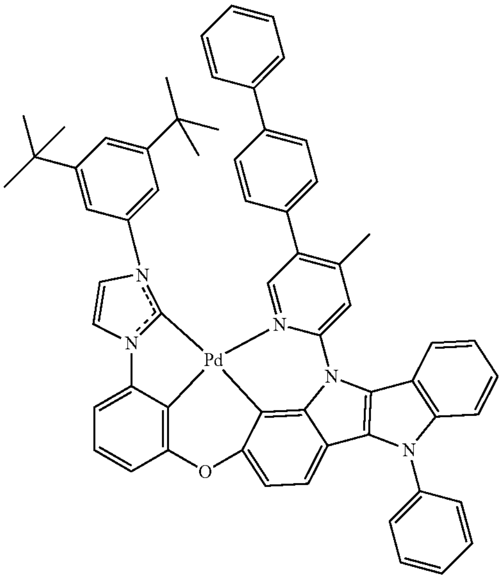
37
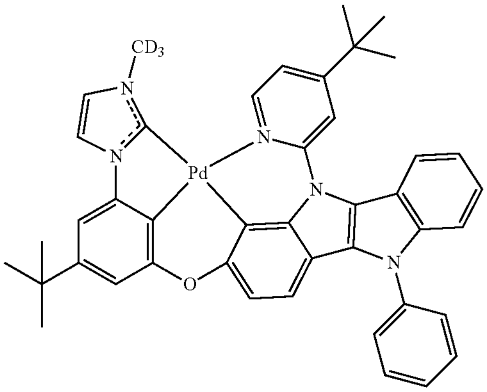

-continued
38
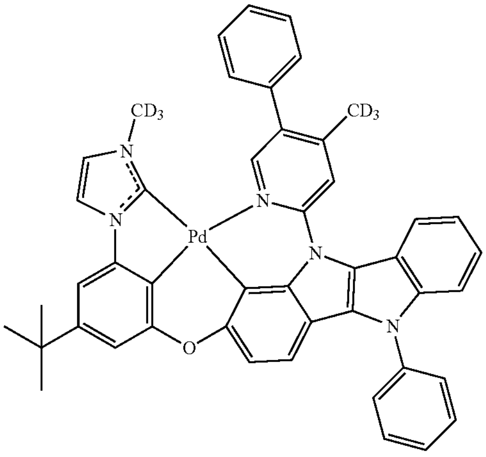
39
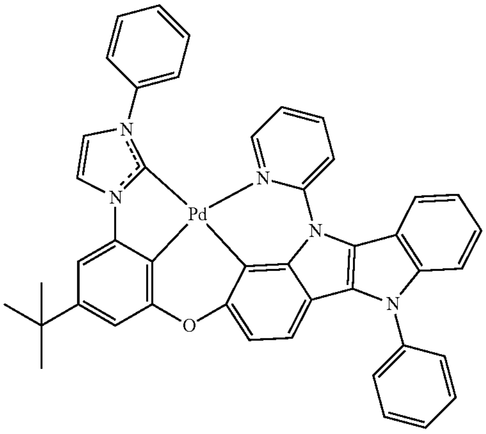
40
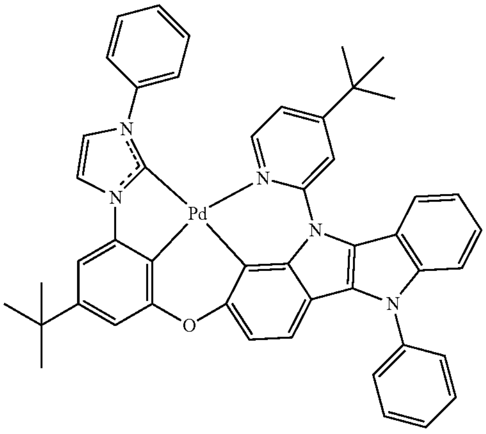
-continued
41
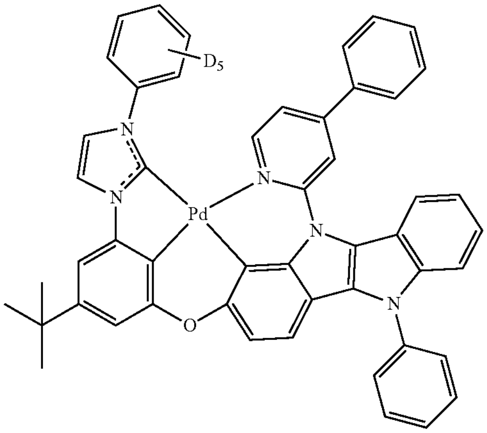
42
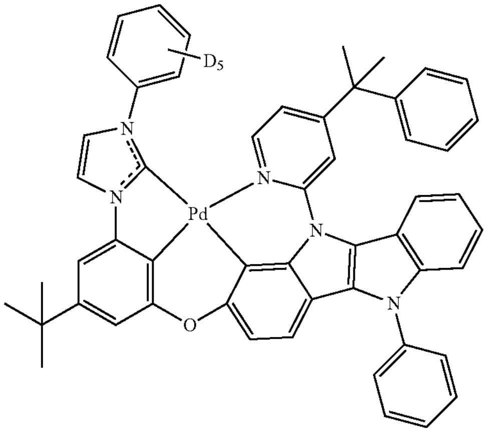
43
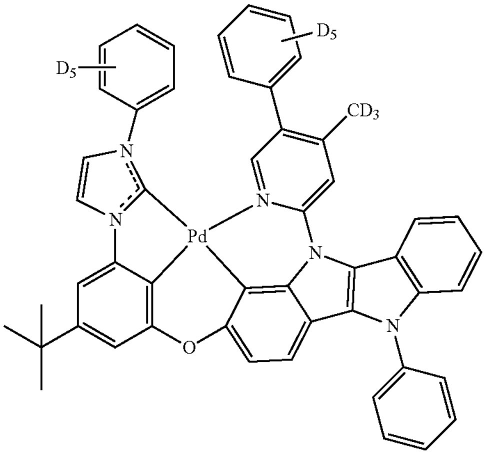

-continued
44
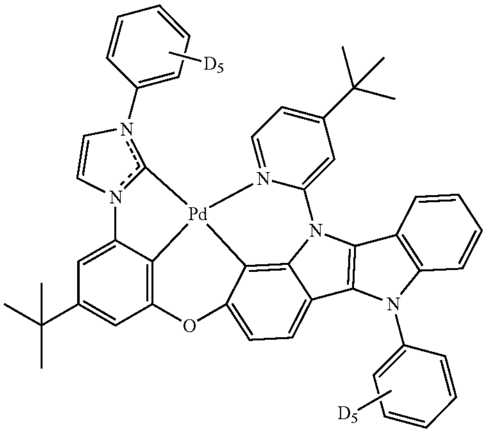
45
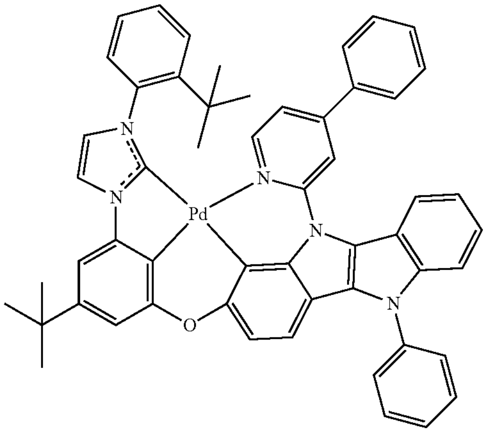
46
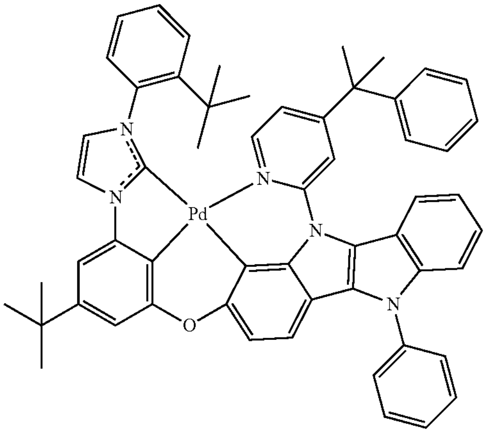
-continued
47
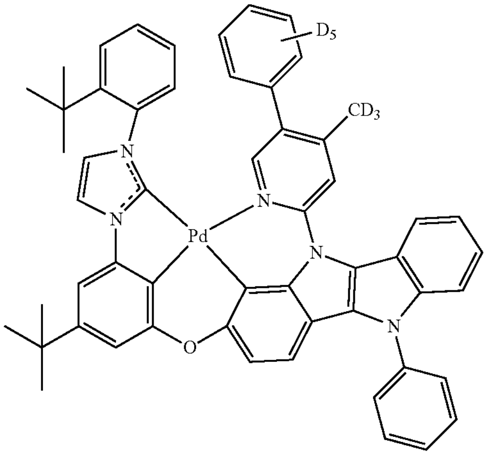
48
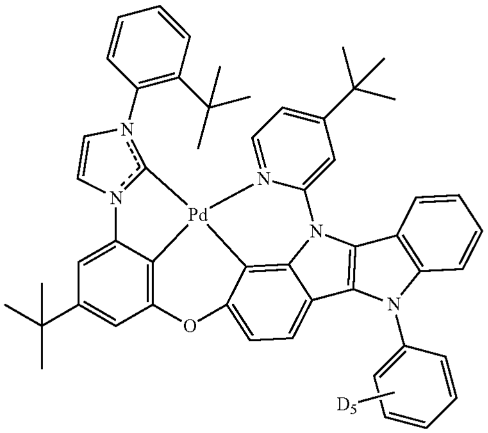
49
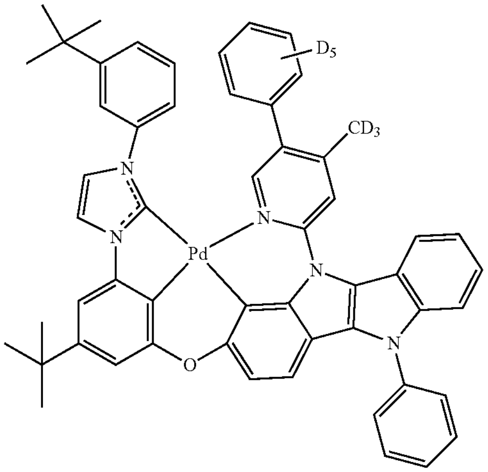

-continued
50
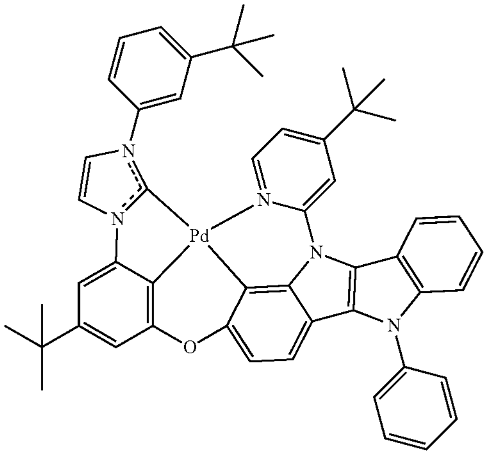
51
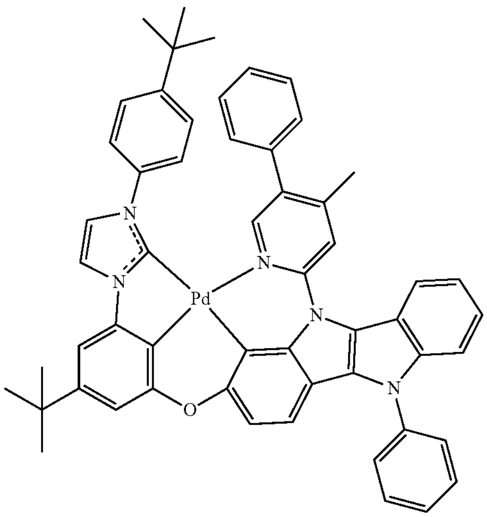
52
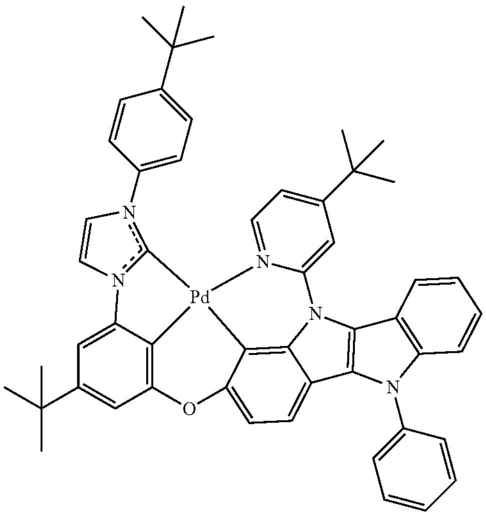
-continued
53
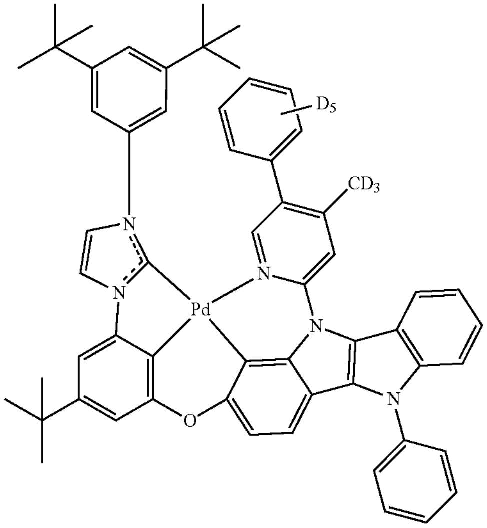
54
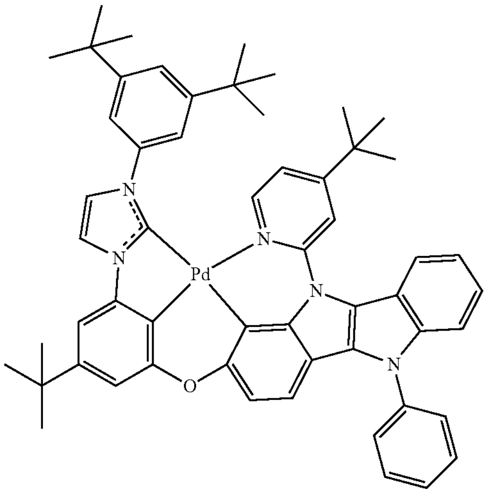
55
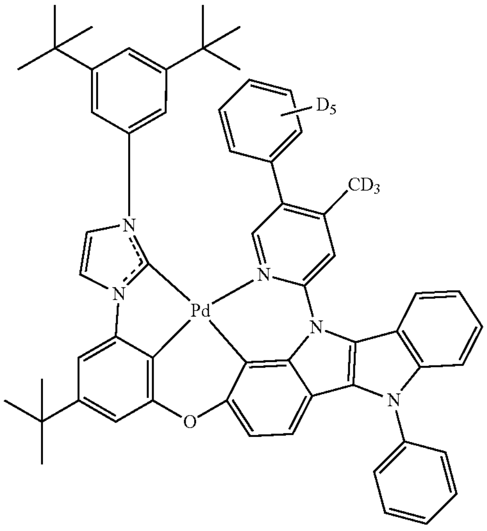

-continued
56
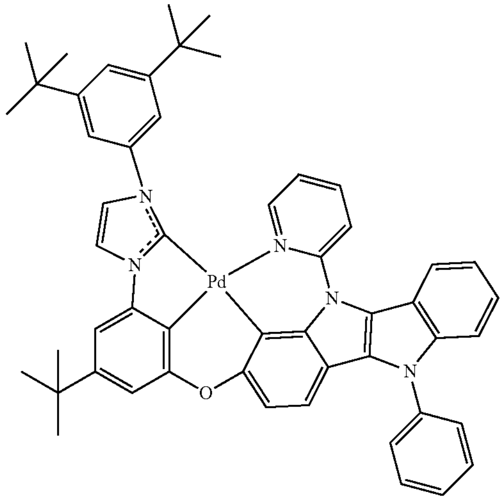
57
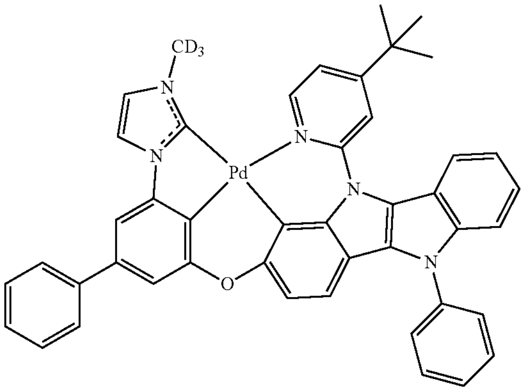
58
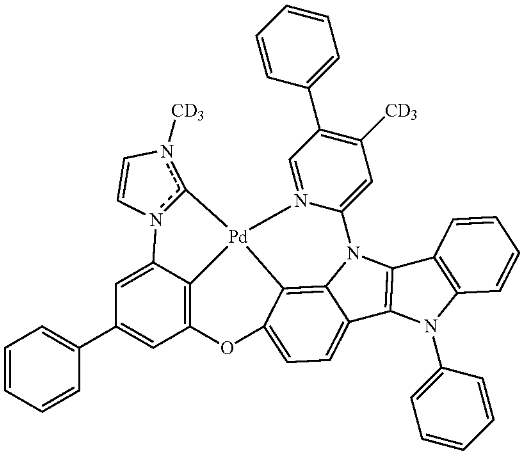
-continued
59
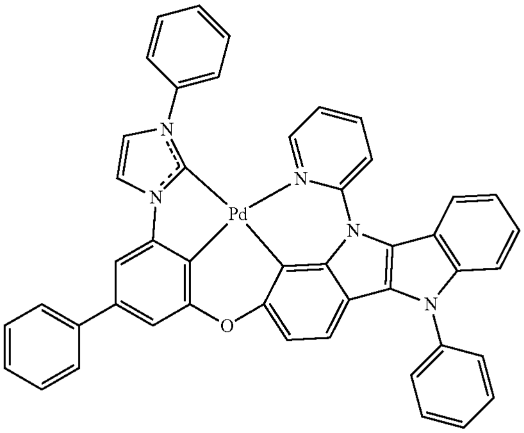
60
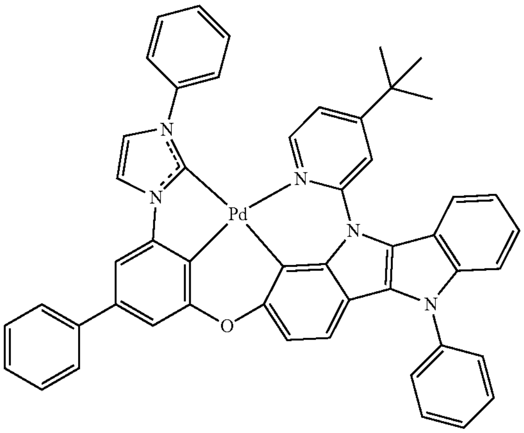
61
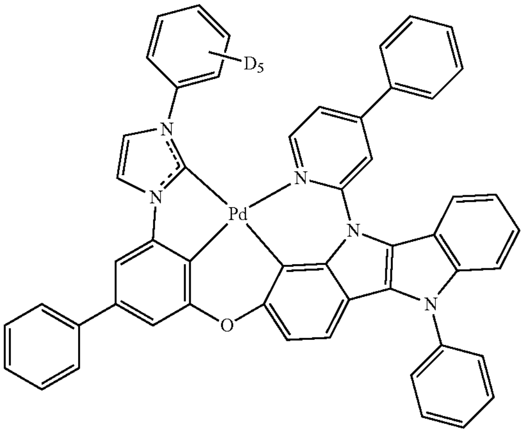

62
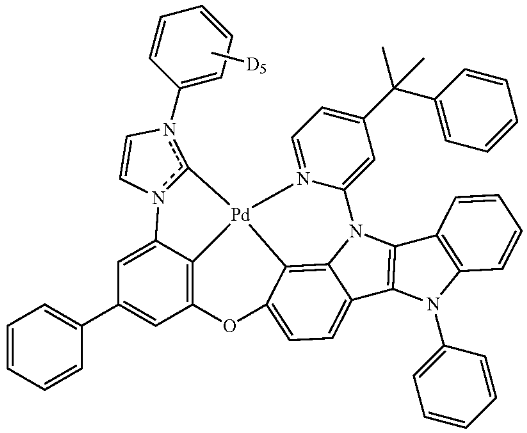
63
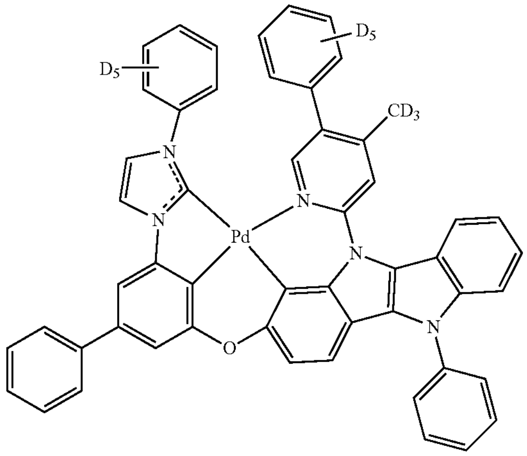
64
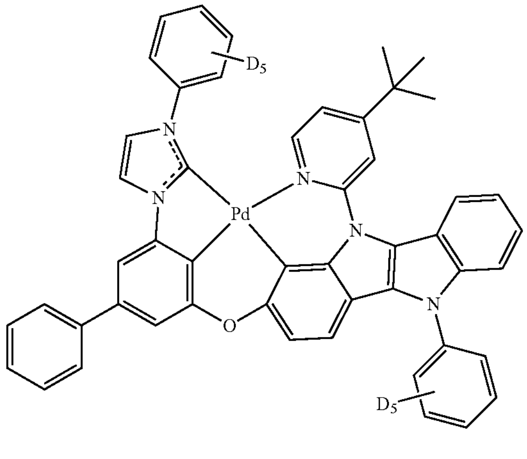
65
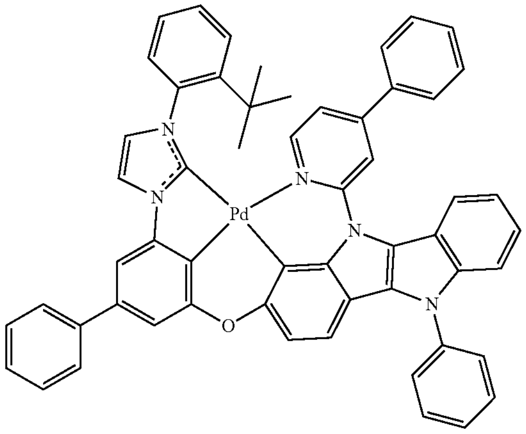
66
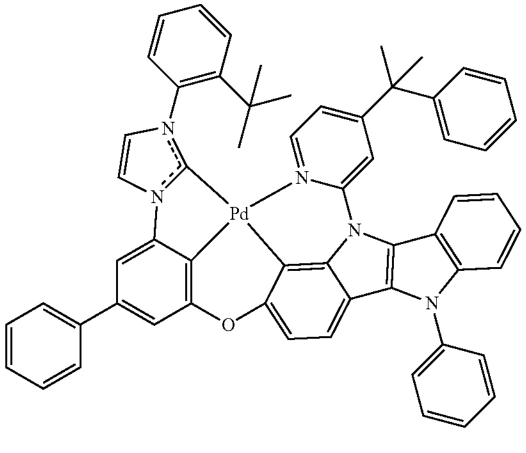
67
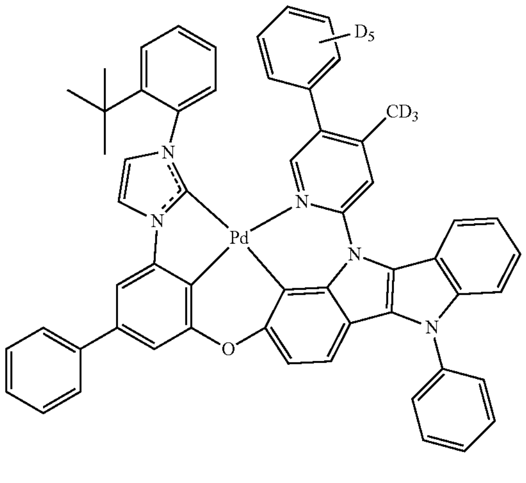

-continued
68
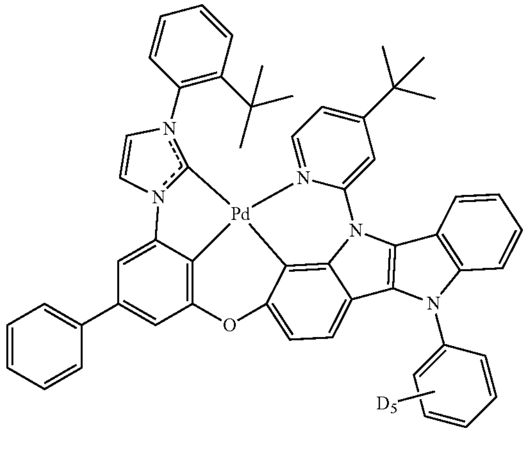
69
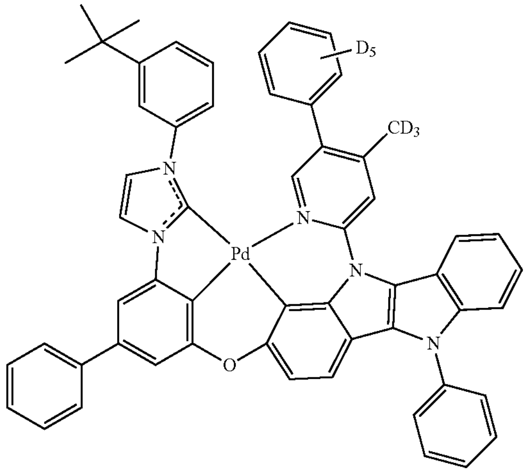
70
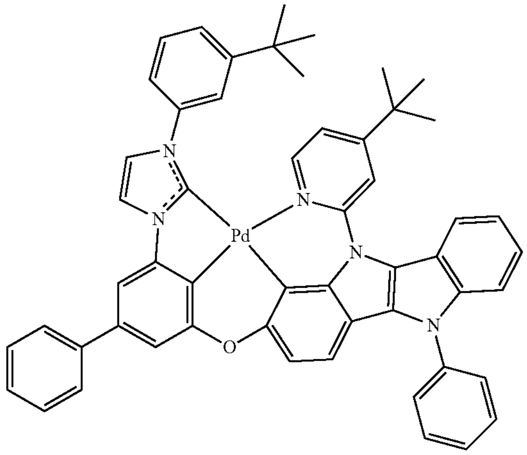
-continued
71
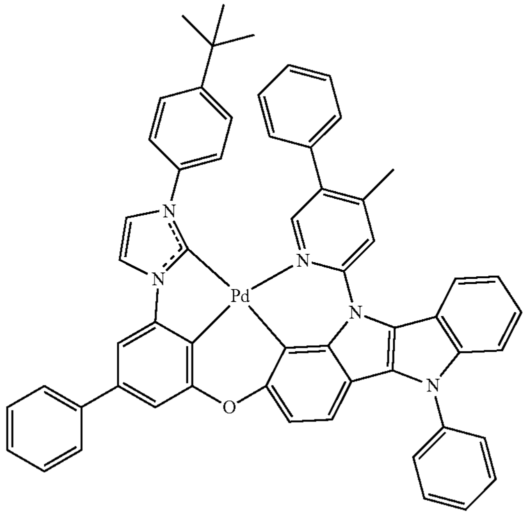
72
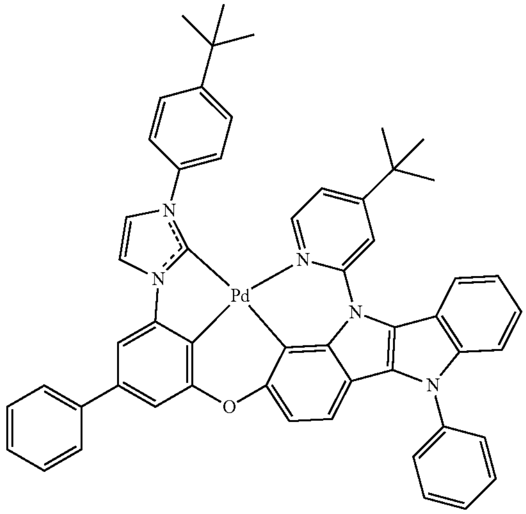
73
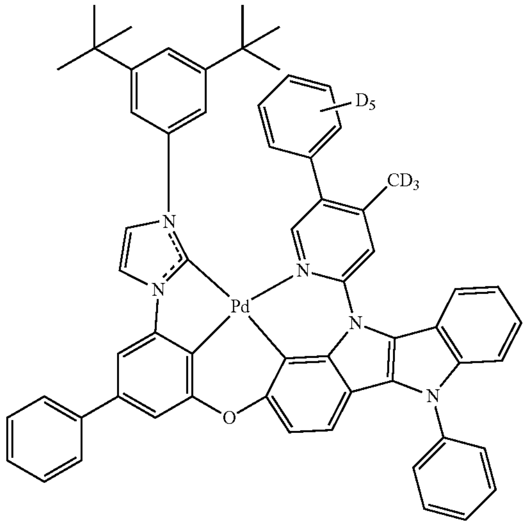

-continued
74
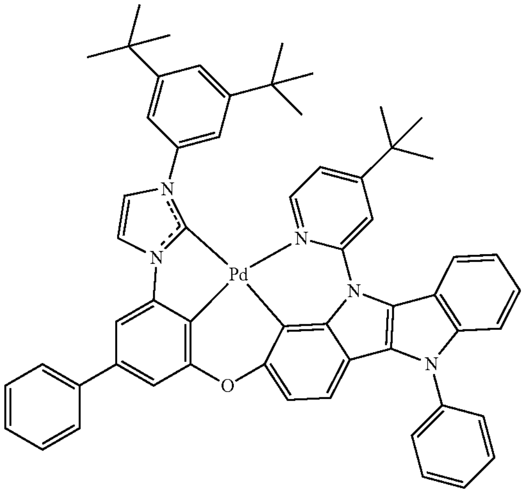
75
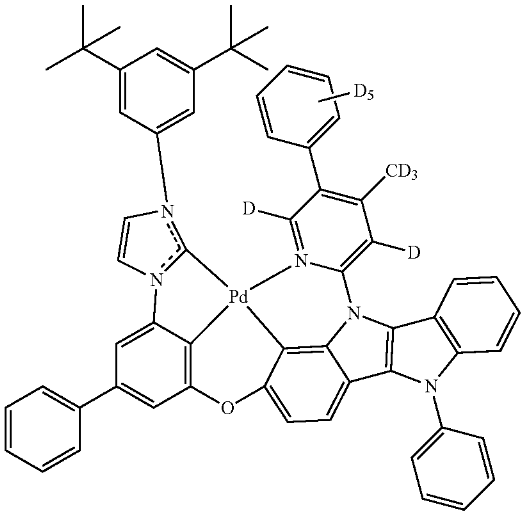
76
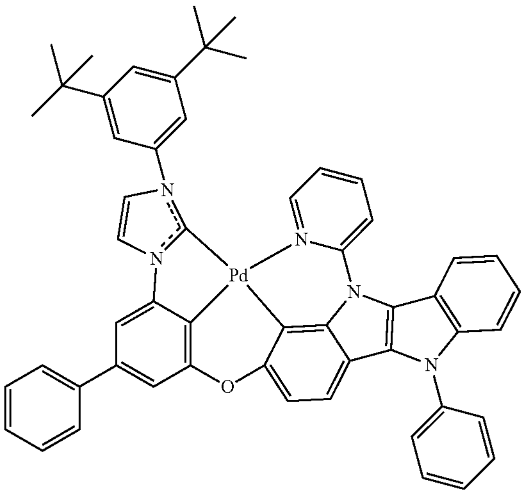
-continued
77
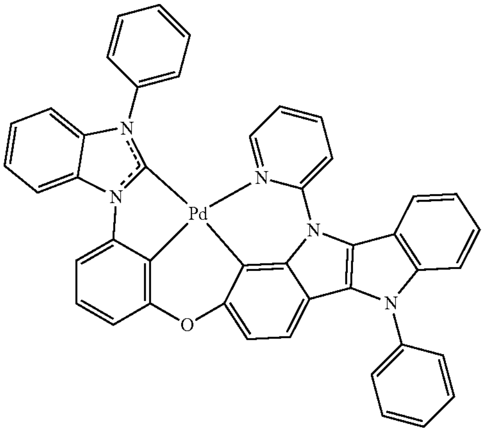
78
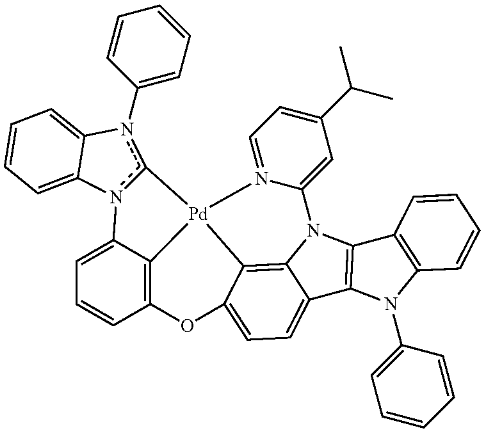
79
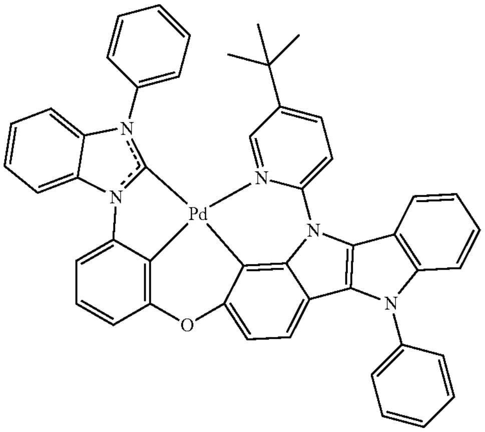

-continued
80
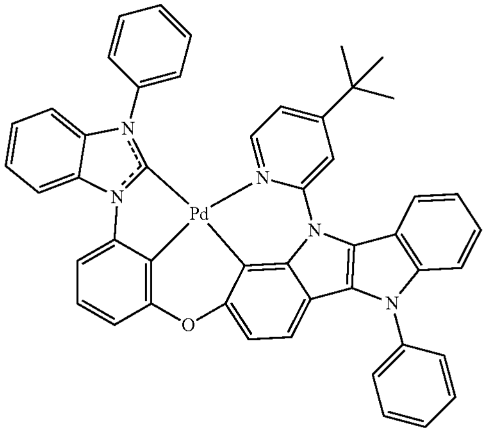
81
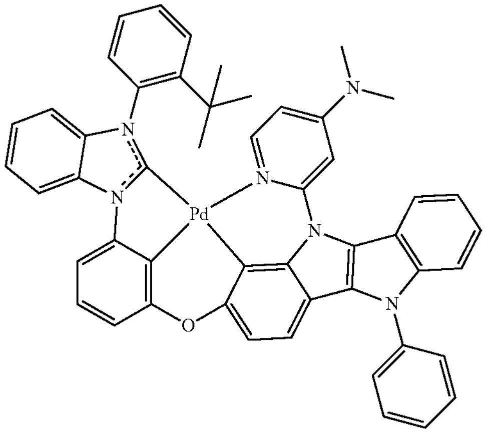
82
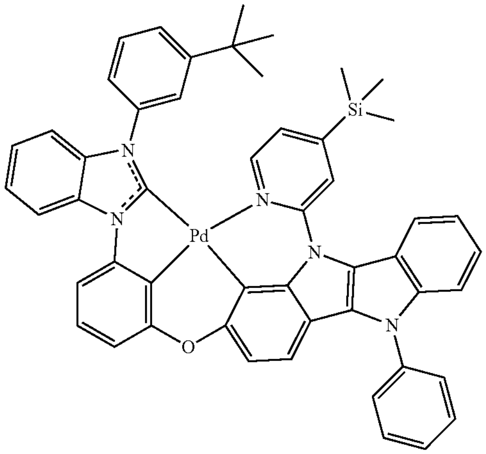
-continued
83
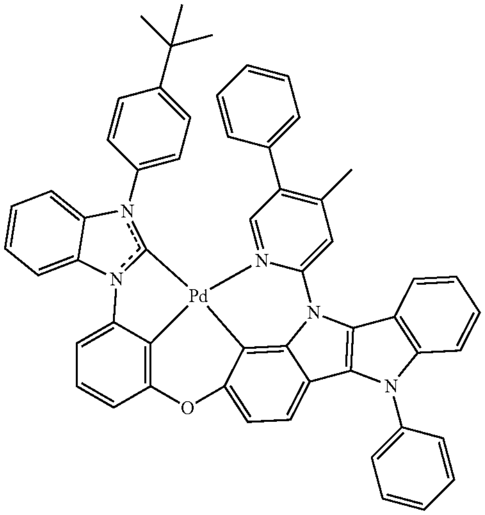
84
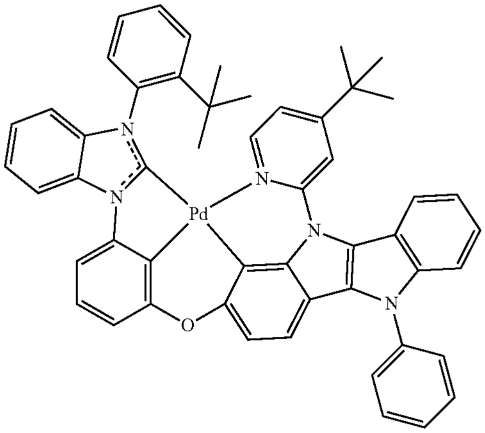
85
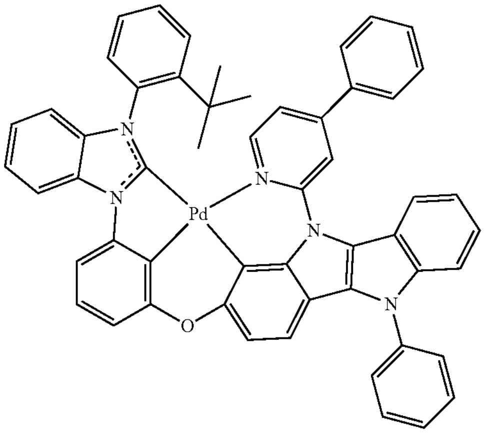

-continued
86
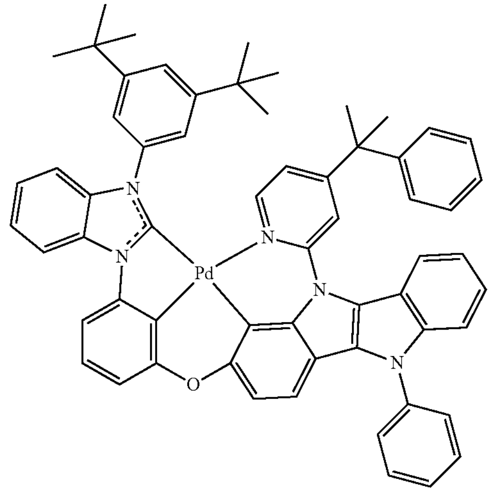
87
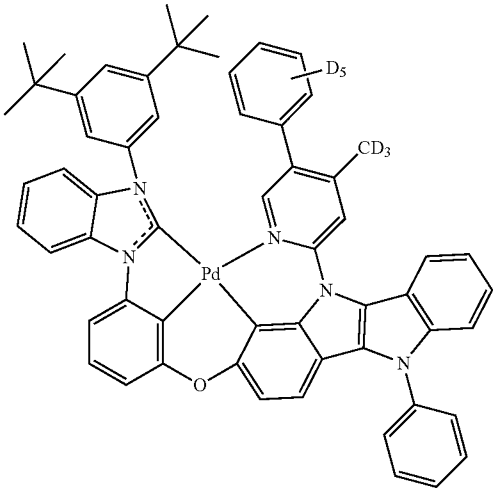
88
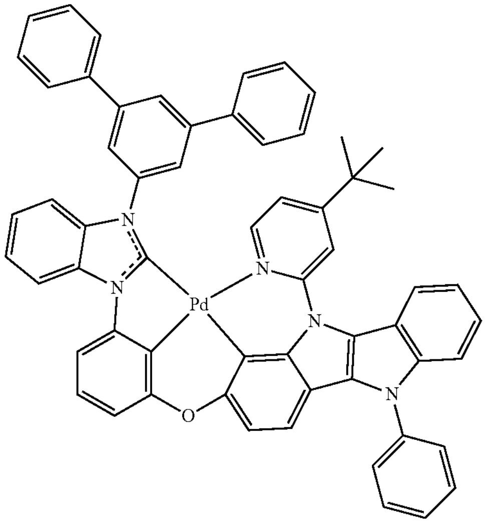
-continued
89
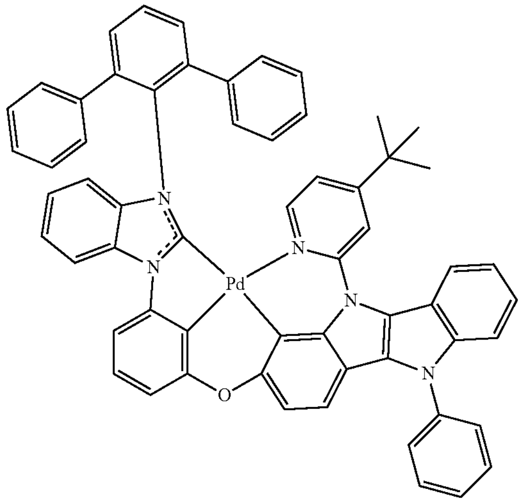
90
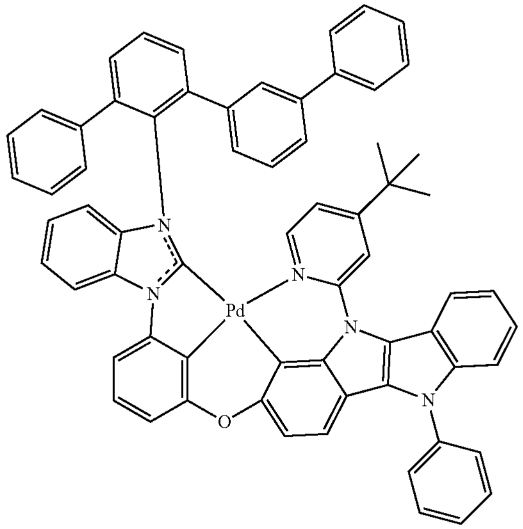
91
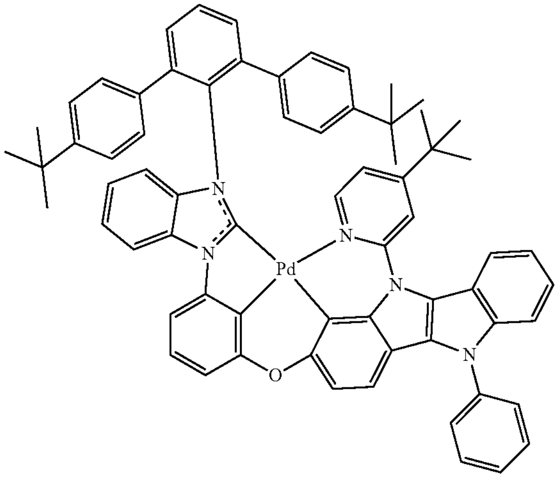

-continued
92
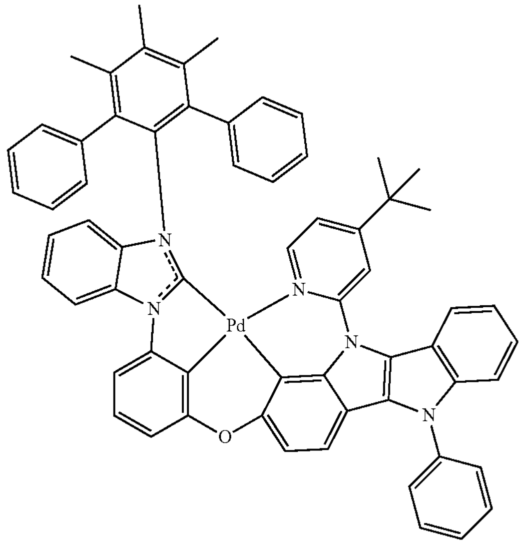
93
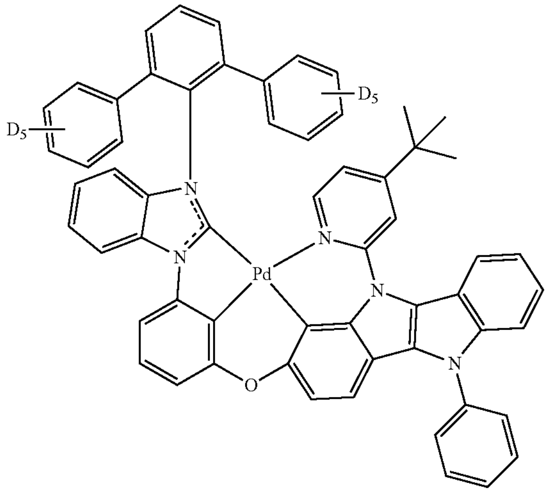
94
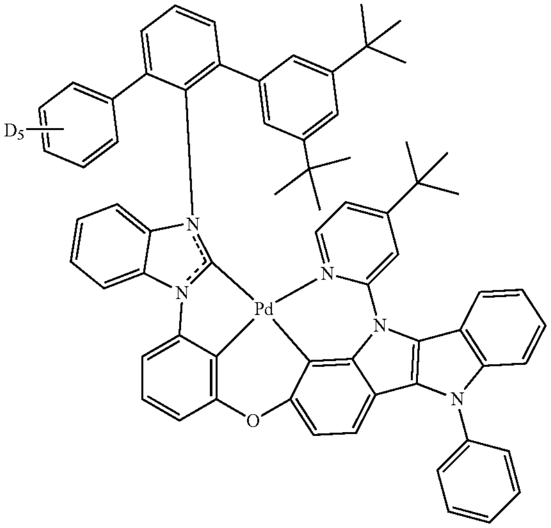
-continued
95
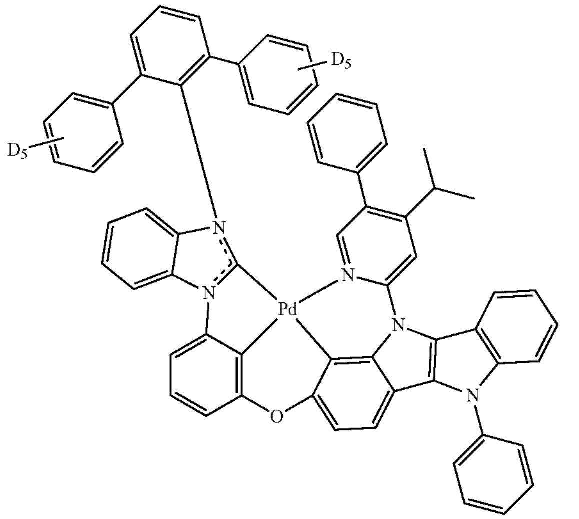
96
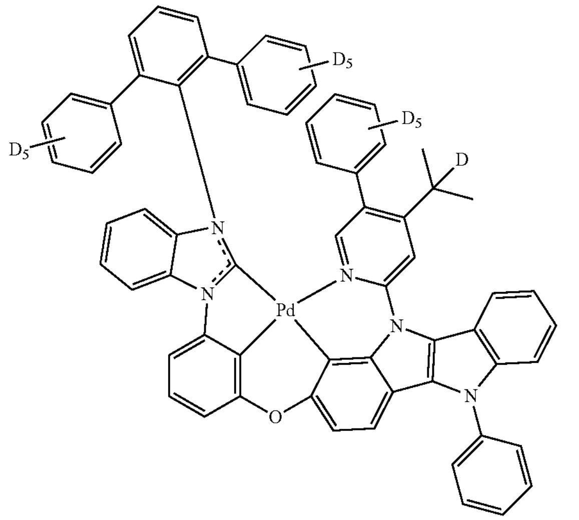

-continued
97
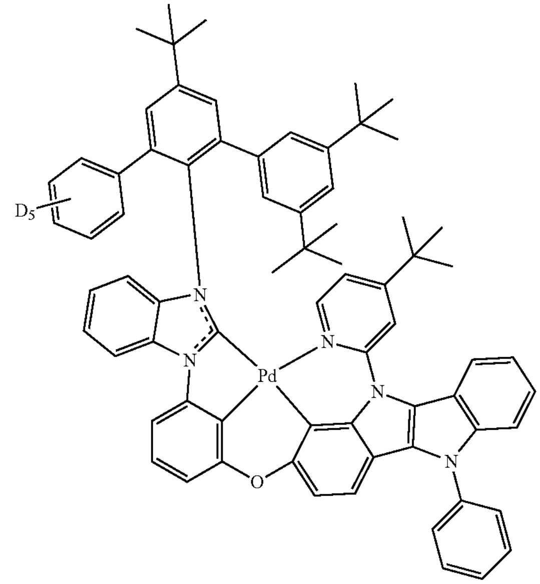
98
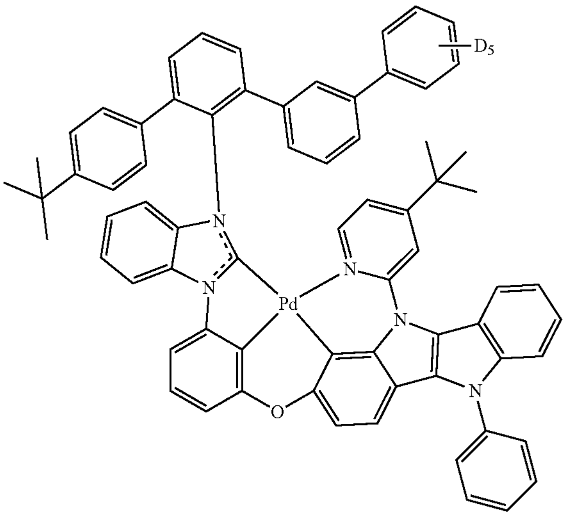
-continued
99
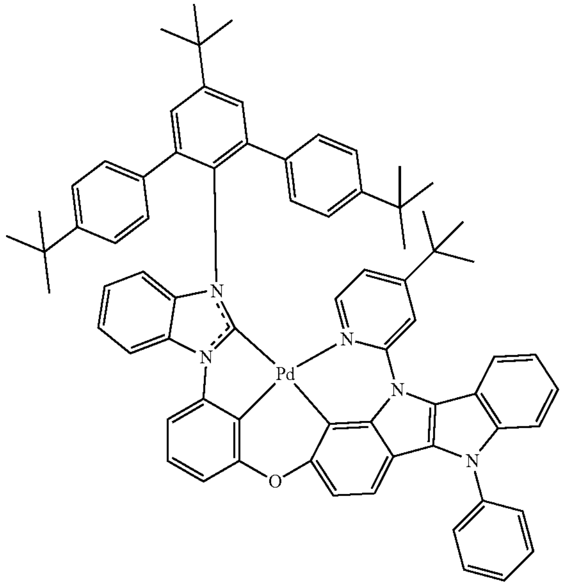
100
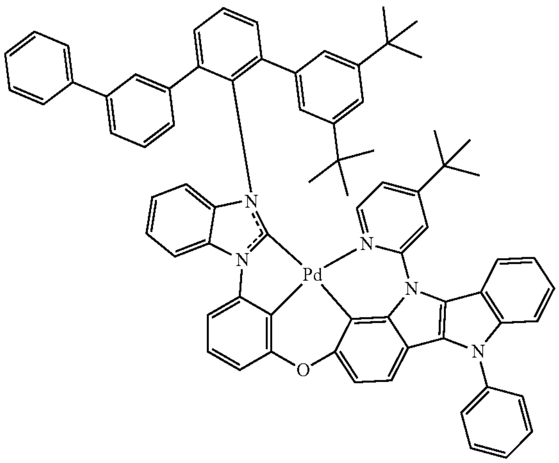
101
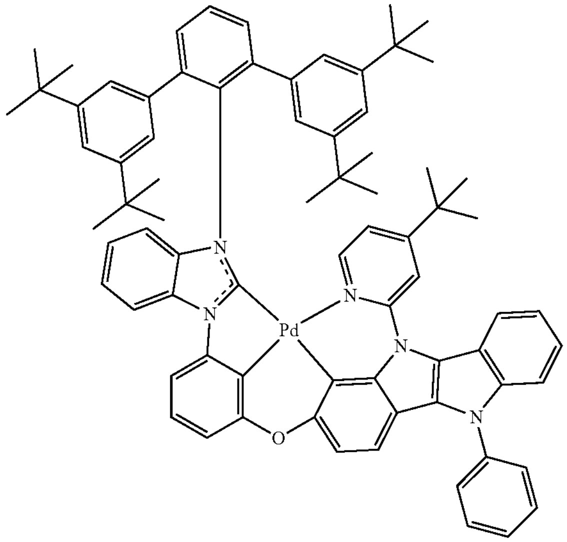

-continued
102
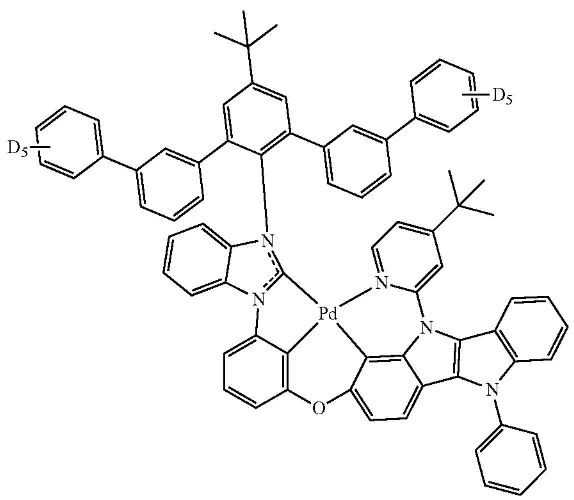
103
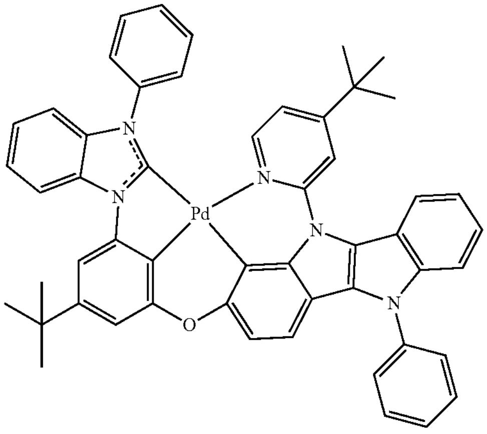
104
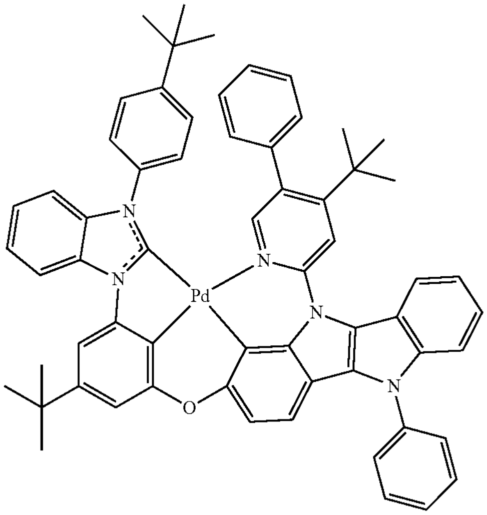
-continued
105
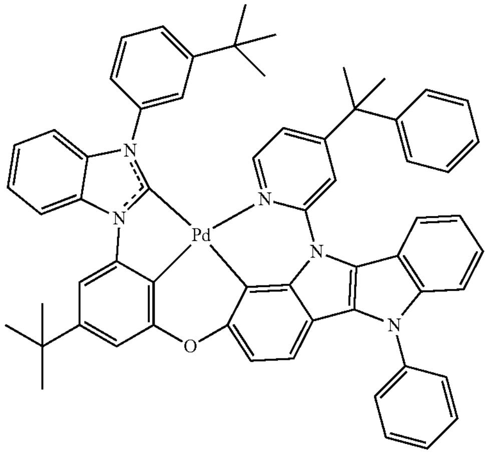
106
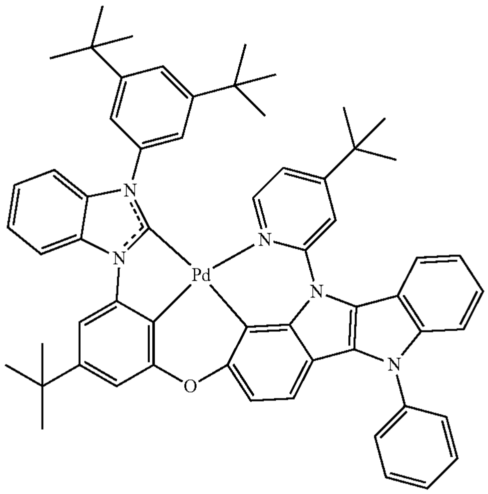
107
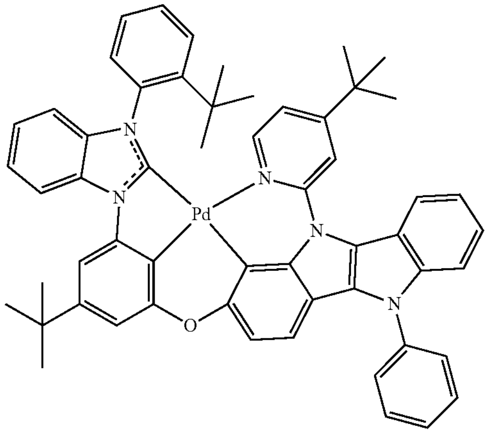

-continued
108
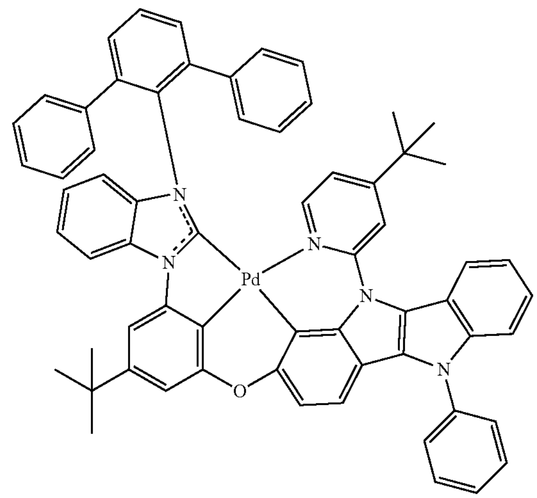
109
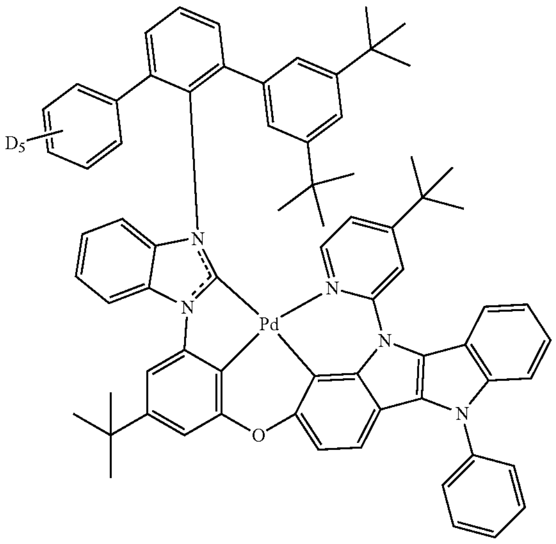
110
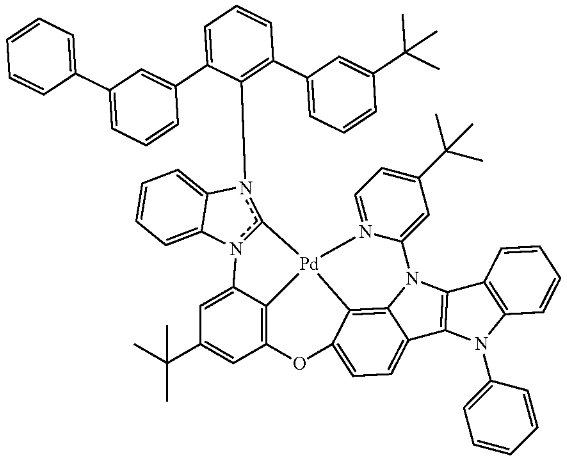
-continued
111
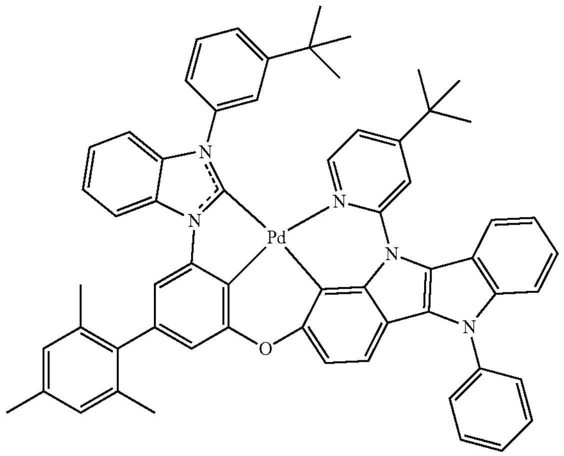
112
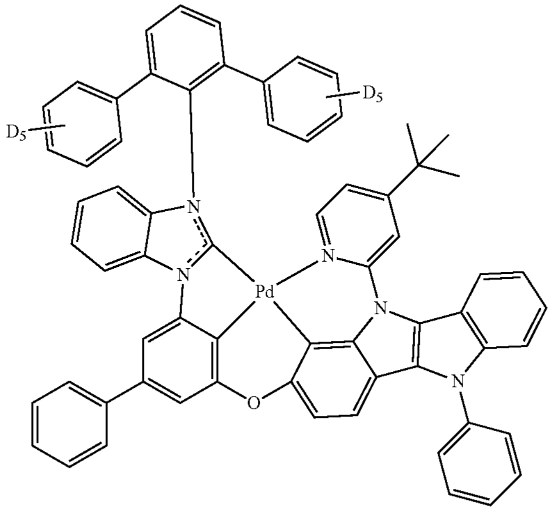
113
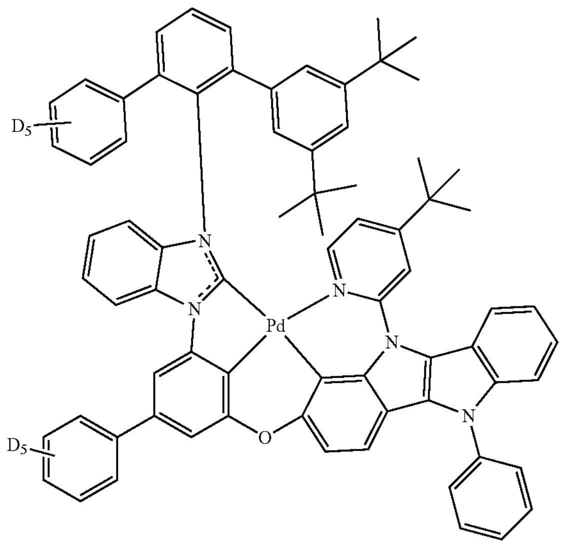

-continued

114

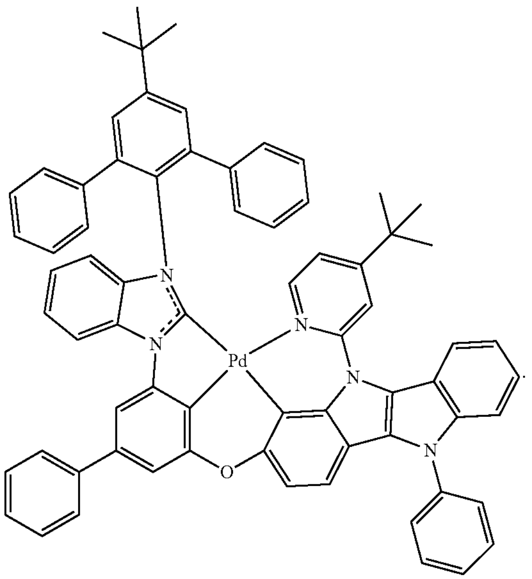

The organometallic compound according to an embodiment may include Pd as a central metal and tetradentate ligands bonded to Pd. The tetradentate ligands may include a carbene imidazole group, a pyridine group, a phenyl group, and an indolo[3,2-b]indole group. The carbene imidazole group, the pyridine group, the phenyl group, and the indolo [3,2-b]indole group may each independently be substituted or unsubstituted. The organometallic compound according to an embodiment may include a structure represented by Formula Z1 or Formula Z2. In Formulas Z1 and Z2, the same descriptions as in Formula 2 may be applied to $R_4$ and $R_{11}$.

Formula Z1

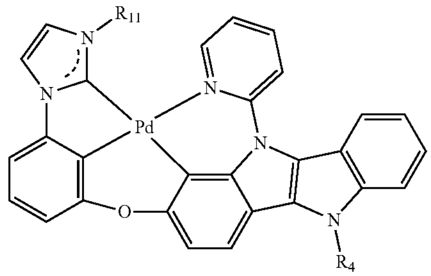

Formula Z2

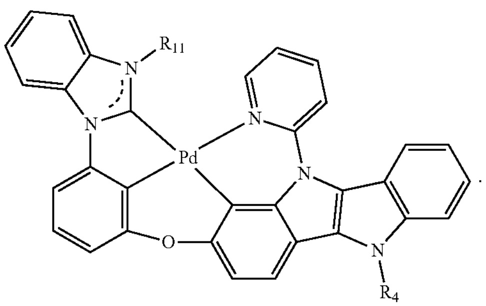

In the organometallic compound according to an embodiment, a bulky substituent is bonded to a nitrogen atom of a carbene imidazole group, so that the central metal Pd may be protected, and the organometallic compound includes the ligand of an indolo[3,2-b]indole group and accordingly may have increased stability of a material. The bulky substituent bonded to the nitrogen atom of the carbene imidazole group may be one represented by $R_{11}$ in Formulas Z1 and Z2. Accordingly, the light emitting element ED including the organometallic compound according to an embodiment may exhibit high efficiency and long lifespan. Accordingly, the light emitting element ED including the organometallic compound according to an embodiment may have a reduced driving voltage.

The emission layer EML may include a hole transporting host, an electron transporting host, and a dopant. The emission layer EML may include the organometallic compound according to an embodiment as a dopant, and the organometallic compound according to an embodiment may be a phosphorescent dopant. The emission layer EML including the organometallic compound according to an embodiment as a dopant may emit light of phosphorescence. For example, the organometallic compound according to an embodiment may be a blue phosphorescent dopant.

The emission layer EML may further include a delayed fluorescent compound. The emission layer EML may further include a compound of thermally activated delayed fluorescence (TADF) as a dopant.

In the emission layer EML, the hole transporting host and the electron transporting host may form an exciplex. At this point, the triplet energy of the exciplex formed by the hole transporting host and the electron transporting host corresponds to a difference between Lowest Unoccupied Molecular Orbital (LUMO) energy level of the electron transporting host and Highest Occupied Molecular Orbital (HOMO) energy level of the hole transporting host.

For example, the triplet energy level (T1) of the exciplex formed by the hole transporting host and the electron transporting host may have an absolute value of about 2.4 eV to about 3.0 eV. In some embodiments, the triplet energy of the exciplex may have a value smaller than the energy gap of each host material. The exciplex may have a triplet energy of 3.0 eV or less, which is an energy gap between the hole transporting host and the electron transporting host. However, this is presented as an example, and the embodiment of the present disclosure is not limited thereto.

When the emission layer EML includes the hole transporting host, the electron transporting host, and the organometallic compound according to an embodiment, the hole transporting host and the electron transporting host may form an exciplex, and energy is transferred from the exciplex to the organometallic compound according to an embodiment, thereby emitting light. When the emission layer EML includes the hole transporting host, the electron transporting host, the organometallic compound according to an embodiment, and the thermally activated delayed fluorescent compound, the hole transporting host and the electron transporting host may form an exciplex, and energy is transferred from the exciplex to the organometallic compound according to an embodiment, and transferred from the organometallic compound according to an embodiment to the thermally activated delayed fluorescent compound, thereby emitting light.

The emission layer EML including the organometallic compound according to an embodiment may emit light of phosphorescence. The emission layer EML including the organometallic compound according to an embodiment may emit deep blue light. The emission layer EML including the organometallic compound according to an embodiment may have a central emission wavelength in a wavelength range of about 440 nm to about 475 nm. In some embodiments, the emission layer EML including the organometallic compound according to an embodiment may emit light in which in the colorimetric system of International Commission on Illumination (CIE), a value of x is about 0.14 and a value of y is about 0.06 to about 0.25. Accordingly, the light emitting element ED including the organometallic compound may emit light having increased color purity.

In an embodiment, the emission layer EML may include a compound represented by Formula HT-1. The compound represented by Formula HT-1 may be utilized as a hole transporting host material of the emission layer EML.

Formula HT-1

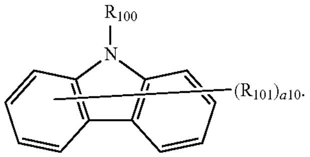

In Formula HT-1, a10 may be an integer from 0 to 8. When a10 is an integer of 2 or greater, a plurality of $R_{101}$s may all be the same or at least one may be different from the others. $R_{100}$ and $R_{101}$ may each independently be a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms. For example, $R_{100}$ may be a substituted phenyl group, an unsubstituted dibenzofuran group, or a substituted fluorenyl group. $R_{101}$ may be a substituted or unsubstituted carbazole group.

The compound represented by Formula HT-1 may be represented by any one selected from among compounds of Compound Group 2. The light emitting element ED may include any one selected from among the compounds of Compound Group 2. In Compound Group 2, D is a deuterium atom, and Ph is a phenyl group.

Compound Group 2

HT1

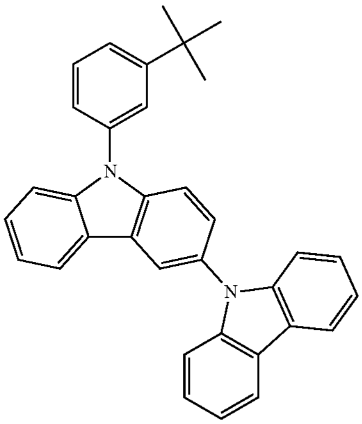

-continued

HT2

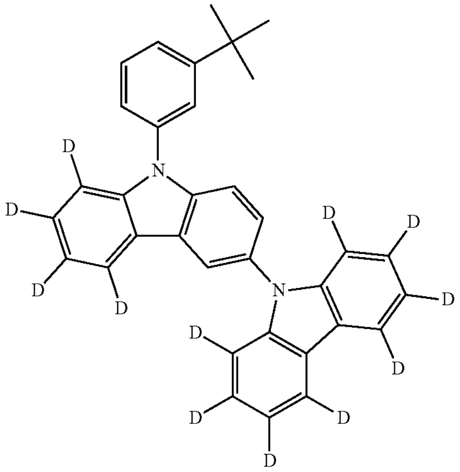

HT3

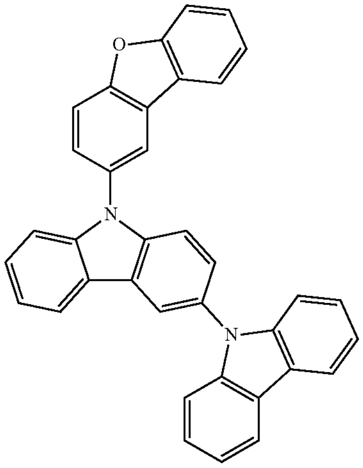

HT4

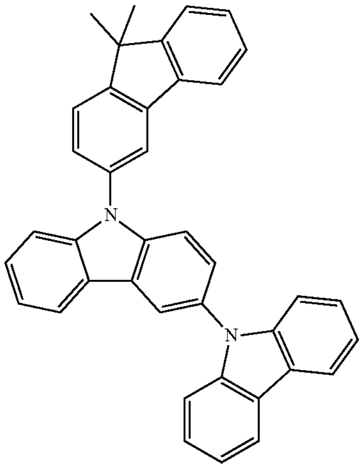

HT5

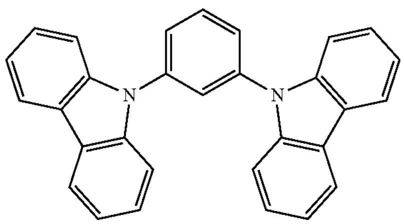

-continued
HT6
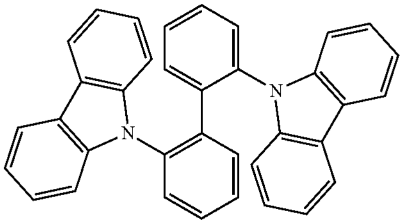
HT7
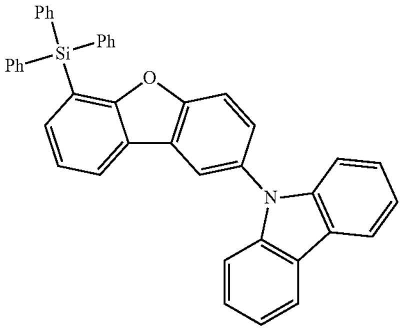
HT8
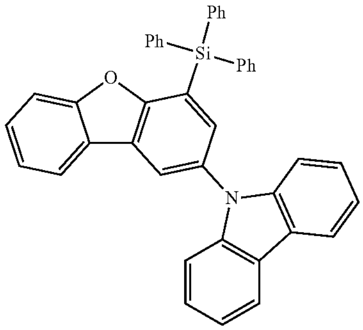
HT9
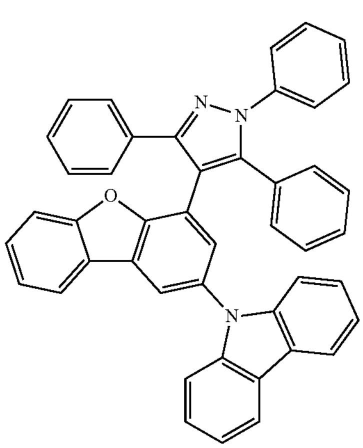
-continued
HT10
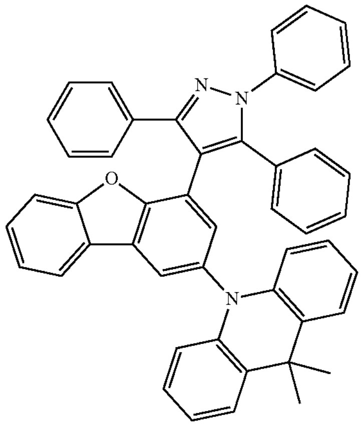
HT11
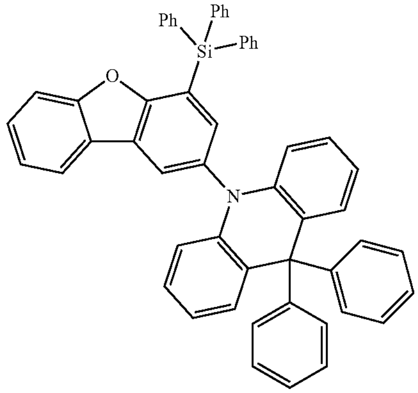
HT12
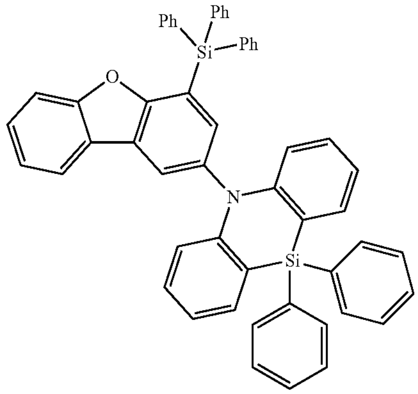
HT13
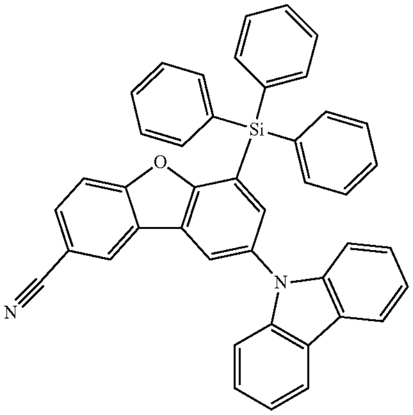

-continued
HT14
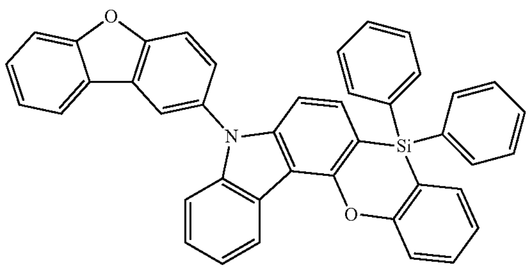
HT15
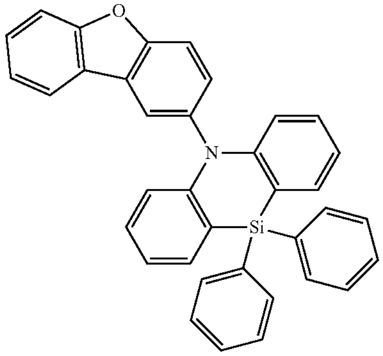
HT16
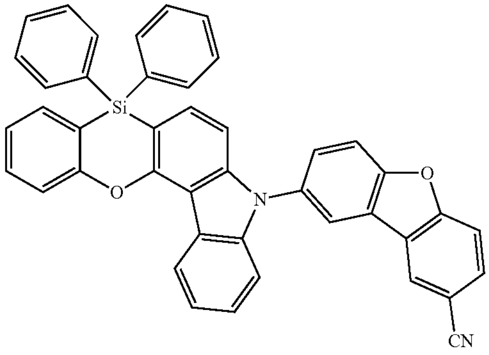
HT17
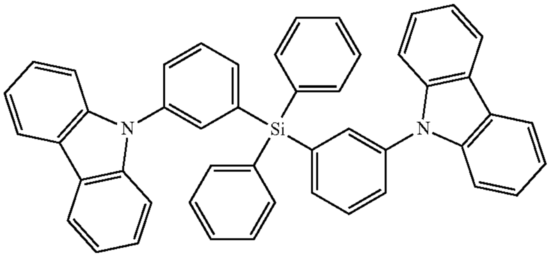
-continued
HT18
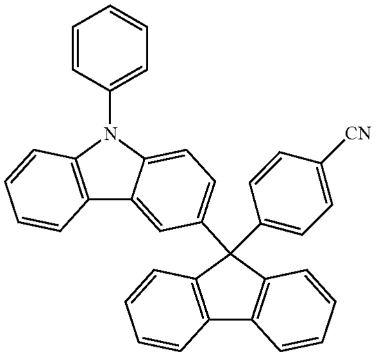
HT19
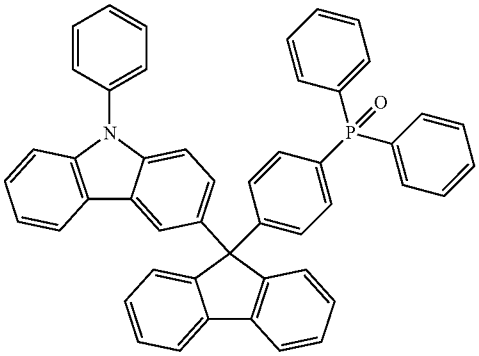
HT20
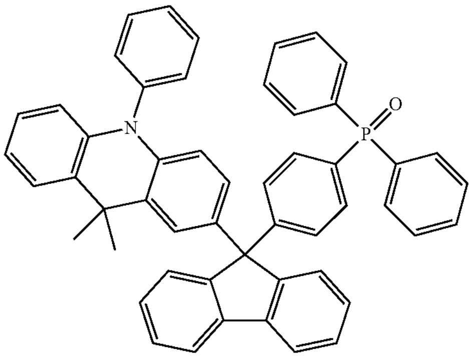
HT21
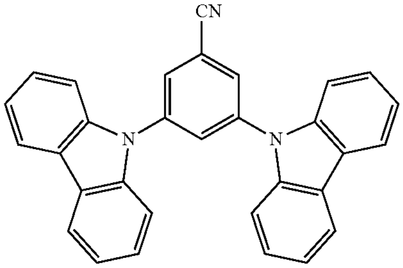

-continued
HT22
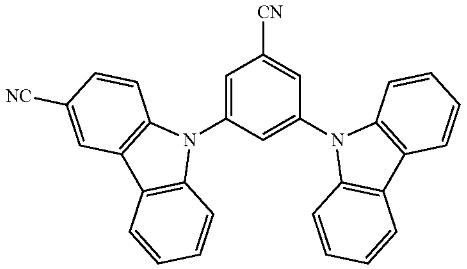
HT23
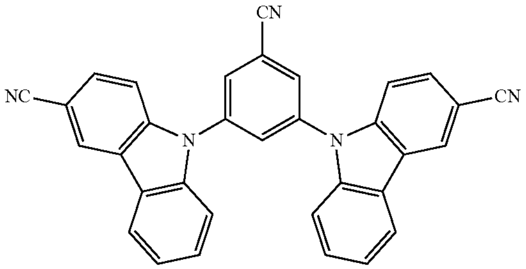
HT24
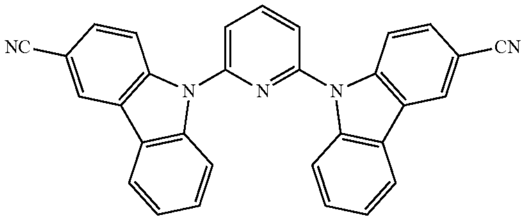
HT25
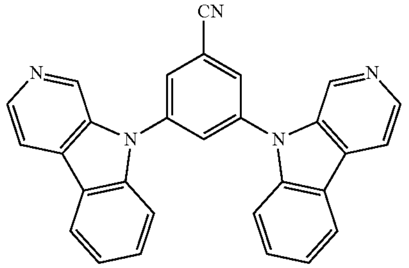
HT26
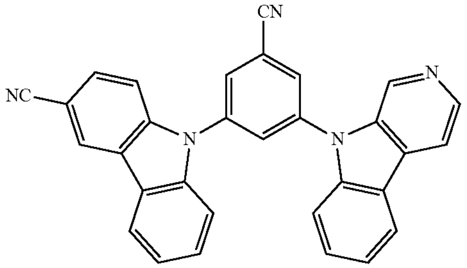
-continued
HT27
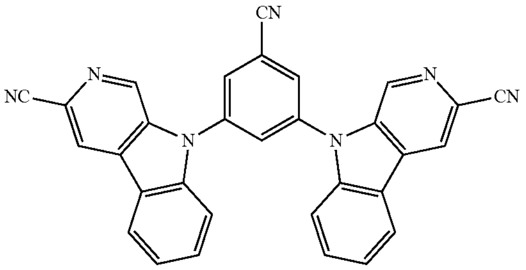
HT28
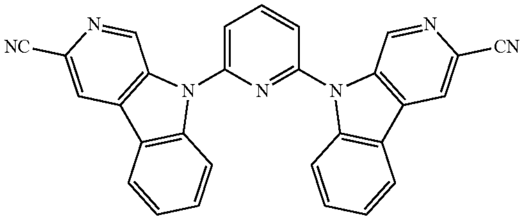
HT29
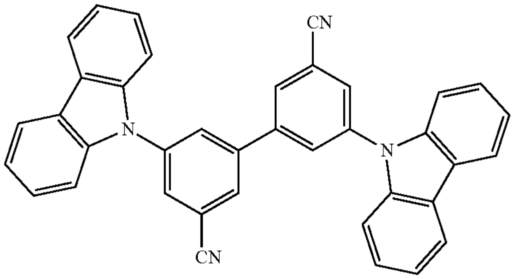
HT30
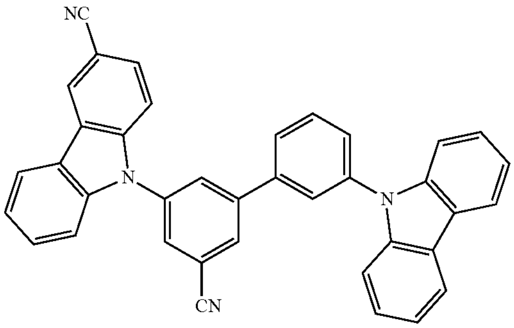
HT31
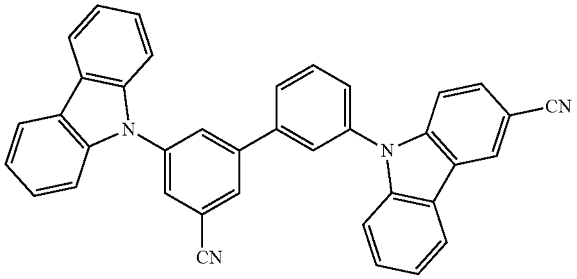

HT32
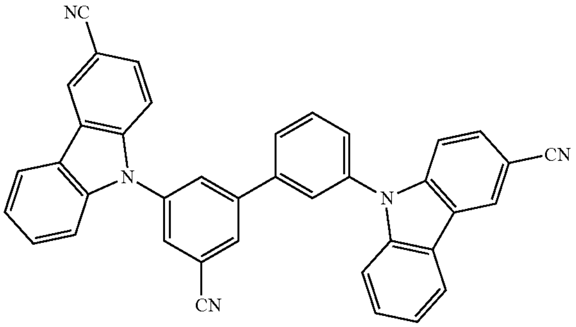
HT33
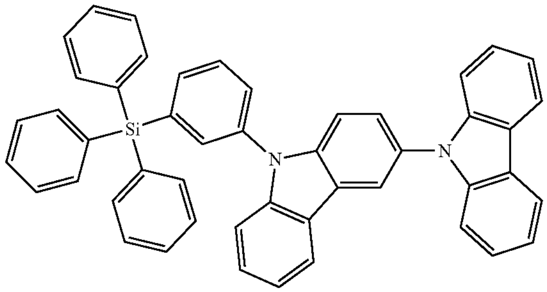
HT34
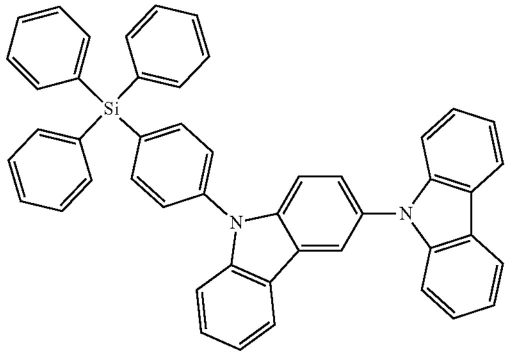
HT35
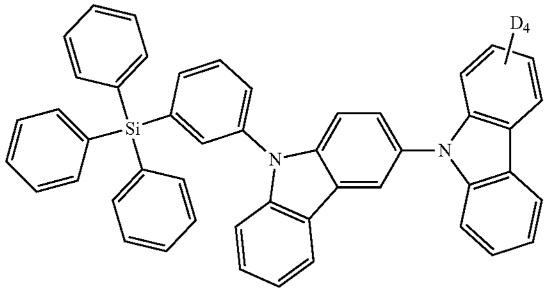
HT36
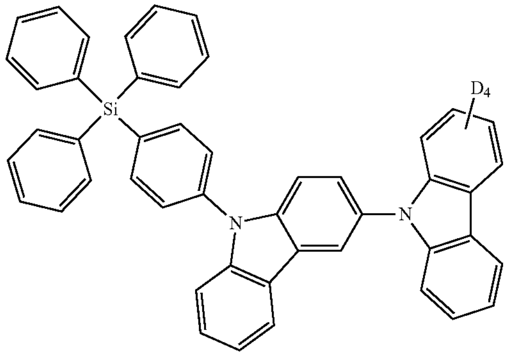
HT37
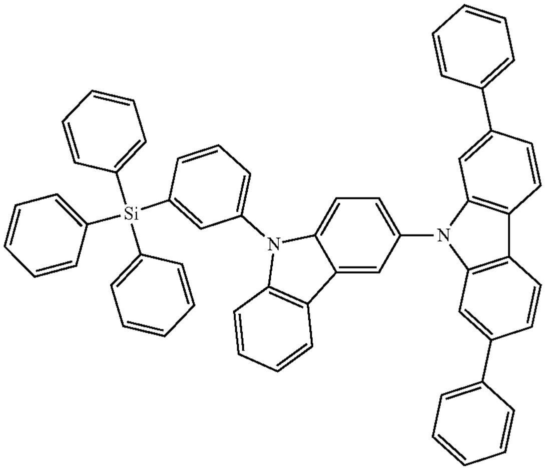
HT38
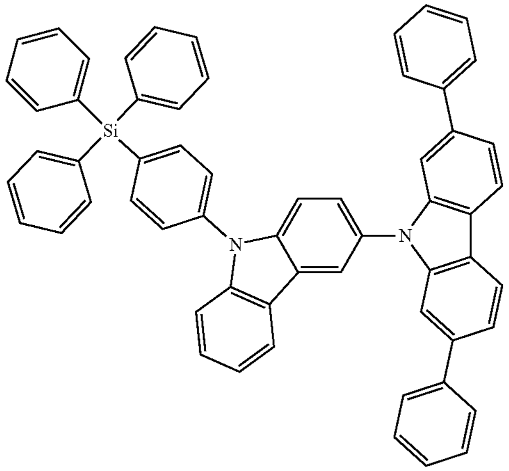

-continued
HT39
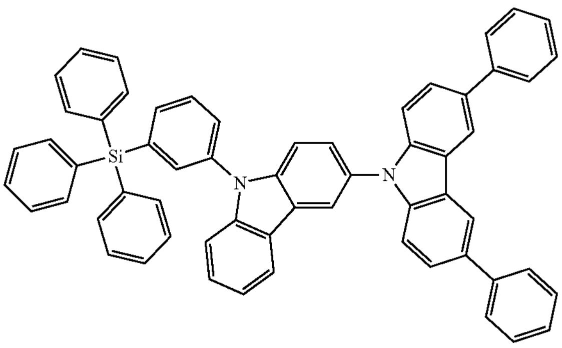
HT40
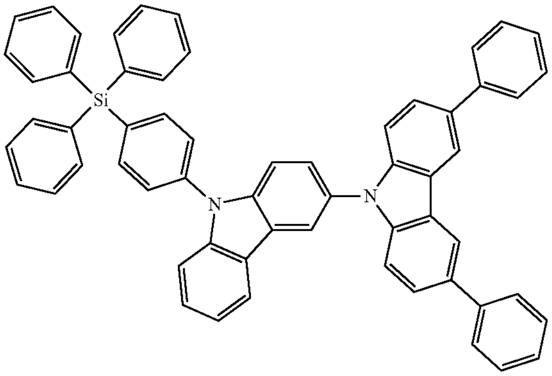
HT41
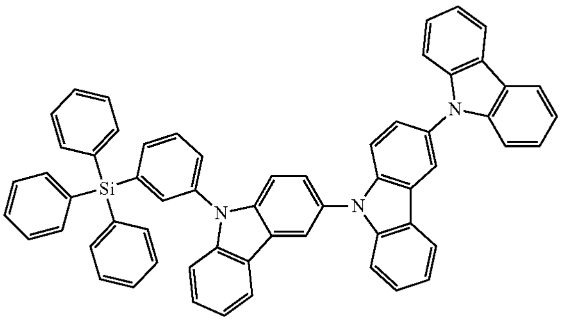
HT42
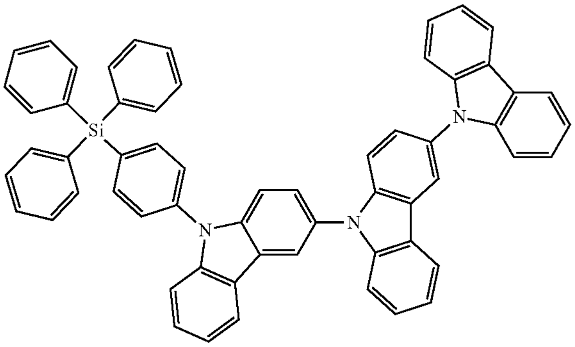
-continued
HT43
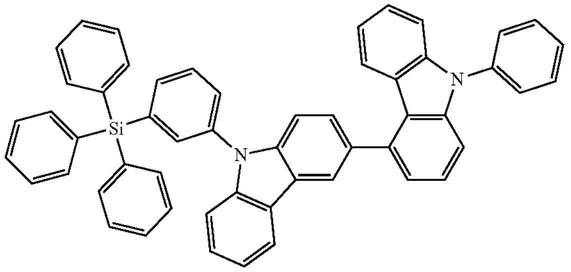
HT44
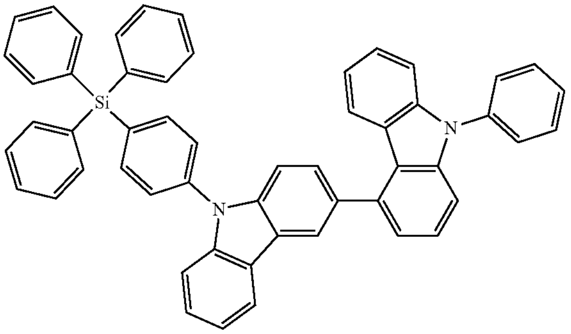
HT45
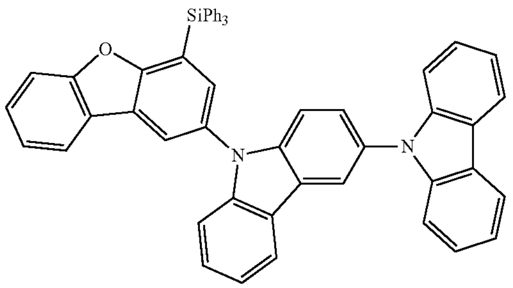
HT46
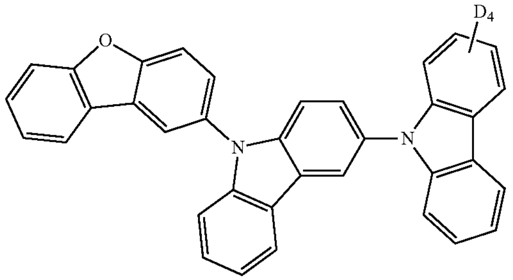
HT47
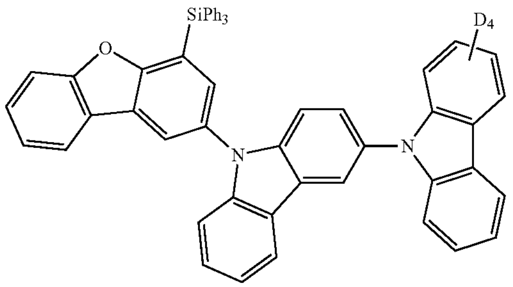

-continued

HT48

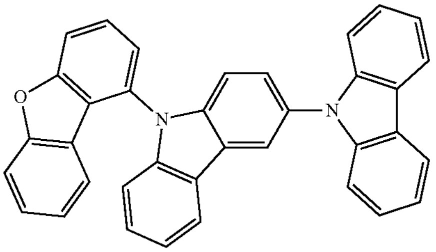

HT49

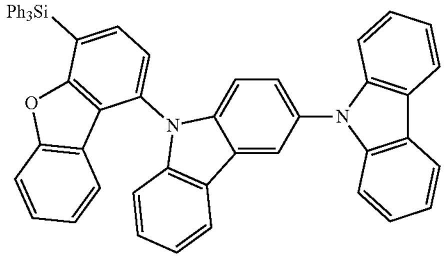

HT50

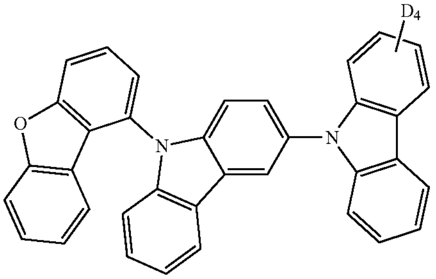

HT51

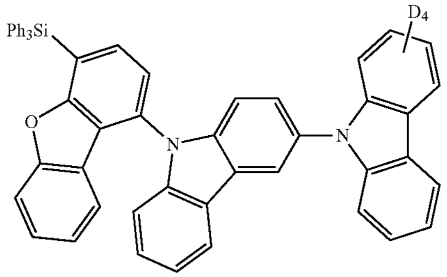

HT52

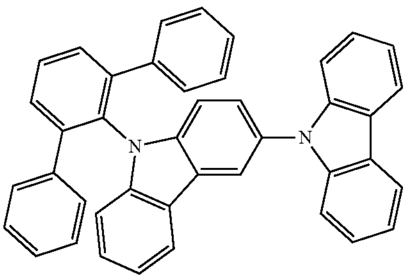

-continued

HT53

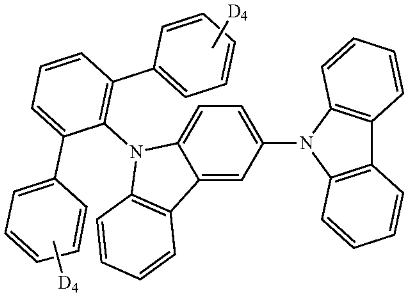

HT54

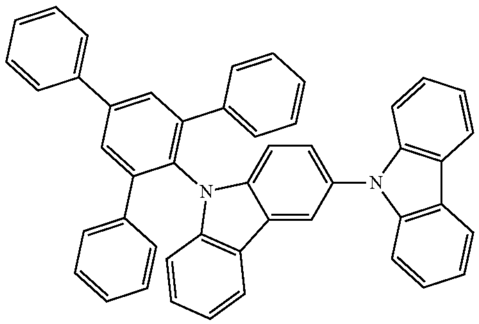

HT55

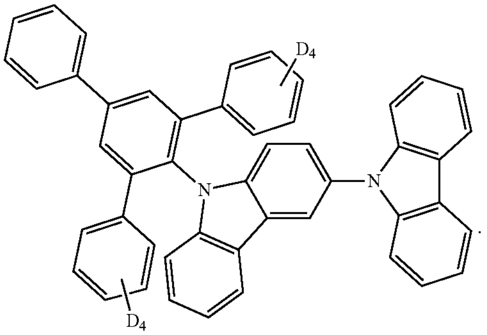

In an embodiment, the emission layer EML may include a compound represented by Formula ET-1. The compound represented by Formula ET-1 may be utilized as an electron transporting host material of the emission layer EML.

Formula ET-1

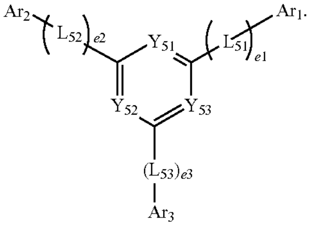

In Formula ET-1, at least one of $Y_{51}$ to $Y_{53}$ may be N and the others are each $Cr_a$. $R_a$ may be a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms.

In Formula ET-1, e1 to e3 may each independently be an integer from 0 to 10. $L_{51}$ to $L_{53}$ may each independently be a direct linkage, a substituted or unsubstituted arylene group having 6 to 30 ring-forming carbon atoms, or a substituted or unsubstituted heteroarylene group having 2 to 30 ring-forming carbon atoms. When b1 to b3 are an integer of 2 or greater, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

In Formula ET-1, $Ar_1$ to $Ar_3$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $Ar_1$ to $Ar_3$ may a substituted or unsubstituted phenyl group or a substituted or unsubstituted carbazole group.

The compound represented by Formula ET-1 may be represented by any one selected from among compounds from Compound Group 3. The light emitting element ED may include any one selected from among the compounds of Compound Group 3.

Compound Group 3

ETH1

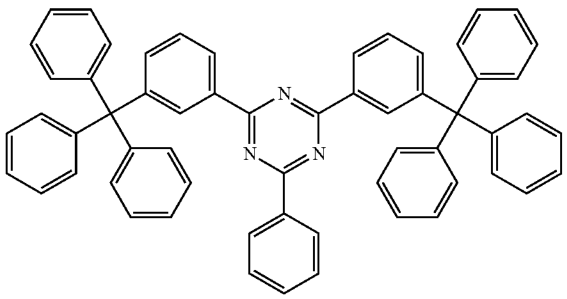

ETH2

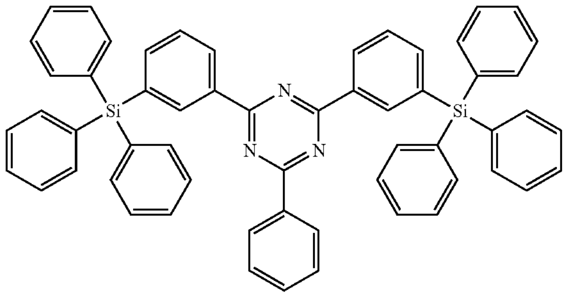

ETH3

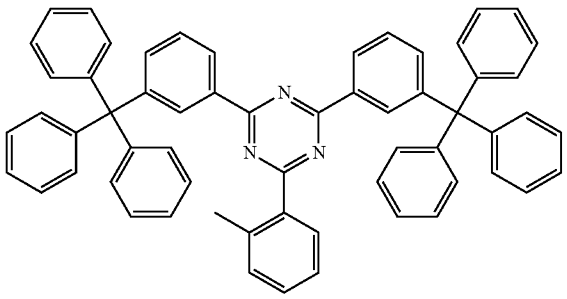

-continued

ETH4

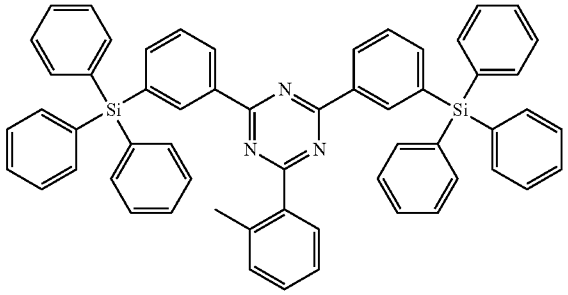

ETH5

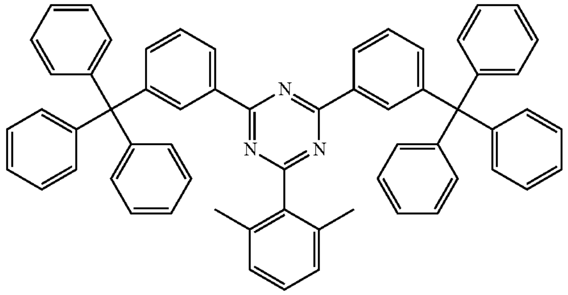

ETH6

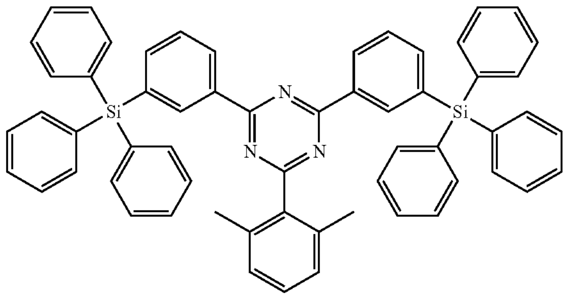

ETH7

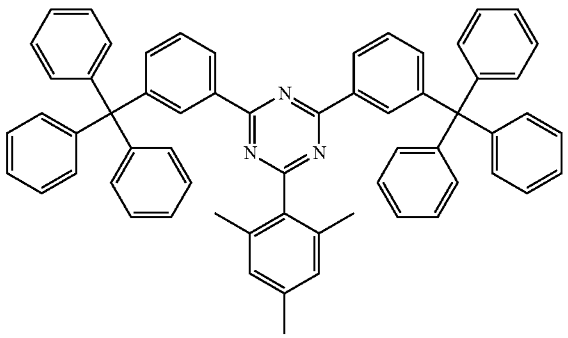

-continued
ETH8
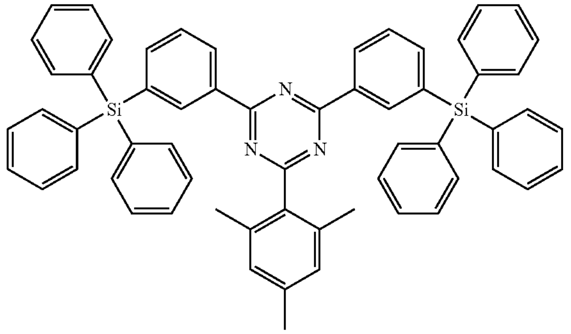
ETH9
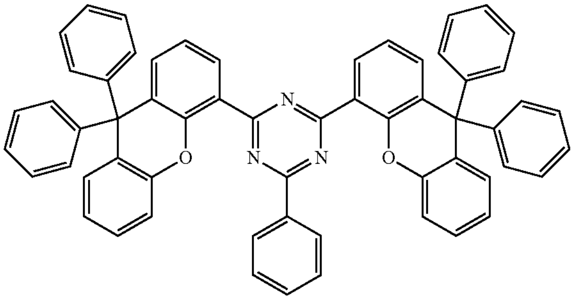
ETH10
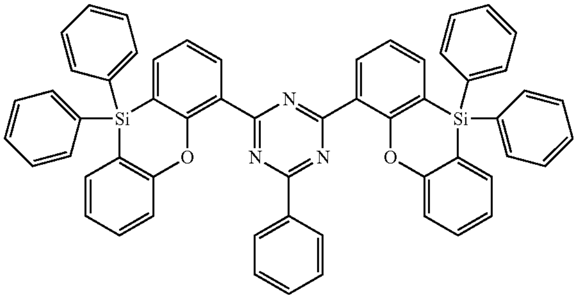
ETH11
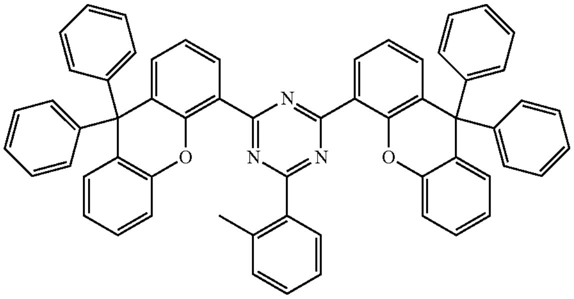
-continued
ETH12
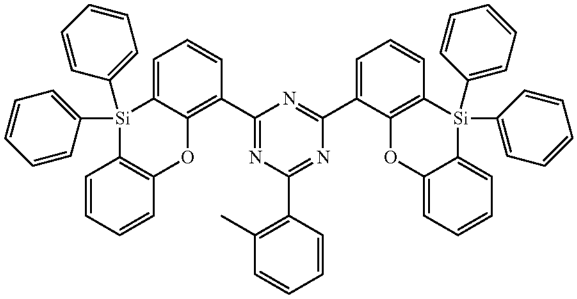
ETH13
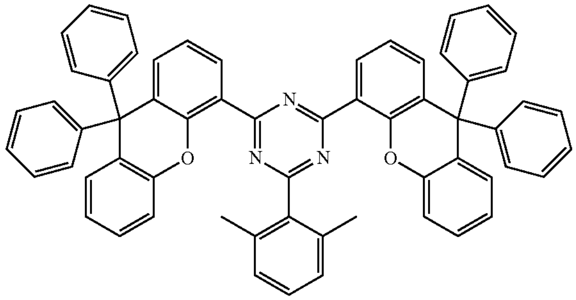
ETH14
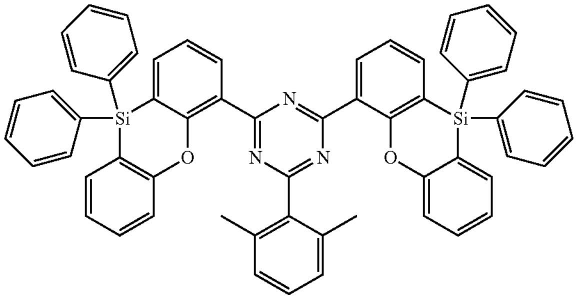
ETH15
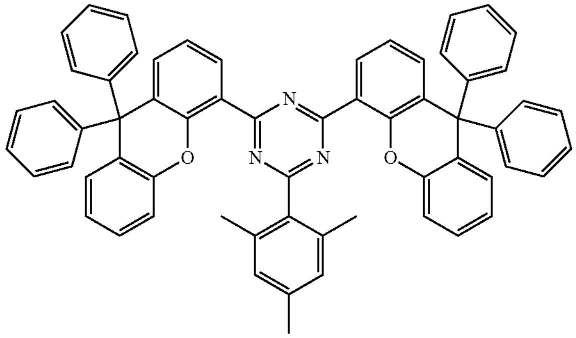

-continued
ETH16
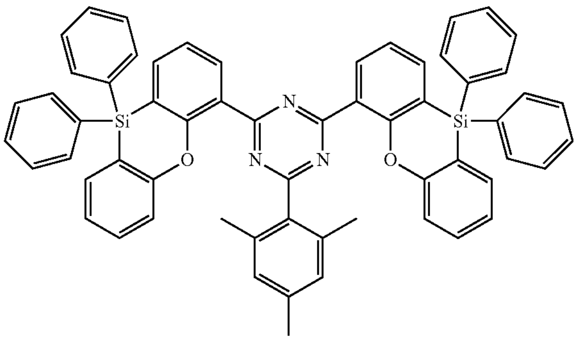
ETH17
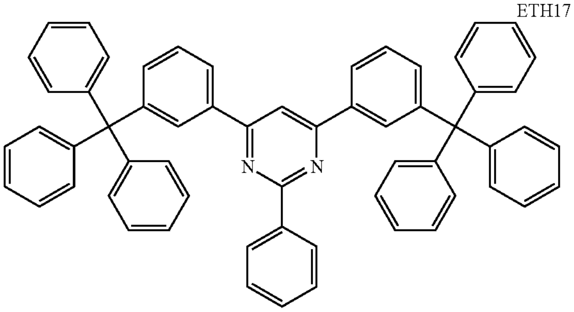
ETH18
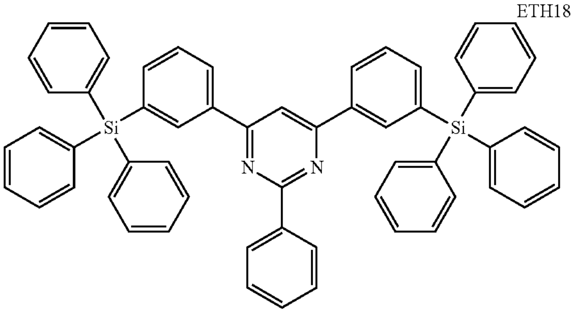
ETH19
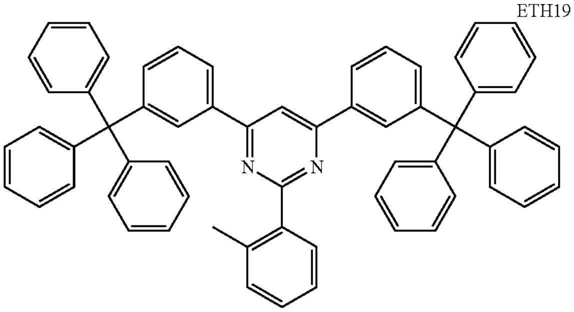
ETH20
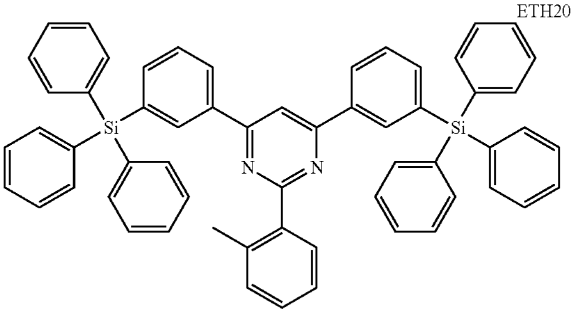
-continued
ETH21
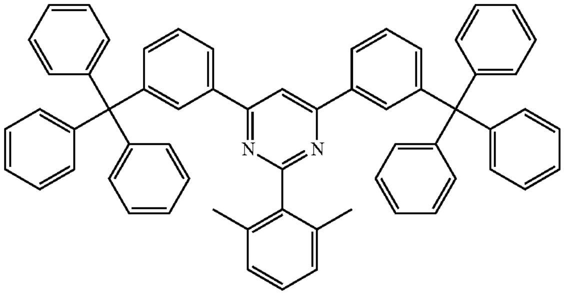
ETH22
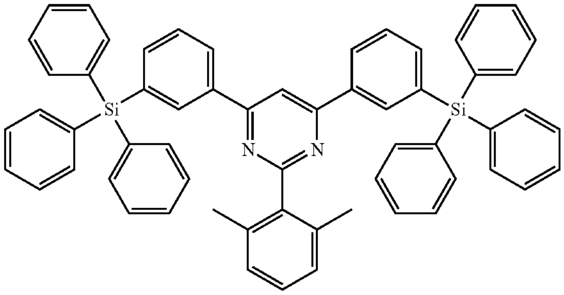
ETH23
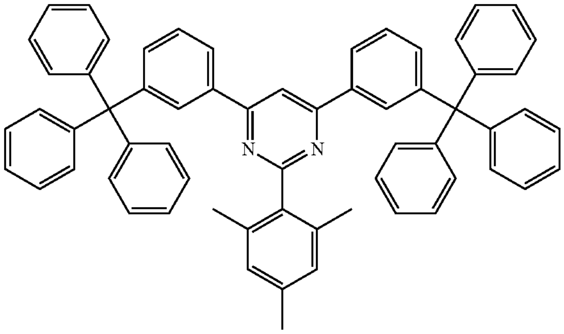
ETH24
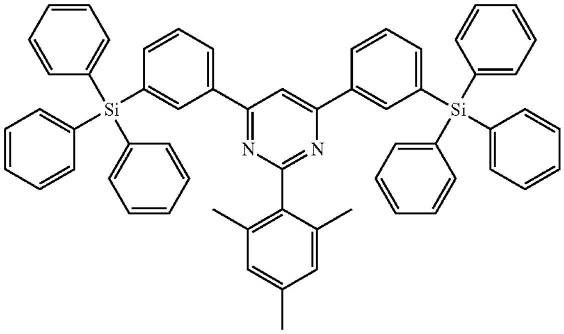

-continued
ETH25
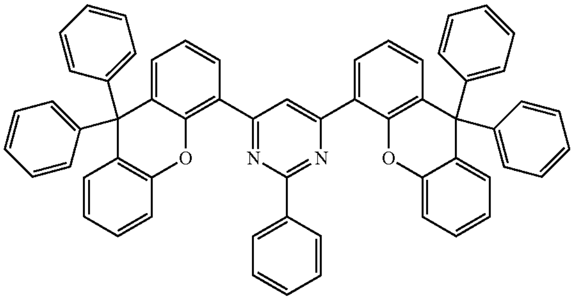
ETH26
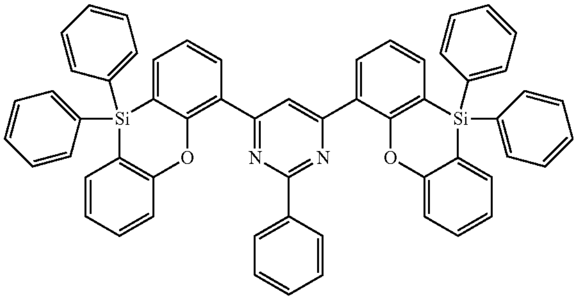
ETH27
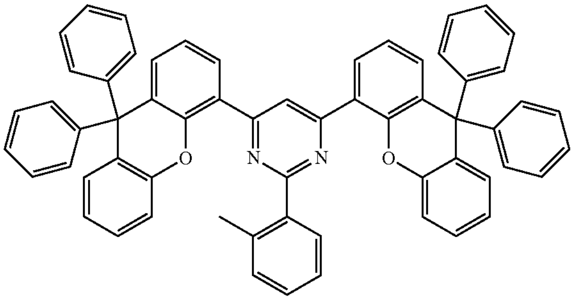
ETH28
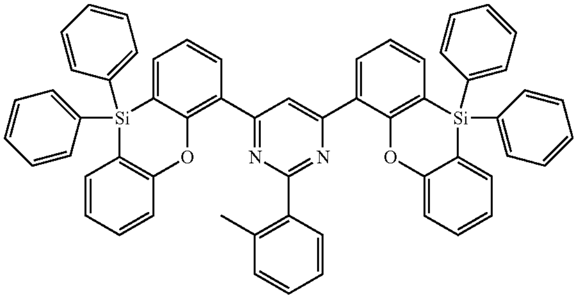
ETH29
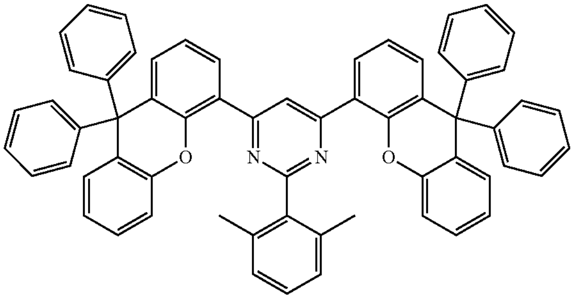
-continued
ETH30
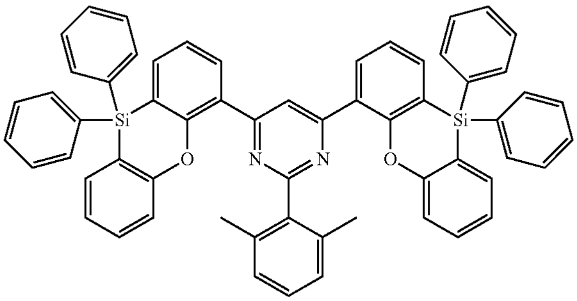
ETH31
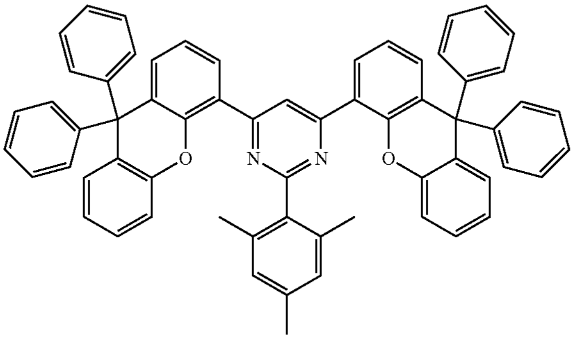
ETH32
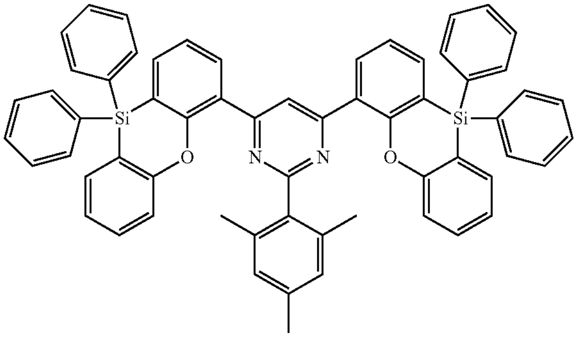
ETH33
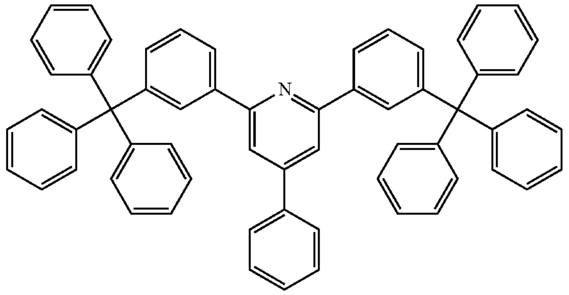

-continued
ETH34
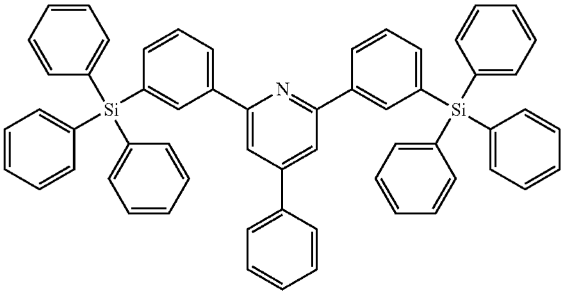
ETH35
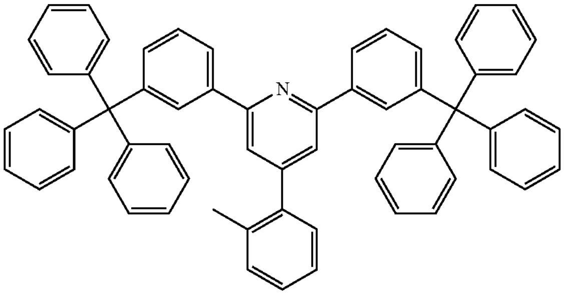
ETH36
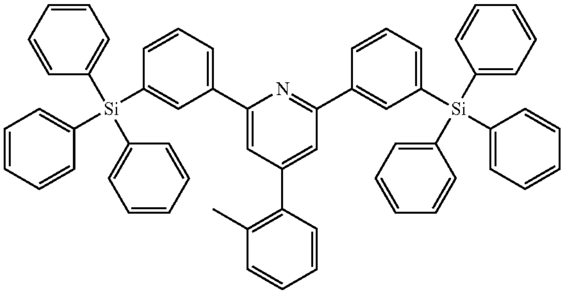
ETH37
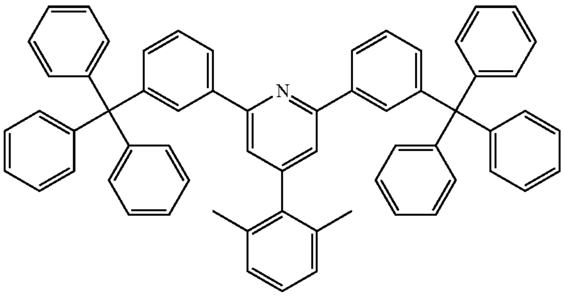
ETH38
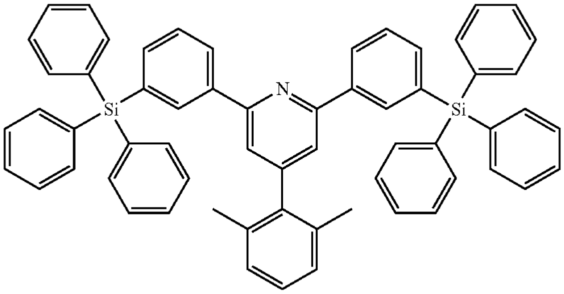
-continued
ETH39
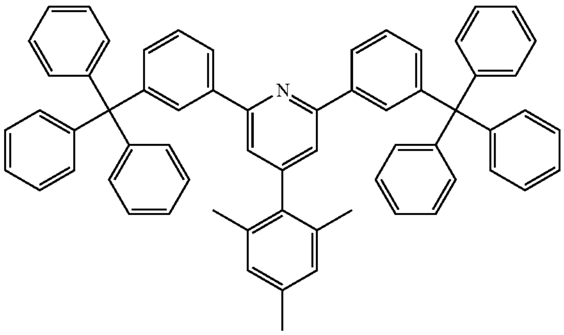
ETH40
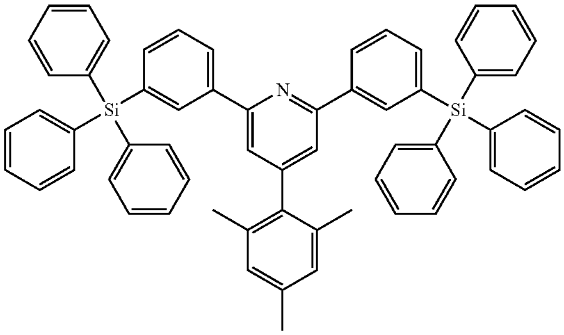
ETH41
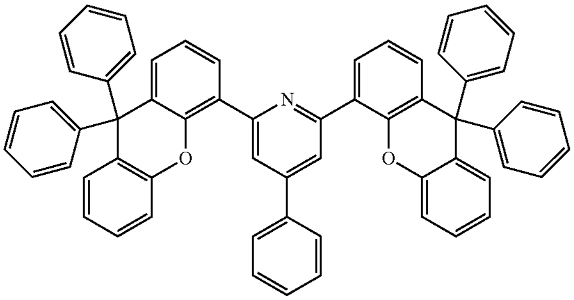
ETH42
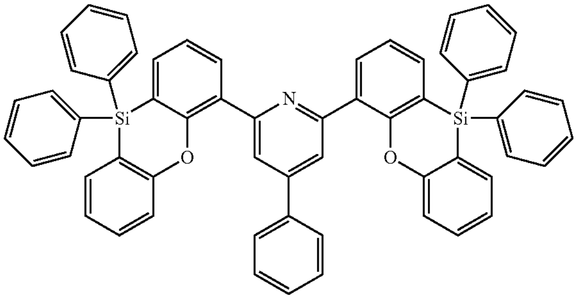

ETH43
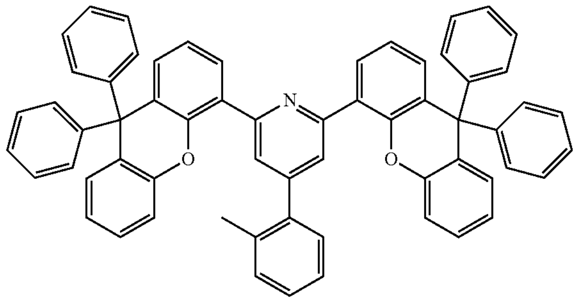
ETH44
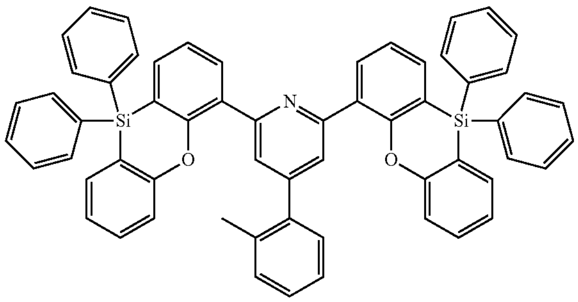
ETH45
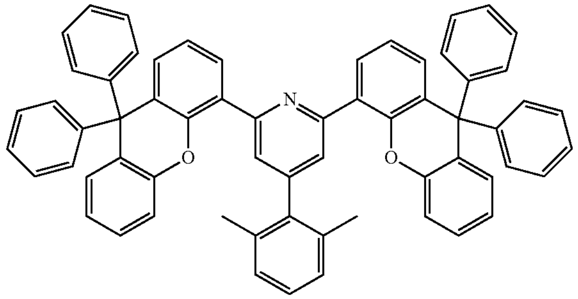
ETH46
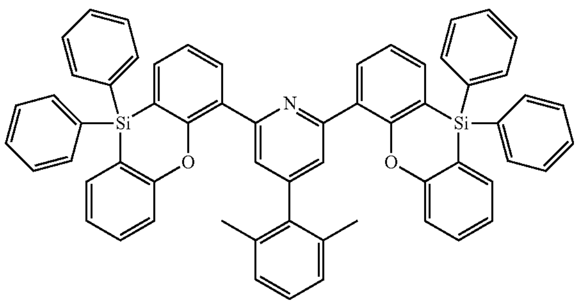
ETH47
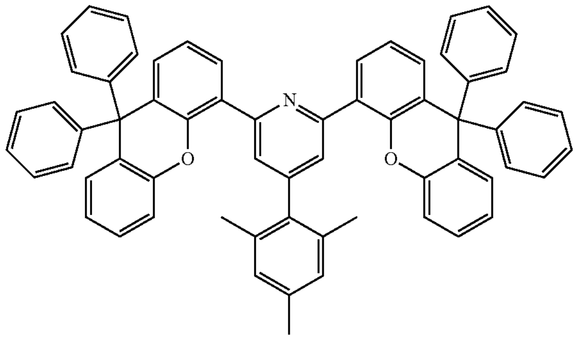
ETH48
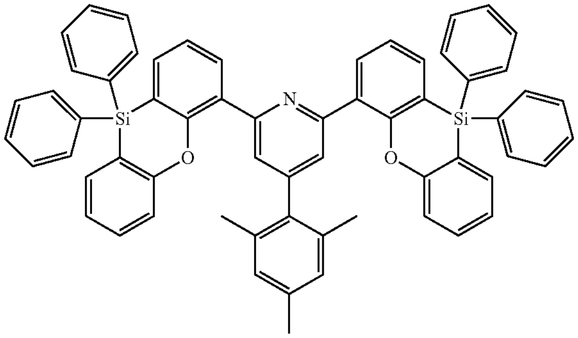
ETH49
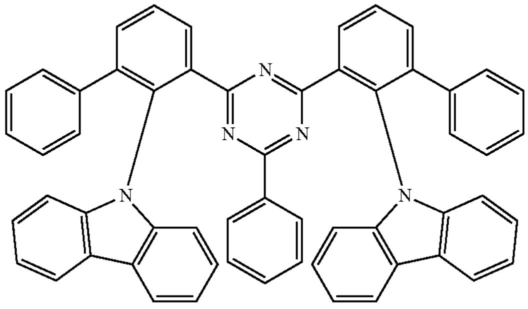
ETH50
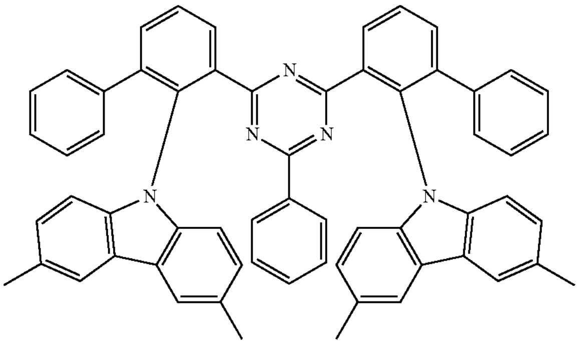

-continued
ETH51
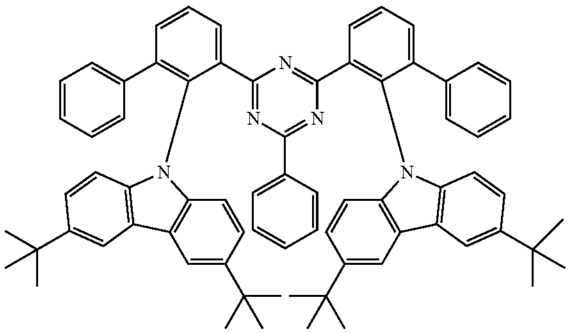
ETH52
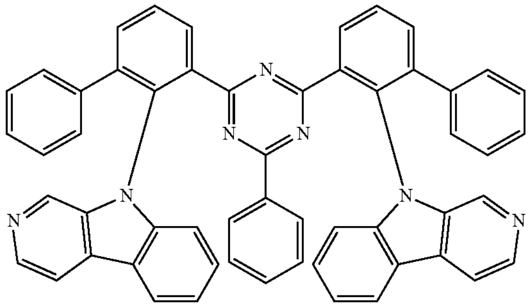
ETH53
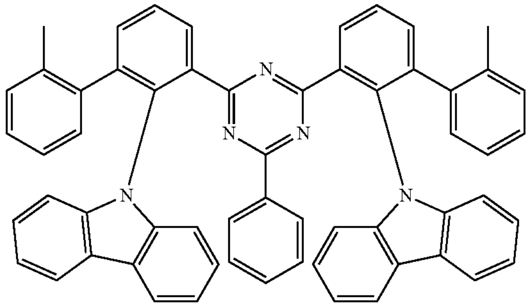
ETH54
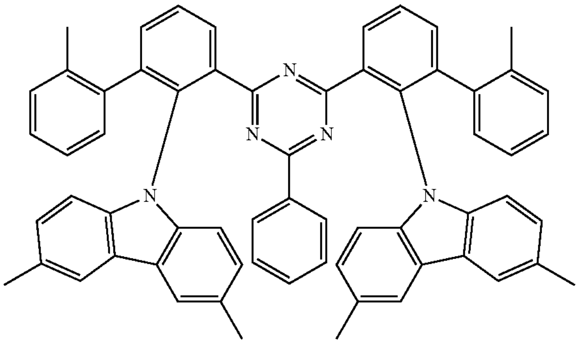
-continued
ETH55
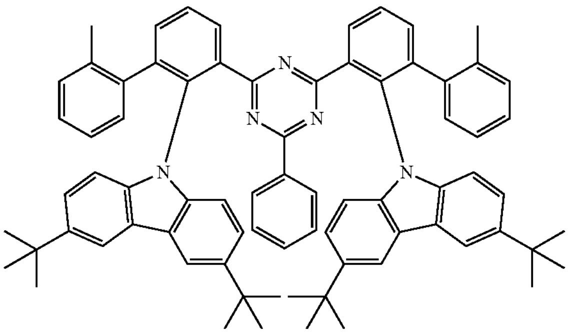
ETH56
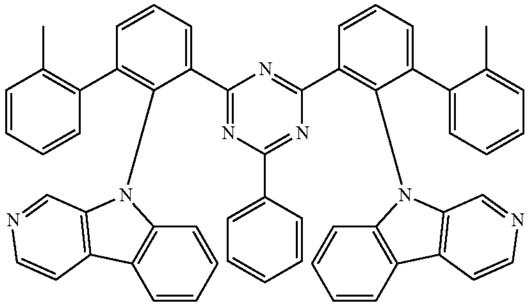
ETH57
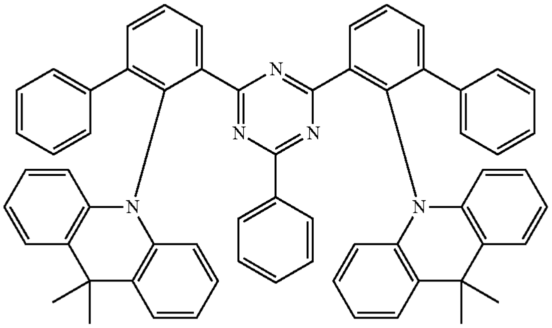
ETH58
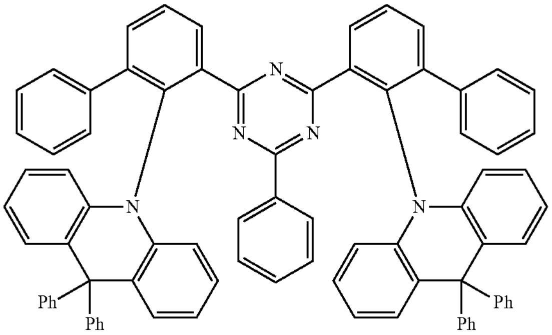

-continued
ETH59
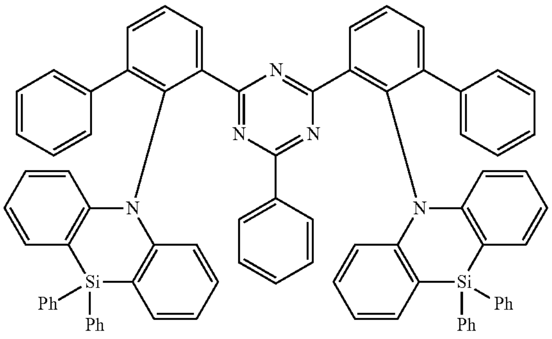
ETH60
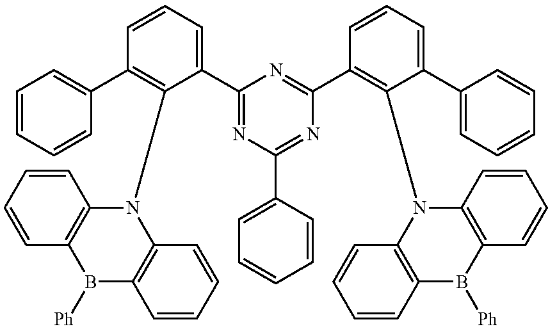
ETH61
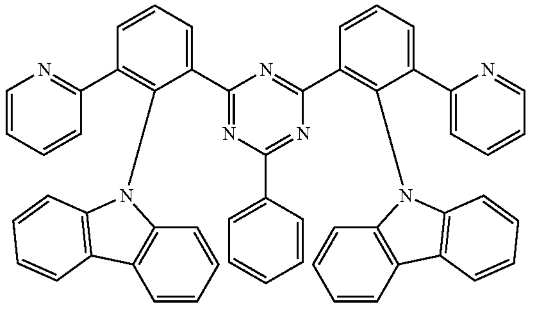
ETH62
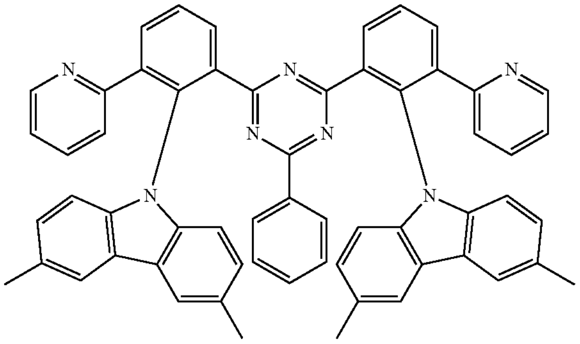
-continued
ETH63
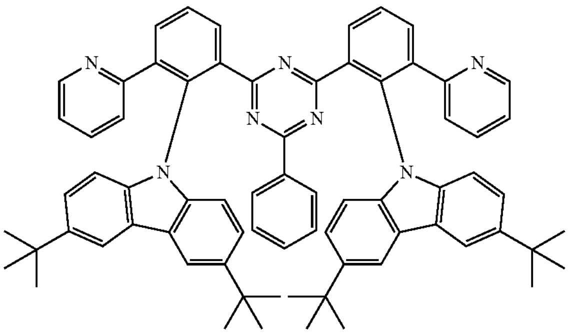
ETH64
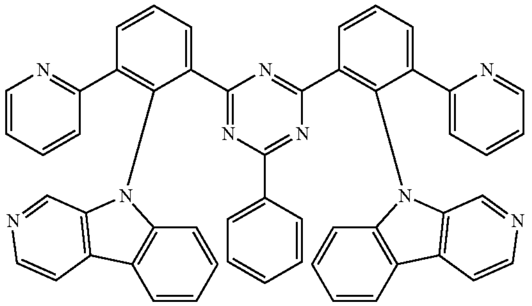
ETH65
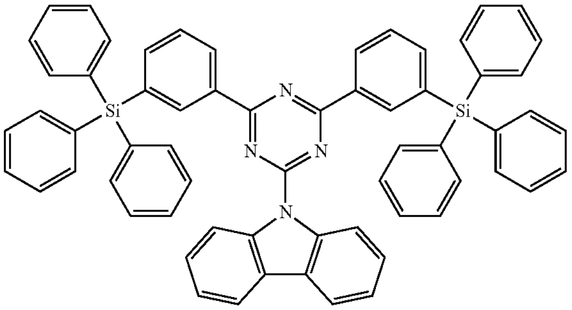
ETH66
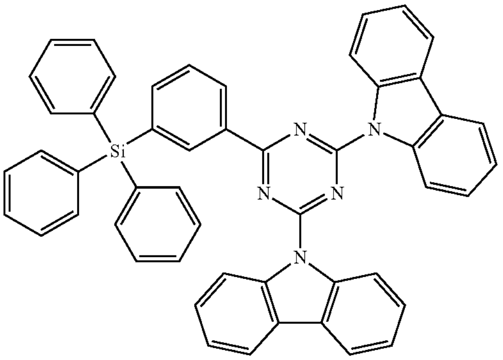

-continued
ETH67
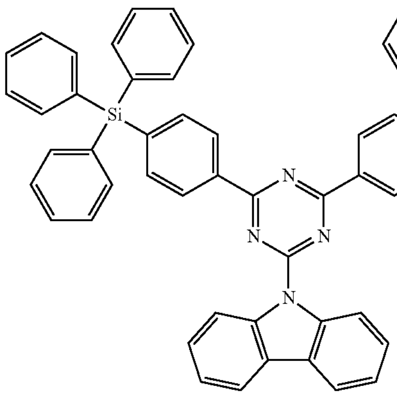
ETH68
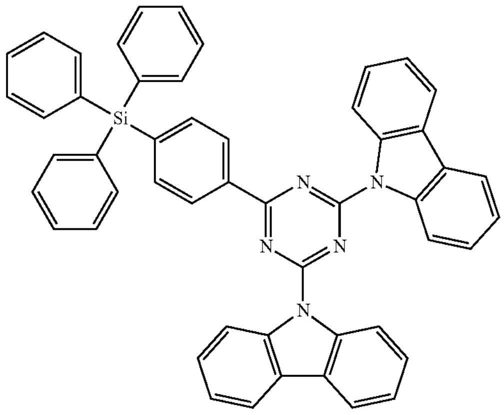
ETH69
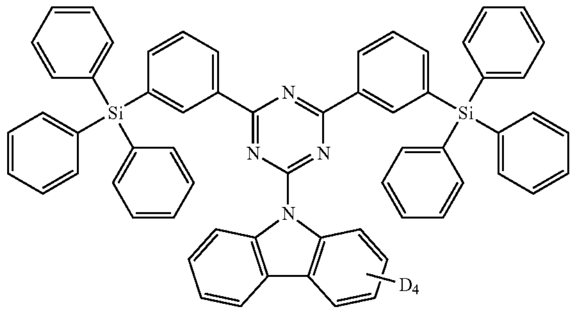
ETH70
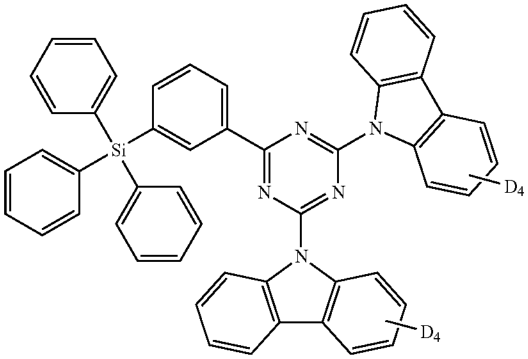
-continued
ETH71
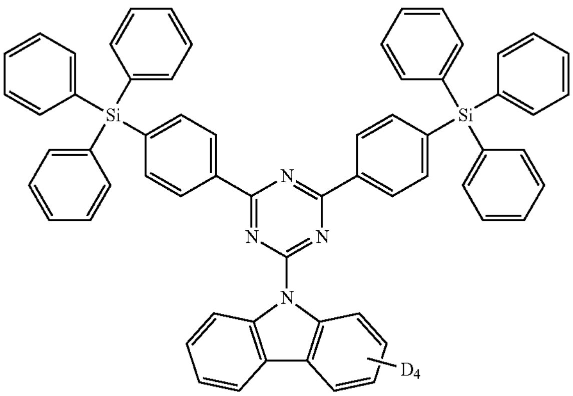
ETH72
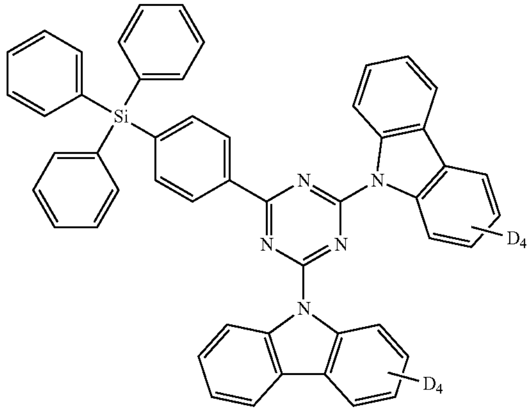
ETH73
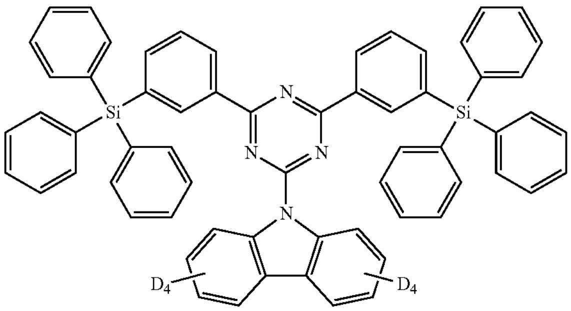
ETH74
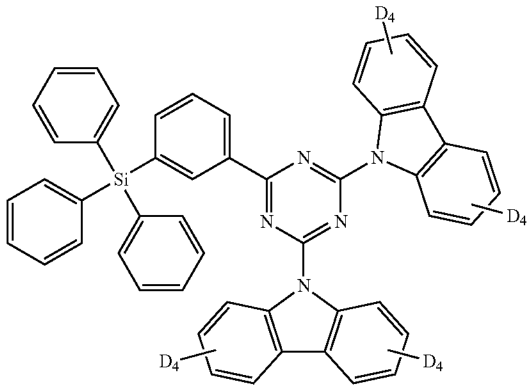

-continued
ETH75
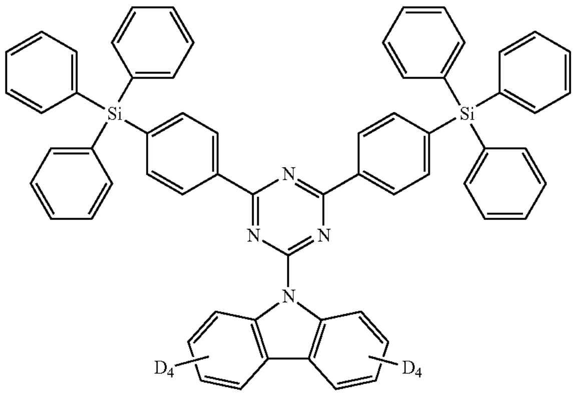
ETH76
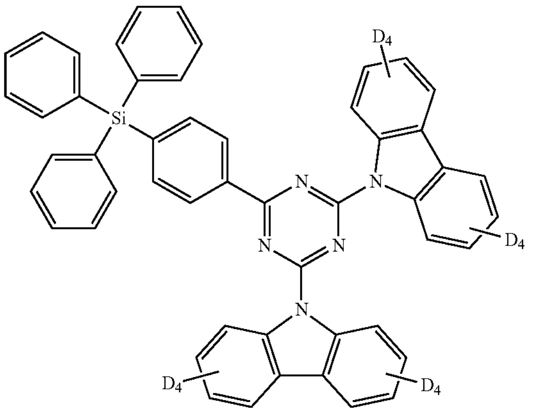
ETH77
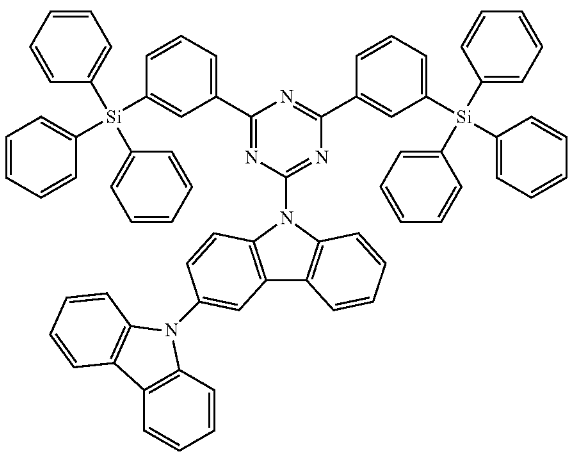
-continued
ETH78
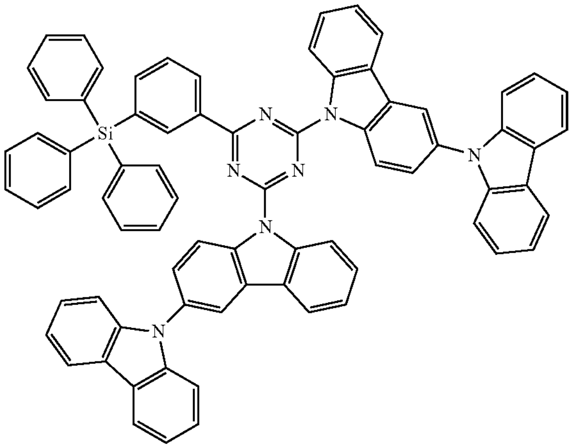
ETH79
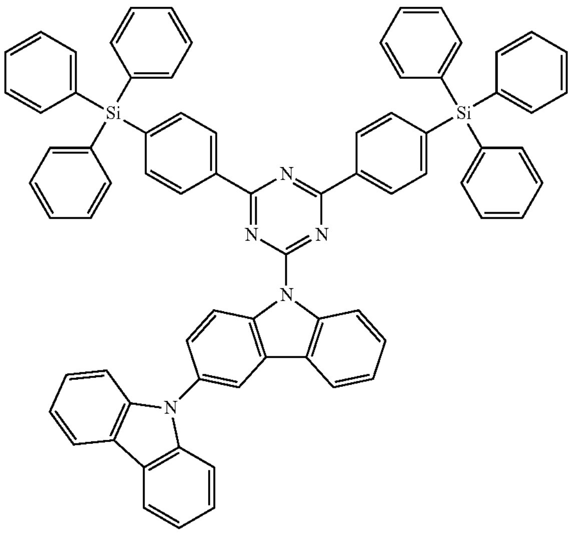
ETH80
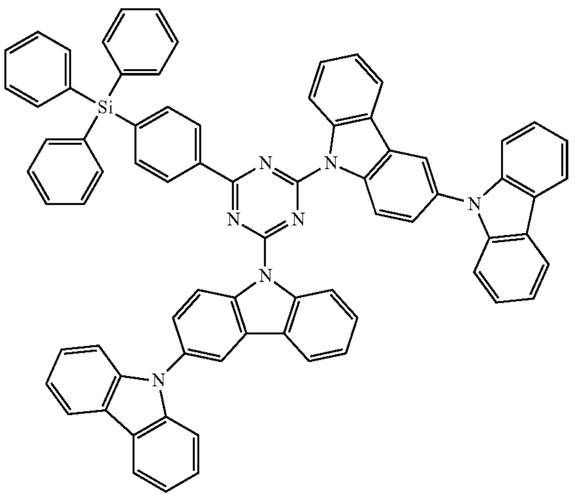

-continued

ETH81

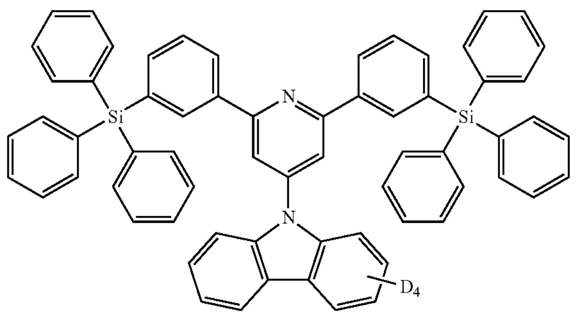

ETH82

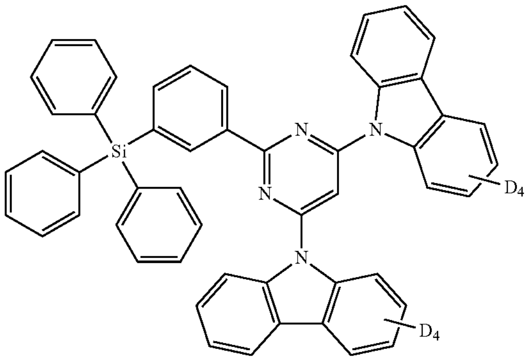

ETH83

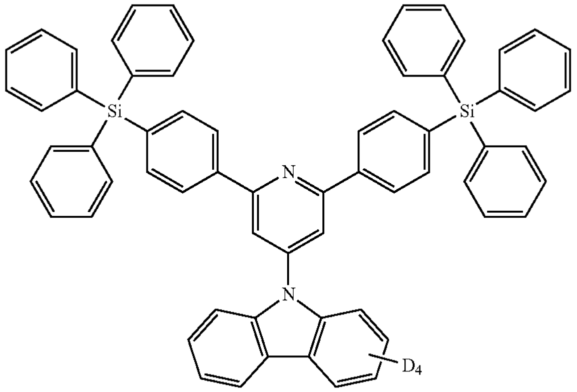

ETH84

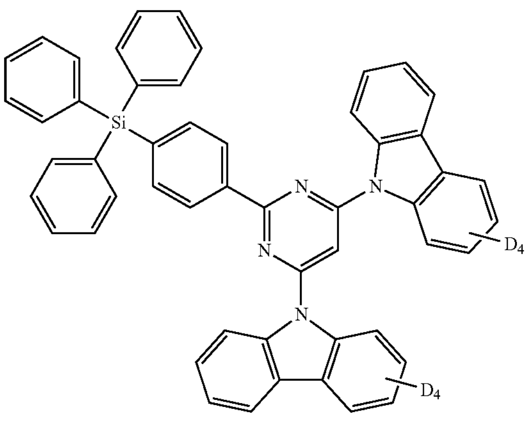

-continued

ETH85

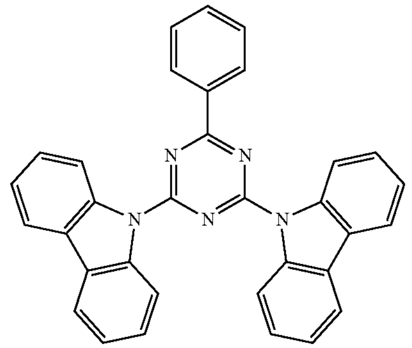

ETH86

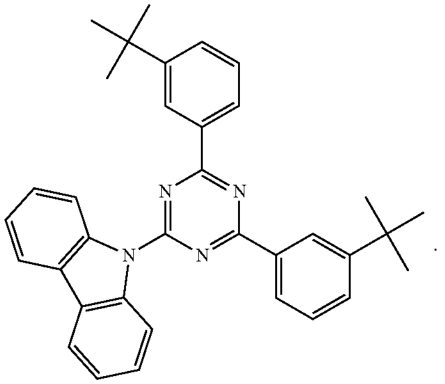

The emission layer EML is provided on the hole transport region HTR. The emission layer EML may have, for example, a thickness of about 100 Å to about 1000 Å or about 100 Å to about 300 Å. The emission layer EML may have a single layer formed of a single material, a single layer formed of a plurality of different materials, or a multilayer structure having a plurality of layers formed of a plurality of different materials.

The emission layer EML may further include compounds described in addition to the organometallic compound according to an embodiment, the hole transporting host, the electron transporting host, and the delayed fluorescent compound.

In the light emitting element ED of an embodiment, the emission layer EML may include an anthracene derivative, a pyrene derivative, a fluoranthene derivative, a chrysene derivative, a dihydrobenzanthracene derivative, or a triphenylene derivative.

For example, the emission layer EML may include an anthracene derivative or a pyrene derivative.

The emission layer EML may include a compound represented by Formula E-1. The compound represented by Formula E-1 may be utilized as a fluorescent host material.

Formula E-1

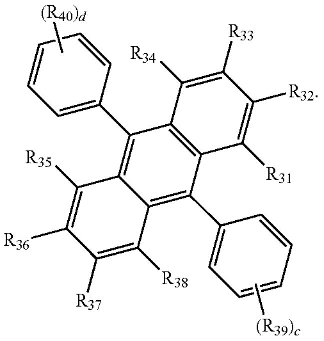

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 2 to 10 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring. In some embodiments, $R_{31}$ to $R_{40}$ may be linked to an adjacent group to form a saturated hydrocarbon ring, an unsaturated hydrocarbon ring, a saturated heterocycle, or an unsaturated heterocycle.

In Formula E-1, c and d may each independently be an integer from 0 to 5. When c is an integer of 2 or greater, a plurality of $R_{39}$s may all be the same or at least one may be different from the others. When d is an integer of 2 or greater, a plurality of $R_{40}$s may all be the same or at least one may be different from the others. Formula E-1 may be represented by any one selected from among compounds E1 to E19.

E1

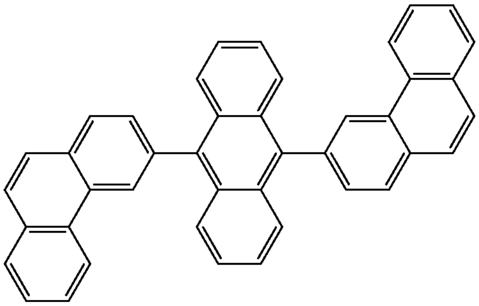

E2

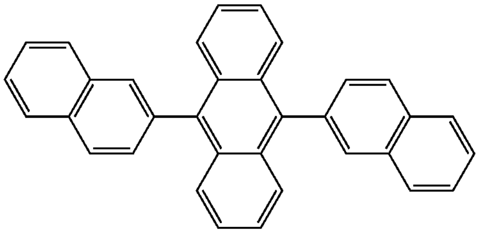

-continued

E3

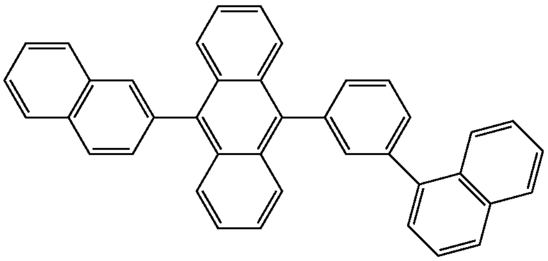

E4

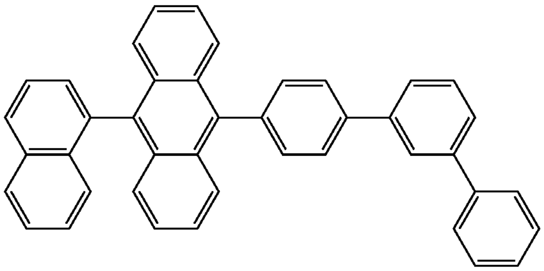

E5

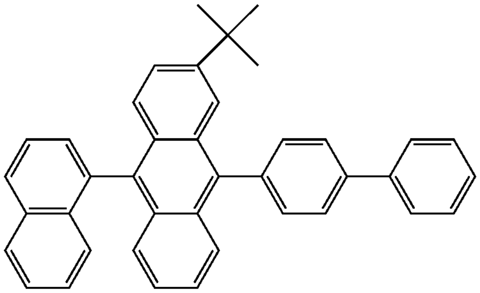

E6

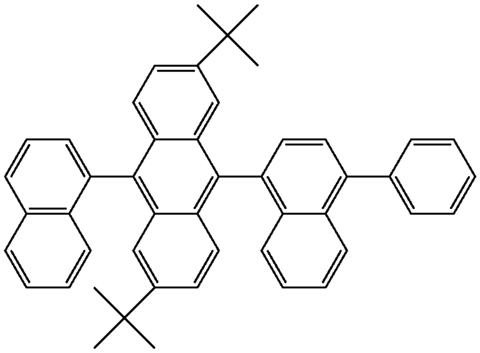

E7

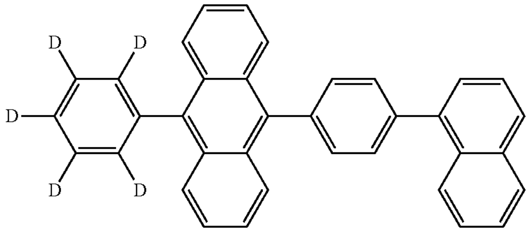

-continued
E8
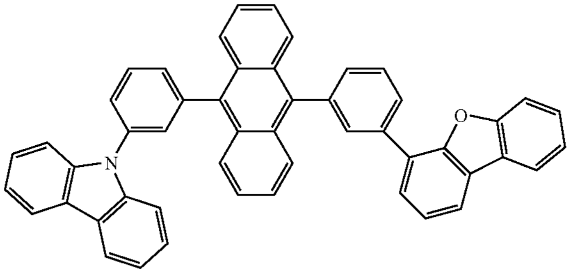
E9
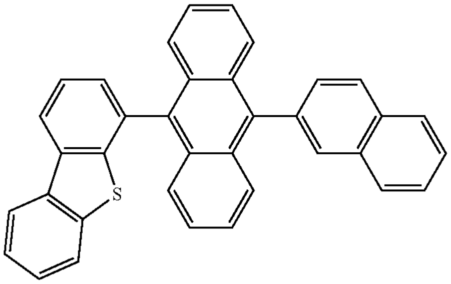
E10
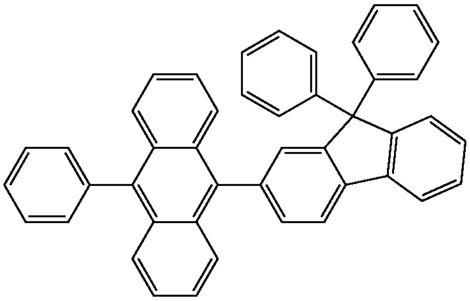
E11
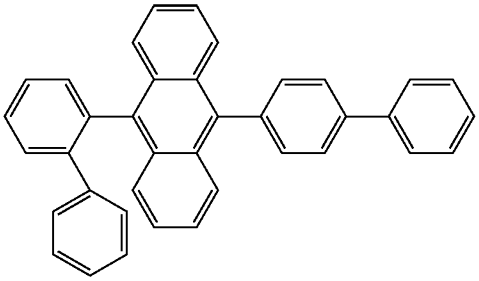
E12
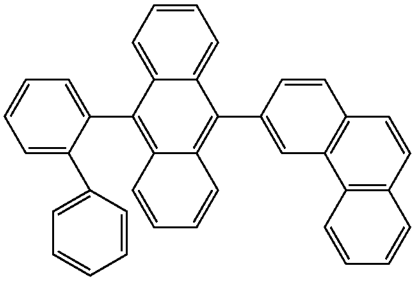
-continued
E13
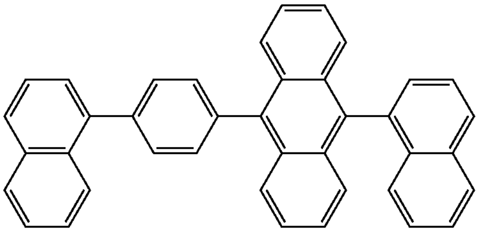
E14
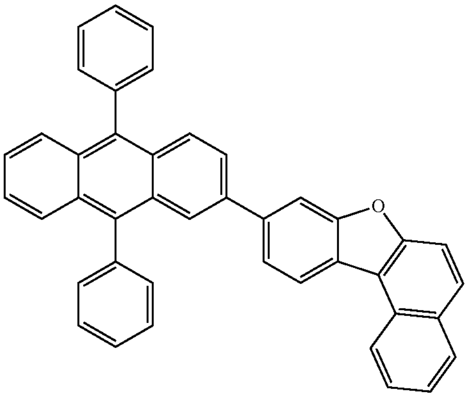
E15
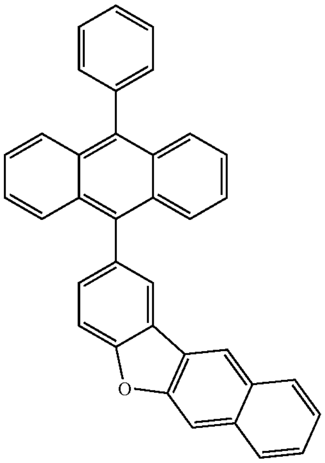
E16
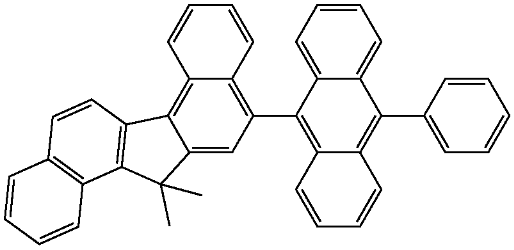

-continued

E17

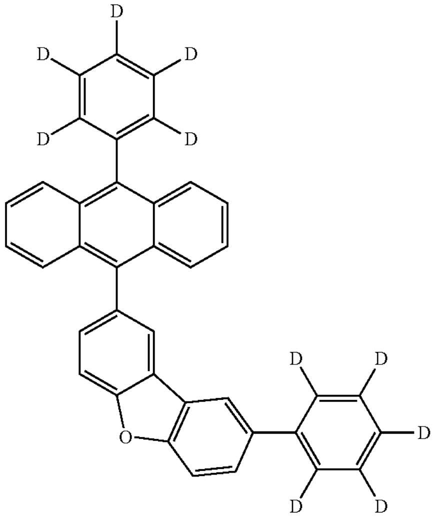

E18

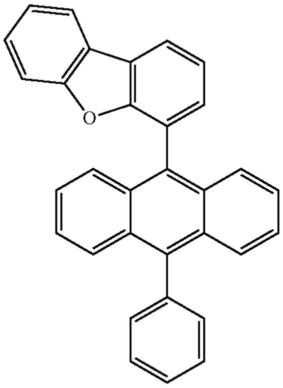

E19

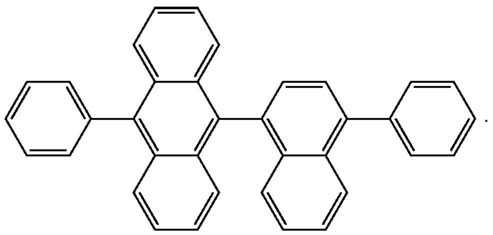

In an embodiment, the emission layer EML may include a compound represented by Formula E-2a or Formula E-2b. The compound represented by Formula E-2a or Formula E-2b may be utilized as a phosphorescent host material.

Formula E-2a

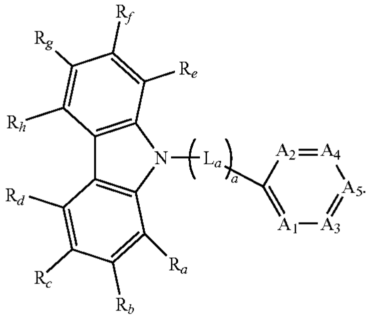

In Formula E-2a, a may be an integer from 0 to 10, and La may be a direct linkage, a substituted or unsubstituted arylene group having 6 to 30 ring-forming carbon atoms, or a substituted or unsubstituted heteroarylene group having 2 to 30 ring-forming carbon atoms. In some embodiments, when a is an integer of 2 or greater, a plurality of Las may each independently be a substituted or unsubstituted arylene group having 6 to 30 ring-forming carbon atoms, or a substituted or unsubstituted heteroarylene group having 2 to 30 ring-forming carbon atoms.

In some embodiments, in Formula E-2a, A1 to A5 may be N or Cri. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or linked to an adjacent group to form a ring. $R_a$ to $R_i$ may be linked to an adjacent group to form a hydrocarbon ring or a heterocycle containing N, O, S, etc. as a ring-forming atom.

In some embodiments, in Formula E-2a, two or three selected from A1 to A5 may be N, and the others may each be Cri.

Formula E-2b

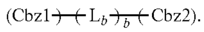

In Formula E-2b, Cbz1 and Cbz2 may each independently be an unsubstituted carbazole group or an aryl-substituted carbazole group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms, b may be an integer from 0 to 10, and when b is an integer of 2 or greater, a plurality of $L_b$s may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be represented by any one selected from among compounds from Compound Group E-2. However, the compounds listed in Compound Group E-2 are presented merely as examples, and the compound represented by Formula E-2a or Formula E-2b is not limited to those listed in Compound Group E-2.

Compound Group E-2
E-2-1
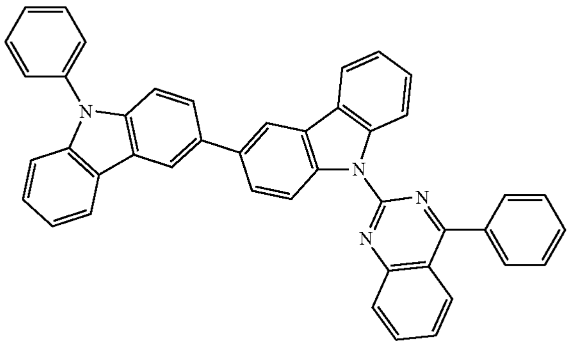
E-2-2
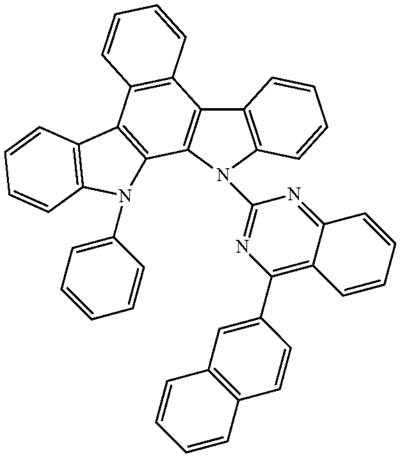
E-2-3
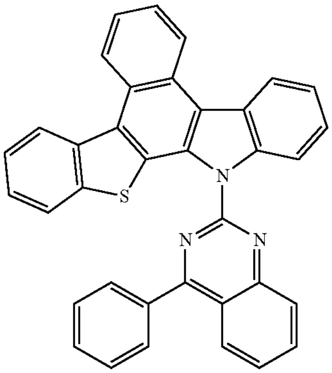
-continued
E-2-4
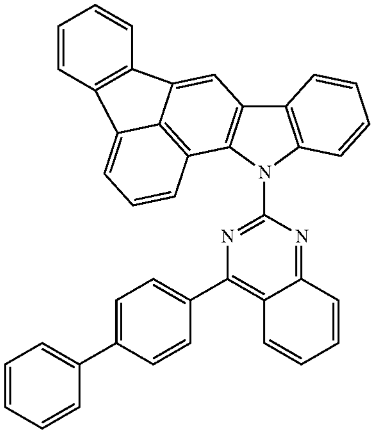
E-2-5
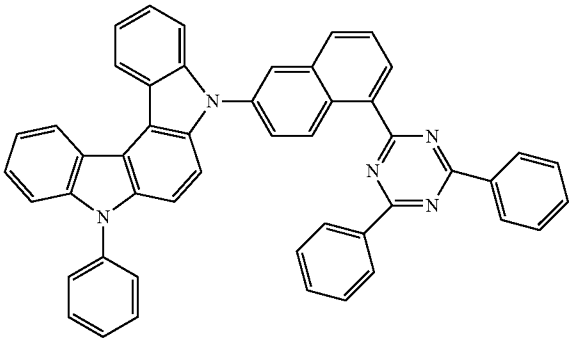
E-2-6
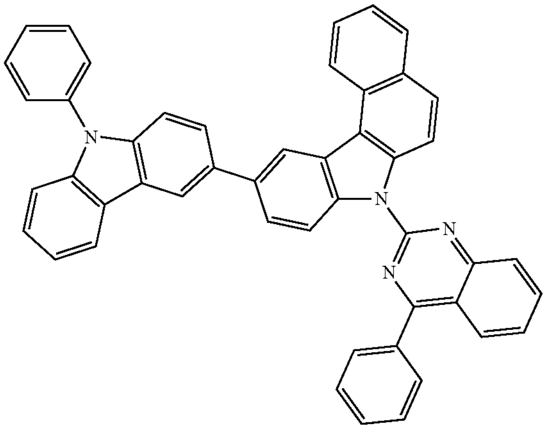

-continued
E-2-7
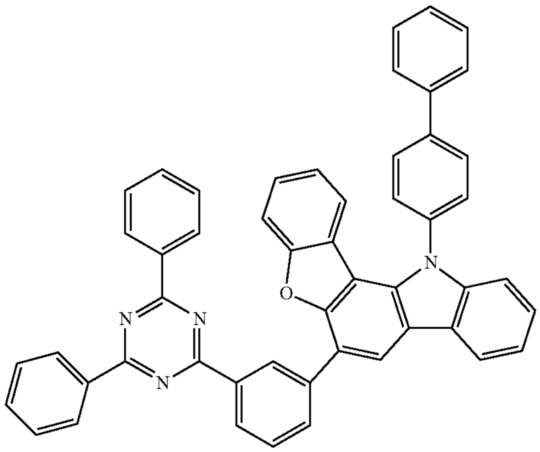
E-2-8
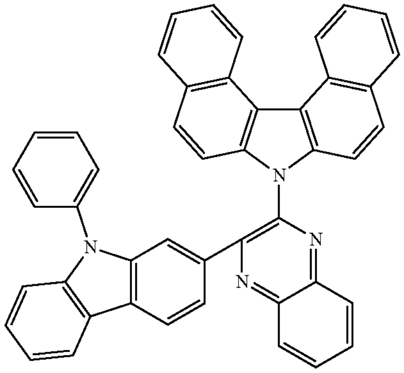
E-2-9
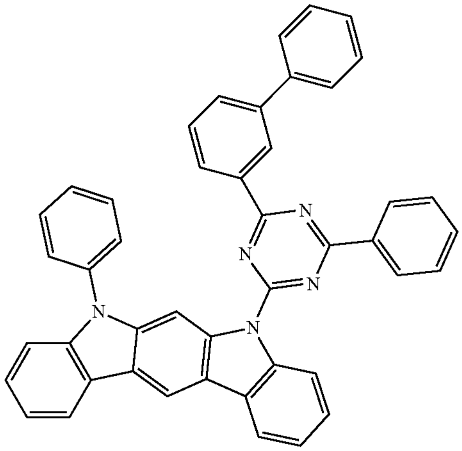
-continued
E-2-10
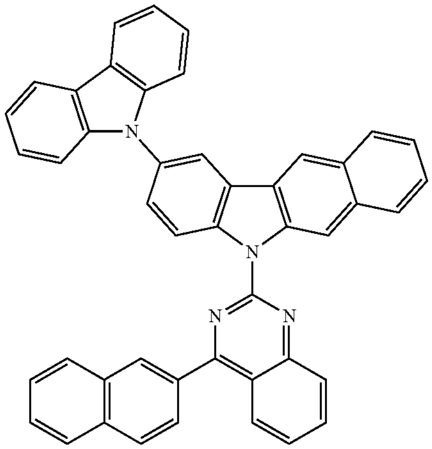
E-2-11
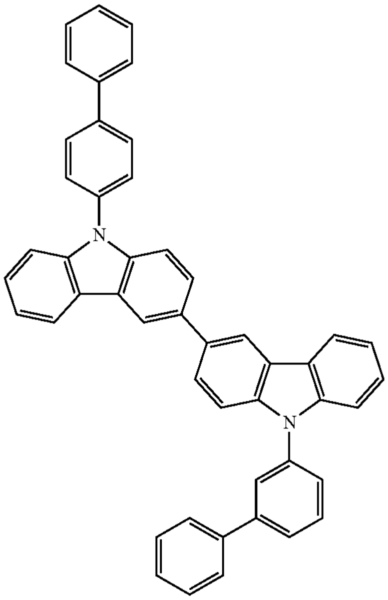
E-2-12
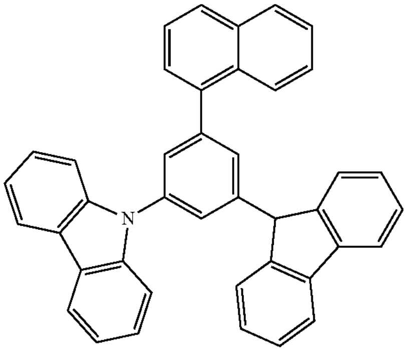

-continued
E-2-13
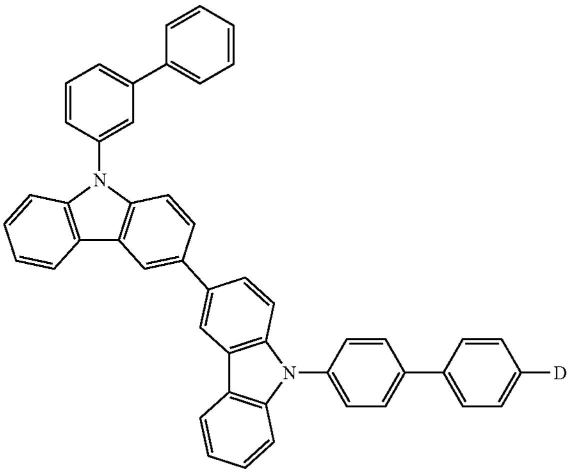
E-2-14
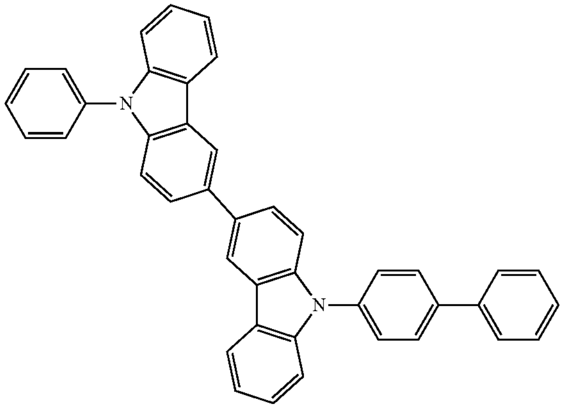
E-2-15
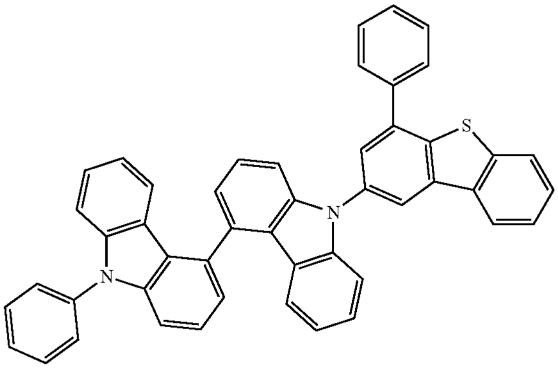
-continued
E-2-16
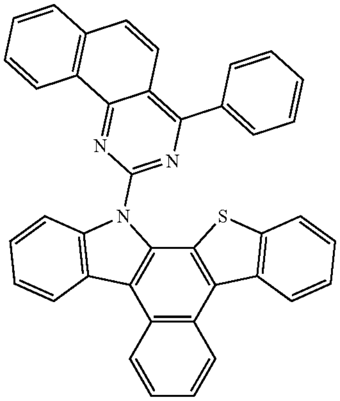
E-2-17
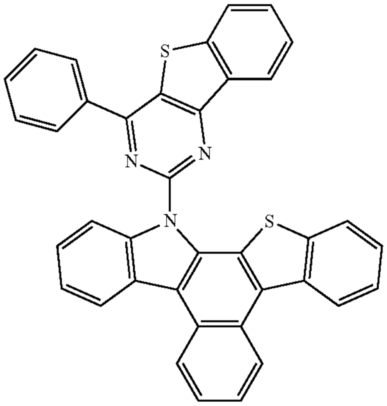
E-2-18
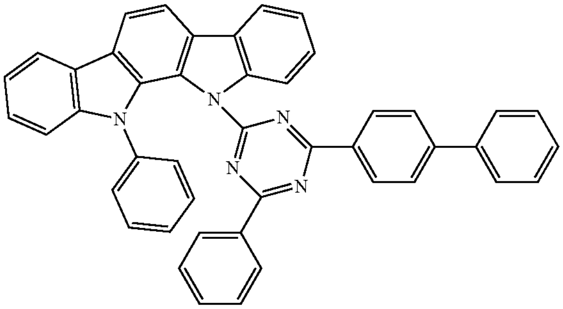
E-2-19
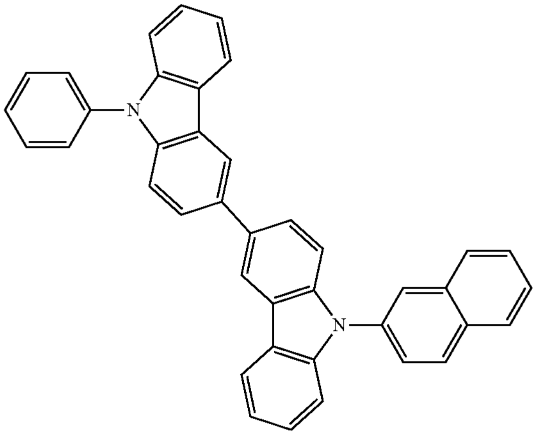

-continued

E-2-20

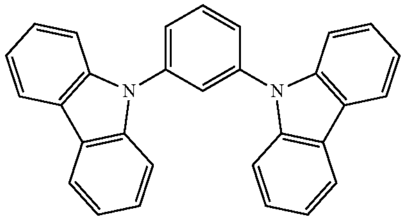

E-2-21

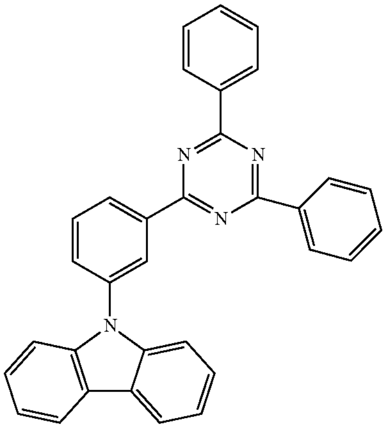

E-2-22

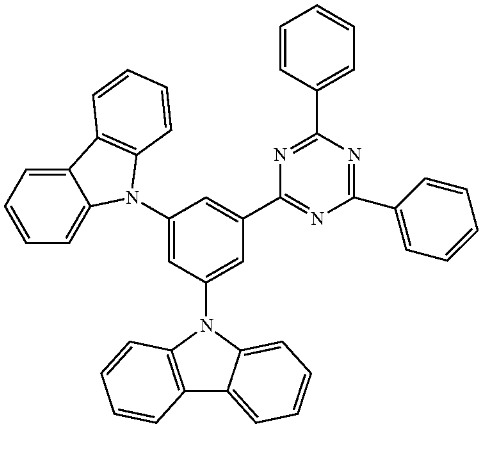

E-2-23

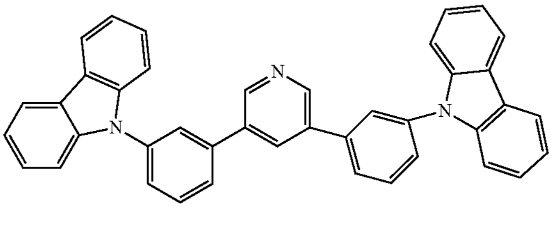

-continued

E-2-24

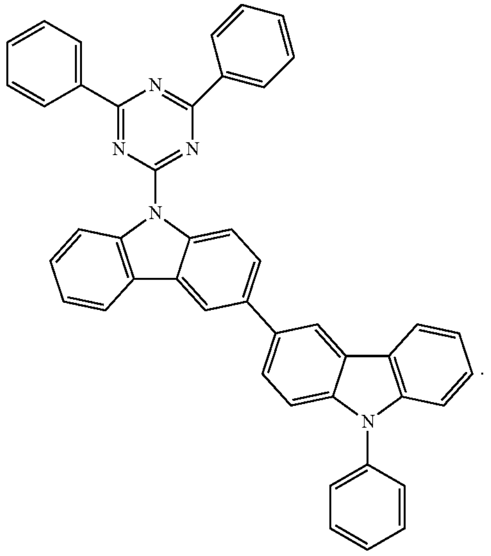

The emission layer EML may further include a material generally utilized/generally available in the art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POP-CPA), bis[2-(diphenylphosphino)phenyl]ether oxide (DPEPO), 4,4'-bis(N-carbazolyl)-1,1'-biphenyl (CBP), 1,3-bis(carbazolyl-9-yl)benzene (mCP), 2,8-bis(diphenylphosphoryl)dibenzofuran (PPF), 4,4',4''-tris(carbazol-9-yl)-triphenylamine (TCTA), and 1,3,5-tris(1-phenyl-1H-benzo[d]imidazol-2-yl)benzene (TPBi). However, the embodiment of the present disclosure is not limited thereto, and for example, tris(8-hydroxyquinolino)aluminum (Alq3), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), etc. may be utilized as a host material.

The emission layer EML may include a compound represented by Formula M-a or Formula M-b. The compound represented by Formula M-a or Formula M-b may be utilized as a phosphorescent dopant material.

Formula M-a

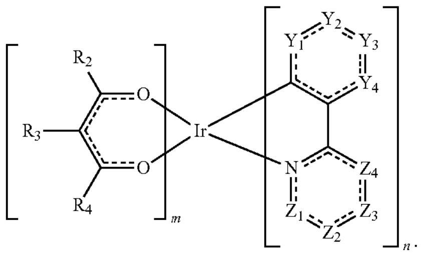

In Formula M-a, $Y_1$ to $Y_4$, and Z1 to Z4 may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring. In Formula M-a, m may be 0 or 1, and n may be 2 or 3. In Formula M-a, when m is 0, n is 3, and when m is 1, n is 2.

The compound represented by Formula M-a may be utilized as a phosphorescent dopant. The compound represented by Formula M-a may be represented by any one selected from among compounds M-a1 to M-a25. However, the compounds M-a1 to M-a25 are presented as an example, and the compound represented by Formula M-a is not limited to those represented by the compounds M-a1 to M-a25.

M-a1

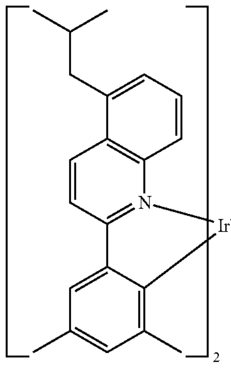

M-a2

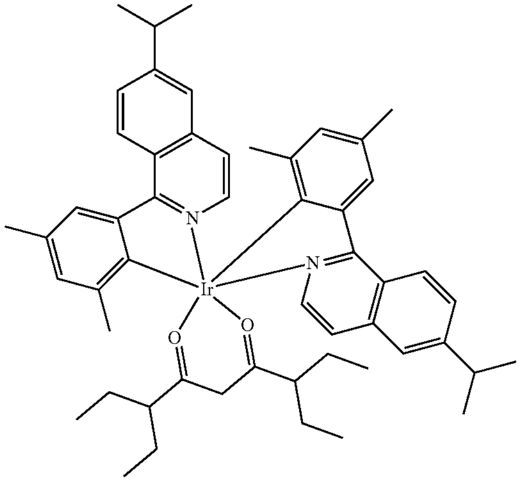

-continued

M-a3

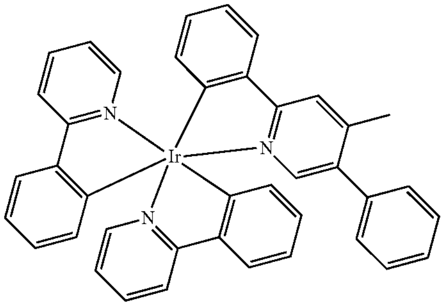

M-a4

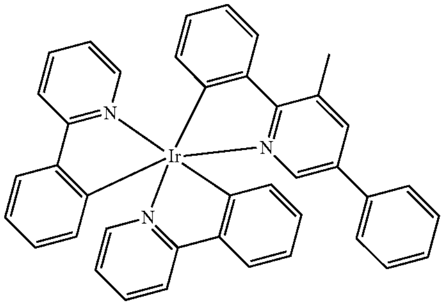

M-a5

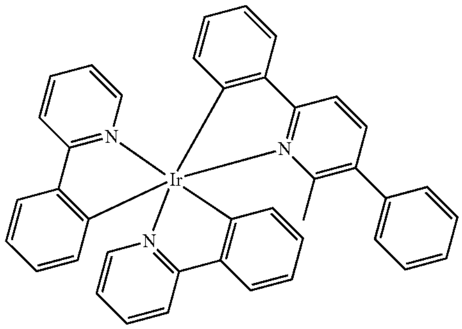

M-a6

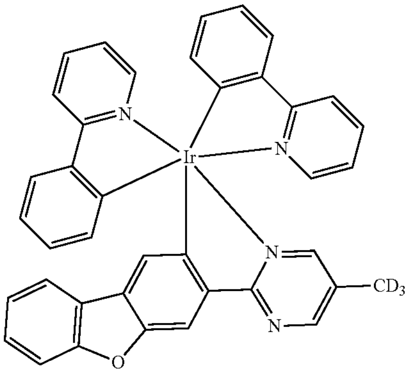

-continued
M-a7
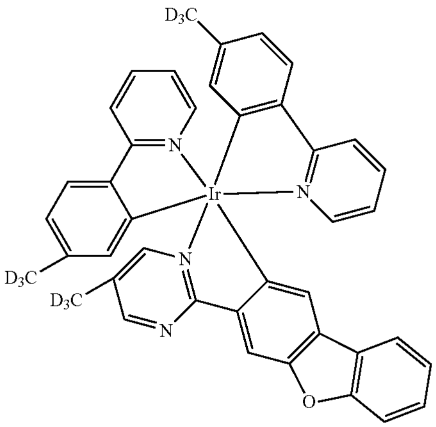
M-a8
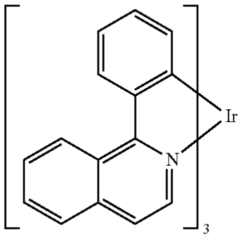
M-a9
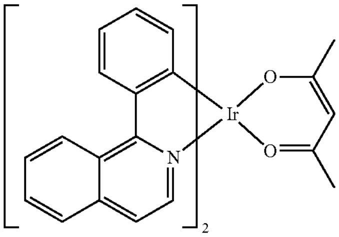
M-a10
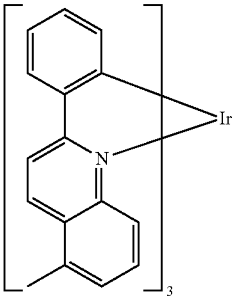
M-a11
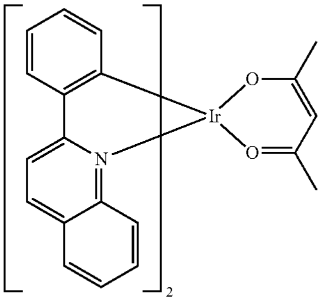
-continued
M-a12
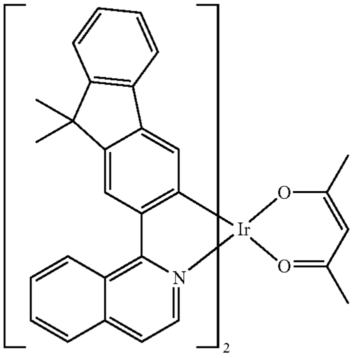
M-a13
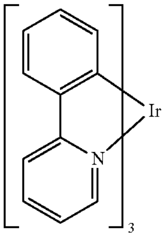
M-a14
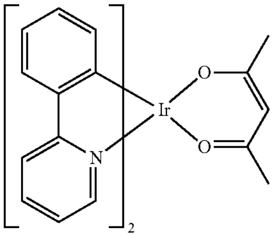
M-a15
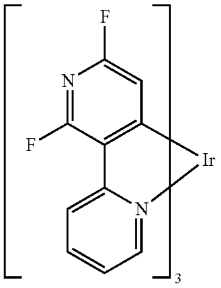
M-a16
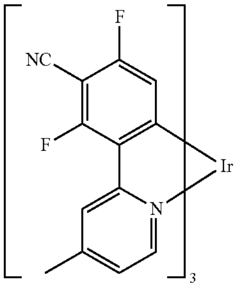

-continued
M-a17
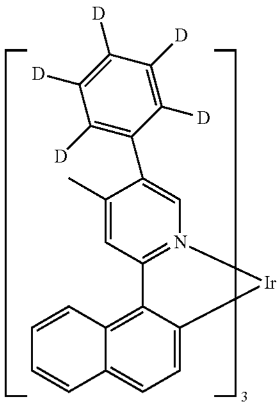
M-a18
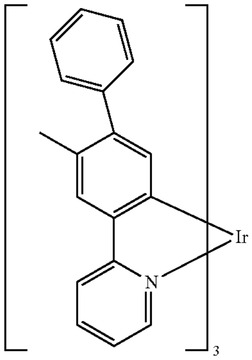
M-a19
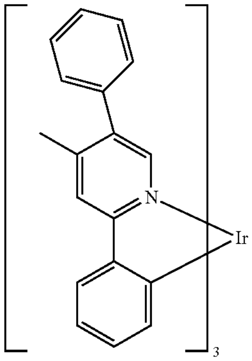
M-a20
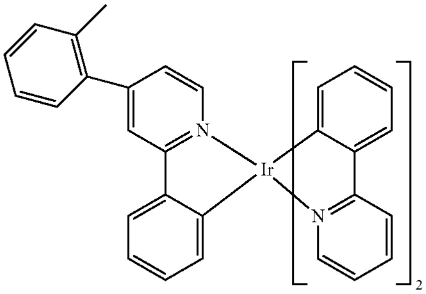
-continued
M-a21
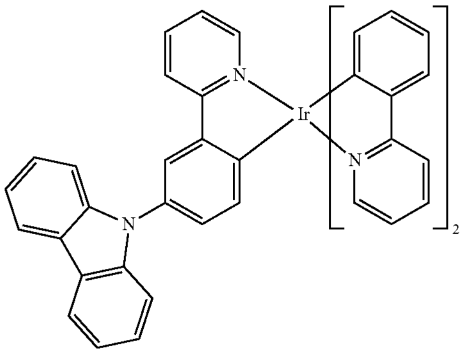
M-a22
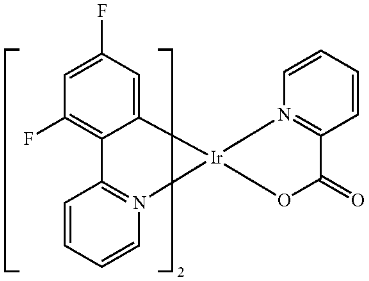
M-a23
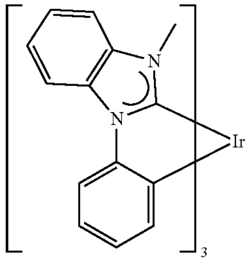
M-a24
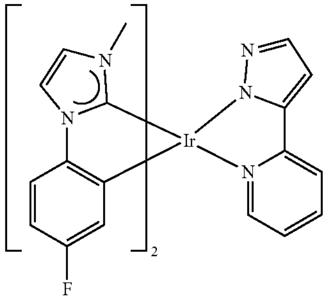
M-a25
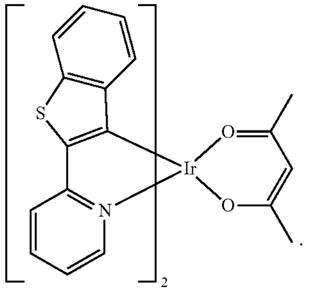
The compounds M-a1 and M-a2 may be utilized as a red dopant material, and the compounds M-a3 to M-a7 may be utilized as a green dopant material.

Formula M-b

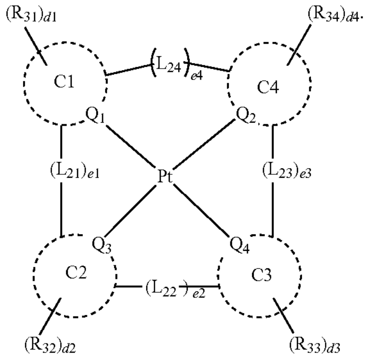

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

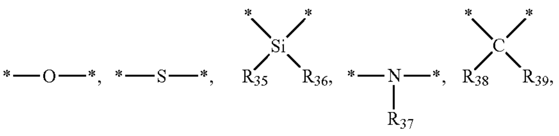

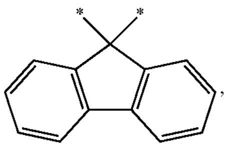

a substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1.

In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring. d1 to d4 may each independently be an integer from 0 to 4.

The compound represented by Formula M-b may be utilized as a blue phosphorescent dopant or a green phosphorescent dopant. The compound represented by Formula M-b may be represented by any one selected from among compounds below. However, the compounds below are presented merely as examples, and the compounds represented by Formula M-b are not limited to those compounds.

M-b-1

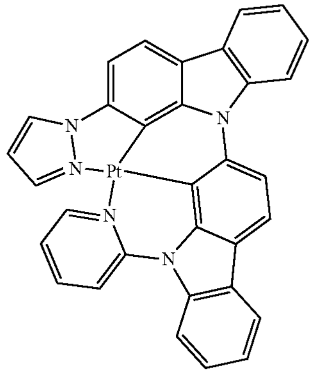

M-b-2

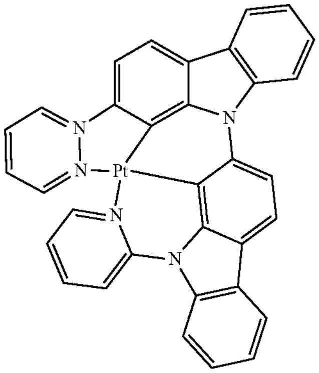

M-b-3

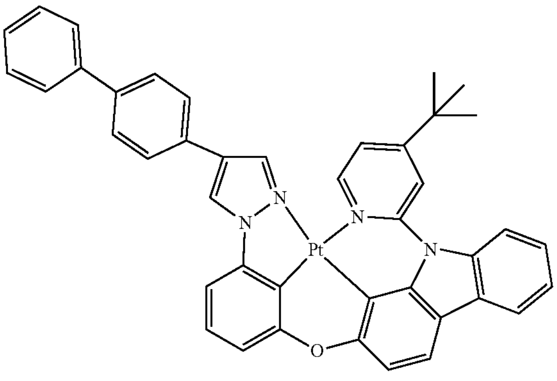

M-b-4

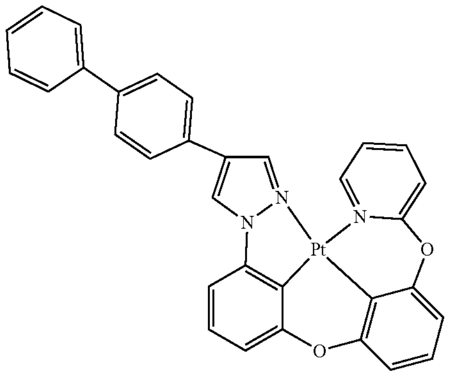

-continued

M-b-5

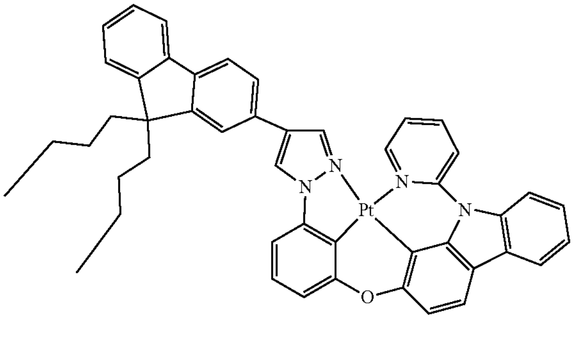

M-b-6

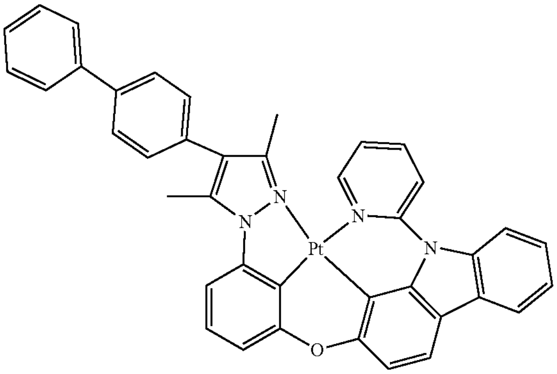

M-b-7

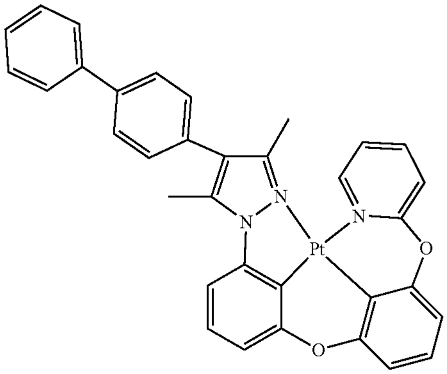

M-b-8

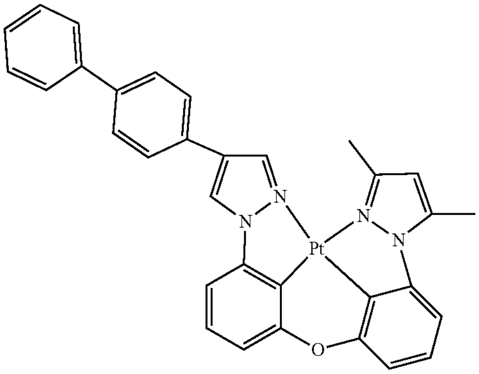

-continued

M-b-9

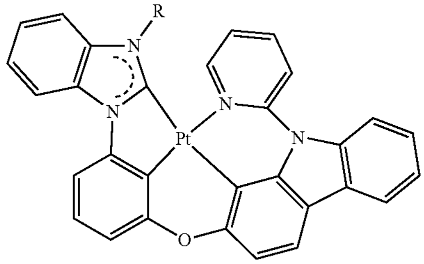

M-b-10

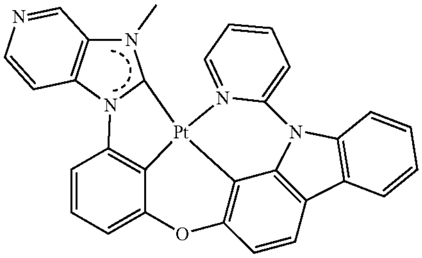

M-b-11

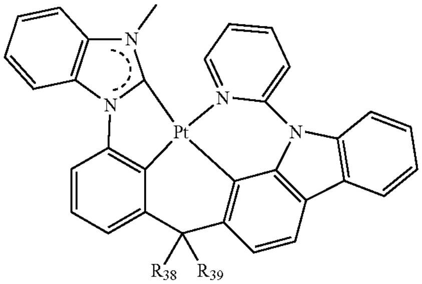

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one selected from among Formulas F-a to F-c. The compounds represented by Formulas F-a to F-c may be utilized as a fluorescent dopant material.

Formula F-a

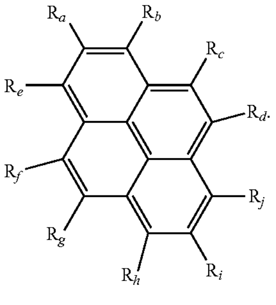

In Formula F-a, two selected from $R_a$ to $R_j$ may each independently be substituted with $*$—$NAr_1Ar_2$ The rest of $R_a$ to $R_j$ which are not substituted with —$NAr_1Ar_2$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In  $NAr_1Ar_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

Formula F-b

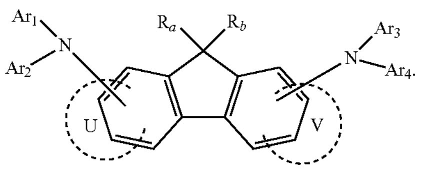

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or linked to an adjacent group to form a ring. $Ar_1$ to $Ar_4$ may each independently be a substituted or unsubstituted aryl group having 6 to 30 ring-forming carbon atoms, or a substituted or unsubstituted heteroaryl group having 2 to 30 ring-forming carbon atoms.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms. In Formula F-b, the number of rings represented by U and V may each independently be 0 or 1.

For example, in Formula F-b, when the number of U or V is 1, one ring forms a fused ring in a portion indicated by U or V, and when the number of U or V is 0, it refers to no ring that is indicated by U or V is present (e.g., the ring indicated by U or V does not exist). For example, when the number of U is 0 and the number of V is 1, or when the number of U is 1 and the number of V is 0, a fused ring having a fluorene core of Formula F-b may be a cyclic compound having four rings. In some embodiments, when both (e.g., simultaneously) U and V are 0, the fused ring of Formula F-b may be a cyclic compound having three rings, which has a fluorene core. In some embodiments, when both (e.g., simultaneously) U and V are 1, the fused ring having a fluorene core of Formula F-b may be a cyclic compound having five rings.

Formula F-c

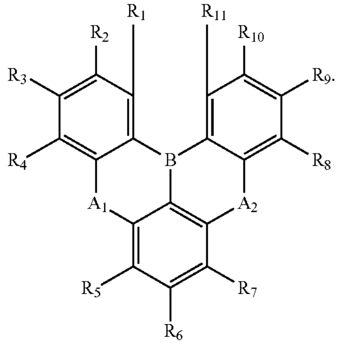

In Formula F-c, A1 and A2 may each independently be O, S, Se, or $NR_m$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boron group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, a substituted or unsubstituted heteroaryl group having 2 to 30 ring-forming carbon atoms, and/or bonded to an adjacent group to form a ring.

In Formula F-c, $A_1$ and $A_2$ may each independently be bonded to substituents of neighboring rings to form a fused ring. For example, when $A_1$ and $A_2$ may each independently be $NR_m$, $A_1$ may be bonded to $R_4$ or $R_5$ to form a ring. In some embodiments, $A_2$ may be bonded to $R_7$ or $R_8$ to form a ring.

The emission layer EML may include, as a generally utilized/generally available dopant material, styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzenamine (N-BDAVBi)), perylene and derivatives thereof (e.g., 2,5,8,11-tetra-t-butylperylene (TBP)), pyrene and/or derivatives thereof (e.g., 1,1-dipyrene, 1,4-dipyrenylbenzene, 1,4-bis(N,N-diphenylamino)pyrene), etc.

The emission layer EML may include a generally utilized/generally available phosphorescent dopant material. For example, as a phosphorescent dopant, a metal complex including iridium (Ir), platinum (Pt), osmium (Os), gold (Au), titanium (Ti), zirconium (Zr), hafnium (Hf), europium (Eu), and terbium (Tb), or thulium (Tm) may be utilized. For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), platinum octaethyl porphyrin (PtOEP), etc. may be utilized as a phosphorescent dopant. However, the embodiment of the present disclosure is not limited thereto.

The emission layer EML may include a quantum dot material. The core of a quantum dot may be selected from a Group II-VI compound, a Group III-VI compound, a Group I-III-VI compound, a Group III-V compound, a Group III-II-V compound, a Group IV-VI compound, a Group IV element, a Group IV compound, and one or more combinations thereof.

The Group II-VI compound may be selected from the group including (e.g., consisting of) a binary compound selected from the group including (e.g., consisting of) CdSe, CdTe, CdS, ZnS, ZnSe, ZnTe, ZnO, HgS, HgSe, HgTe, MgSe, MgS, and one or more compounds or mixtures thereof, a ternary compound selected from the group including (e.g., consisting of) CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and one or more compounds or mixtures thereof, and/or a quaternary compound selected from the group including (e.g., consisting of) HgZnTeS, CdZnSeS, CdZnSeTe, CdZnSTe, CdHgSeS, CdHgSeTe, CdHgSTe, HgZnSeS, HgZnSeTe, HgZnSTe, and one or more compounds or mixtures thereof.

The Group III-VI compound may include a binary compound such as $In_2S_3$ and $In_2Se_3$, a ternary compound such as $InGaS_3$ and $InGaSe_3$, or one or more combinations thereof.

The Group I-III-VI compound may include a ternary compound selected from the group including (e.g., consisting of) AgInS, $AgInS_2$, CuInS, $CuInS_2$, $AgGaS_2$, $CuGaS_2$ $CuGaO_2$, $AgGaO_2$, $AgAlO_2$, or one or more compounds or mixtures thereof, or a quaternary compound such as $AgInGaS_2$ and $CuInGaS_2$.

The Group III-V compound may be selected from the group including (e.g., consisting of) a binary compound selected from the group including (e.g., consisting of) GaN, GaP, GaAs, GaSb, AlN, AlP, AlAs, AlSb, InN, InP, InAs, InSb, and one or more compounds or mixtures thereof, a ternary compound selected from the group including (e.g., consisting of) GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and one or more compounds or mixtures thereof, and/or a quaternary compound selected from the group including (e.g., consisting of) GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and one or more compounds or mixtures thereof. In some embodiments, the Group III-V compound may further include a Group II metal. For example, InZnP, etc. may be selected as a Group III-II-V compound.

The Group IV-VI compound may be selected from the group including (e.g., consisting of) a binary compound selected from the group including (e.g., consisting of) SnS, SnSe, SnTe, PbS, PbSe, PbTe, and one or more compounds or mixtures thereof, a ternary compound selected from the group including (e.g., consisting of) SnSeS, SnSeTe, SnSTe, PbSeS, PbSeTe, PbSTe, SnPbS, SnPbSe, SnPbTe, and one or more compounds or mixtures thereof, and/or a quaternary compound selected from the group including (e.g., consisting of) SnPbSSe, SnPbSeTe, SnPbSTe, and one or more compounds or mixtures thereof. The Group IV element may be selected from the group including (e.g., consisting of) Si, Ge, and one or more elements or mixtures thereof. The Group IV compound may be a binary compound selected from the group including (e.g., consisting of) SiC, SiGe, and one or more compounds or mixtures thereof.

In this embodiment, a binary compound, a ternary compound, or a quaternary compound may be present in a particle form in a substantially uniform concentration distribution, or may be present in substantially the same particle form in a partially different concentration distribution. In some embodiments, a core/shell structure in which one quantum dot surrounds another quantum dot may be present. The core/shell structure may have a concentration gradient in which the concentration of an element present in the shell decreases towards the core.

In some embodiments, a quantum dot may have the core/shell structure including a core having nano-crystals, and a shell around (e.g., surrounding) the core, which are described above. The shell of the quantum dot may serve as a protection layer to prevent or reduce the chemical deformation of the core so as to keep semiconductor properties, and/or a charging layer to impart electrophoresis properties to the quantum dot. The shell may be a single layer or multiple layers. Examples of the shell of the quantum dot may be a metal or non-metal oxide, a semiconductor compound, or one or more combinations thereof.

For example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, or a ternary compound such as $MgAl_2O_4$, $CoFe_2O_4$, $NiFe_2O_4$, and $CoMn_2O_4$, but the embodiment of the present disclosure is not limited thereto.

In some embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the present disclosure is not limited thereto.

A quantum dot may have a full width of half maximum (FWHM) of a light emitting wavelength spectrum of about 45 nm or less, about 40 nm or less, or about 30 nm or less, and color purity or color reproducibility may be enhanced in the above ranges. In some embodiments, light emitted through such a quantum dot is emitted in all directions, and thus a wide viewing angle may be improved (increased).

In some embodiments, the form of a quantum dot is not particularly limited as long as it is a form commonly utilized in the art, but for example, a quantum dot in the form of a substantially spherical, pyramidal, multi-arm, or cubic nanoparticles, nanotubes, nanowires, nanofibers, nanoplatelets, etc. may be utilized. The quantum dot may control the color of emitted light according to particle size thereof, and thus the quantum dot may have one or more suitable colors of emitted light such as blue, red, green, etc.

Referring back to FIGS. 3 to 6, the first electrode EL1 has conductivity (e.g., is a conductor). The first electrode EL1 may be formed of a metal material, a metal alloy or a conductive compound. The first electrode EL1 may be an anode or a cathode. However, the embodiment of the present disclosure is not limited thereto. In some embodiments, the first electrode EL1 may be a pixel electrode. The first electrode EL1 may be a transmissive electrode, a transflective electrode, or a reflective electrode. The first electrode may include at least one selected from among Ag, Mg, Cu, Al, Pt, Pd, Au, Ni, Nd, Ir, Cr, Li, Ca, LiF, Mo, Ti, W, In, Sn, and Zn, two or more compounds selected therefrom, two or more mixtures selected therefrom, or one or more oxides thereof.

When the first electrode EL1 is the transmissive electrode, the first electrode EL1 may include a transparent metal oxide such as indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, W, one or more compounds thereof, or one or more mixtures thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may have a three-layer structure of ITO/Ag/ITO, but is not limited thereto. In some embodiments, the first electrode EL1 may include one or more of the above-described metal materials, one or more combinations of two or more metal materials selected from the above-described metal materials, and/or one or more oxides of one or more of the above-described metal materials, and the embodiment of the present disclosure is not limited thereto. The first electrode EL1 may have a thickness of about 700 Å to about 10000 Å. For example, the first electrode EL1 may have a thickness of 1000 Å to about 3000 Å.

The hole transport region HTR is provided on the first electrode EL1. The hole transport region HTR may include at least one selected from among a hole injection layer HIL, a hole transport layer HTL, a buffer layer, a light emitting auxiliary layer, and an electron blocking layer EBL. The hole transport region HTR may have, for example, a thickness of about 50 Å to about 15000 Å.

The hole transport region HTR may have a single layer formed of a single material, a single layer formed of a plurality of different materials, or a multilayer structure having a plurality of layers formed of a plurality of different materials. For example, the hole transport region HTR may have a single-layer structure formed of the hole injection layer HIL or the hole transport layer HTL, or a single-layer structure formed of a hole injection material or a hole transport material.

For example, the hole transport region HTR may have a single-layer structure formed of a plurality of different materials, or a structure in which a hole injection layer HIL/hole transport layer HTL, a hole injection layer HIL/hole transport layer HTL/buffer layer, a hole injection layer HIL/buffer layer, a hole transport layer HTL/buffer layer, or a hole injection layer HIL/hole transport layer HTL/electron blocking layer EBL are stacked in order from the first electrode EL1. However, this is presented merely as an example, and the embodiment of the present disclosure is not limited thereto.

The hole transport region HTR may be formed utilizing one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole transport region HTR may include a compound represented by Formula H-1.

Formula H-1

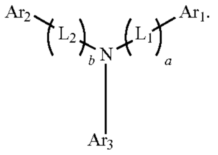

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. a and b may each independently be an integer from 0 to 10. In some embodiments, when a or b is an integer of 2 or greater, a plurality of $L_1$s and $L_2$s may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In some embodiments, in Formula H-1, $Ar_3$ may each independently be a substituted or unsubstituted aryl group having 6 to 30 ring-forming carbon atoms.

A compound represented by Formula H-1 may be a monoamine compound. In some embodiments, the compound represented by Formula H-1 may be a diamine compound in which at least one of $Ar_1$ to $Ar_3$ includes an amine group as a substituent. In some embodiments, the compound represented by Formula H-1 may be a carbazole-based compound including a substituted or unsubstituted carbazole group in at least one of $Ar_1$ or $Ar_2$ or a substituted or unsubstituted fluorene-based group in at least one of $Ar_1$ or $Ar_2$.

The compound represented by Formula H-1 may be represented by any one selected from among compounds from Compound Group H. However, the compounds listed in Compound Group H are presented merely as examples, and the compounds represented by Formula H-1 are not limited to the those listed in Compound Group H.

Compound Group H

H-1-1

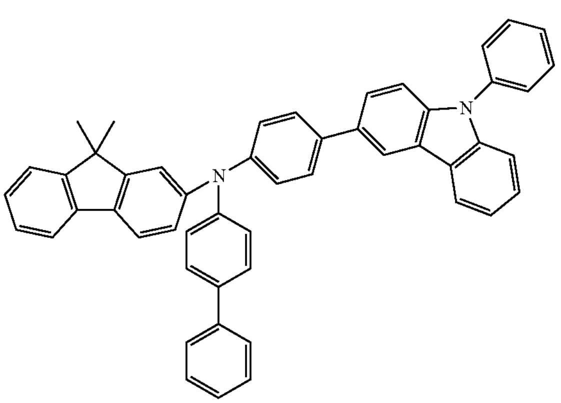

H-1-2

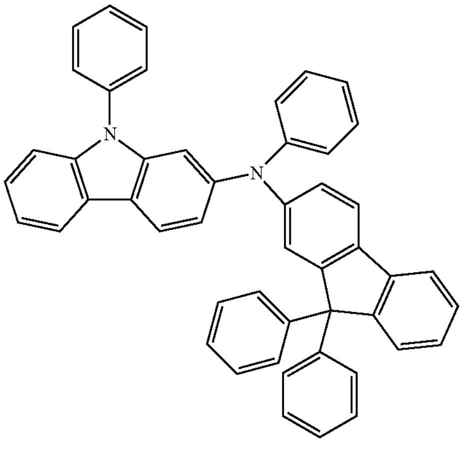

-continued
H-1-3
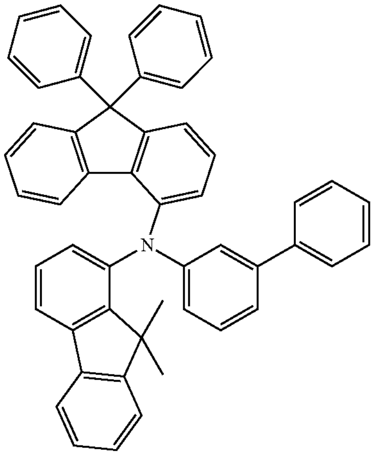
H-1-4
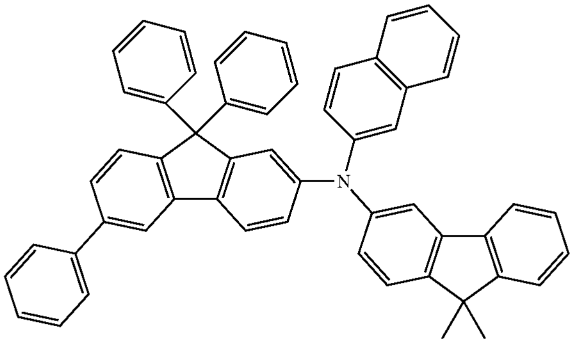
H-1-5
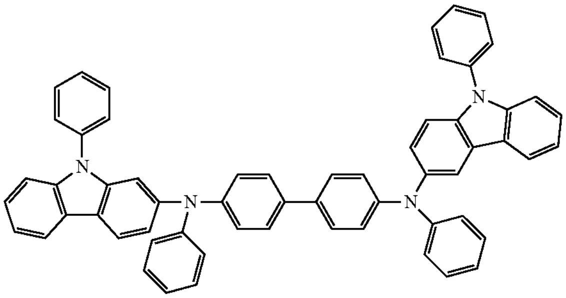
-continued
H-1-6
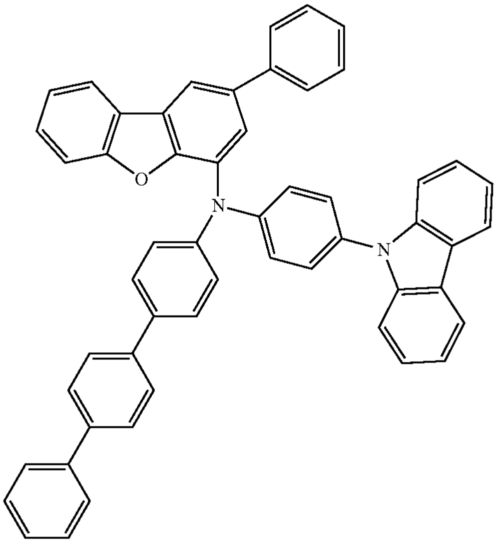
H-1-7
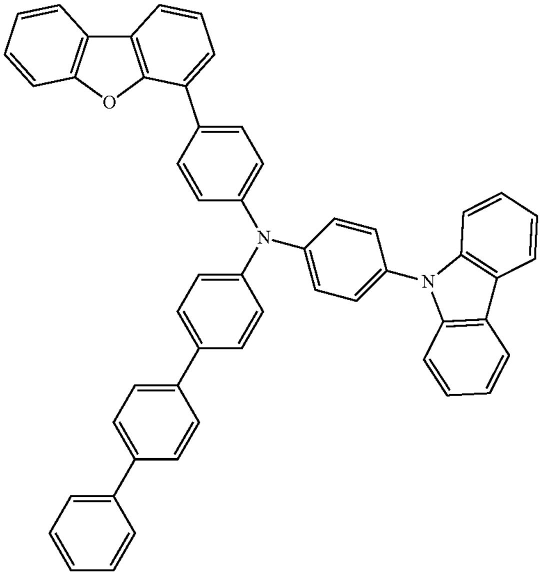
H-1-8
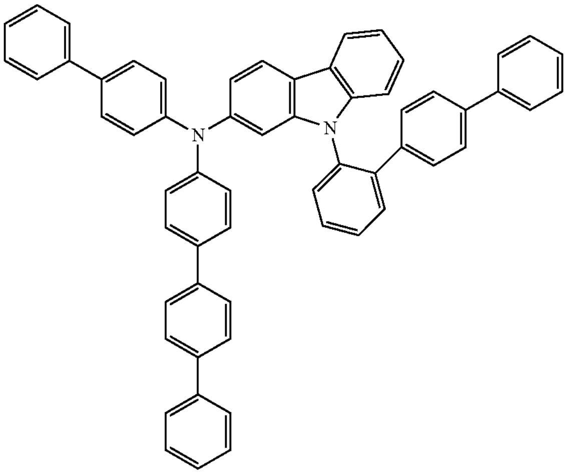

-continued
H-1-9
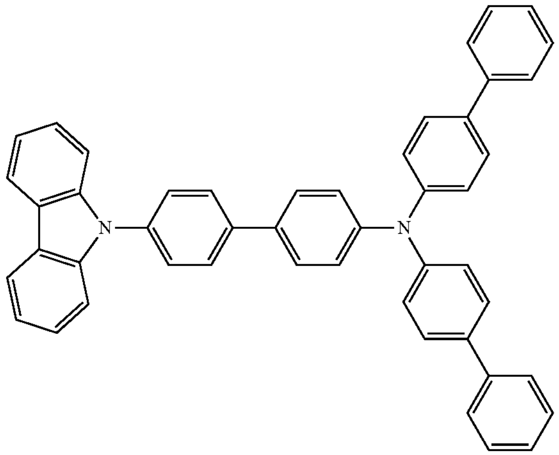
H-1-10
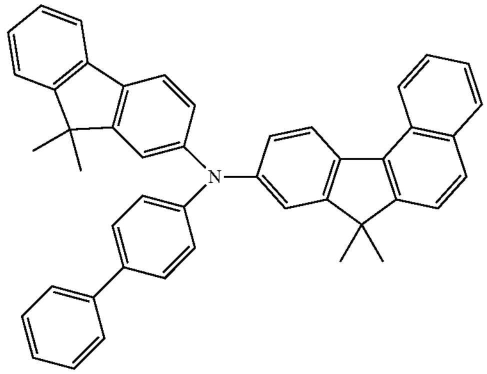
H-1-11
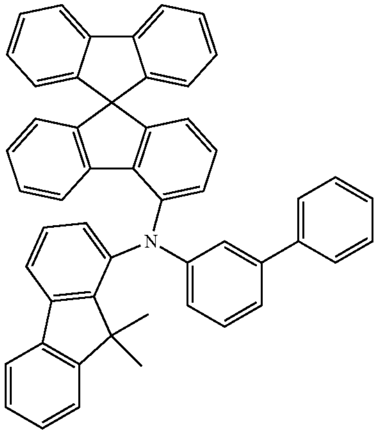
-continued
H-1-12
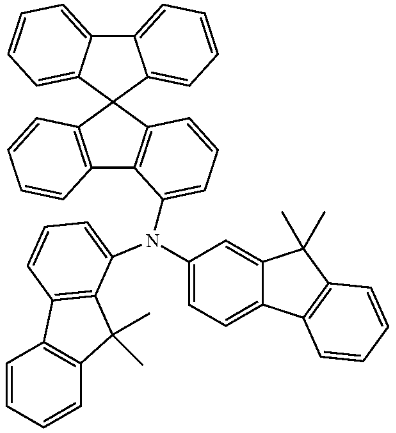
H-1-13
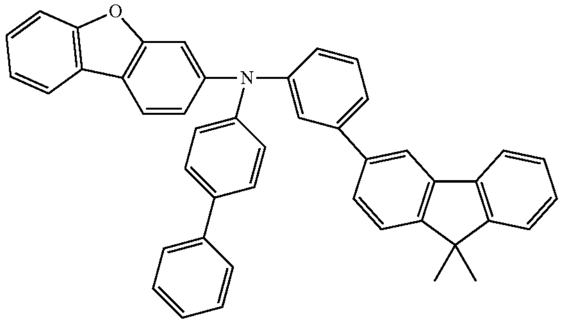
H-1-14
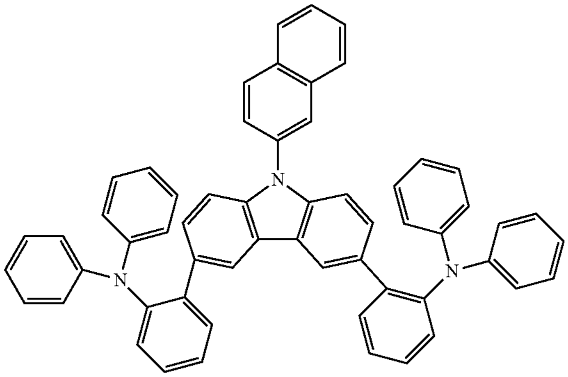
H-1-15
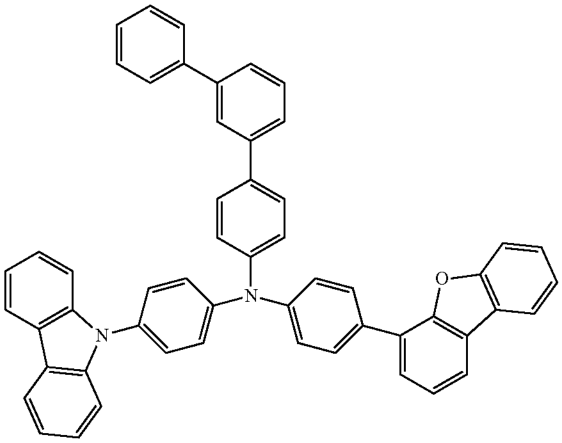

-continued

H-1-16

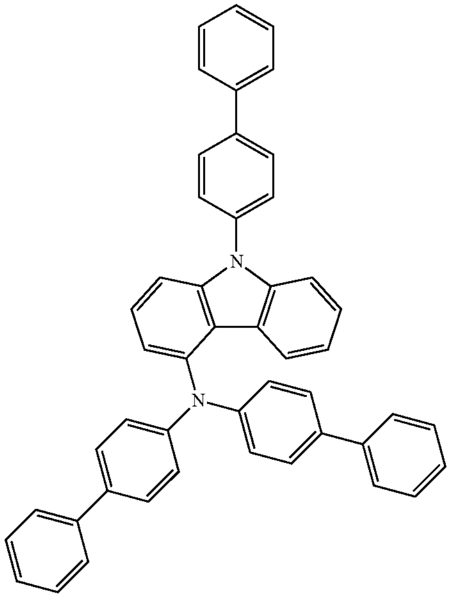

H-1-17

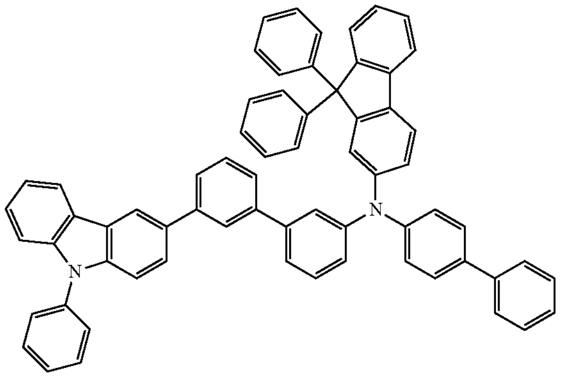

H-1-18

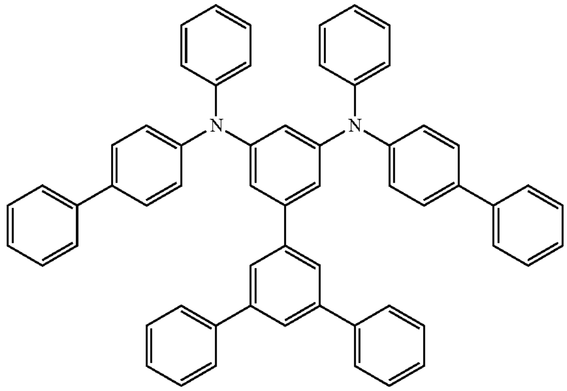

-continued

H-1-19

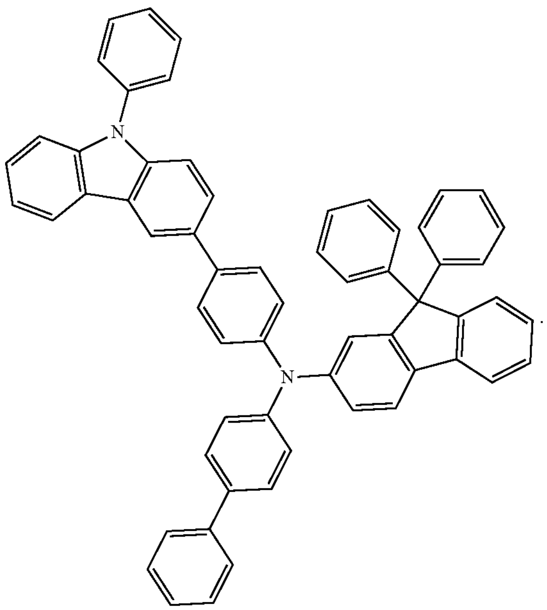

The hole transport region HTR may include a phthalocyanine compound such as copper phthalocyanine, $N^1$,$N^1$-([1,1'-biphenyl]-4,4'-diyl)bis($N^1$-phenyl-$N^4$,$N^4$-di-m-tolylbenzene-1,4-diamine) (DNTPD), 4,4',4"-[tris(3-methylphenyl)phenylamino]triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/Dodecylbenzenesulfonic acid (PANI/DBSA), polyaniline/camphor sulfonicacid (PANI/CSA), polyaniline/poly(4-styrenesulfonate) (PANI/PSS), N,N'-di(naphthalene-I-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

In some embodiments, the hole transport region HTR may include carbazole-based derivatives such as N-phenyl carbazole and polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4'-tris(N-carbazolyl)triphenylamine (TCTA), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 9-(4-tert-Butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzenem (DCP) etc.

The hole transport region HTR may include one or more of the compounds of the hole transport region described above in at least one selected from among the hole injection layer HIL, the hole transport layer HTL, and the electron blocking layer EBL.

The hole transport region HTR may have a thickness of about 100 Å to about 10000 Å, for example, about 100 Å to about 5000 Å. When the hole transport region HTR includes the hole injection layer HIL, the hole injection layer HIL may have a thickness of, for example, about 30 Å to about 1000 Å. When the hole transport region HTR includes the hole transport layer HTL, the hole transport layer HTL may have a thickness of about 30 Å to about 1000 Å. When the hole transport region HTR includes the electron blocking layer EBL, the electron blocking layer EBL may have a thickness of, for example, about 10 Å to about 1000 Å. When the thicknesses of the hole transport region HTR, the hole injection layer HIL, the hole transport layer HTL, and the electron blocking layer EBL satisfy the above-described ranges, satisfactory (suitable) hole transport properties may be obtained without a substantial increase in driving voltage.

The hole transport region HTR may further include, in addition to the above-described materials, a charge generation material to increase conductivity. The charge generation material may be substantially uniformly or non-uniformly dispersed in the hole transport region HTR. The charge generation material may be, for example, a p-dopant. The p-dopant may include at least one of halogenated metal compounds, quinone derivatives, metal oxides, or cyano group-containing compounds, but is not limited thereto. For example, the p-dopant may include halogenated metal compounds such as CuI and/or RbI, quinone derivatives such as tetracyanoquinodimethane (TCNQ) and/or 2,3,5,6-tetrafluoro-7,7',8,8'-tetracyanoquinodimethane (F4-TCNQ), metal oxides such as tungsten oxides and molybdenum oxides, cyano group-containing compounds such as dipyrazino[2,3-f: 2',3'-h] quinoxaline-2,3,6,7,10,11-hexacarbonitrile (HAT-CN) and 4-[[2,3-bis[cyano-(4-cyano-2,3,5,6-tetrafluorophenyl)methylidene]cyclopropylidene]-cyanomethyl]-2,3,5,6-tetrafluorobenzonitrile (NDP9), etc., but is not limited thereto.

As described above, the hole transport region HTR may further include at least one of a buffer layer or an electron blocking layer EBL in addition to the hole injection layer HIL and the hole transport layer HTL. The buffer layer may compensate a resonance distance according to wavelengths of light emitted from an emission layer EML, and may thus increase luminous efficiency. Materials which may be included in the hole transport region HTR may be utilized as materials included in the buffer layer. The electron blocking layer EBL is a layer that serves to prevent or reduce electrons from being injected from the electron transport region ETR to the hole transport region HTR.

The electron transport region ETR is provided on the emission layer EML. The electron transport region ETR may include at least one selected from among a hole blocking layer HBL, an electron transport layer ETL, and an electron injection layer EIL, but the embodiment of the present disclosure is not limited thereto.

The electron transport region ETR may have a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, or a hole blocking layer HBL/electron transport layer ETL/electron injection layer EIL are stacked in order from the emission layer EML, but is not limited thereto. The electron transport region ETR may have a thickness of, for example, about 1000 Å to about 1500 Å.

The electron transport region ETR may be formed utilizing one or more suitable methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1 described above. The electron transport region ETR may include an anthracene-based compound. However, the embodiment of the present disclosure is not limited thereto, and the electron transport region ETR may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate (Bebq$_2$), 9,10-di(naphthalene-2-yl)anthracene (ADN), 1,3-bis[3,5-di(pyridin-3-yl)phenyl]benzene (BmPyPhB), or one or more compounds or mixtures thereof.

In some embodiments, the electron transport region ETR may include one or more halogenated metals such as LiF, NaCl, CsF, RbCl, RbI, CuI, and/or KI, lanthanide metals such as Yb, co-deposition materials of a halogenated metal and a lanthanide metal. For example, the electron transport region ETR may include KI:Yb, RbI:Yb, LiF:Yb, etc. as a co-deposition material. In some embodiments, for the electron transport region ETR, a metal oxide such as $Li_2O$ and BaO, or 8-hydroxyl-lithium quinolate (Liq), etc. may be utilized, but the embodiment of the present disclosure is not limited thereto. The electron transport region ETR may also be formed of a mixture material of an electron transport material and an insulating organo-metal salt. The organo-metal salt may be a material having an energy band gap of about 4 eV or greater. For example, the organo-metal salt may include, for example, metal acetates, metal benzoates, metal acetoacetates, metal acetylacetonates, or metal stearates.

The electron transport region ETR may further include, for example, at least one of 2,9-dimethyl-4,7-diphenyl-1,10-phenanthroline (BCP), diphenyl(4-(triphenylsilyl)phenyl)phosphine oxide (TSPO1), or 4,7-diphenyl-1,10-phenanthroline (Bphen) in addition to the materials described above, but the embodiment of the present disclosure is not limited thereto.

The electron transport region ETR may include one or more of the compounds of the electron transport region described above in at least one selected from among the electron injection layer EIL, the electron transport layer ETL, and the hole blocking layer HBL.

When the electron transport region ETR includes the electron transport layer ETL, the electron transport layer ETL may have a thickness of about 100 Å to about 1000 Å, for example, about 150 Å to about 500 Å. When the thickness of the electron transport layer ETL satisfies the above-described ranges, satisfactory (suitable) electron transport properties may be obtained without a substantial increase in driving voltage. When the electron transport region ETR includes the electron injection layer EIL, the electron injection layer EIL may have a thickness of about 1 Å to about 100 Å, for example, about 3 Å to about 90 Å. When the thickness of the electron injection layer EIL satisfies the above-described ranges, satisfactory (suitable) electron injection properties may be obtained without a substantial increase in driving voltage.

The second electrode EL2 is provided on the electron transport region ETR. The second electrode EL2 may be a common electrode. The second electrode EL2 may be a cathode or an anode but the embodiment of the present disclosure is not limited thereto. For example, when the first electrode EL1 is an anode, the second electrode EL2 may be a cathode, and when the first electrode EL1 is a cathode, the second electrode EL2 may be an anode. The second electrode EL2 may include at least one selected from among Ag, Mg, Cu, Al, Pt, Pd, Au, Ni, Nd, Ir, Cr, Li, Ca, LiF, Mo, Ti, W, In, Sn, and Zn, two or more compounds selected therefrom, two or more mixtures selected therefrom, or one or more oxides thereof.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a combination thereof, or one or more compounds or mixtures thereof (e.g., AgMg, AgYb, or MgYb). In some embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode EL2 may include one or more of the above-described metal materials, a combination of two or more metal materials selected from the above-described metal materials, or one or more oxides of the above-described metal materials.

The second electrode EL2 may be connected with an auxiliary electrode. When the second electrode EL2 is connected with the auxiliary electrode, the resistance of the second electrode EL2 may decrease.

In some embodiments, a capping layer CPL may be further disposed on the second electrode EL2 of the light emitting element ED of an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, SiNx, SiOy, etc.

For example, when the capping layer CPL includes an organic material, the organic material may include α-NPD, NPB, TPD, m-MTDATA, Alq3 CuPc, N4,N4,N4',N4'-tetra (biphenyl-4-yl) biphenyl-4,4'-diamine (TPD15), 4,4',4"-tris (carbazol-9-yl)triphenylamine (TCTA), etc., or may include epoxy resins or acrylates such as methacrylates. However, the embodiment of the present disclosure is not limited thereto, and the capping layer CPL may include one or more of compounds P1 to P5.

P1

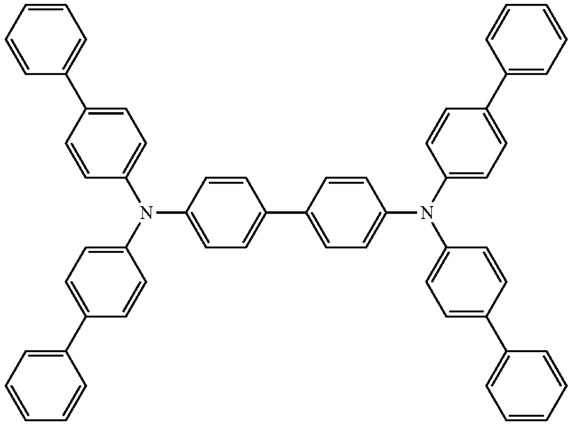

P2

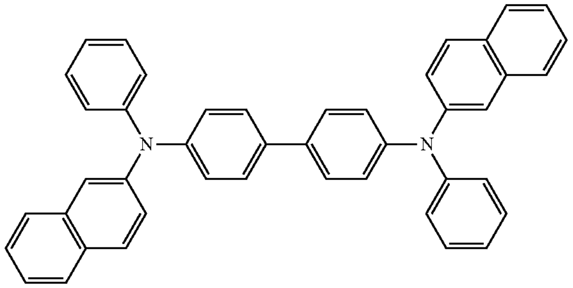

P3

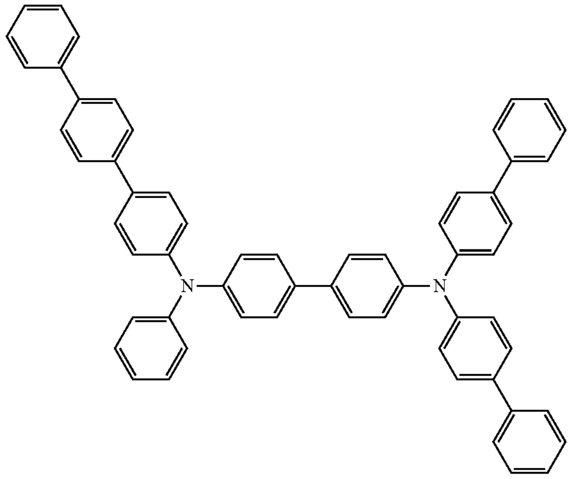

P4

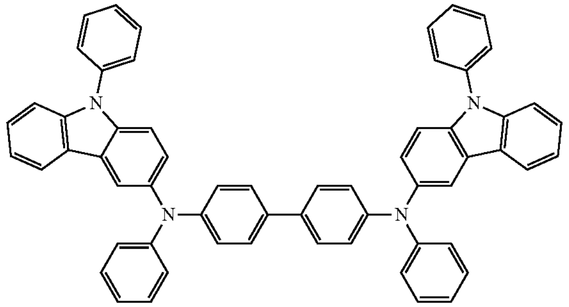

-continued

P5

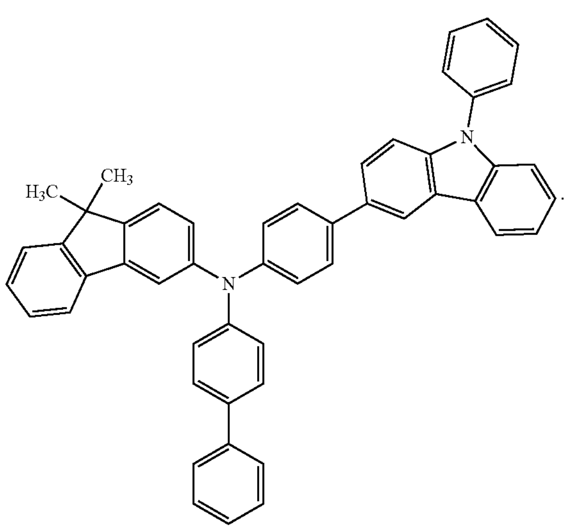

In some embodiments, the capping layer CPL may have a refractive index of about 1.6 or greater. For example, the capping layer CPL may have a refractive index of about 1.6 or greater in a wavelength range of about 550 nm to about 660 nm.

FIGS. 7 to 10 are each a cross-sectional view of a display device according to an embodiment. Hereinafter, in the description of the display device according to an embodiment with reference to FIGS. 7 and 10, content overlapping the one described above with reference to FIGS. 1 to 6 may not be described again, and the differences will primarily be described.

Figure 7:
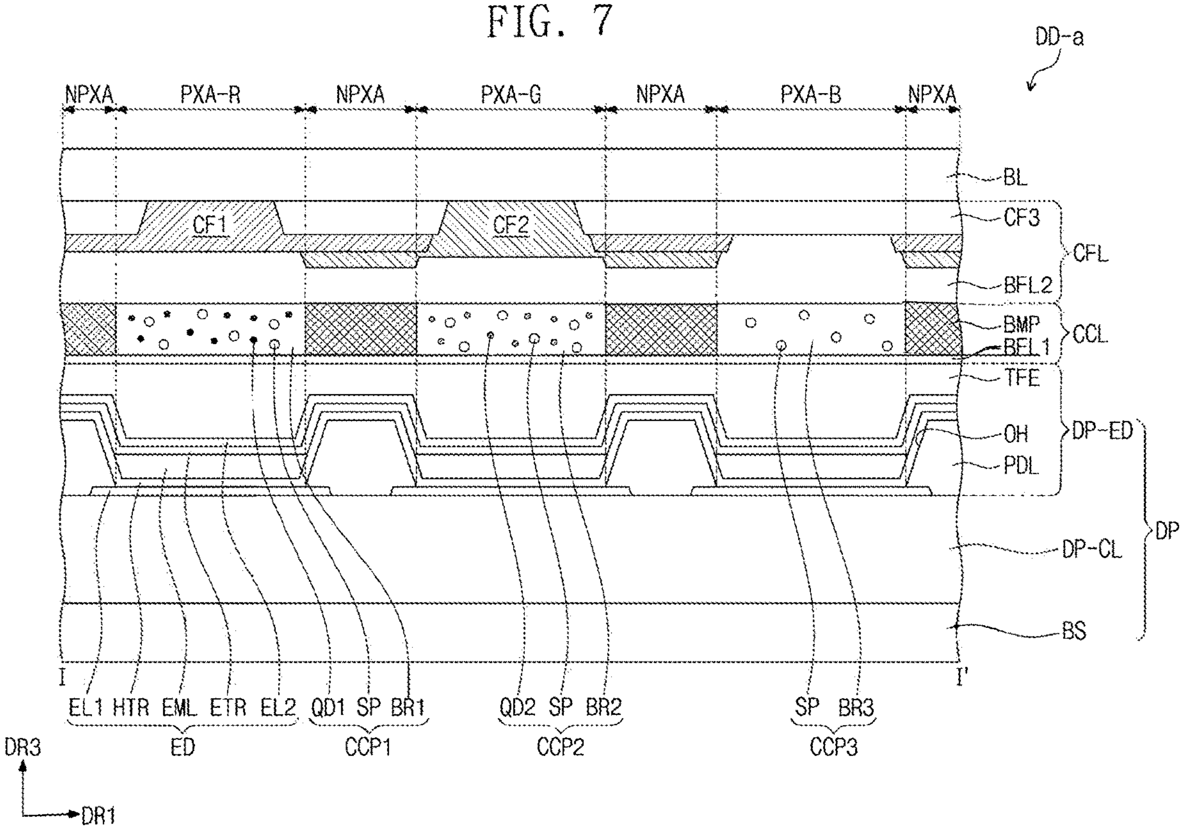
FIG. 7 is a cross-sectional view showing a display device according to an embodiment.

Referring to FIG. 7, a display device DD according to an embodiment may include a display panel DP having a display element layer DP-ED, a light control layer CCL on the display panel DP, and a color filter layer CFL. In an embodiment illustrated in FIG. 7, the display panel DP may include a base layer BS, a circuit layer DP-CL provided on the base layer BS, and a display element layer DP-ED, and the display element layer DP-ED may include a light emitting element ED.

The light emitting element ED may include a first electrode EL1, a hole transport region HTR on the first electrode EL1, an emission layer EML on the hole transport region HTR, an electron transport region ETR on the emission layer EML, and a second electrode EL2 on the electron transport region ETR. In some embodiments, a structure of the light emitting element ED shown in FIG. 7 may be the same as the structure of the light emitting element of FIGS. 3 to 6 described above.

Referring to FIG. 7, the emission layer EML may be disposed in the openings OH defined in the pixel defining films PDL. For example, the emission layer EML separated by the pixel defining films PDL and provided corresponding to each of light emitting regions PXA-R, PXA-G, and PXA-B may emit light in substantially the same wavelength ranges. In the display device DD of an embodiment, the emission layer EML may emit blue light. In some embodiments, the emission layer EML may be provided as a common layer throughout the light emitting regions PXA-R, PXA-G, and PXA-B.

The light control layer CCL may be on the display panel DP. The light control layer CCL may include a photoconverter. The photoconverter may be a quantum dot or a phosphor. The photoconverter may convert the wavelength of received light, and emit the resulting light. For example, the light control layer CCL may be a layer containing quantum dots or phosphors.

The light control layer CCL may include a plurality of light control units CCP1, CCP2, and CCP3. The light control units CCP1, CCP2, and CCP3 may be spaced apart from (separated from) each other.

Referring to FIG. 7, a division pattern BMP may be disposed between the light control units CCP1, CCP2, and CCP3 spaced apart from (separated from) each other, but the embodiment of the present disclosure is not limited thereto. In FIG. 7, the division pattern BMP is shown to not overlap the light control units CCP1, CCP2, and CCP3, but edges of the light control units CCP1, CCP2, and CCP3 may overlap at least a portion of the division pattern BMP.

The light control layer CCL may include a first light control unit CCP1 including a first quantum dot QD1 for converting first color light provided from the light emitting element ED into second color light, a second light control unit CCP2 including a second quantum dot QD2 for converting the first color light into third color light, and a third light control unit CCP3 transmitting the first color light.

In an embodiment, the first light control unit CCP1 may provide red light, which is the second color light, and the second light control unit CCP2 may provide green light, which is the third color light. The third light control unit CCP3 may transmit and provide blue light, which is the first color light provided from the light emitting element ED. For example, the first quantum dot QD1 may be a red quantum dot and the second quantum dot QD2 may be a green quantum dot. The same descriptions above may be applied to the quantum dots QD1 and QD2.

In some embodiments, the light control layer CCL may further include scatterers SP. The first light control unit CCP1 may include the first quantum dot QD1 and the scatterers SP, the second light control unit CCP2 may include the second quantum dot QD2 and the scatterers SP, and the third light control unit CCP3 may not include (e.g., may exclude) a quantum dot (e.g., not include any quantum dot) but may include the scatterers SP.

The scatterers SP may be inorganic particles. For example, the scatterers SP may include at least one selected from among $TiO_2$, ZnO, $Al_2O_3$, $SiO_2$, and hollow silica. The scatterers SP may include any one selected from among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP1, the second light control unit CCP2, and the third light control unit CCP3 may include base resins BR1, BR2, and BR3 for dispersing the quantum dots QD1 and QD2 and the scatterers SP. In an embodiment, the first light control unit CCP1 may include the first quantum dot QD1 and the scatterers SP dispersed in the first base resin BR1, the second light control unit CCP2 may include the second quantum dot QD2 and the scatterers SP dispersed in the second base resin BR2, and the third light control unit CCP3 may include the scatterers SP dispersed in the third base resin BR3.

The base resins BR1, BR2, and BR3 are a medium in which the quantum dots QD1 and QD2 and the scatterers SP are dispersed, and may be formed of one or more suitable resin compositions, which may be generally referred to as a binder. For example, the base resins BR1, BR2, and BR3 may be an acrylic-based resin, a urethane-based resin, a silicone-based resin, an epoxy-based resin, etc. The base resins BR1, BR2, and BR3 may be a transparent resin. In an embodiment, the first base resin BR1, the second base resin BR2, and the third base resin BR3 may each be the same as or different from each other.

The light control layer CCL may include a barrier layer BFL1. The barrier layer BFL1 may serve to prevent or reduce moisture and/or oxygen (hereinafter referred to as "moisture/oxygen") from being introduced. The barrier layer BFL1 may prevent or reduce the light control units CCP1, CCP2, and CCP3 from being exposed to moisture/oxygen. In some embodiments, the barrier layer BFL1 may cover the light control units CCP1, CCP2, and CCP3. In some embodiments, a barrier layer BFL2 may be provided between the light control units CCP1, CCP2, and CCP3 and the color filter layer CFL.

The barrier layers BFL1 and BFL2 may include at least one inorganic layer. For example, the barrier layers BFL1 and BFL2 may be formed of an inorganic material. For example, the barrier layers BFL1 and BFL2 may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. In some embodiments, the barrier layers BFL1 and BFL2 may further include an organic film. The barrier layers BFL1 and BFL2 may be formed of a single layer or a plurality of layers.

In the display device DD of an embodiment, the color filter layer CFL may be on the light control layer CCL. For example, the color filter layer CFL may be directly on the light control layer CCL. In this case, the barrier layer BFL2 may not be provided.

The color filter layer CFL may include filters CF1, CF2, and CF3. For example, the color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. The filters CF1, CF2, and CF3 may each include a polymer photosensitive resin, a pigment or a dye. The first filter CF1 may include a red pigment and/or a red dye, the second filter CF2 may include a green pigment and/or a green dye, and the third filter CF3 may include a blue pigment and/or a blue dye. In some embodiments, the embodiment of the present disclosure is not limited thereto, and the third filter CF3 may not include (e.g., may exclude) any pigment or dye. The third filter CF3 may include a polymer photosensitive resin, but not include any pigment or dye. The third filter CF3 may be transparent. The third filter CF3 may be formed of a transparent photosensitive resin.

In some embodiments, the first filter CF1 and the second filter CF2 may be yellow filters. The first filter CF1 and the second filter CF2 may not be separated from each other and may be provided as a single body.

The color filter layer CFL may further include a light blocking unit. The light blocking unit may be a black matrix. The light blocking unit may be formed including an organic light blocking material or an inorganic light blocking material, both (e.g., simultaneously) including a black pigment or a black dye. The light blocking unit may prevent or reduce light leakage, and separate boundaries between the adjacent filters CF1, CF2, and CF3.

The first to third filters CF1, CF2, and CF3 may be disposed corresponding to the red light emitting region PXA-R, the green light emitting region PXA-G, and the blue light emitting region PXA-B, respectively.

The base substrate BL may be on the color filter layer CFL. The base substrate BL may be a member providing a base surface on which the color filter layer CFL and the light control layer CCL are disposed. The base substrate BL may be a glass substrate, a metal substrate, a plastic substrate, etc. However, the embodiment of the present disclosure is not limited thereto, and the base substrate BL may be an inorganic layer, an organic layer, or a composite material layer. In some embodiments, the base substrate BL may not be provided.

Figure 8:
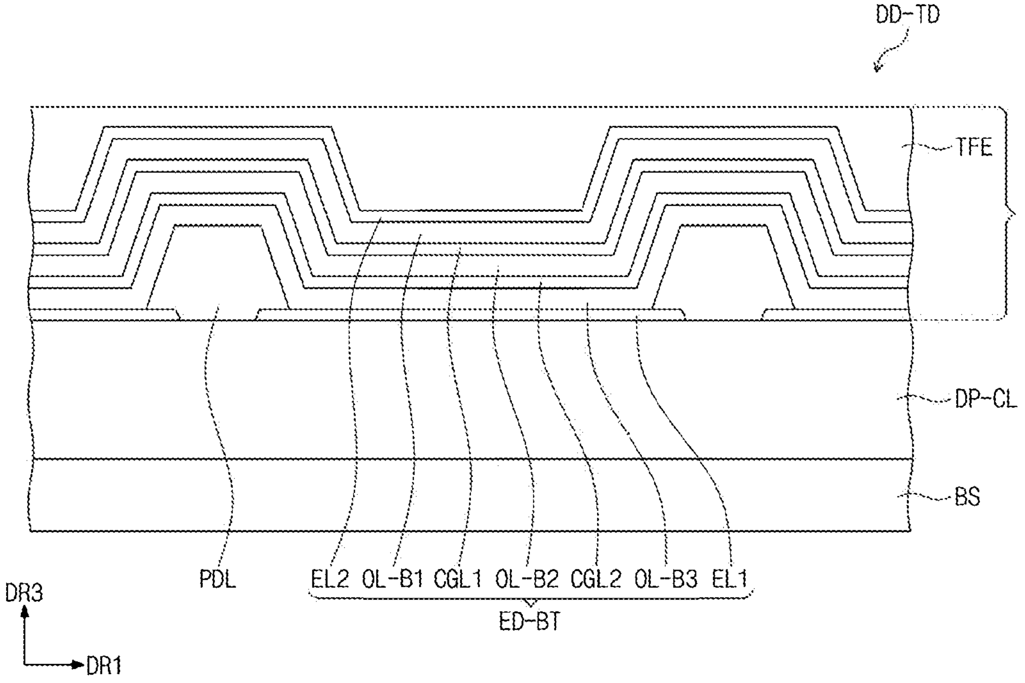
FIG. 8 is a cross-sectional view showing a display device according to an embodiment.

FIG. 8 is a cross-sectional view showing a portion of a display device according to an embodiment. FIG. 8 shows a cross-sectional view of a portion corresponding to the display panel DP of FIG. 7. In a display device DD-TD of an embodiment, a light emitting element ED-BT may include a plurality of light emitting structures OL-B1, OL-B2, and OL-B3. The light emitting element ED-BT may include the first electrode EL1 and the second electrode EL2 facing each other, and the plurality of light emitting structures OL-B1, OL-B2, and OL-B3 provided by being sequentially stacked in a thickness direction between the first electrode EL1 and the second electrode EL2. The light emitting structures OL-B1, OL-B2, and OL-B3 each may include the emission layer EML (FIG. 7), a hole transport region HTR and an electron transport region ETR with the emission layer EML (FIG. 7) therebetween. For example, the light emitting element ED-BT included in the display device DD-TD of an embodiment may be a light emitting element having a tandem structure including a plurality of emission layers.

In an embodiment illustrated in FIG. 8, light emitted from each of the light emitting structures (e.g., OL-B1, OL-B2, and/or OL-B3) may all be blue light emitting structures (e.g., may each emit light in the blue wavelength range). However, the embodiment of the present disclosure is not limited thereto, and wavelength ranges of light emitted from each of the light emitting structures OL-B1, OL-B2, and/or OL-B3 may be different from each other. For example, the light emitting element ED-BT including the plurality of light emitting structures OL-B1, OL-B2, and OL-B3 emitting light (e.g., light beams) in different wavelength ranges may emit white light (e.g., a combined white light).

Charge generation layers CGL1 and CGL2 may be between neighboring light emitting structures OL-B1, OL-B2, and OL-B3. The charge generation layers CGL1 and CGL2 may include a p-type or kind charge generation layer (e.g., P-charge generation layer) and/or an n-type or kind charge generation layer (e.g., N-charge generation layer).

Figure 9:
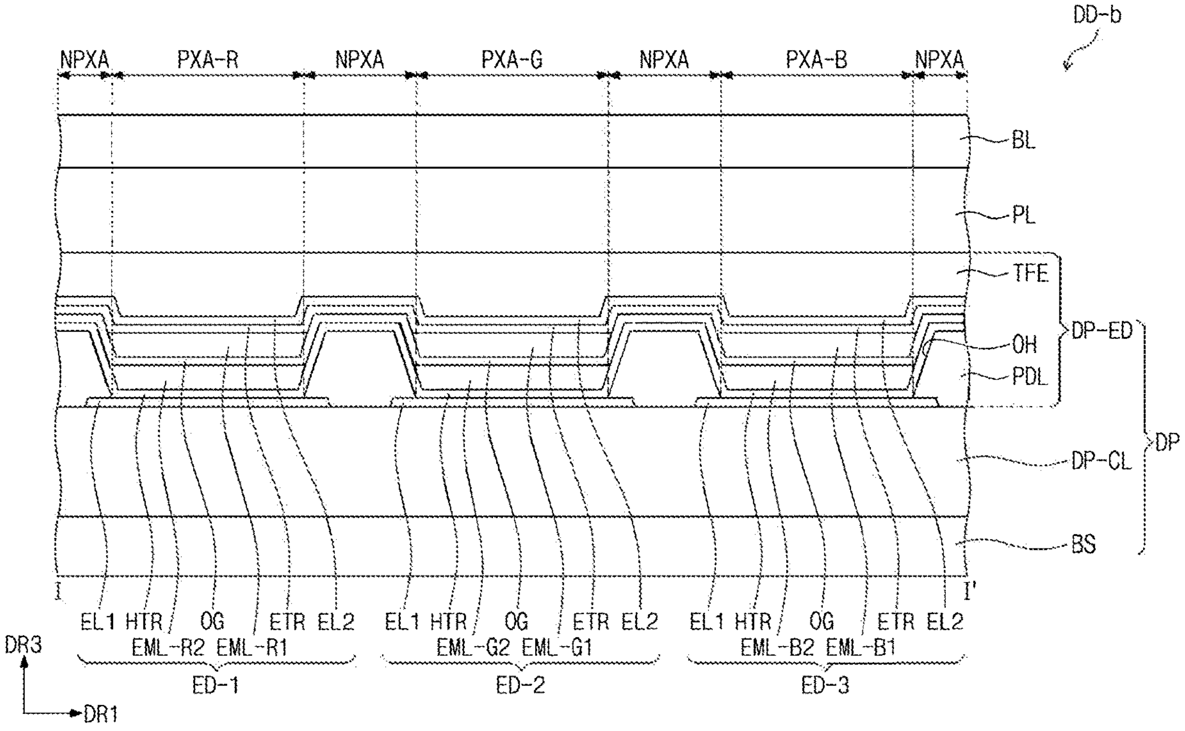
FIG. 9 is a cross-sectional view showing a display device according to an embodiment.

Referring to FIG. 9, a display device DD-b according to an embodiment may include light emitting elements ED-1, ED-2, and ED-3 in which two emission layers are stacked. Compared to the display device DD according to an embodiment shown in FIG. 2, the difference is that in an embodiment shown in FIG. 9, the first to third light emitting elements ED-1, ED-2, and ED-3 each include two emission layers stacked in a thickness direction. In each of the first to third light emitting elements ED-1, ED-2, and ED-3, the two emission layers may (may each) emit light in substantially the same wavelength range.

The first light emitting element ED-1 may include a first red emission layer EML-R1 and a second red emission layer EML-R2. The second light emitting element ED-2 may include a first green emission layer EML-G1 and a second green emission layer EML-G2. In some embodiments, the third light emitting element ED-3 may include a first blue emission layer EML-B1 and a second blue emission layer EML-B2. For example, at least one of the first blue emission layer EML-B1 or the second blue emission layer EML-B2 may include the organometallic compound according to an embodiment. A light emitting auxiliary portion OG may be between the first red emission layer EML-R1 and the second red emission layer EML-R2 (along the thickness direction), between the first green emission layer EML-G1 and the second green emission layer EML-G2, and between the first blue emission layer EML-B1 and the second blue emission layer EML-B2.

The light emitting auxiliary portion OG may include a single layer or multiple layers. The light emitting auxiliary portion OG may include a charge generation layer. For example, the light emitting auxiliary portion OG may include an electron transport region, a charge generation layer, and a hole transport region that are sequentially stacked. The light emitting auxiliary portion OG may be provided as a common layer throughout the first to third light emitting elements ED-1, ED-2, and ED-3. However, the embodiment of the present disclosure is not limited thereto, and the light emitting auxiliary portion OG may be provided to be patterned inside the openings OH defined in the pixel defining films PDL.

The first red emission layer EML-R1, the first green emission layer EML-G1, and the first blue emission layer EML-B1 may be between the hole transport region HTR and the emission auxiliary portion OG. The second red emission layer EML-R2, the second green emission layer EML-G2, and the second blue emission layer EML-B2 may be between the light emission auxiliary portion OG and the electron transport region ETR.

For example, the light emitting element ED-1 may include the first electrode EL1, the hole transport region HTR, the second red emission layer EML-R2, the emission auxiliary portion OG, the first red emission layer EML-R1, the electron transport region ETR, and the second electrode EL2, which are sequentially stacked (in the stated order). The second light emitting element ED-2 may include the first electrode EL1, the hole transport region HTR, the second green emission layer EML-G2, the emission auxiliary portion OG, the first green emission layer EML-G1, the electron transport region ETR, and the second electrode EL2, which are sequentially stacked. The third light emitting element ED-3 may include the first electrode EL1, the hole transport region HTR, the second blue emission layer EML-B2, the emission auxiliary portion OG, the first blue emission layer EML-B1, the electron transport region ETR, and the second electrode EL2, which are sequentially stacked.

In some embodiments, an optical auxiliary layer PL may be on the display element layer DP-ED. The optical auxiliary layer PL may include a polarizing layer. The optical auxiliary layer PL may be on the display panel DP to control reflected light in the display panel DP due to external light. The optical auxiliary layer PL may not be provided in the display device according to an embodiment.

Figure 10:
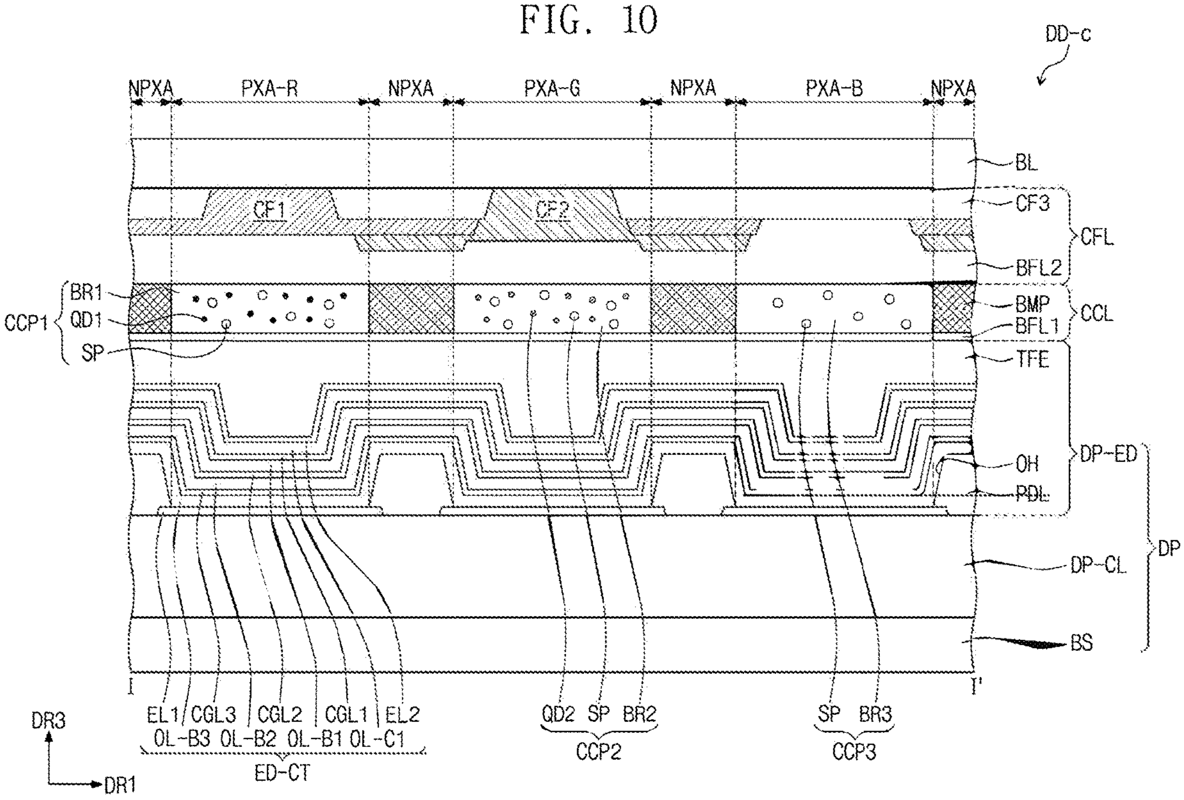
FIG. 10 is a cross-sectional view showing a display device according to an embodiment.

Unlike FIGS. 8 and 9, the display device DD-c of FIG. 10 is illustrated to include four light emitting structures OL-B1, OL-B2, OL-B3, and OL-C1. The light emitting element ED-BT may include the first electrode EL1 and the second electrode EL2 facing each other, and the first to fourth light emitting structures L-B1, OL-B2, OL-B3, and OL-C1 sequentially stacked in a thickness direction between the first electrode EL1 and the second electrode EL2. Charge generation layers CGL1, CGL2, and CGL3 may be disposed between the first to fourth light emitting structures OL-B1, OL-B2, OL-B3, and OL-C1 (respectively). The charge generation layers CGL1, CGL2 and CGL3 disposed between the neighboring light emitting structures OL-B1, OL-B2, OL-B3, and OL-C1 may include a p-type or kind charge generation layer (e.g., P-charge generation layer) and/or an n-type or kind charge generation layer (e.g., N-charge generation layer).

Among the four light emitting structures, the first to third light emitting structures OL-B1, OL-B2, and OL-B3 may emit blue light, and the fourth light emitting structure OL-C1 may emit green light. At least one of the first to third light emitting structures OL-B1, OL-B2, and OL-B3 may include an organometallic compound according to an embodiment. However, the embodiment of the present disclosure is not limited thereto, and the first to fourth light emitting structures OL-B1, OL-B2, OL-B3, and OL-C1 may emit light having different wavelength ranges.

Hereinafter, with reference to Examples and Comparative Examples, an organometallic compound and a light emitting element of an embodiment of the present disclosure will be described in more detail. The Examples shown below are merely examples to assist in the understanding of the present disclosure, and the scope of the present disclosure is not limited thereto.

Examples

1. Synthesis of Organometallic Compounds of Examples

First, a process of synthesizing organometallic compounds according to an embodiment of the present disclosure will be described in more detail by presenting a process of synthesizing each of Compounds 6, 18, 35, 50, 84, 93, and 113 as an example. A process of synthesizing organometallic compounds, which will be described hereinafter, is provided merely as an example, and thus a process of synthesizing compounds according to an embodiment of the present disclosure is not limited to the Examples below. Among the processes for synthesizing organometallic compounds which will be described below, intermediates [A-1] to [A-11] were utilized after sublimation-purifying commercially available products.

(1) Synthesis of Organometallic Compound 6

Organometallic Compound 6 according to an embodiment may be synthesized by, for example, a process of Reaction Formula 1.

Reaction Formula 1

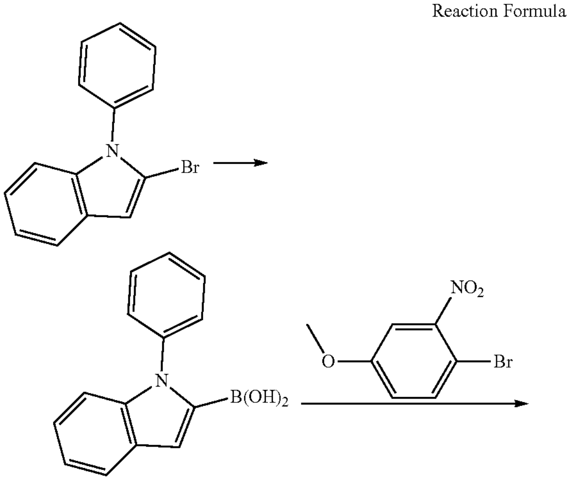

6-1

-continued
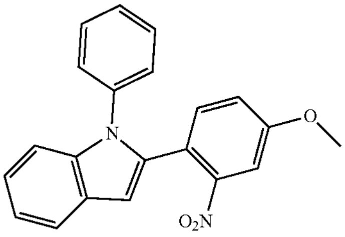
6-2
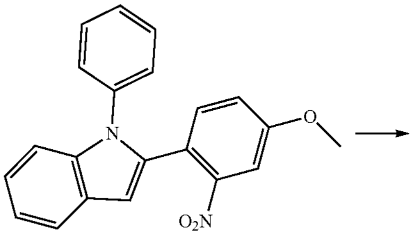
6-2
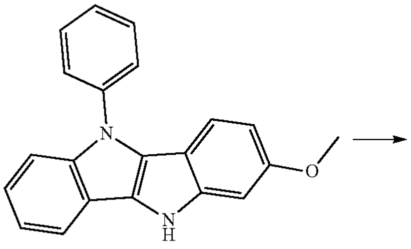
6-3
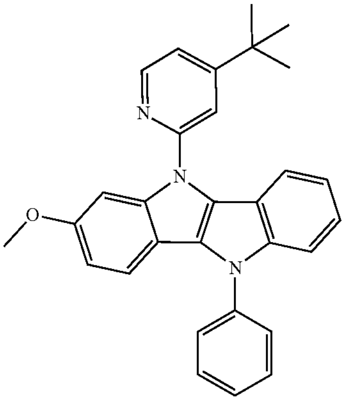
6-4
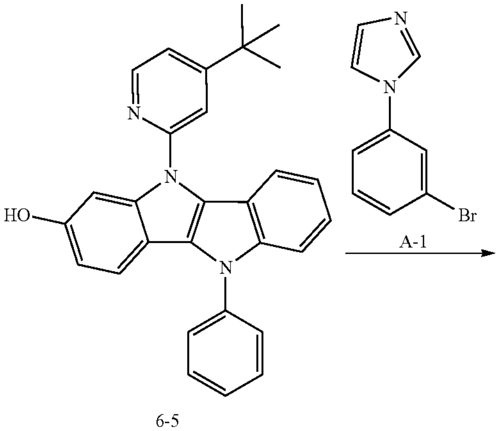
6-5
-continued
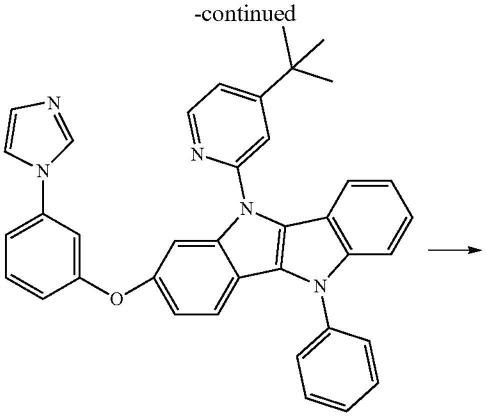
6-6
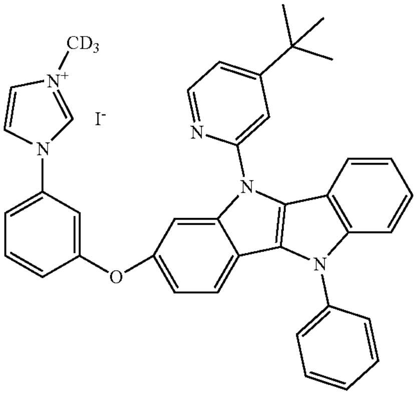
6-7
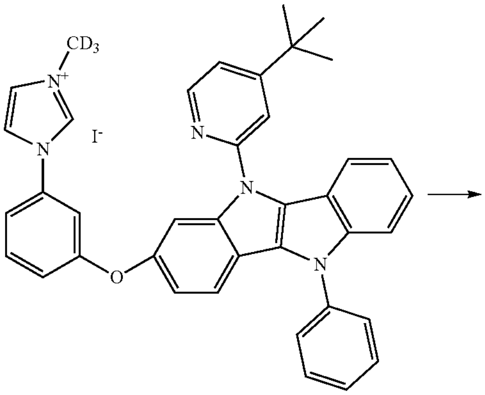
6-7
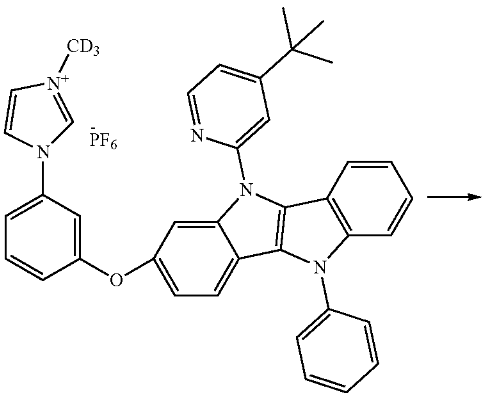
6-8

-continued

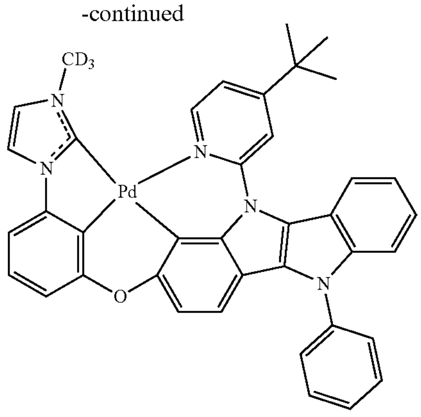

6

Synthesis of Intermediate 6-1

2-bromo-1-phenyl-1H-indole (5.44 g, 20 mmol) was dissolved in THF (60 mL), and then normal butyllithium (2.5 M in hexane, 8 mL) was added thereto at −78° C. After 1 hour, triisopropylborate (15 mmol) was added thereto at the same temperature. The mixture was stirred at room temperature for 10 hours, water was added thereto, and the resultant mixture was washed 3 times with diethyl ether (40 mL). The washed diethyl ether layer was dried over magnesium sulfate ($MgSO_4$) and then dried under reduced pressure to obtain a product. The obtained product was separated and purified utilizing silica gel column chromatography to obtain Intermediate [6-1] (4.03 g, 17 mmol).

Synthesis of Intermediate 6-2

Intermediate [6-1] (4.03 g, 17 mmol), 1-bromo-4-methoxy-2-nitrobenzene (4.1 g, 17.7 mmol), $Pd(PPh_3)_4$ (0.59 g, 0.51 mmol), and NaOH (2.0 g, 51 mmol) were put into a reaction vessel and suspended in THF (80 mL). The reaction mixture was warmed and stirred at 80° C. for 10 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [6-2] (5.17 g, 15 mmol).

Synthesis of Intermediate 6-3

Intermediate [6-2] (5.17 g, 15 mmol) and triphenylphosphine (9.8 g, 37.5 mmol) were put into a reaction vessel and suspended in o-dichlorobenzene (80 mL). The reaction mixture was warmed and stirred at 180° C. for 20 hours. After completion of the reaction, the solvent was distilled under reduced pressure to be removed from the mixture, and the obtained was cooled to room temperature, then distilled water (100 mL) was added thereto, and the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [6-3](3.75 g, 12 mmol).

Synthesis of Intermediate 6-4

Intermediate [6-3] (3.75 g, 12 mmol), 2-bromo-4(tert-butyl)pyridine (3.9 g, 18 mmol), tripotassium phosphate (0.44 g, 2.4 mmol), CuI (0.44 g, 2.4 mmol), picolinic acid (0.27 g, 2.4 mmol) were put into a reaction vessel and suspended in dimethyl sulfoxide (50 mL). The reaction mixture was warmed and stirred at 160° C. for 24 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [6-4] (4.46 g, 10 mmol).

Synthesis of Intermediate 6-5

Intermediate [6-4] (4.46 g, 10 mmol) was suspended in an excess of hydrobromic acid solution. The reaction mixture was warmed and stirred at 110° C. for 24 hours. After completion of the reaction, the mixture was cooled to room temperature, and neutralized by adding an appropriate or suitable amount of sodium hydrogen carbonate. Distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [6-5] (3.88 g, 9.0 mmol).

Synthesis of Intermediate 6-6

Intermediate [6-5] (3.88 g, 9.0 mmol), Intermediate [A-1] (3.01 g, 13.5 mmol), tripotassium phosphate (4.2 g, 18 mmol), CuI (0.44 g, 0.18 mmol), and picolinic acid (0.02 g, 0.18 mmol) were put into a reaction vessel and suspended in dimethyl sulfoxide (40 mL). The reaction mixture was warmed and stirred at 160° C. for 20 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [6-6] (3.73 g, 6.5 mmol).

Synthesis of Intermediate 6-7

Intermediate [6-6] (3.73 g, 6.5 mmol) was suspended in excess of methane iodide. The reaction mixture was warmed and stirred at 110° C. for 24 hours. After completion of the reaction, the mixture was cooled to room temperature, and the resulting solid was filtered and washed with ether. The washed solid was separated utilizing recrystallization to obtain Intermediate [6-7] (3.95 g, 5.5 mmol).

Synthesis of Intermediate 6-8

Intermediate [6-7] (3.95 g, 5.5 mmol) and ammonium hexafluorophosphate (3.3 g, 20 mol) were put into a reaction vessel and suspended in a mixed solution of methyl alcohol (100 mL) and water (25 mL). The reaction mixture was stirred at room temperature for 24 hours. After completion of the reaction, the resulting solid was filtered and washed with ether. The washed solid was dried to obtain Intermediate [6-8] (3.83 g, 5.2 mmol).

Synthesis of Compound 6

Intermediate [6-8] (3.83 g, 5.2 mmol), palladium acetate (1.30 g, 5.73 mmol), and sodium acetate (0.12 g, 15.6 mmol) were suspended in dioxane (50 mL). The reaction mixture was warmed and stirred at 120° C. for 24 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Compound 6 (1.40 g, 1.7 mmol).

(2) Synthesis of Organometallic Compound 18
Organometallic Compound 18 according to an embodiment may be synthesized by, for example, a process of Reaction Formula 2.
Reaction Formula 2
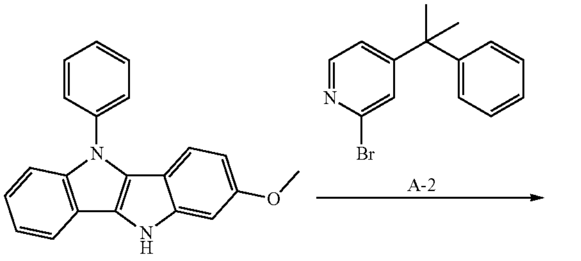
6-3
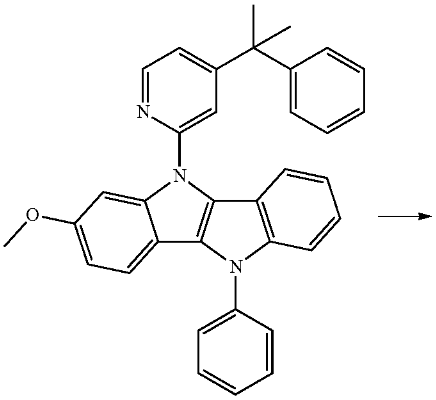
18-1
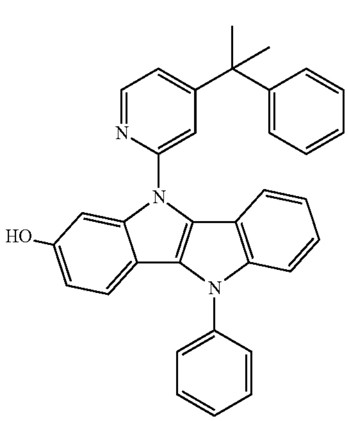
18-2
-continued
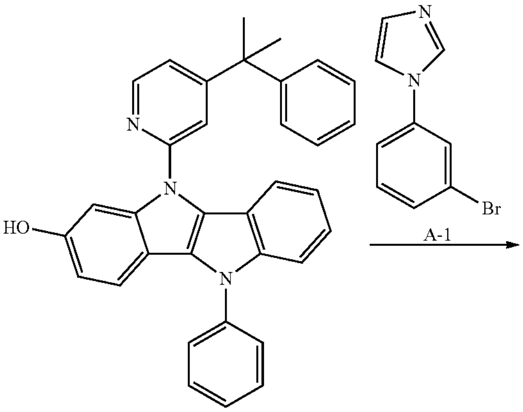
18-2
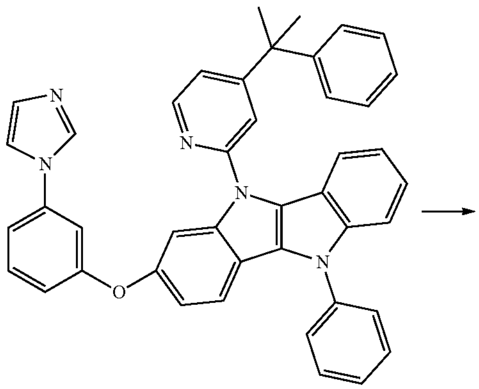
18-3
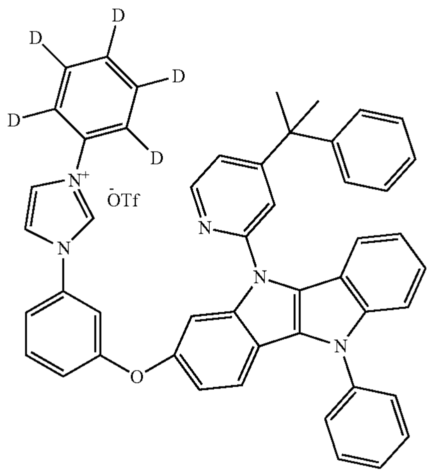
18-4

-continued

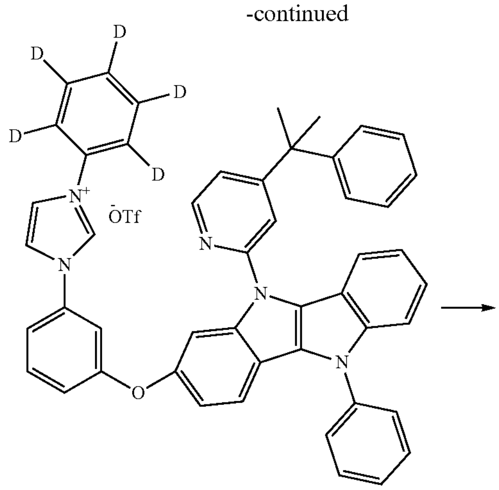

18-4

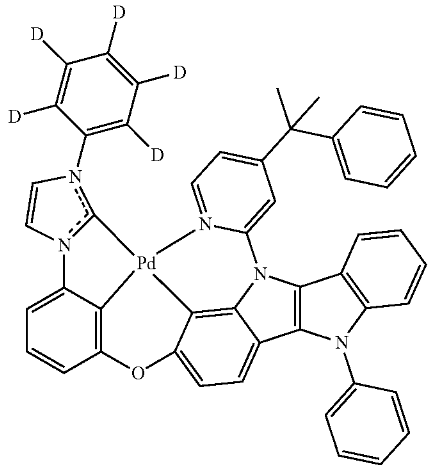

18

Synthesis of Intermediate 18-1

Intermediate [18-1] was obtained in substantially the same manner as in the synthesis of Intermediate [6-4], except that Intermediate [A-2] was utilized instead of 2-bromo-4(tert-butyl)pyridine.

Synthesis of Intermediate 18-2

Intermediate [18-2] was obtained in substantially the same manner as in the synthesis of Intermediate [6-5], except that Intermediate [18-1] was utilized instead of Intermediate [6-4].

Synthesis of Intermediate 18-3

Intermediate [18-3] was obtained in substantially the same manner as in the synthesis of Intermediate [6-6], except that Intermediate [18-2] was utilized instead of Intermediate [6-5].

Synthesis of Intermediate 18-4

Intermediate [18-3] (6.36 g, 10 mmol) and deuterated diphenyliodanium (20 mmol) were suspended in toluene. The reaction mixture was warmed and stirred at 110° C. for 24 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [18-4] (6.16 g, 7.1 mmol).

Synthesis of Compound 18

Compound 18 (1.72 g, 2.1 mmol) was obtained in substantially the same manner as in the synthesis of Compound 6, except that Intermediate [18-4] was utilized instead of Intermediate [6-8].

(3) Synthesis of Organometallic Compound 35

Organometallic Compound 35 according to an embodiment may be synthesized by, for example, a process of Reaction Formula 3.

Reaction Formula 3

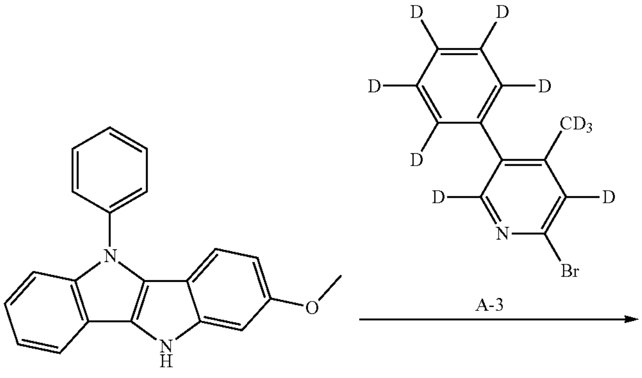

A-3

6-3

-continued
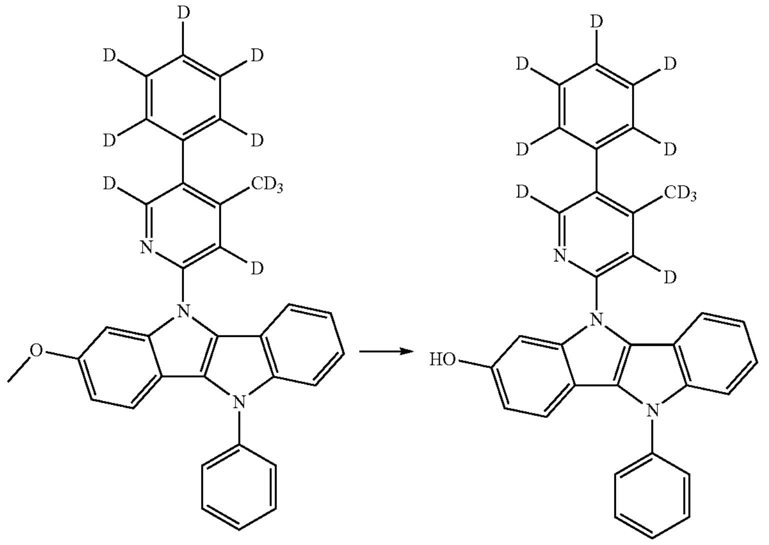
35-1 35-2
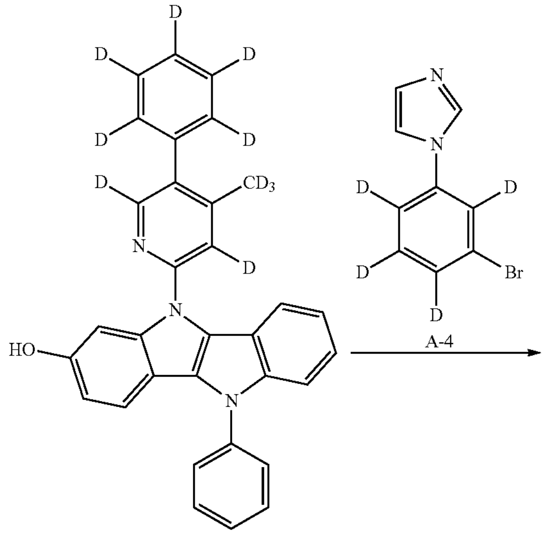
35-2
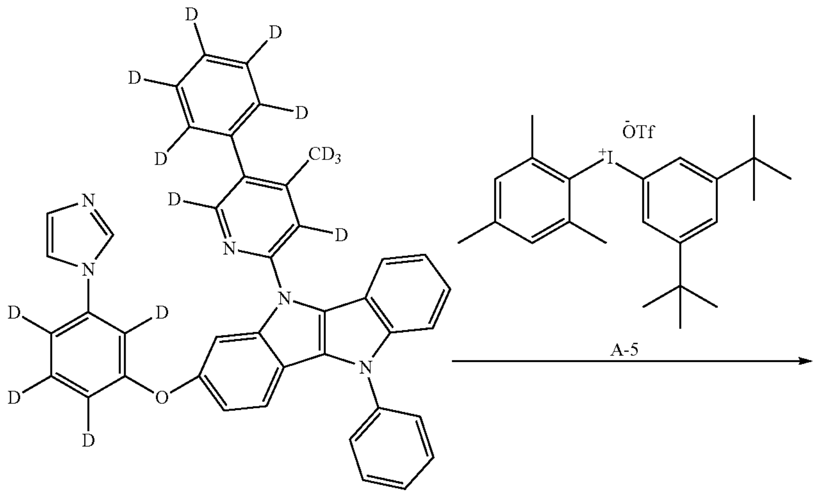
35-3

-continued

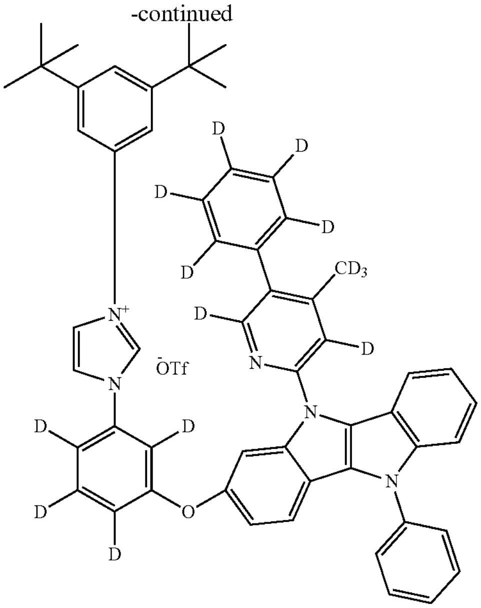

35-4

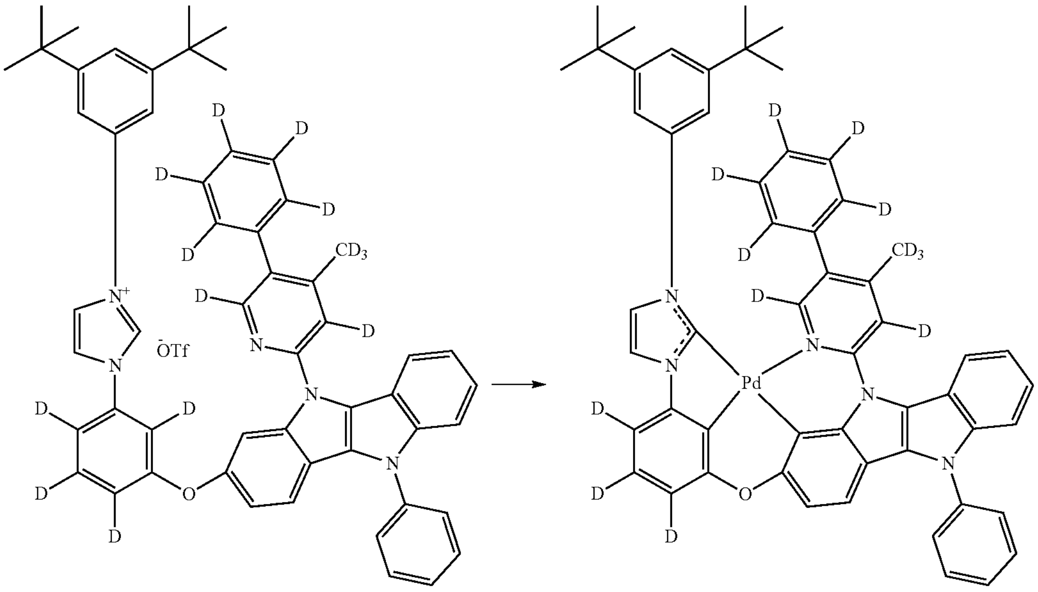

35-4 35

Synthesis of Intermediate 35-1

Intermediate [35-1] was obtained in substantially the same manner as in the synthesis of Intermediate [6-4], except that Intermediate [A-3] was utilized instead of 2-bromo-4(tert-butyl)pyridine.

Synthesis of Intermediate 35-2

Intermediate [35-1] (4.89 g, 10 mmol) was dissolved in dichloromethane, and stirred at 0° C. Boron tribromide was added dropwise thereto, and the mixture was stirred at room temperature for 2 hours. Distilled water (50 mL) was added thereto, and then the resultant mixture was extracted with dichloromethane. The extracted organic layer was washed with a saturated aqueous sodium chloride solution and dried over sodium sulfate. The residue left after removing the solvent was separated utilizing column chromatography to obtain Intermediate [35-2] (4.37 g, 9.2 mmol).

Synthesis of Intermediate 35-3

Intermediate [35-3] was obtained in substantially the same manner as in the synthesis of Intermediate [6-6], except that Intermediate [35-2] was utilized instead of Intermediate [6-5] and Intermediate [A-4] was utilized instead of Intermediate [A-1].

Synthesis of Intermediate 35-4

Intermediate [35-3] (6.2 g, 10 mmol), Intermediate [A-5] (8.8 g, 15 mmol), and $Cu(OAc)_2$ (0.18 g, 1.0 mmol) were added to dimethylsulfoxide, and the reaction mixture was warmed and stirred at 150° C. for 12 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [35-4] (5.9 g, 6.1 mmol).

Synthesis of Compound 35

Compound 35 (1.74 g, 1.9 mmol) was obtained in substantially the same manner as in the synthesis of Compound 6, except that Intermediate [35-4] was utilized instead of Intermediate [6-8].

(4) Synthesis of Organometallic Compound 50

Organometallic Compound 50 according to an embodiment may be synthesized by, for example, a process of Reaction Formula 4.

Reaction Formula 4

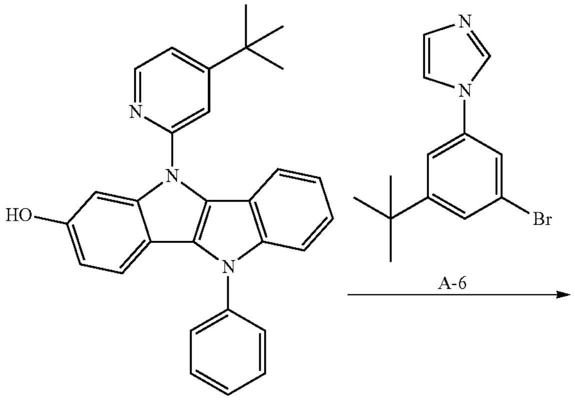

6-5

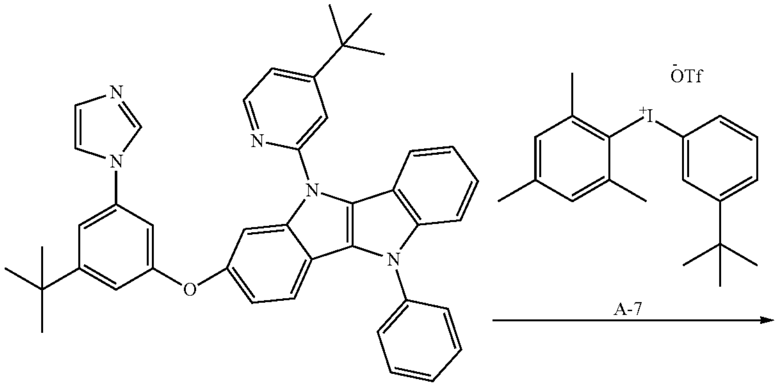

50-1

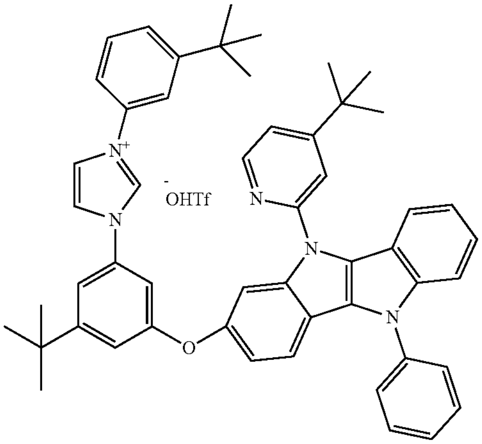

50-2

-continued

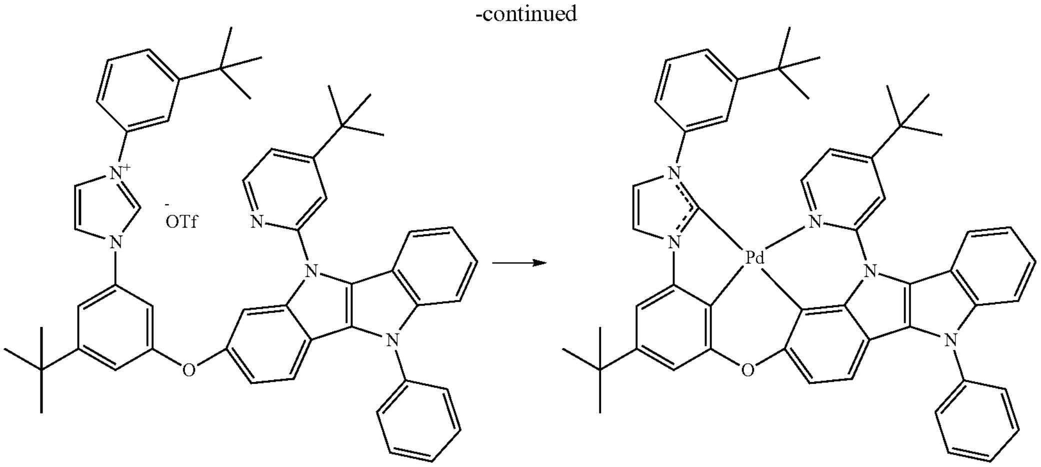

50-2

50

Synthesis of Intermediate 50-1

Intermediate [50-1] was obtained in substantially the same manner as in the synthesis of Intermediate [6-6], except that Intermediate [A-6] was utilized instead of Intermediate [A-1].

Synthesis of Intermediate 50-2

Intermediate [50-2] was obtained in substantially the same manner as in the synthesis of Intermediate [35-4], except that Intermediate [50-1] was utilized instead of Intermediate [35-3] and Intermediate [A-7] was utilized instead of Intermediate [A-5].

Synthesis of Compound 50

Compound 50 (2.69 g, 3.1 mmol) was obtained in substantially the same manner as in the synthesis of Compound 6, except that Intermediate [50-2] was utilized instead of Intermediate [6-8].

(5) Synthesis of Organometallic Compound 84

Organometallic Compound 84 according to an embodiment may be synthesized by, for example, a process of Reaction Formula 5.

Reaction Formula 5

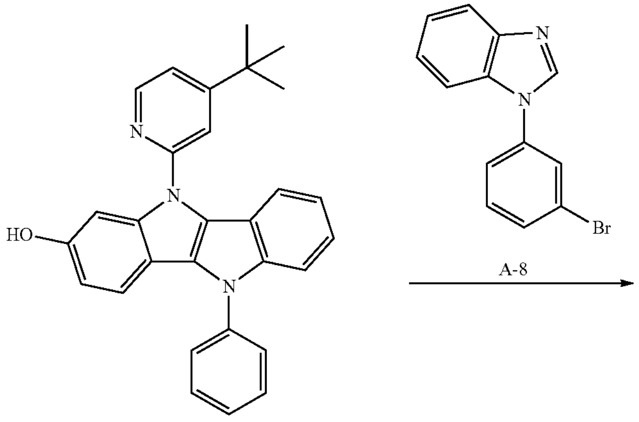

6-5

-continued
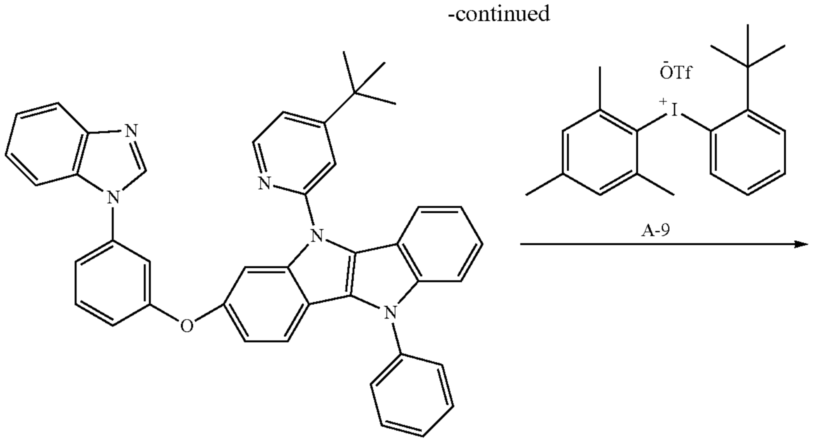
84-1
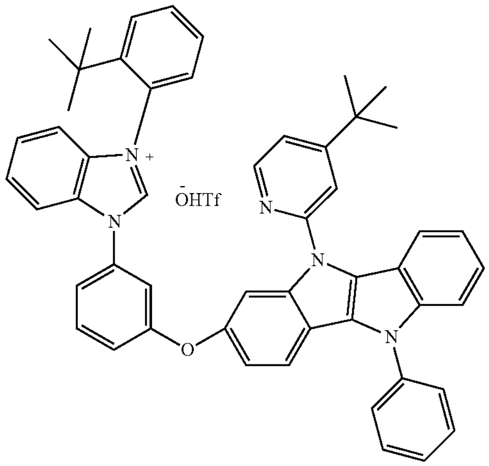
84-2
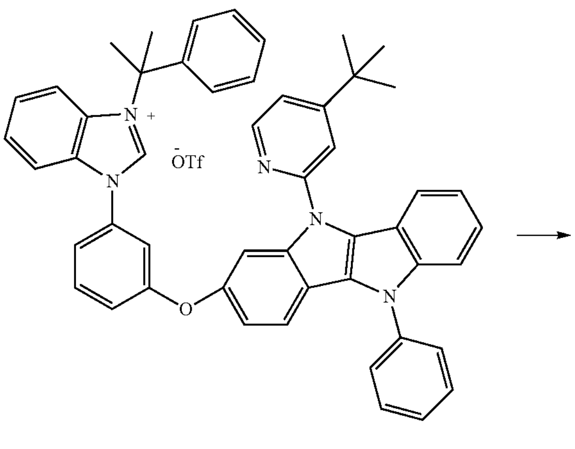
84-2

-continued

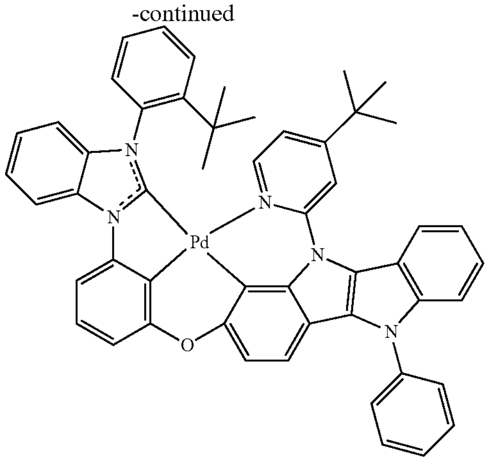

84

Synthesis of Intermediate 84-1

Intermediate [84-1] was obtained in substantially the same manner as in the synthesis of Intermediate [6-6], except that Intermediate [A-8] was utilized instead of Intermediate [A-i].

Synthesis of Intermediate 84-2

Intermediate [84-2] was obtained in substantially the same manner as in the synthesis of Intermediate [35-4], except that Intermediate [84-1] was utilized instead of Intermediate [35-3] and Intermediate [A-9] was utilized instead of Intermediate [A-5].

Synthesis of Compound 84

Compound 84 (1.55 g, 1.8 mmol) was obtained in substantially the same manner as in the synthesis of Compound 6, except that Intermediate [84-2] was utilized instead of Intermediate [6-8].

(6) Synthesis of Organometallic Compound 93

Organometallic Compound 93 according to an embodiment may be synthesized by, for example, a process of Reaction Formula 6.

Reaction Formula 6

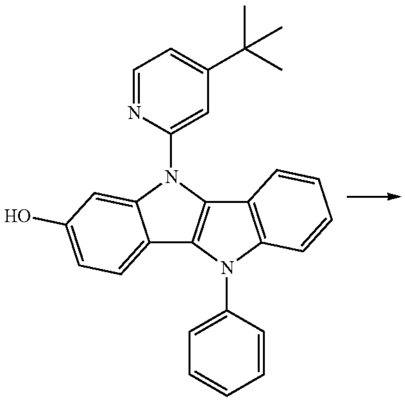

6-5

-continued
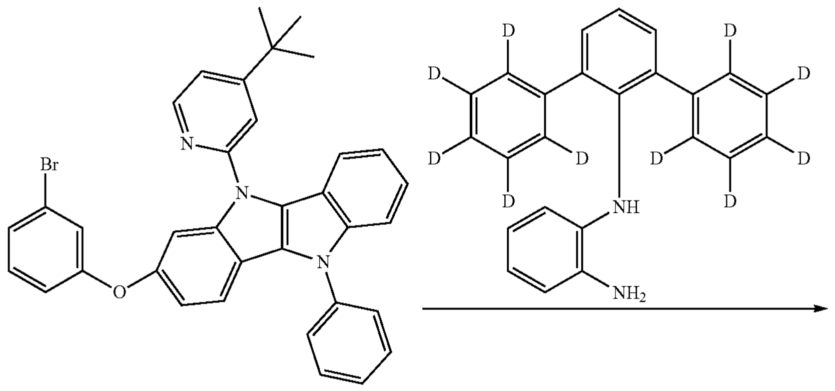
93-1
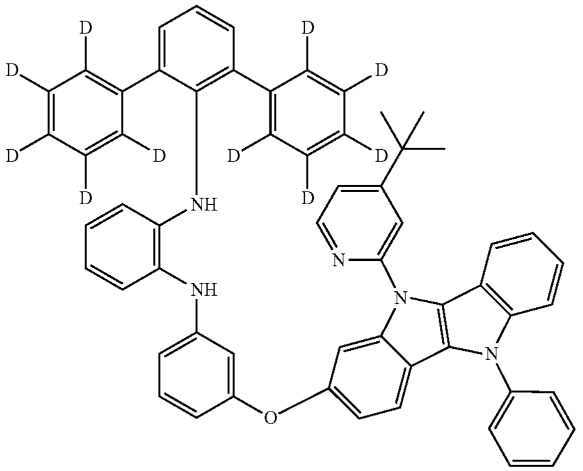
93-2
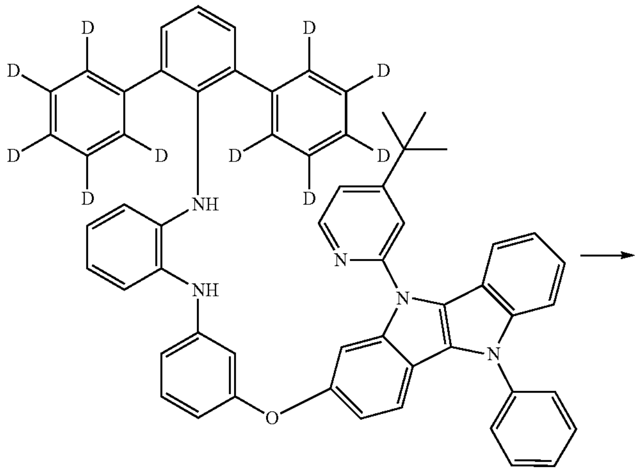
93-2

-continued
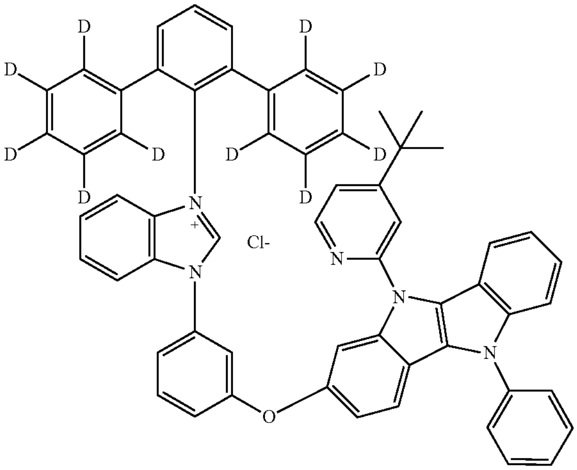
93-3
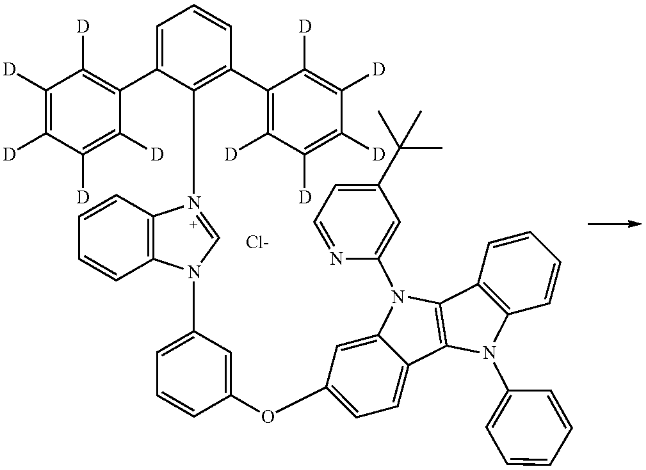
93-3
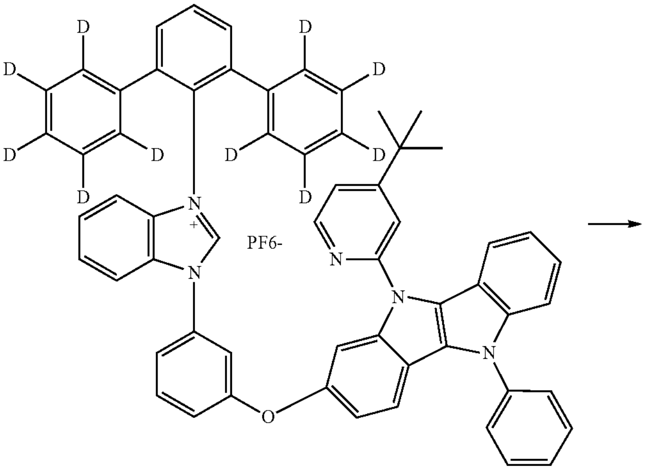
93-4

-continued

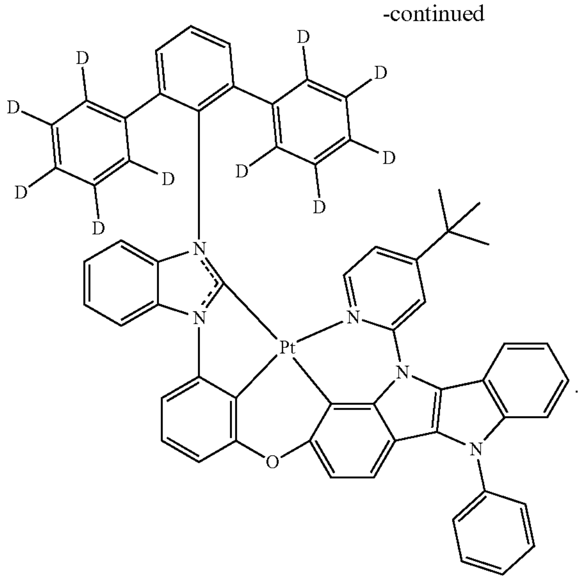

93

<Synthesis of Intermediate 93-1>

Intermediate [6-5] (3.9 g, 9 mmol), 1,3-dibromophenyl (3.2 g, 13.5 mmol), tripotassium phosphate (4.2 g, 18 mmol), CuI (0.33 g, 0.18 mmol), and picolinic acid (0.02 g, 0.18 mmol) were put into a reaction vessel and suspended in dimethyl sulfoxide (40 mL). The reaction mixture was warmed and stirred at 160° C. for 20 hours. After completion of the reaction, the mixture was cooled to room temperature, distilled water (100 mL) was added thereto, and then the resultant mixture was extracted with ethyl acetate. The extracted organic layer was washed with a saturated aqueous sodium chloride solution and dried over sodium sulfate. The residue left after removing the solvent was separated utilizing column chromatography to obtain Intermediate [93-1] (4.0 g, 6.8 mmol).

Synthesis of Intermediate 93-2

Intermediate [93-1] (4.0 g, 6.8 mmol) and N1-([1,1':3',1"-terphenyl]-2'-nyl-2,2",3,3", 4,4",5,5",6,6"-d10)benzene-$d_4$-1,2-diamine (2.4 g, 6.8 mmol), SPhos (0.51 mmol), $Pd_2(dba)_3$ (0.34 mmol), and sodium t-butoxide (13.6 mmol) were suspended in a toluene solvent (100 mL), and then at a temperature raised to 110° C., the mixture was stirred for 4 hours. After completion of the reaction, the solvent was removed under reduced pressure, and the mixture was extracted with methylene chloride and distilled water. The extracted organic layer was washed with a saturated aqueous sodium chloride solution and dried over sodium sulfate. The residue left after removing the solvent was separated utilizing column chromatography to obtain Intermediate [93-2] (5.0 g, 5.9 mmol).

Synthesis of Intermediate 93-3

Intermediate [93-2] (5.0 g, 5.9 mmol) was dissolved in triethyl orthoformate (200 mmol), and HCl (7.1 mmol) was added dropwise thereto. The reaction mixture was stirred for 20 hours at a temperature raised to 80° C. After completion of the reaction, the solvent was removed under reduced pressure, and the mixture was extracted with methylene chloride and distilled water. The extracted organic layer was washed with a saturated aqueous sodium chloride solution and dried over sodium sulfate. The residue left after removing the solvent was separated utilizing column chromatography to obtain Intermediate [93-3] (4.3 g, 4.8 mmol).

Synthesis of Intermediate 93-4

Intermediate [93-3] (4.3 g, 4.8 mmol) and ammonium hexafluorophosphate (2.4 g, 14.4 mmol) were put into a reaction vessel and suspended in a mixed solution of methyl alcohol (160 mL) and water (40 mL). The reaction mixture was stirred at room temperature for 4 hours. After completion of the reaction, the resulting solid was filtered and washed with ether. The washed solid was dried to obtain a target compound (4.6 g, 4.6 mmol).

Synthesis of Compound 93

Compound 93 (1.6 g, 1.6 mmol) was obtained in substantially the same manner as in the synthesis of Compound 6, except that Intermediate [93-4] was utilized instead of Intermediate [6-8].

(7) Synthesis of Organometallic Compound 113

Organometallic Compound 113 according to an embodiment may be synthesized by, for example, a process of Reaction Formula 7.

Reaction Formula 7
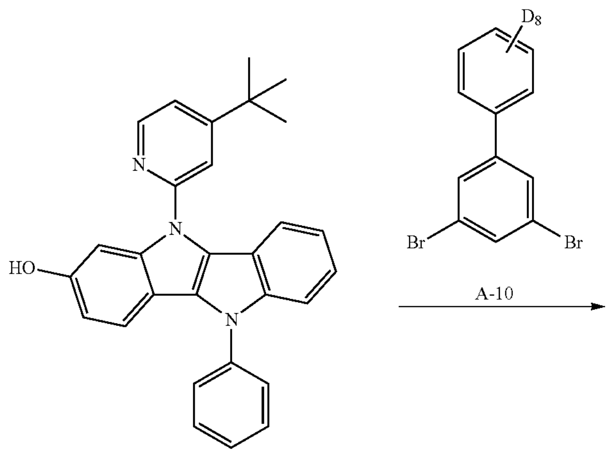
6-5
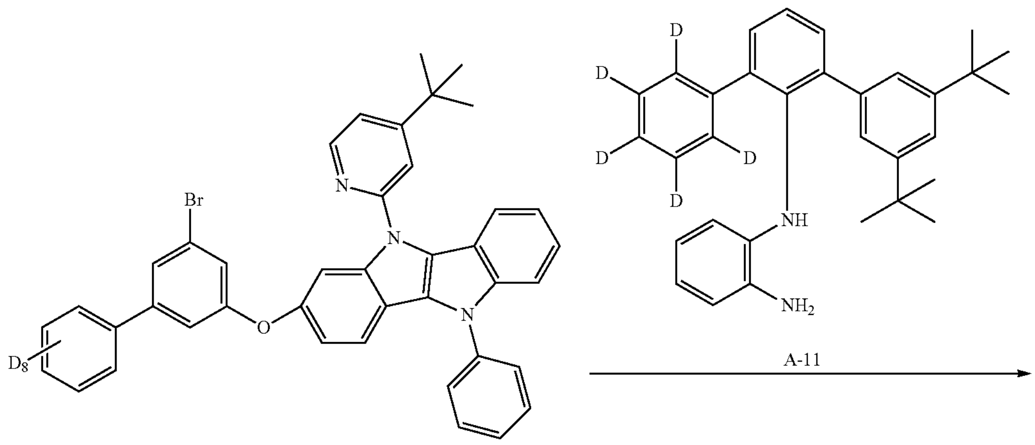
113-1
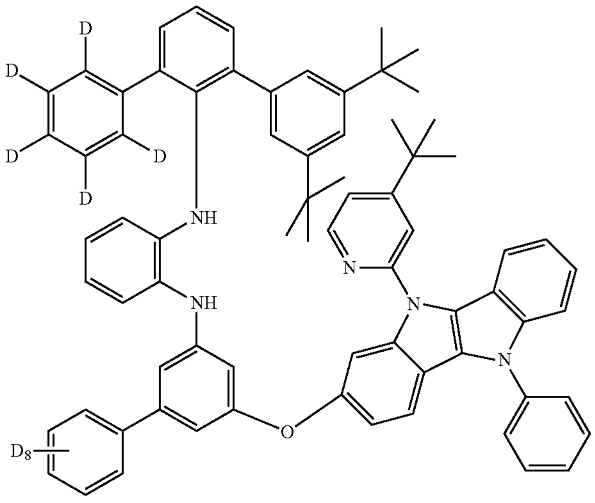
113-2

-continued
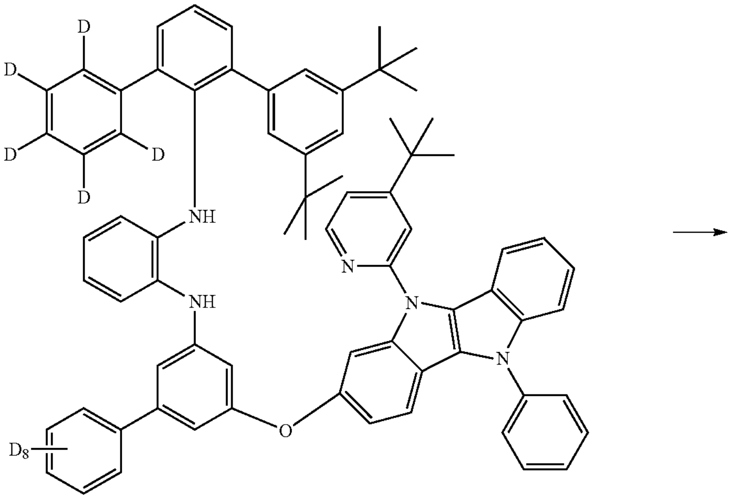
113-2
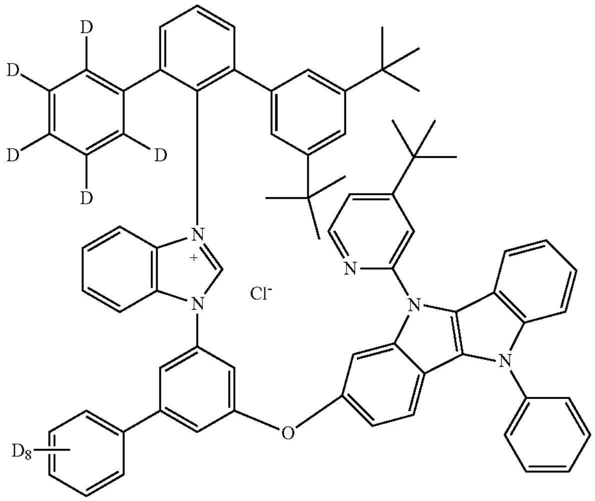
113-3
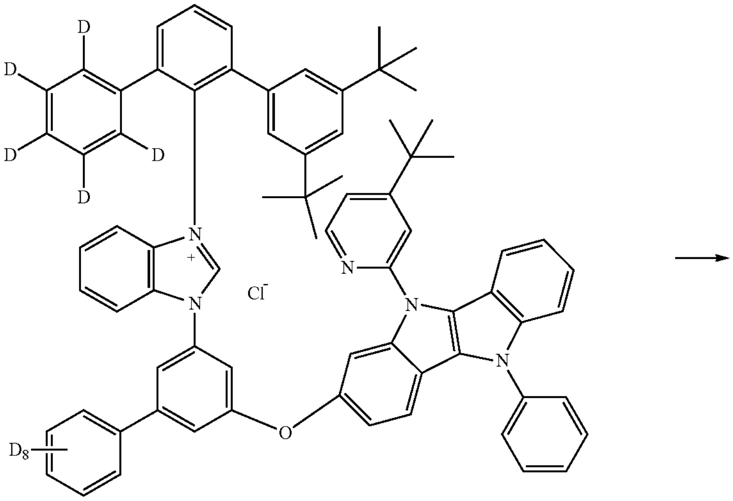
113-3

-continued

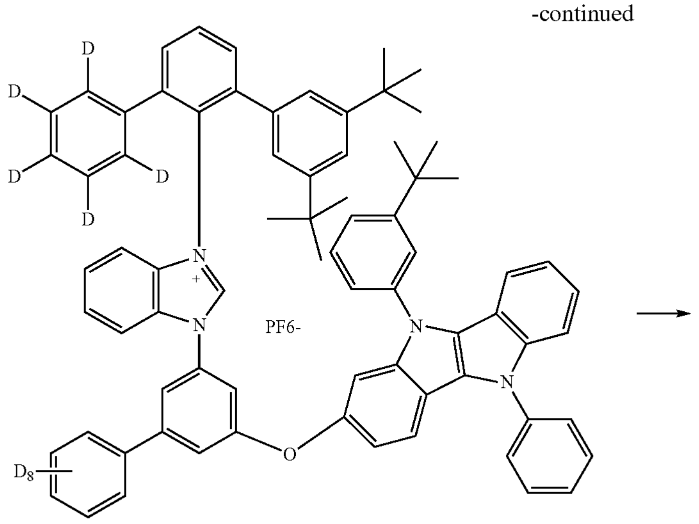

113-4

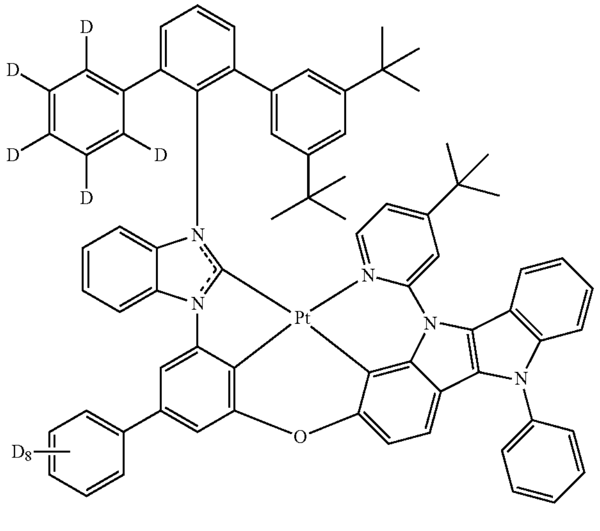

113

Synthesis of Intermediate 113-1

Intermediate [113-1] was obtained in substantially the same manner as in the synthesis of Intermediate [93-1], except that Intermediate [A-10] was utilized instead of 1,3-dibromophenyl.

Synthesis of Intermediate 113-2

Intermediate [113-2] was obtained in substantially the same manner as in the synthesis of Intermediate [93-2], except that Intermediate [113-1] was utilized instead of Intermediate [93-1] and Intermediate [A-11] was utilized instead of N1-([1,1':3',1"-terphenyl]-2'-yl-2,2",3,3",4,4",5,5",6,6"-$d_{10}$)benzene-$d_4$-1,2-diamine.

Synthesis of Intermediate 113-3

Intermediate [113-3] was obtained in substantially the same manner as in the synthesis of Intermediate [93-3], except that Intermediate [113-2] was utilized instead of Intermediate [93-2].

Synthesis of Intermediate 113-4

Intermediate [113-4] was obtained in substantially the same manner as in the synthesis of Intermediate [93-4], except that Intermediate [113-3] was utilized instead of Intermediate [93-3].

Synthesis of Compound 113

Compound 113 (3.6 g, 2.9 mmol) was obtained in substantially the same manner as in the synthesis of Compound 6, except that Intermediate [113-4] was utilized instead of Intermediate [6-8].

$^1$H NMR and MS/FAB of the compounds synthesized in the above synthesis examples are shown in Table 1. With reference to the above synthesis processes and raw materials, compounds other than those shown in Table 1 may also be easily recognized by those skilled in the art.

TABLE 1

| Compound No. | $^1$H NMR ($CDCl_3$, 400 MHz) | MS/FAB found | MS/FAB calc. |
|---|---|---|---|
| 6 | δ 8.74-8.72(m, 2H), 8.64(d, 1H), 7.94-7.93(m, 1H), 7.62-7.58(m, 3H), 7.50-7.49(m, 3H), 7.41-7.40(m, 2H), 7.35-7.32(m, 2H), 7.06(t, 1H), 6.69(d, 1H), 6.52-6.49(m, 3H), 1.32(s, 9H) | 694.1750 | 694.1752 |
| 18 | δ 8.74-8.73(m, 2H), 8.39(d, 1H), 7.94-7.93(m, 1H), 7.62-7.52(m, 5H), 7.36-7.24(m, 9H), 7.06(t, 1H), 6.69(d, 1H), 6.52(d, 1H), 6.46(d, 1H), 5.43(s, 2H), 1.69(s, 6H) | 820.2189 | 820.2190 |
| 35 | δ 8.73(d, 1H), 8.39(d, 1H), 7.94(d, 1H), 7.61-7.55(m, 5H), 7.35-7.32(m, 2H), 6.91(m, 1H), 6.82(s, 2H), 6.69(d, 1H), 5.43(s, 2H), 1.42(s, 18H) | 912.3630 | 912.3631 |
| 50 | δ 8.74-8.73(m, 2H), 8.39(d, 1H), 7.94-7.93(m, 1H), 7.62-7.52(m, 5H), 7.40-7.32(m, 4H), 7.03-7.02(m, 2H), 6.87(m, 1H), 6.73-6.70(m, 2H), 6.50-6.49(m, 1H), 6.38(d, 1H), 5.43(s, 2H), 1.35(s, 9H), 1.31 (s, 9H), 1.27(s, 9H) | 865.2975 | 865.2972 |
| 84 | δ 8.74-8.73(m, 2H), 8.39(d, 1H), 7.94-7.93(m, 1H), 7.62-7.52(m, 5H), 7.40-7.33(m, 4H), 7.20-7.10(m, 7H), 6.95-6.91 (m, 3H), 6.69-6.66(m, 2H), 1.38(s, 9H), 1.33(s, 9H) | 859.2501 | 859.2502 |
| 93 | δ 8.74-8.73(m, 2H), 8.39(d, 1H), 8.20(d, 2H), 7.94-7.93(m, 1H), 7.62-7.52(m, 5H), 7.40-7.33(m, 5H), 7.17-7.14(m, 3H), 6.95-6.90(m, 3H), 6.69-6.66(m, 2H), 1.33(s, 9H) | 1054.3745 | 1054.3743 |
| 113 | δ 8.74-8.73(m, 2H), 8.39(d, 1H), 8.20(d, 2H), 7.94-7.93(m, 1H), 7.73(s, 2H), 7.62-7.52(m, 6H), 7.40-7.33(m, 5H), 7.14(dd, 2H), 6.99-6.95(m, 4H), 6.69(d, 1H), 1.36(s, 18H), 1.33(s, 9H) | 1242.5310 | 1242.5308 |

2. Preparation and Evaluation of Light Emitting Elements
(1) Preparation of Light Emitting Elements Light emitting elements containing organometallic compounds according to an embodiment or Comparative Example compounds were prepared through a process described in more detail below. Light emitting elements of Examples 1 to 7 were prepared respectively utilizing organometallic compounds according to an embodiment, 6, 18, 35, 50, 84, 93, and 113 as a dopant material of an emission layer. Light emitting elements of Comparative Examples 1 to 3 were prepared respectively utilizing Comparative Example Compounds CX1 to CX3 as a dopant material of an emission layer.

In order to form a first electrode, an ITO glass substrate (Corning, 15 Ω/cm$^2$, 1200 Å) was cut to a size of about 50 mm×50 mm×0.7 mm, subjected to ultrasonic cleaning utilizing isopropyl alcohol and pure water for 5 minutes respectively and ultraviolet irradiation for 30 minutes, and then exposed to ozone for cleaning to form the glass substrate in a vacuum deposition apparatus. As a hole injection layer, 2-TNATA was vacuum deposited to be 600 Å thick on an upper portion of the glass substrate, and then as a hole transporting compound, 4,4'-bis[N-(1-naphthyl)-N-phenyl aminobiphenyl (NPB) was vacuum deposited to be 300 Å thick to form a hole transport layer.

On an upper portion of the hole transport layer, a host and a dopant were deposited at a weight ratio of 9:1 to form an emission layer EML having a thickness of 400 Å. As for a host, HT33 and ETH66 were co-deposited as a mixed host at a weight ratio of 3:7.

Thereafter, ETH2 was vacuum deposited to be 50 Å thick to form a hole blocking layer. As an electron transport layer, Alq3 was deposited to be 300 Å thick on the hole blocking layer, and then LiF, which is a halogenated alkali metal, was deposited to be 10 Å thick as an electron injection layer. Al was vacuum deposited to be 3000 Å thick to form a LiF/Al electrode, thereby preparing a light emitting element.

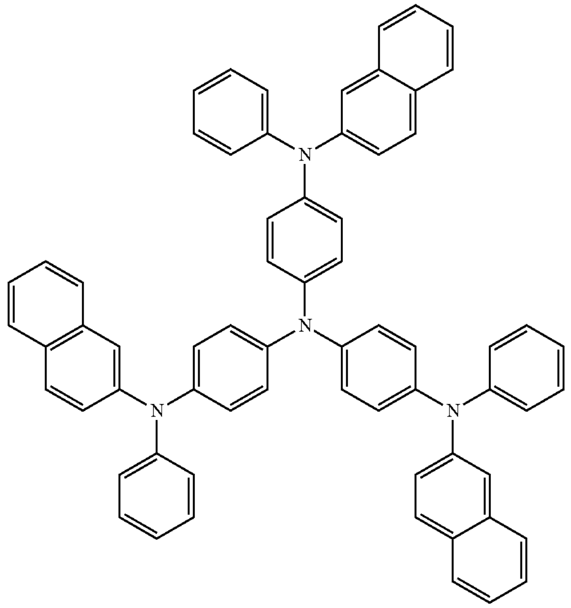

2-TNATA

-continued
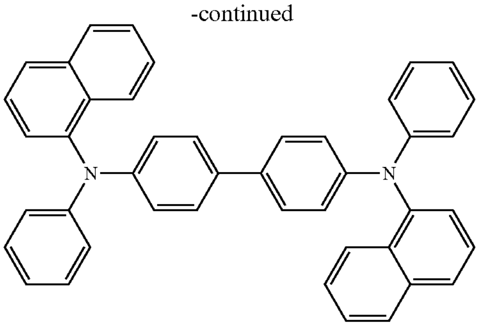
NPB
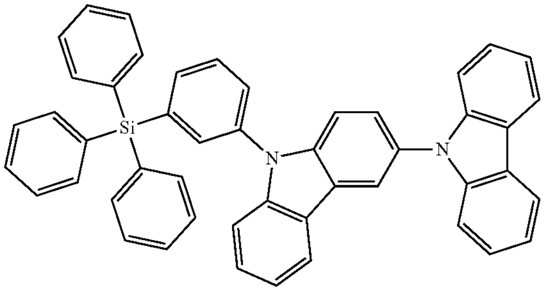
HT33
-continued
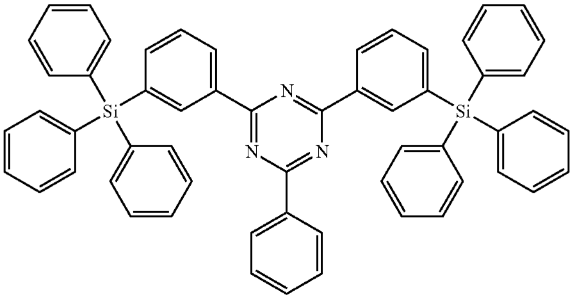
ETH2
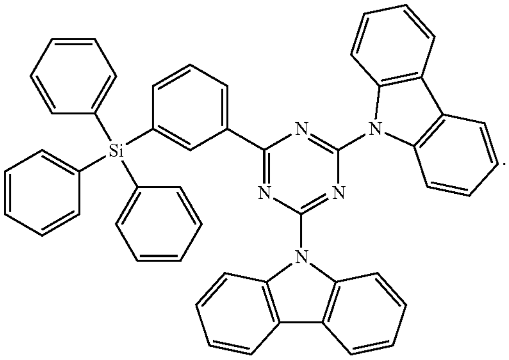
ETH66
Example Compounds utilized in Examples 1 to 7 and Comparative Example Compounds utilized in Comparative Examples 1 to 3 are shown in Table 2.
TABLE 2
| | |
|---|---|
| 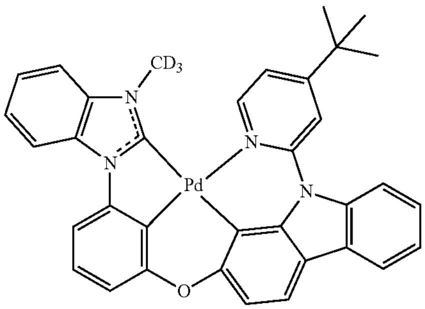 CX1 | Comparative Example Compound CX1 |
| 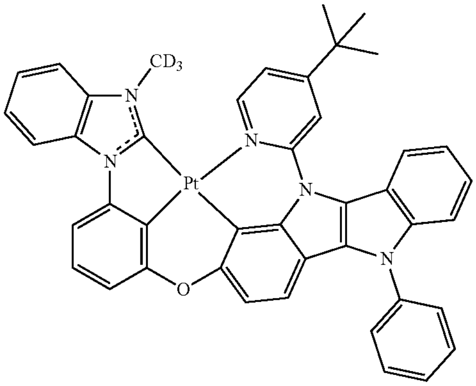 CX2 | Comparative Example Compound CX2 |

TABLE 2-continued
Comparative Example Compound CX3
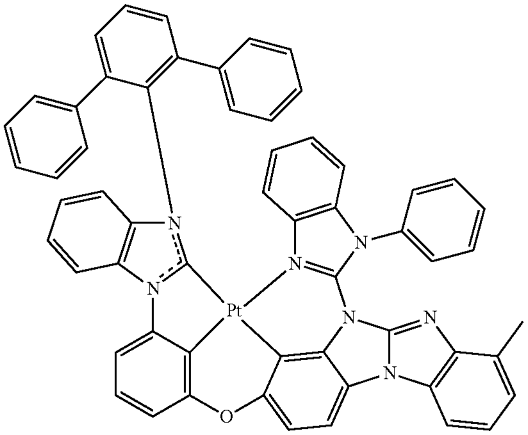
CX3
Compound 6
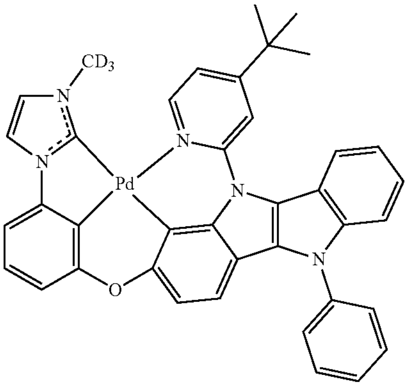
6
Compound 18
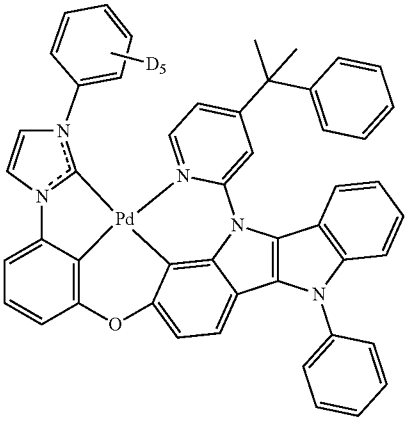
18

TABLE 2-continued
Compound 35
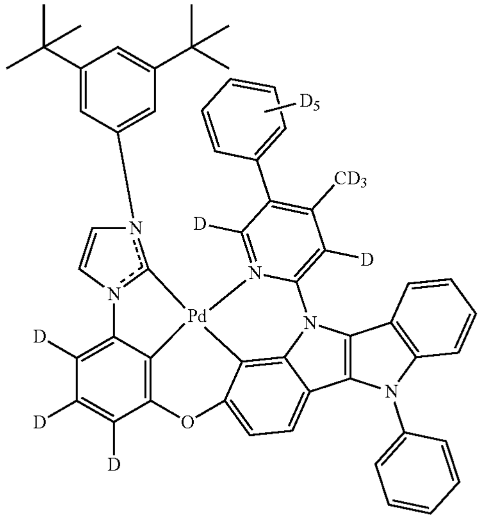
35
Compound 50
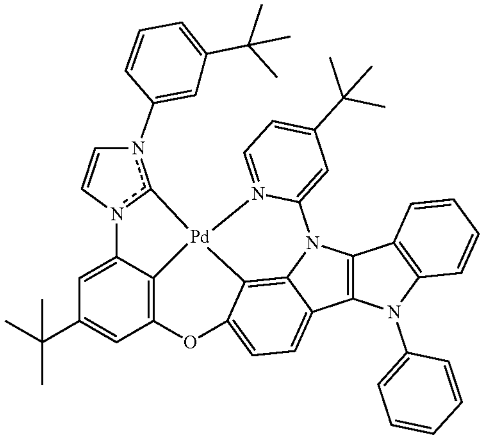
50
Compound 84
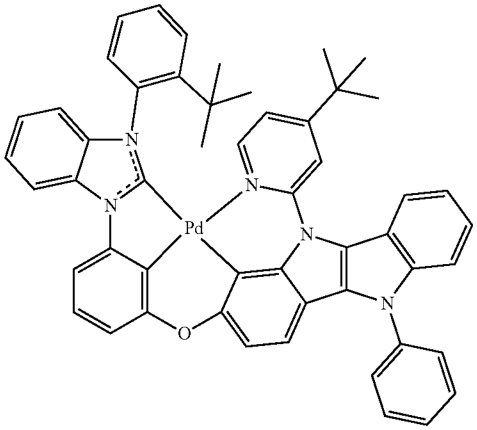
84

TABLE 2-continued

Compound 93

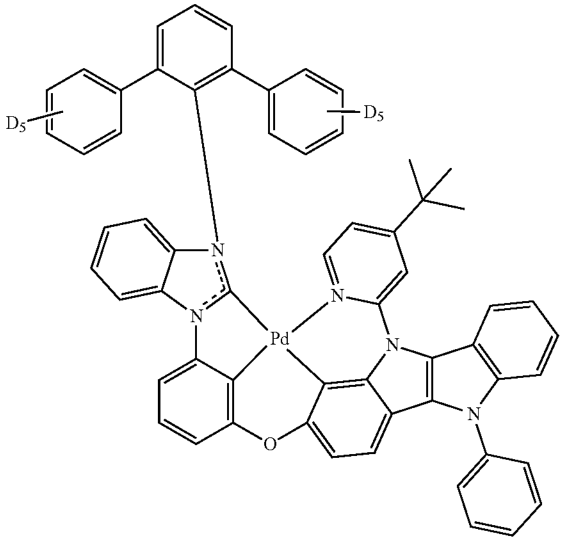

93

Compound 113

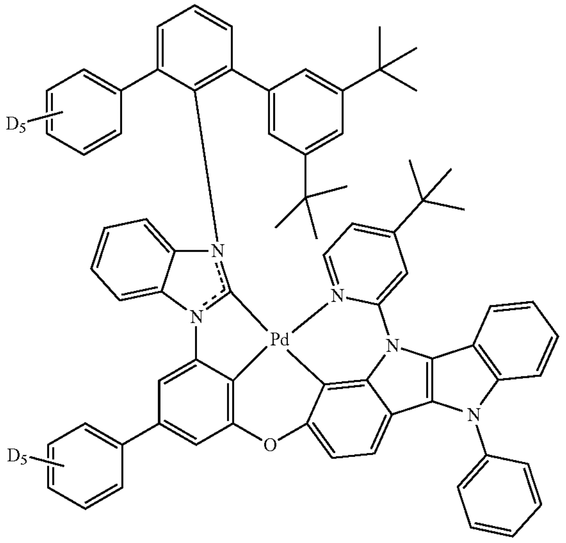

113

(2) Characteristics Evaluation of Light Emitting Elements

Table 3 shows results after the evaluation of driving voltage, colorimetric system of CIE, efficiency, color conversion efficiency, maximum emission wavelength, and lifetime (195) in each of the light emitting elements of Examples and Comparative Examples. The driving voltage, the colorimetric system of CIE, the efficiency, the maximum emission wavelength, and the lifetime (195) are evaluated at a luminance of 1000 cd/$m^2$. The maximum emission wavelength shows wavelength indicating the maximum value in the emission spectrum, the lifetime (195) shows the time taken to decrease to 95% of the initial luminance, and the color conversion efficiency is measured by dividing efficiency by a value of y of the CIE colorimetric system.

TABLE 3

| Example of element preparation | Emission layer (Dopant) | Luminance (cd/$m^2$) | Driving voltage (V) | CIE(x, y) | Efficiency (cd/A) | Color conversion efficiency (cd/A/y) | Maximum emission wavelength (nm) | Lifespan (T95, hr) |
|---|---|---|---|---|---|---|---|---|
| Example 1 | Compound 6 | 1000 | 4.0 | (0.14, 0.14) | 12.5 | 88.5 | 445 | 31 |
| Example 2 | Compound 18 | 1000 | 4.1 | (0.14, 0.15) | 15.9 | 105.1 | 448 | 53 |
| Example 3 | Compound 35 | 1000 | 4.1 | (0.14, 0.15) | 17.1 | 112.6 | 450 | 61 |
| Example 4 | Compound 50 | 1000 | 4.3 | (0.14, 0.16) | 15.1 | 94.8 | 452 | 69 |
| Example 5 | Compound 84 | 1000 | 4.2 | (0.14, 0.16) | 17.5 | 108.2 | 453 | 83 |

TABLE 3-continued

| Example of element preparation | Emission layer (Dopant) | Luminance ($cd/m^2$) | Driving voltage (V) | CIE(x, y) | Efficiency (cd/A) | Color conversion efficiency (cd/A/y) | Maximum emission wavelength (nm) | Lifespan (T95, hr) |
|---|---|---|---|---|---|---|---|---|
| Example 6 | Compound 93 | 1000 | 4.1 | (0.14, 0.16) | 18.6 | 115.4 | 453 | 105 |
| Example 7 | Compound 113 | 1000 | 4.2 | (0.14, 0.17) | 18.3 | 107.1 | 456 | 123 |
| Comparative Example 1 | Comparative Example Compound CX1 | 1000 | 4.8 | (0.15, 0.12) | 7.5 | 61.3 | 423 | 10 |
| Comparative Example 2 | Comparative Example Compound CX2 | 1000 | 4.5 | (0.15, 0.39) | 30.1 | 77.1 | 492 | 20 |
| Comparative Example 3 | Comparative Example Compound CX3 | 1000 | 4.5 | (0.14, 0.12) | 7.1 | 65.2 | 442 | 10 |

Referring to Table 3, it is seen that, compared to the light emitting elements of Comparative Examples 1 to 3, the light emitting elements of Examples 1 to 7 had reduced driving voltage, and increased efficiency and lifespan. It is seen that, compared to the light emitting element of Comparative Example 2, the light emitting elements of Examples 1 to 7 had reduced driving voltage and increased lifespan. It is seen that, in the light emitting elements of Examples 1 to 7, a value of x from the CIE colorimetric system is 0.14 and a value of y from the CIE colorimetric system is 0.14 to 0.17. Compared with the light emitting elements of Comparative Examples 1 to 3, it is confirmed that the light emitting elements of Examples 1 to 7 show excellent or suitable color conversion efficiency, and accomplish both (e.g., simultaneously) increased efficiency and color purity. It is seen that the light emitting elements of Examples 1 to 7 may have a maximum emission wavelength in a wavelength range of about 440 nm to about 475 nm.

The light emitting elements of Examples 1 to 7 include Compounds 6, 18, 35, 50, 84, 93, and 113, and Compounds 6, 18, 35, 50, 84, 93, and 113 contain Pd as a central metal, and a carbene imidazole group, a pyridine group, a phenyl group, and an indolo[3,2-b]indole group as tetradentate ligands. Compounds 6, 18, 35, 50, 84, 93, and 113 are organometallic compounds according to an embodiment. Accordingly, the light emitting element including the organometallic compound according to an embodiment may have reduced driving voltage, emit light having increased color purity, and exhibit high efficiency and long lifespan.

The light emitting element of Comparative Example 1 includes Comparative Example Compound CX1. Comparative Example Compound CX1 contains Pd as a central metal, and a carbene imidazole group, a pyridine group, a phenyl group, and a carbazole group as tetradentate ligands. Comparative Example Compound CX1 does not include an indolo[3,2-b]indole group, and thus it is believed that the light emitting element of Comparative Example 1 has short lifespan and low efficiency.

The light emitting element of Comparative Example 2 includes Comparative Example Compound CX2. Comparative Example Compound CX2 contains Pd as a central metal, and a carbene imidazole group, a pyridine group, a phenyl group, and an indolo[3,2-b]indole group as tetradentate ligands. It is seen that the light emitting element of Comparative Example 2 including Comparative Example Compound CX2 shows a maximum emission wavelength in a wavelength of 492 nm, which is a value exceeding a wavelength of 475 nm. Comparative Example Compound CX2 contains a central metal and ligands different from those of the organometallic compound according to an embodiment, and thus it is believed that the light emitting element of Comparative Example 2 including Comparative Example Compound CX2 exhibits short lifespan.

The light emitting element of Comparative Example 3 includes Comparative Example Compound CX3. Comparative Example Compound CX3 contains Pd as a central metal, and a carbene imidazole group, a benzo imidazole group, a phenyl group, and a group in which two benzoimidazoles are fused as tetradentate ligands. It is seen that the light emitting element of Comparative Example 3 including Comparative Example Compound CX3 shows low efficiency. Comparative Example Compound CX3 contains a central metal and ligands different from those of the organometallic compound according to an embodiment, and thus it is believed that the light emitting element of Comparative Example 3 including Comparative Example Compound CX3 exhibits short lifespan and low efficiency.

A light emitting element according to an embodiment may include a first electrode, a second electrode on the first electrode, and an emission layer. The emission layer may include an organometallic compound according to an embodiment. The organometallic compound of an embodiment may include Pd as a central metal, and may include a carbene imidazole group, a pyridine group, a phenyl group, and an indolo[3,2-b]indole group as four ligands. Accordingly, the organometallic compound according to an embodiment may exhibit excellent or suitable material stability. The light emitting element including the organometallic compound according to an embodiment may exhibit high efficiency and long lifespan. In some embodiments, the light emitting element including the organometallic compound according to an embodiment may have reduced driving voltage and emit light having increased color purity.

A light emitting element according to an embodiment includes an organometallic compound according to an embodiment, and may thus have reduced driving voltage and emit light having increased color purity, and exhibit high efficiency and long lifespan.

An organometallic compound according to an embodiment may contribute to a reduction in driving voltage and an increase in efficiency and lifespan.

The use of "may" when describing embodiments of the present disclosure refers to "one or more embodiments of the present disclosure."

As used herein, the term "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this disclosure is intended to include all higher numerical limitations subsumed therein. Accordingly, Applicant reserves the right to amend this disclosure, including the claims, to expressly recite any sub-range subsumed within the ranges expressly recited herein.

The light emitting device or any other relevant devices or components according to embodiments of the present disclosure described herein may be implemented utilizing any suitable hardware, firmware (e.g., an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Although the embodiments of the present disclosure have been described, it is understood that the present disclosure should not be limited to these embodiments, but one or more suitable changes and modifications can be made by one ordinary skilled in the art within the spirit and scope of the present disclosure as defined by the following claims and equivalents thereof.

What is claimed is:

1. A light emitting element comprising:

a first electrode;

a second electrode on the first electrode; and an emission layer between the first electrode and the second electrode, and comprising an organometallic compound represented by Formula 1:

Formula 1

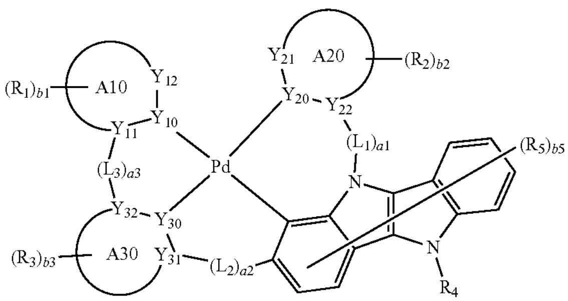

wherein in Formula 1, $Y_{10}$ to $Y_{12}$, $Y_{20}$ to $Y_{22}$, and $Y_{30}$ to $Y_{32}$ are each independently C or N, ring groups A10 to A30 are each independently a substituted or unsubstituted hydrocarbon ring group having 5 to 60 ring-forming carbon atoms, a substituted or unsubstituted aryl group having 6 to 60 ring-forming carbon atoms, or a substituted or unsubstituted heterocyclic group having 2 to 60 ring-forming carbon atoms, a1 to a3 are each independently an integer from 0 to 3, $L_1$ to $L_3$ are each independently a direct linkage, O, S, $—C(R_{a11})(R_{a12})—$, $—C(R_{a13})=$, $—C(R_{a14})=C(R_{a15})—$, $—C≡C—$, $—C(=O)—$, $—C(=S)—$, $—B(R_{a16})—$, $—N(R_{a17})—$, $—P(R_{a18})—$, $—Si(R_{a19})(R_{a20})—$, or $—Ge(R_{a21})(R_{a22})—$, b1 to b3 are each independently an integer from 0 to 8, b5 is an integer from 0 to 6, and $R_1$ to $R_5$ and $R_{a11}$ to $R_{a22}$ are each independently a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring.

2. The light emitting element of claim 1, wherein Formula 1 is represented by Formula 2:

Formula 2

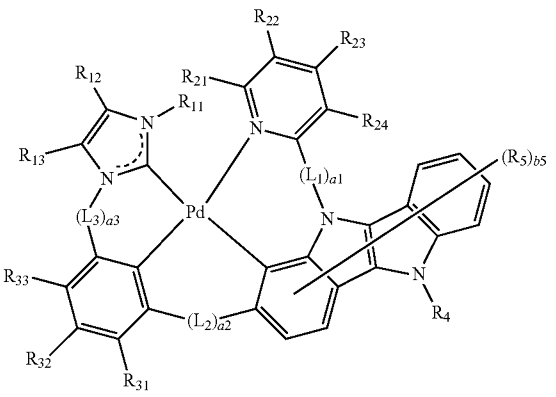

wherein in Formula 2, $R_{11}$ to $R_{13}$, $R_{21}$ to $R_{24}$, and $R_{31}$ to $R_{33}$ are each independently a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring, and a1 to a3, $L_1$ to $L_3$, b5, $R_4$, and $R_5$ are the same as defined in Formula 1.

3. The light emitting element of claim 2, wherein Formula 2 is represented by Formula 3:

Formula 3

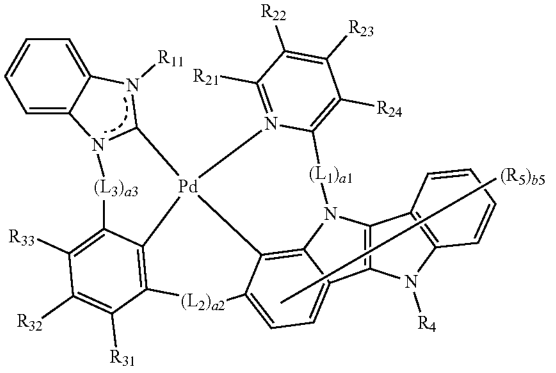

wherein in Formula 3, a1 to a3, $L_1$ to $L_3$, b5, $R_4$, $R_5$, $R_{11}$, $R_{21}$ to $R_{24}$, and $R_{31}$ to $R_{33}$ are the same as defined in Formula 2.

4. The light emitting element of claim 1, wherein in Formula 1, $L_1$ and $L_3$ are each independently a direct linkage, and $L_2$ is O.

5. The light emitting element of claim 1, wherein in Formula 1, $R_1$ to $R_5$ are each independently a hydrogen atom, a deuterium atom, a dimethylamine group, a trimethylsilyl group, a substituted or unsubstituted methyl group, a substituted or unsubstituted isopropyl group, a substituted or unsubstituted i-butyl group, a substituted or unsubstituted t-butyl group, or a substituted or unsubstituted phenyl group.

6. The light emitting element of claim 1, wherein in Formula 1, $R_1$ to $R_5$ are each independently represented by any one selected from among R-1 to R-10:

R-1

$*-CH_3$

R-2

$*-CD_3$

R-3

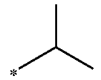

R-4

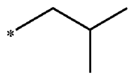

R-5

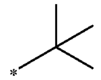

R-6

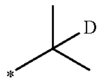

R-7

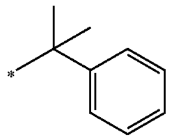

R-8

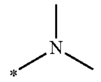

R-9

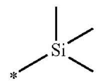

R-10

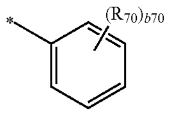

wherein in R-2 and R-6,

D is a deuterium atom, wherein in R-10, b70 is an integer from 0 to 5, and $R_{70}$ is a hydrogen atom, a deuterium atom, a substituted or unsubstituted alkyl group having 1 to 10 carbon atoms, or a substituted or unsubstituted aryl group having 6 to 30 ring-forming carbon atoms.

7. The light emitting element of claim 1, wherein in Formula 1, one or more of $R_1$ to $R_5$ comprise a deuterium atom or a substituent containing a deuterium atom.

8. The light emitting element of claim 1, wherein the emission layer comprises a hole transporting host, an electron transporting host, and a dopant, the dopant containing the organometallic compound.

9. The light emitting element of claim 8, wherein the hole transporting host comprises a compound represented by Formula HT-1, and the electron transporting host comprises a compound represented by Formula ET-1:

Formula HT-1

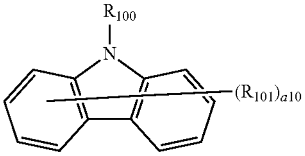

wherein in Formula HT-1, a10 is an integer from 0 to 8, and $R_{100}$ and $R_{101}$ are each independently a hydrogen atom, a deuterium atom, a substituted or unsubstituted aryl group having 6 to 60 ring-forming carbon atoms, or a substituted or unsubstituted heteroaryl group having 2 to 60 ring-forming carbon atoms;

Formula ET-1

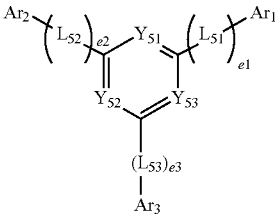

wherein in Formula ET-1, one or more of $Y_{51}$ to $Y_{53}$ is N and the $Y_{51}$ to $Y_{53}$ that are not N are each independently $CR_a$, $R_a$ is a hydrogen atom, a deuterium atom, a substituted or unsubstituted alkyl group having 1 to 20 carbon atoms, a substituted or unsubstituted aryl group having 6 to 60 ring-forming carbon atoms, or a substituted or unsubstituted heteroaryl group having 2 to 60 ring-forming carbon atoms, e1 to e3 are each independently an integer from 0 to 10, $L_{51}$ to $L_{53}$ are each independently a direct linkage, a substituted or unsubstituted arylene group having 6 to 30 ring-forming carbon atoms, or a substituted or unsubstituted heteroarylene group having 2 to 30 ring-forming carbon atoms, and $Ar_1$ to $Ar_3$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

10. The light emitting element of claim 8, wherein the dopant further comprises a delayed fluorescent compound.

11. The light emitting element of claim 1, wherein the organometallic compound is represented by any one selected from among compounds of Compound Group 1:

Compound Group 1

1

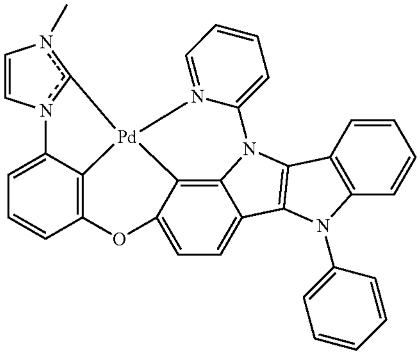

2

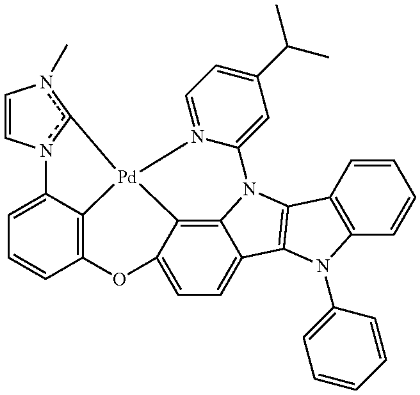

3

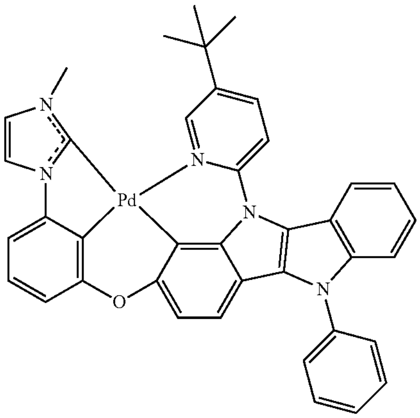

4

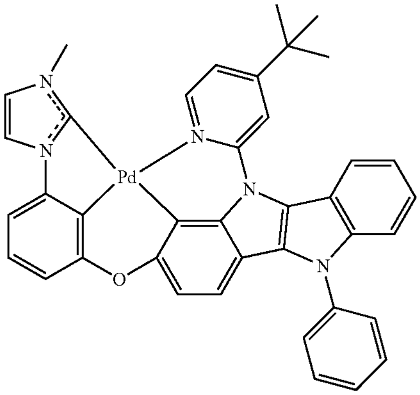

-continued
5
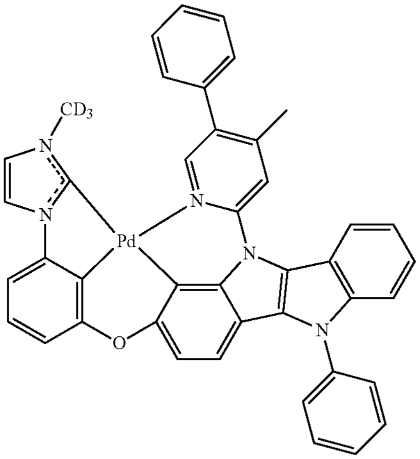
6
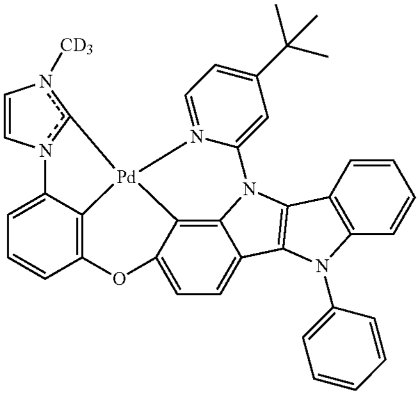
7
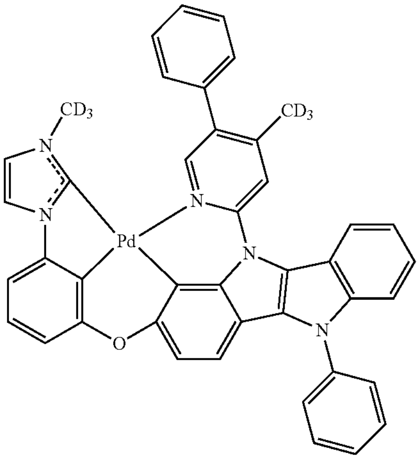
-continued
8
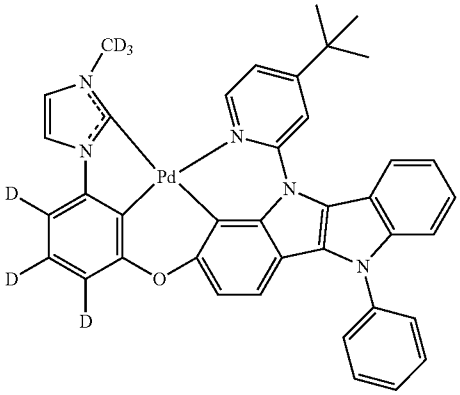
9
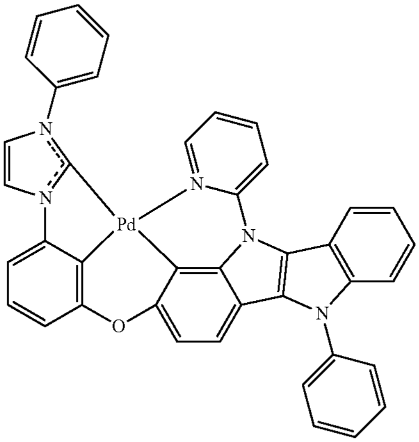
10
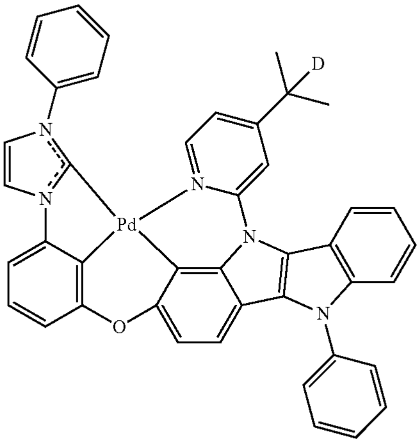

-continued
11
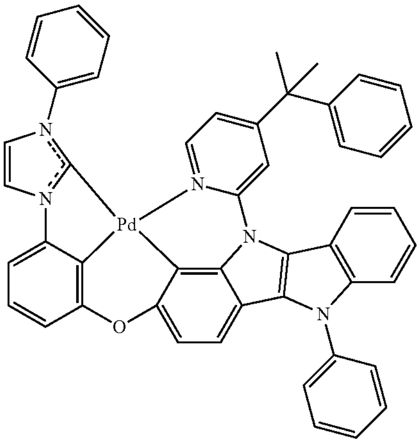
12
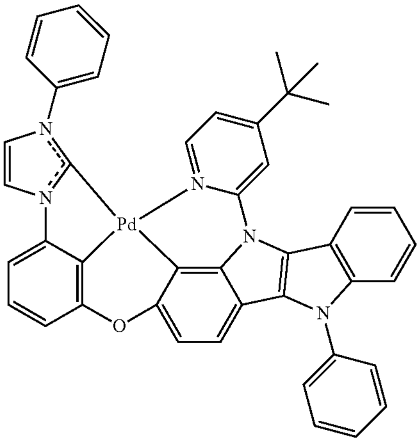
13
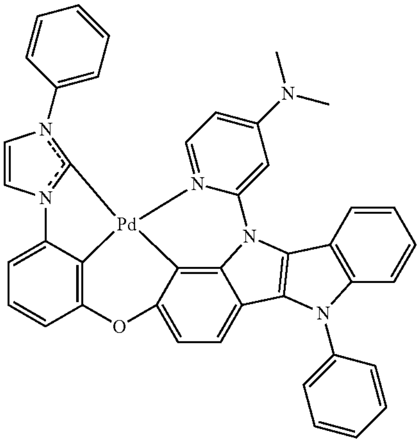
-continued
14
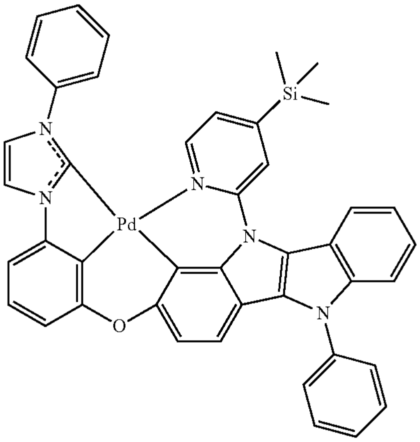
15
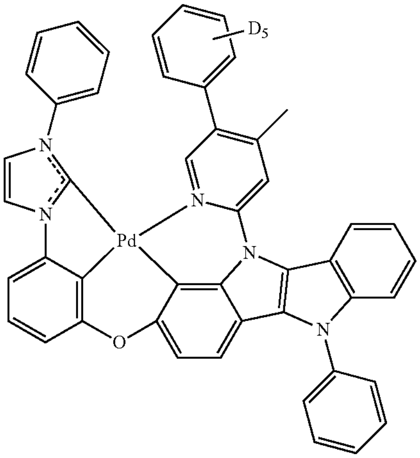
16
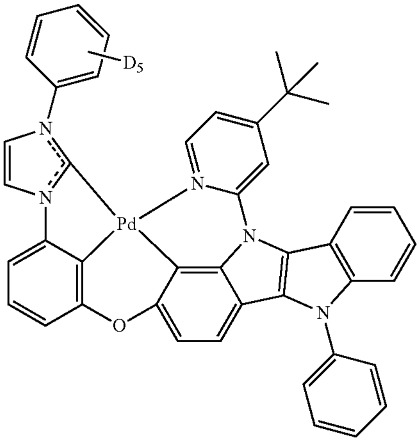

-continued
17
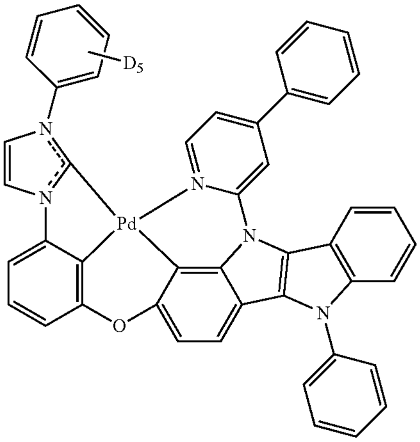
18
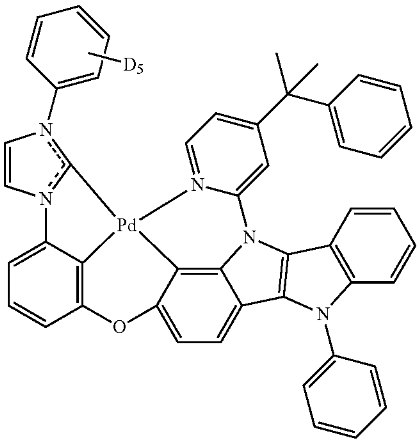
19
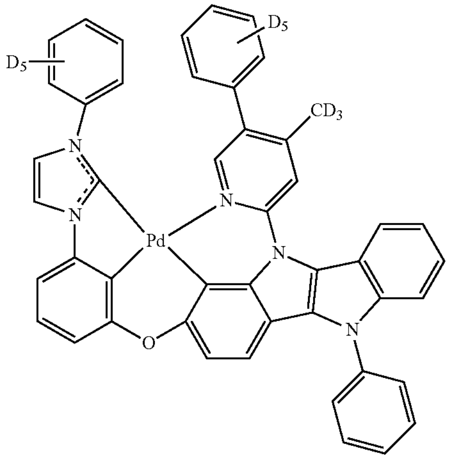
-continued
20
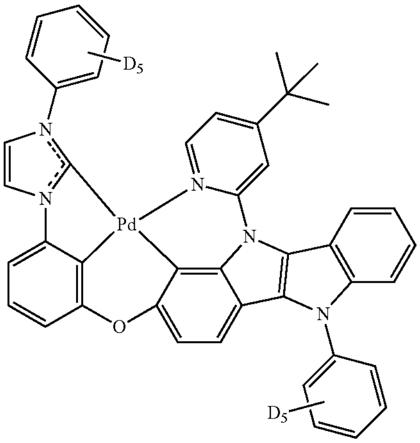
21
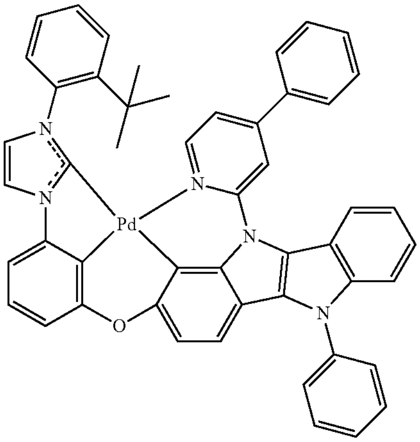
22
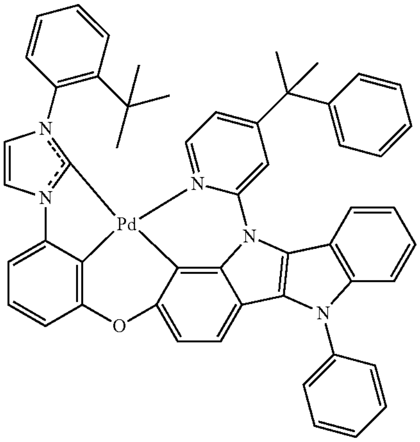

-continued
23
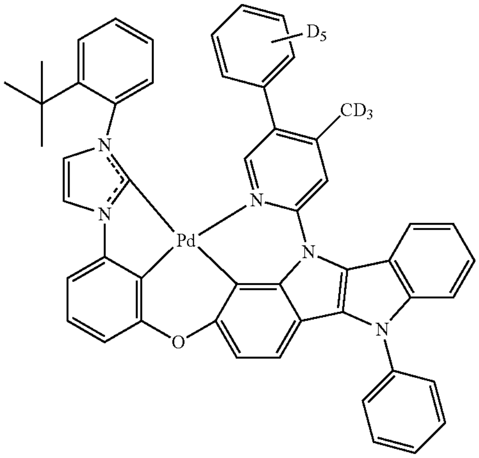
24
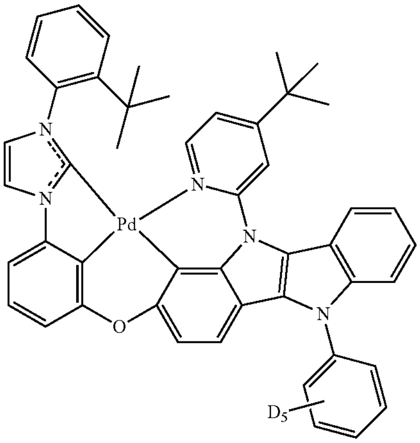
25
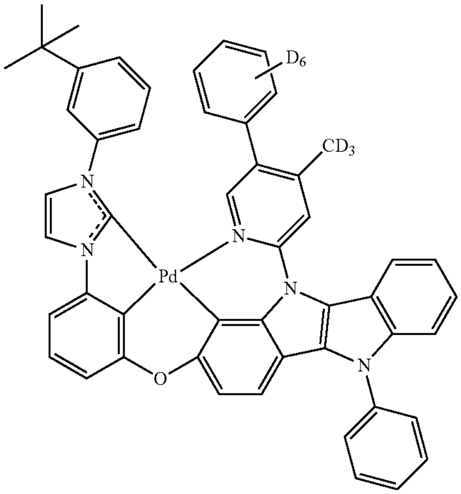
-continued
26
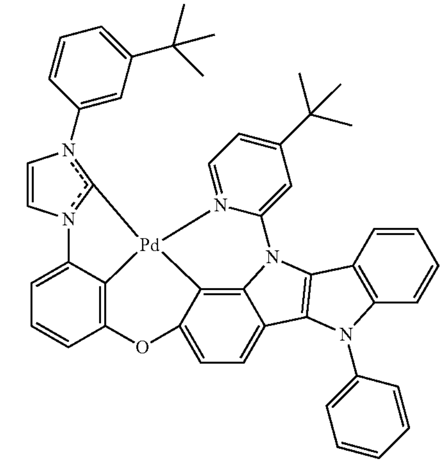
27
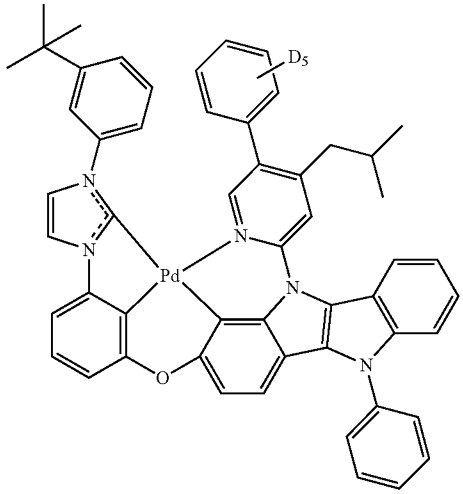
28
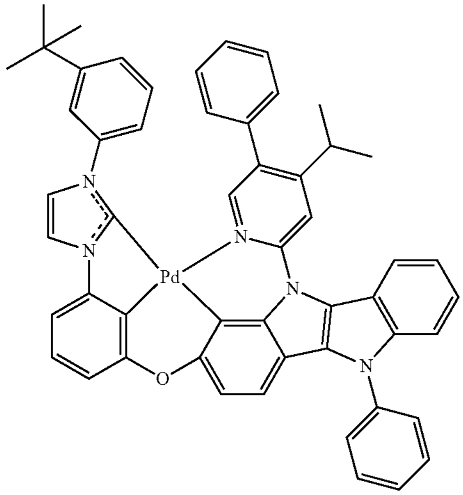

-continued
29
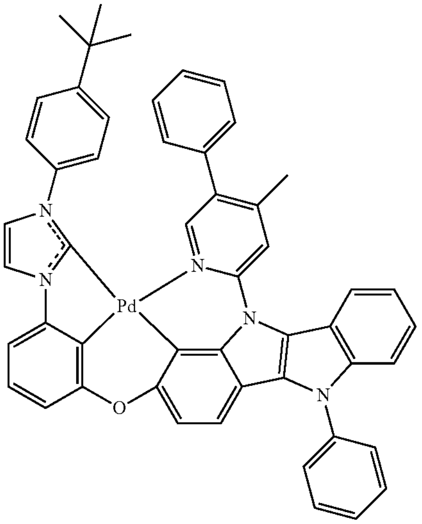
30
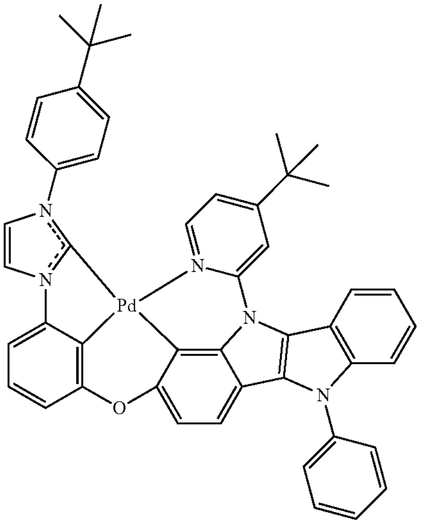
31
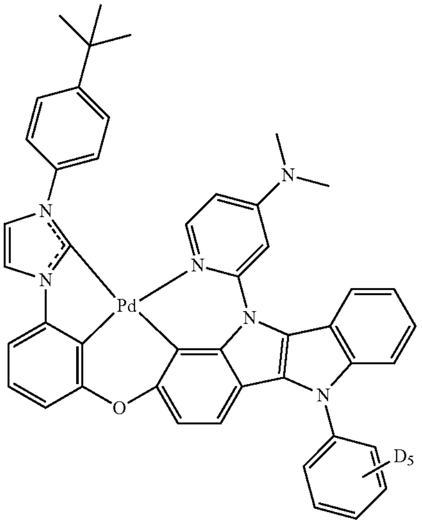
-continued
32
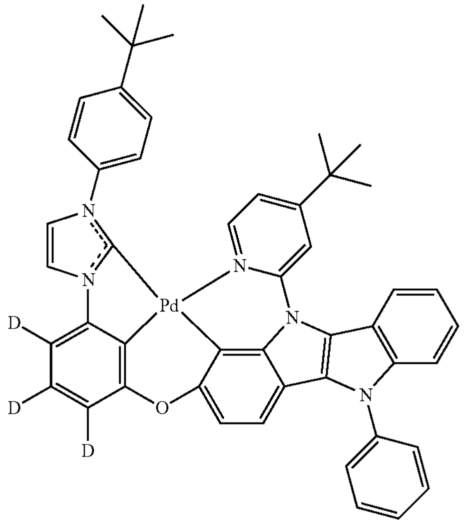
33
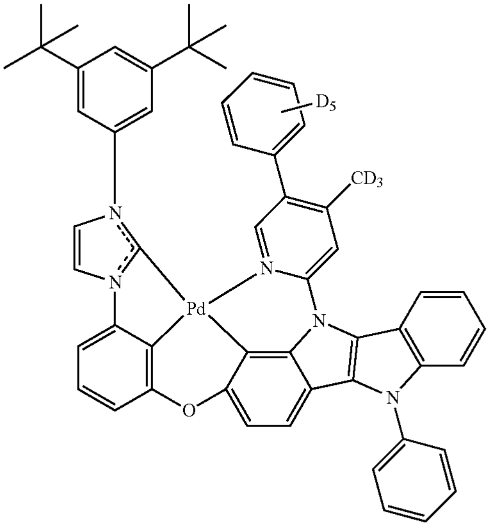
34
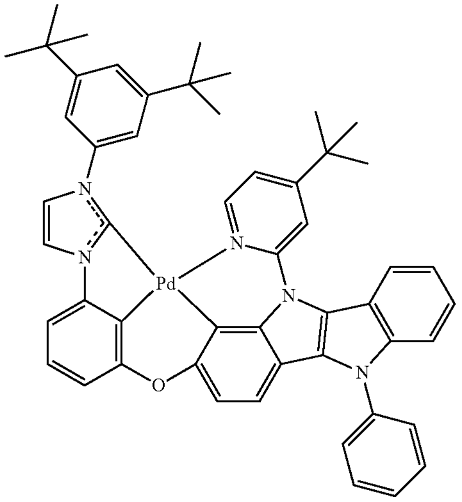

-continued
35
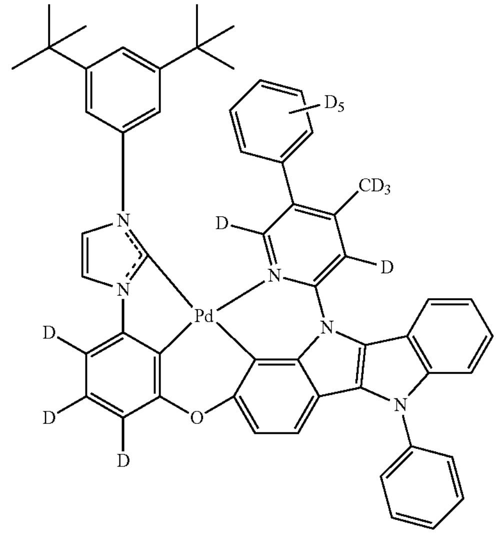
36
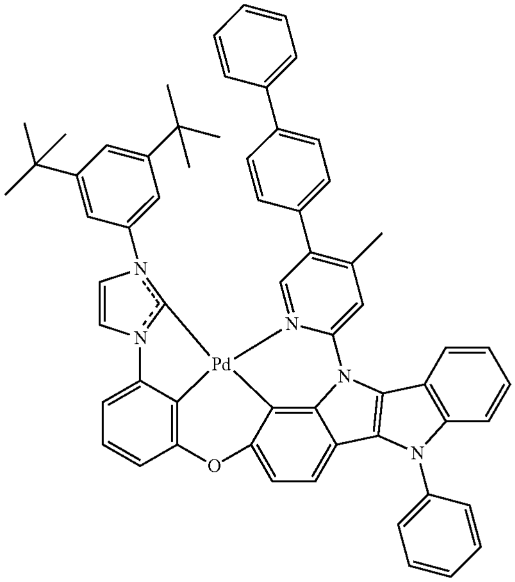
37
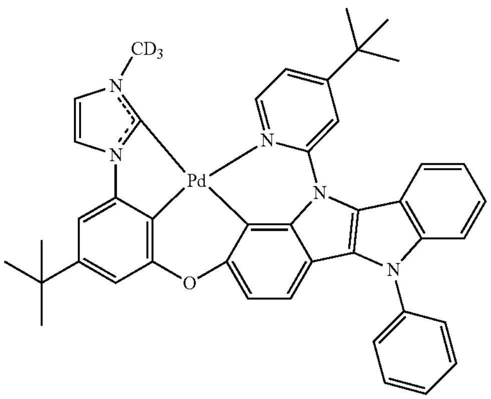
-continued
38
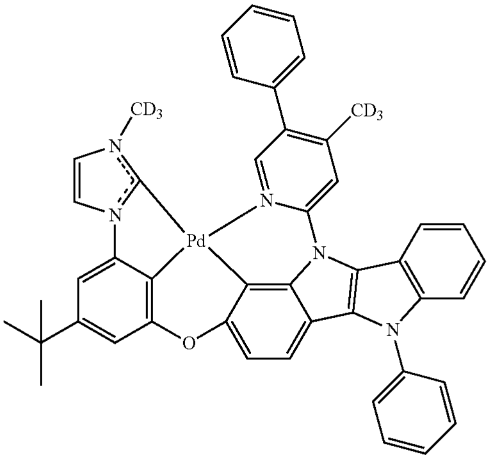
39
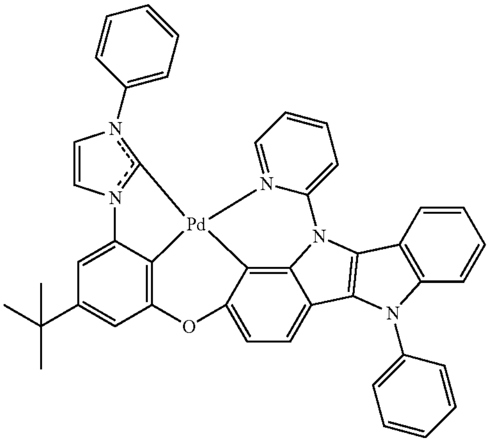
40
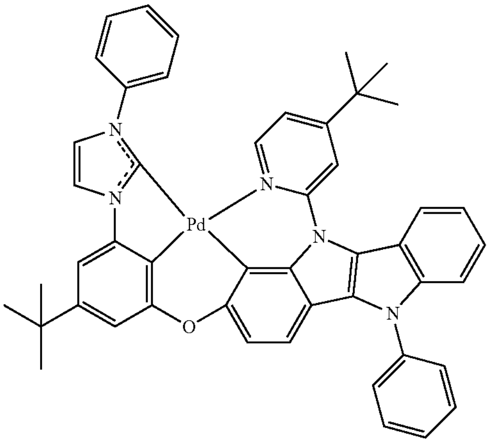

-continued
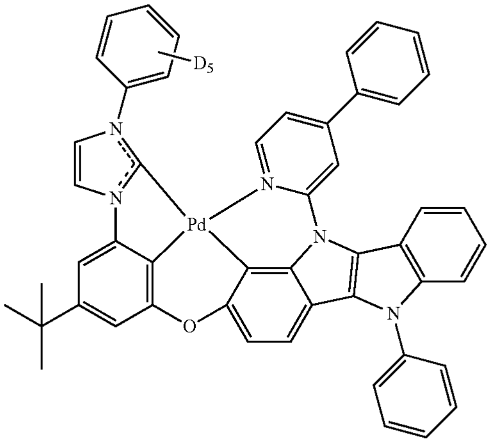
41
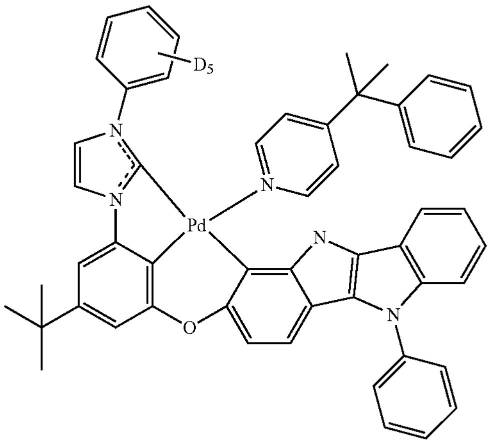
42
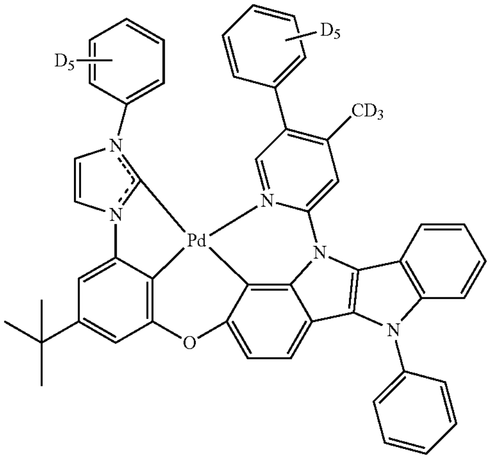
43
-continued
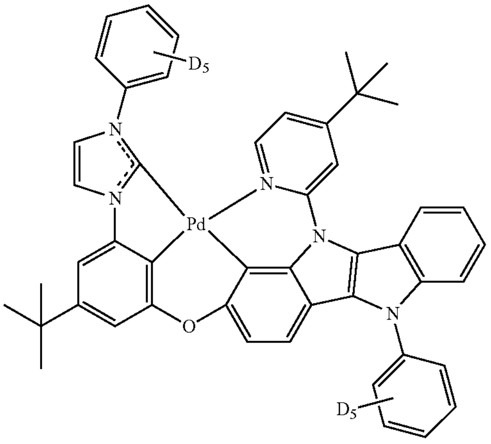
44
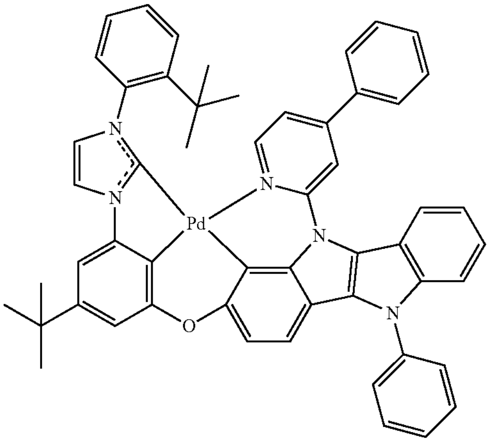
45
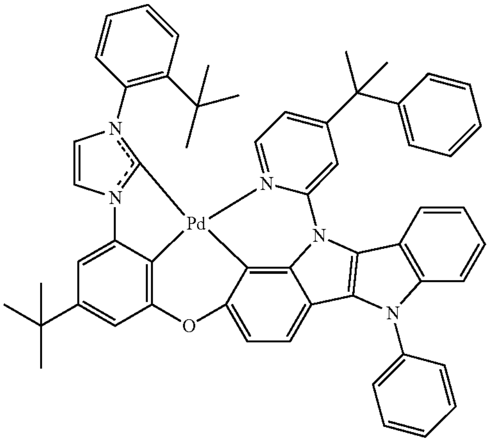
46

-continued
47
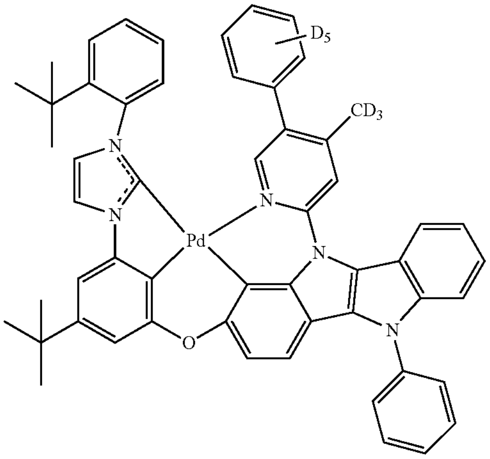
48
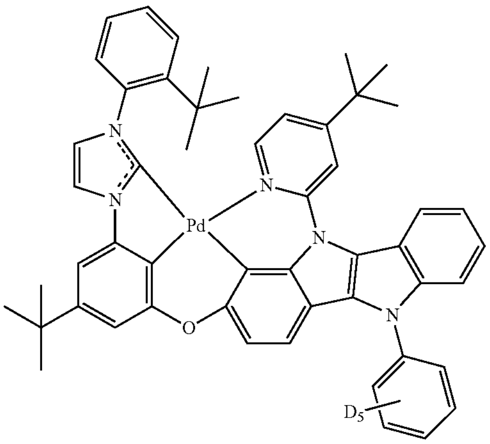
49
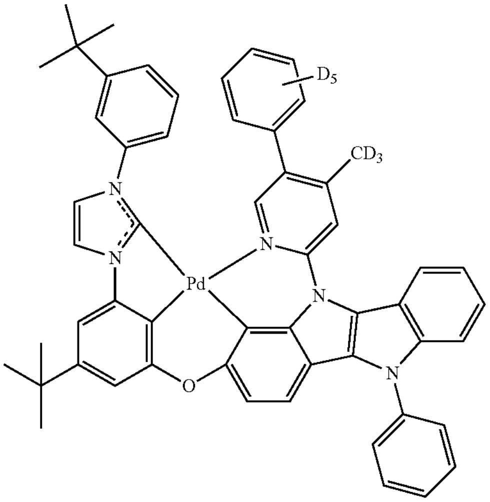
-continued
50
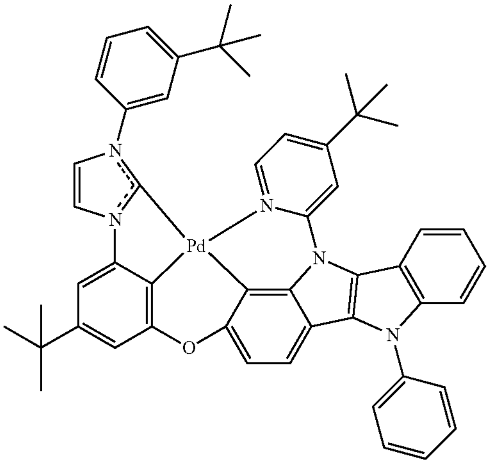
51
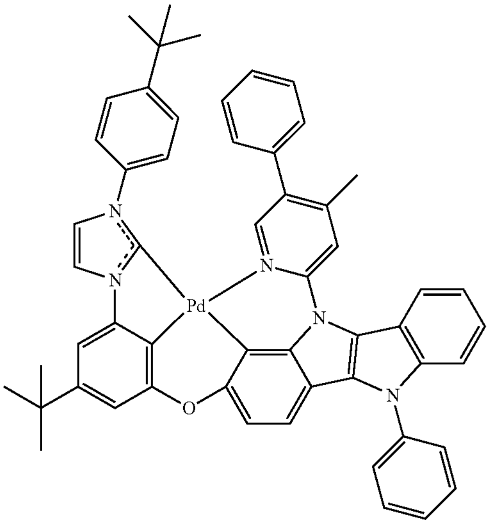
52
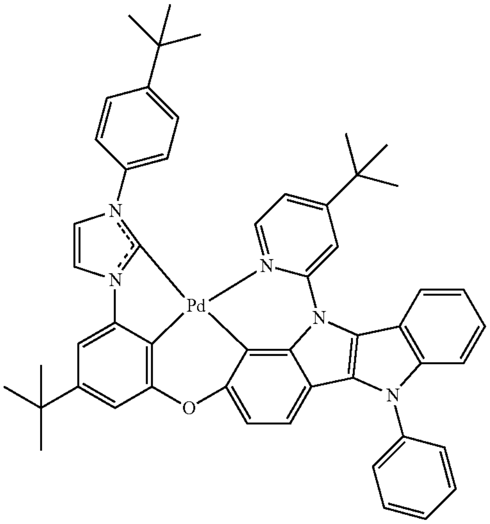

-continued
53
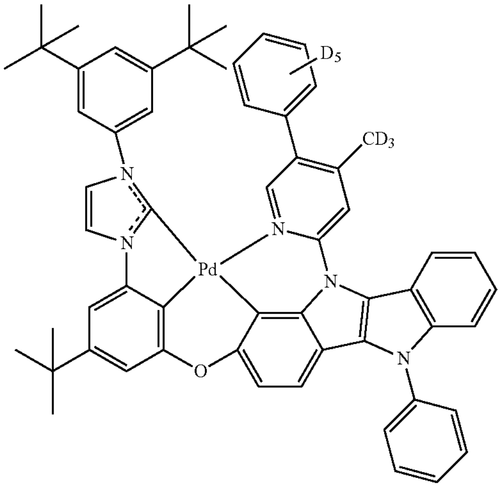
54
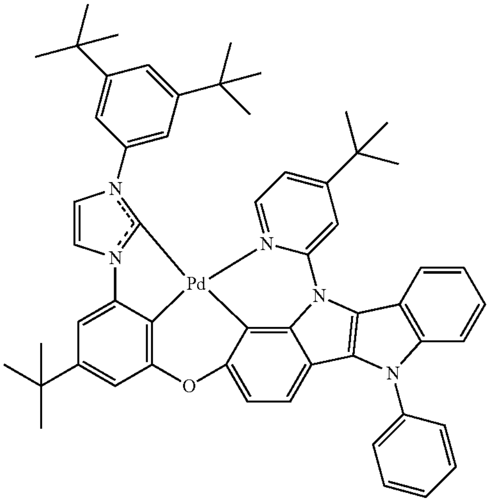
55
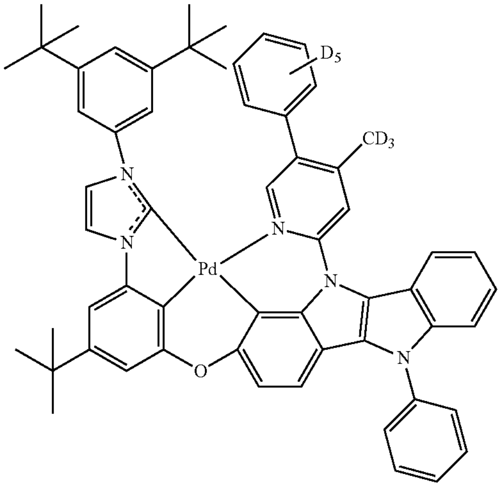
-continued
56
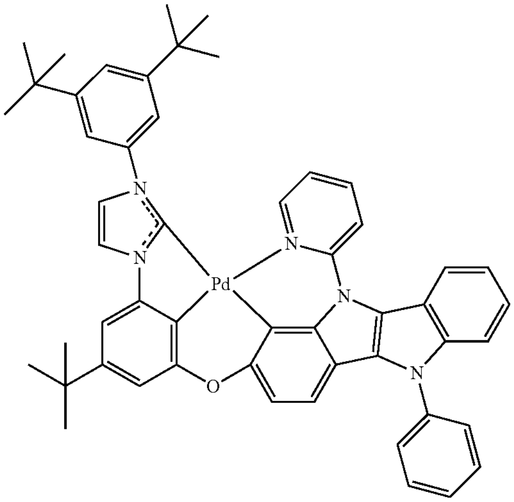
57
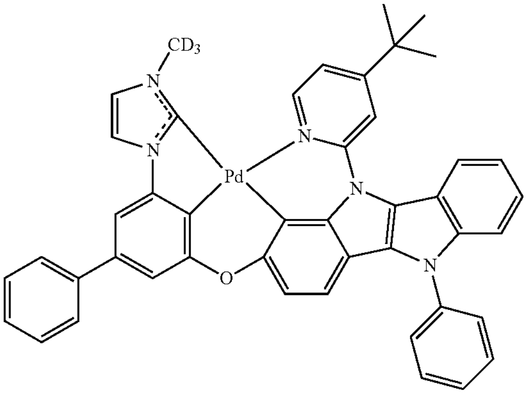
58
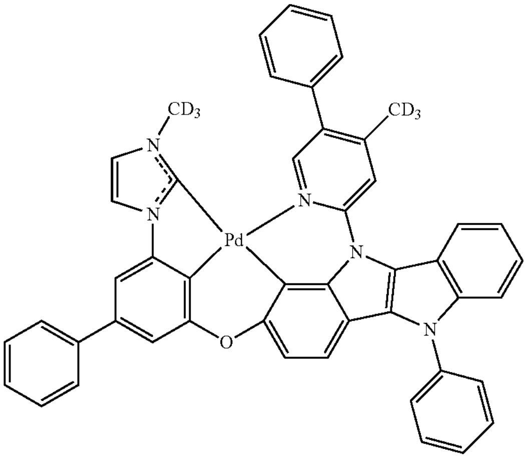

-continued
59
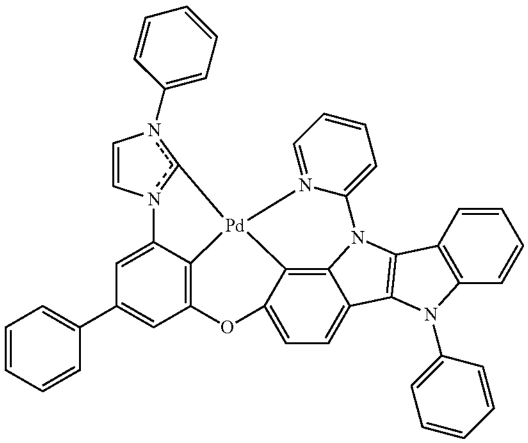
60
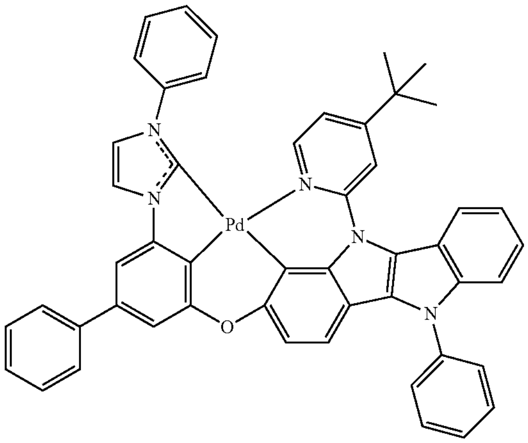
61
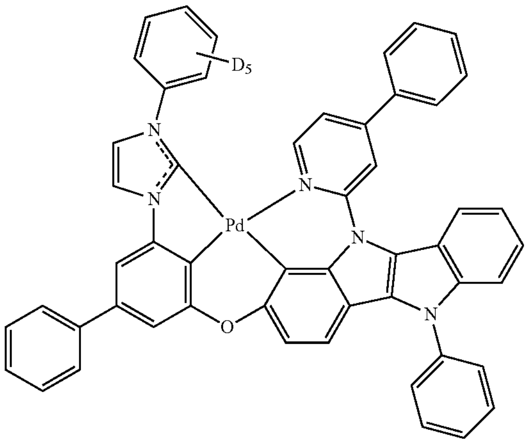
-continued
62
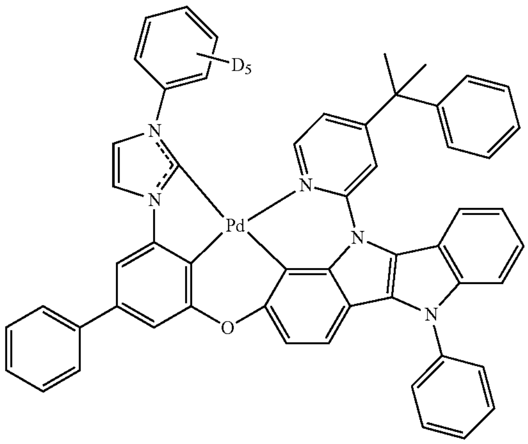
63
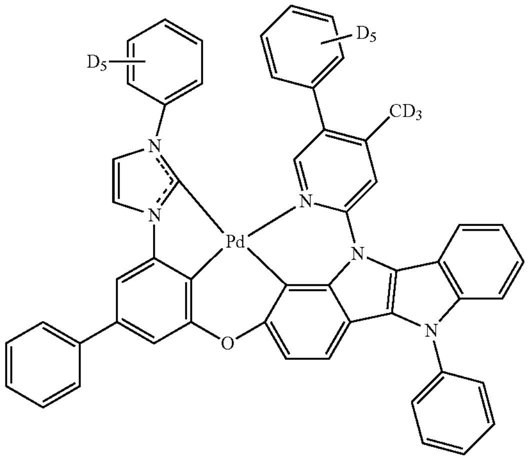
64
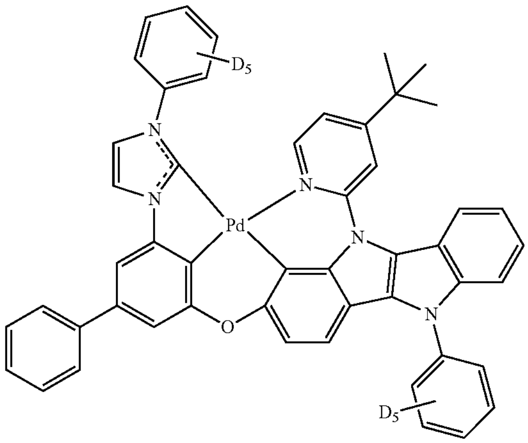

-continued
65
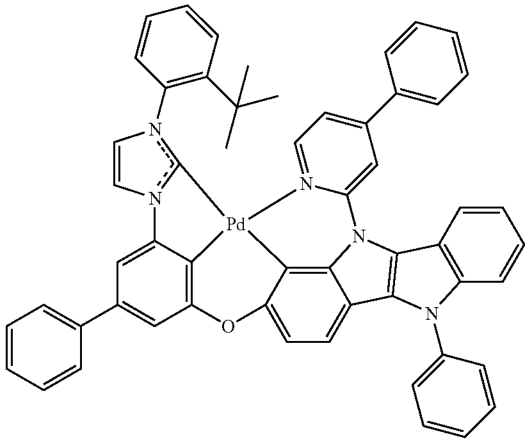
68
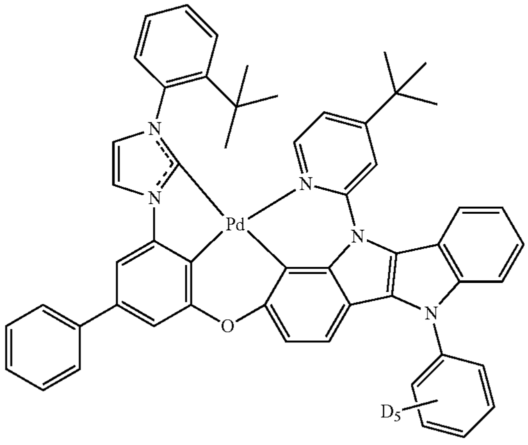
66
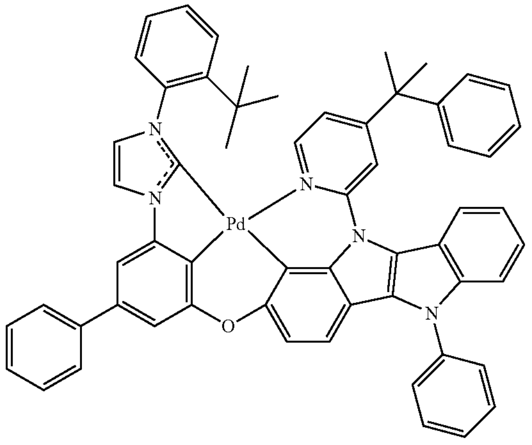
69
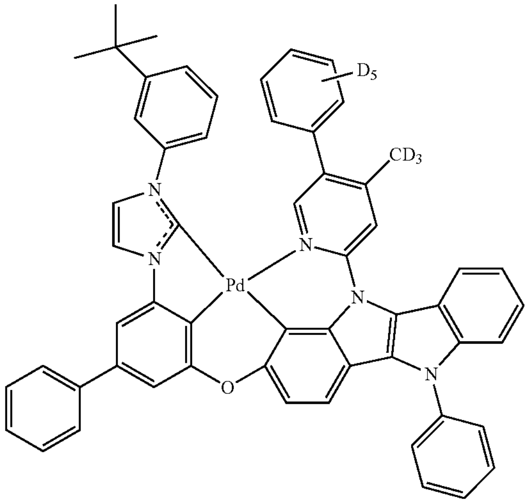
67
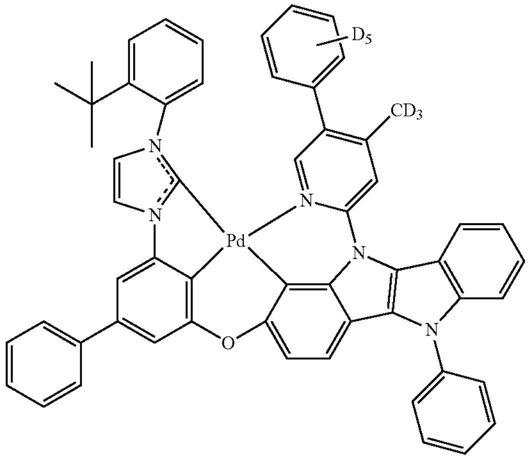
70
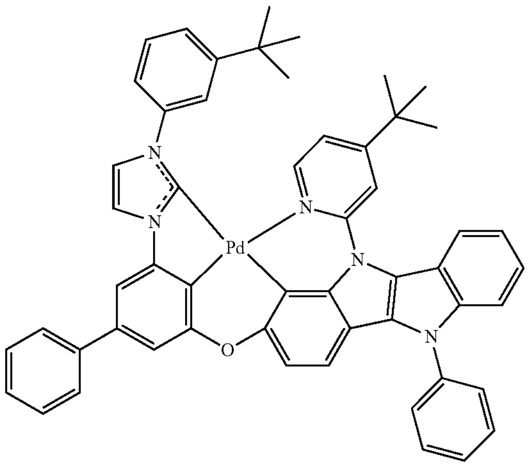

-continued
71
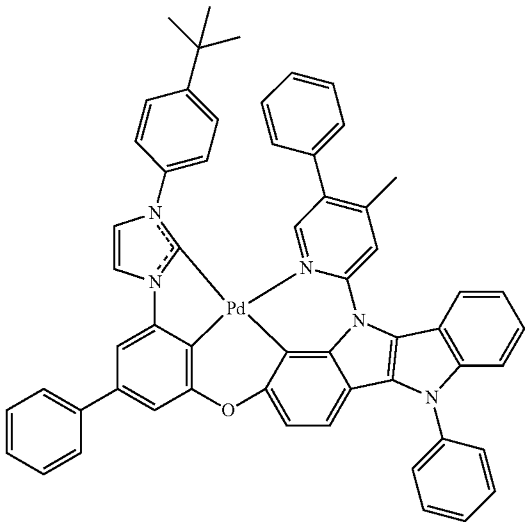
72
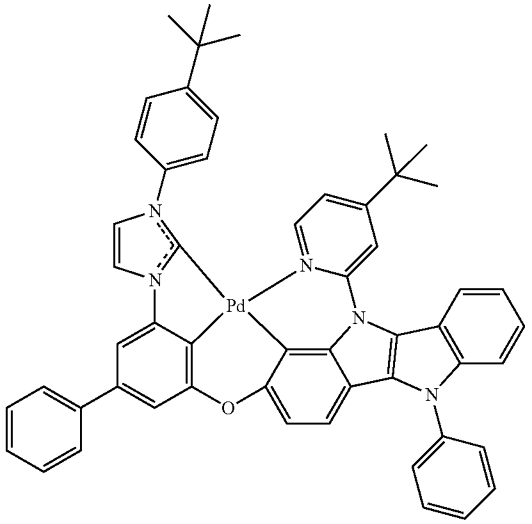
73
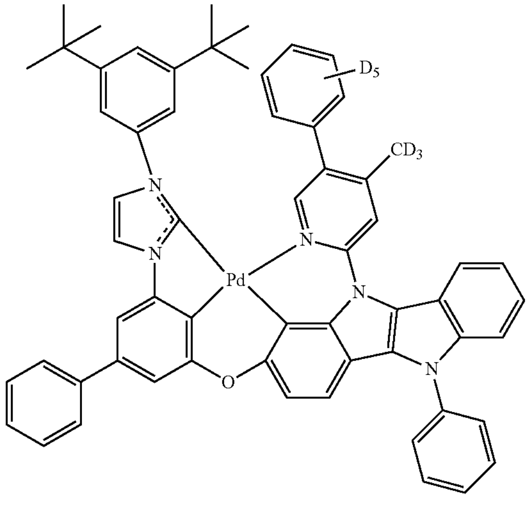
-continued
74
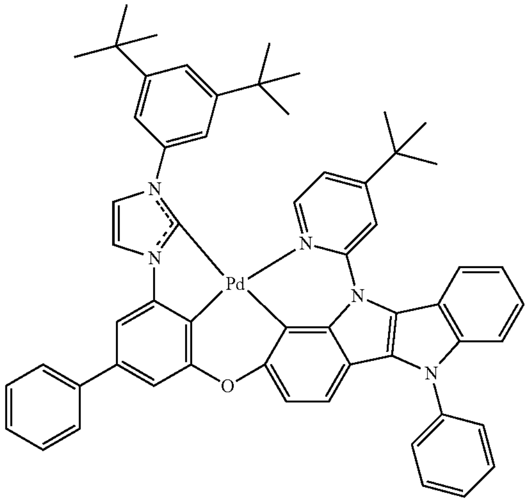
75
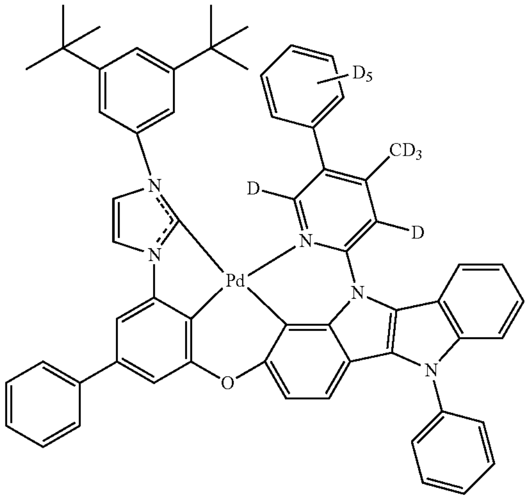
76
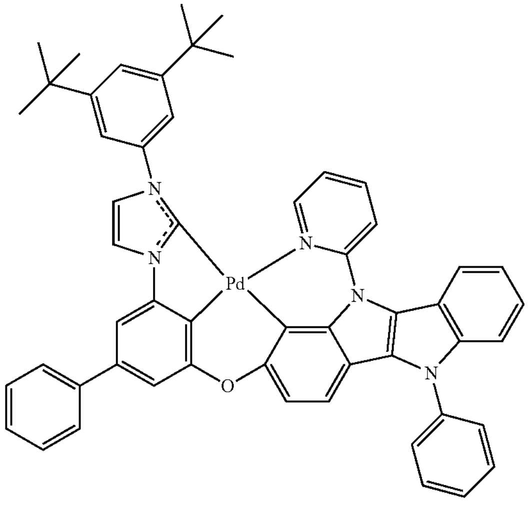

-continued
77
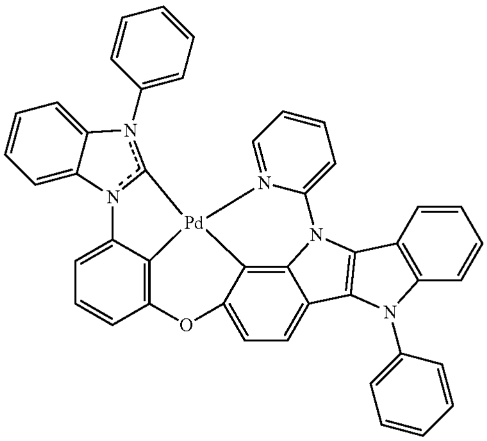
78
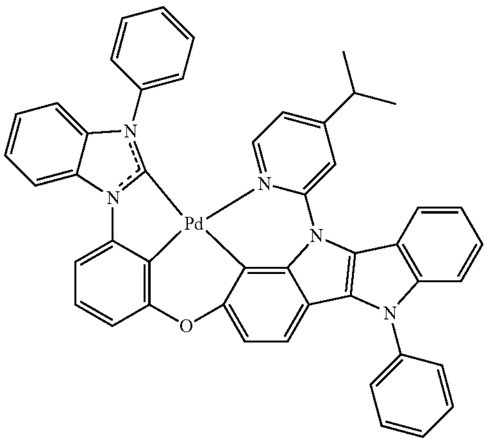
79
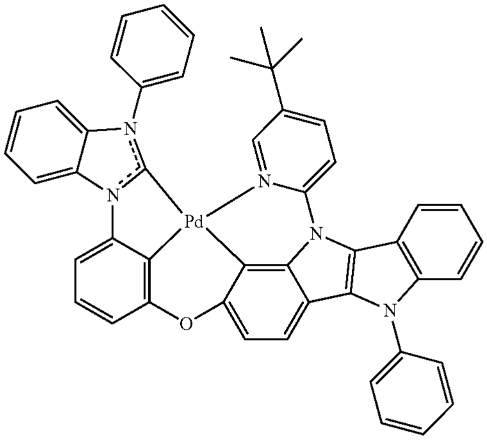
80
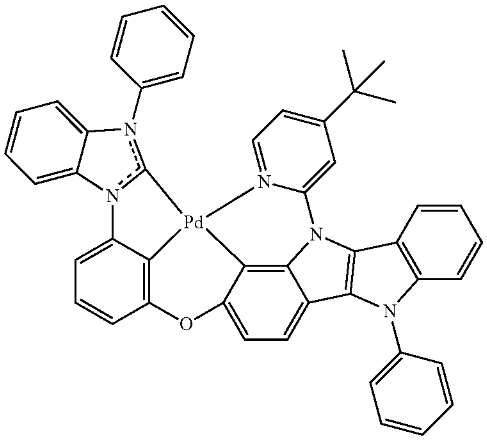
81
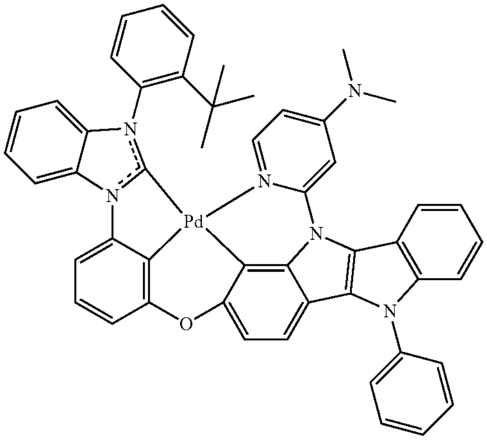
82
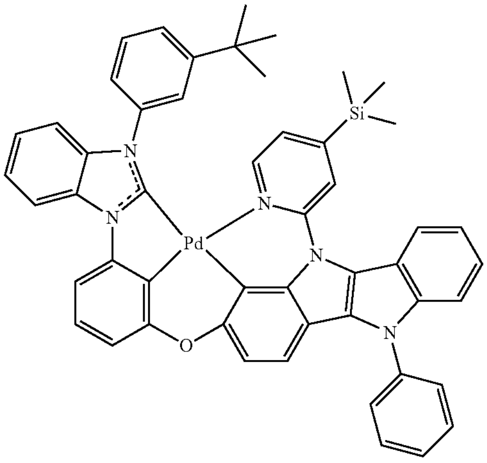

-continued
83
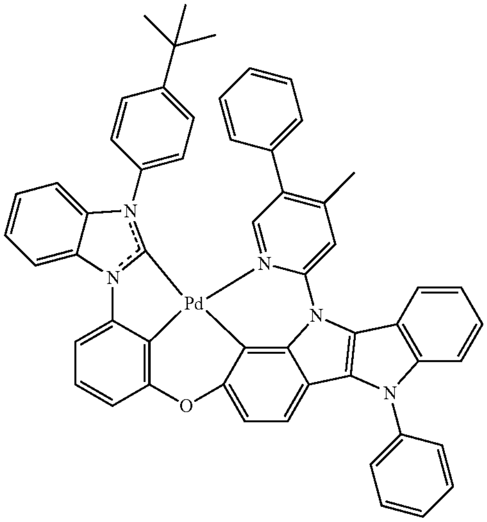
84
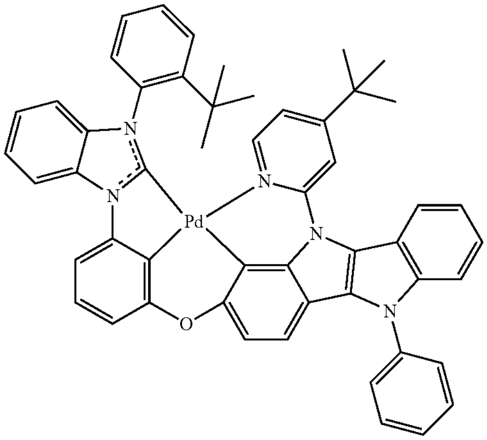
85
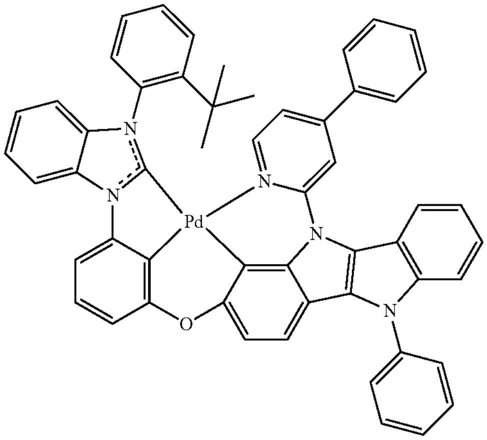
-continued
86
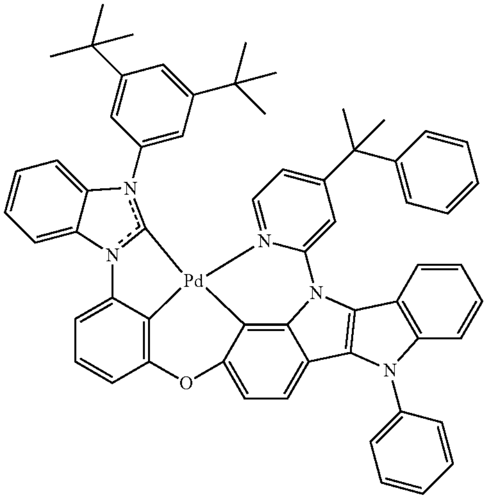
87
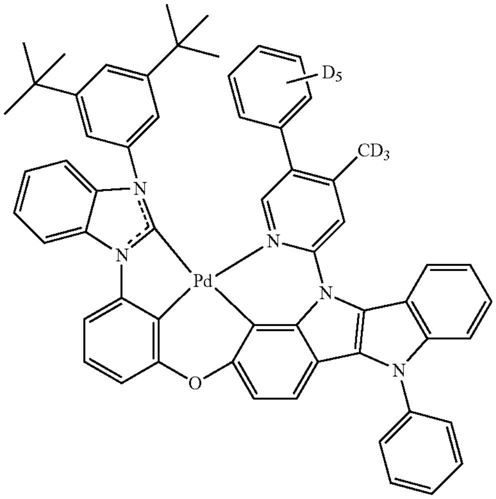
88
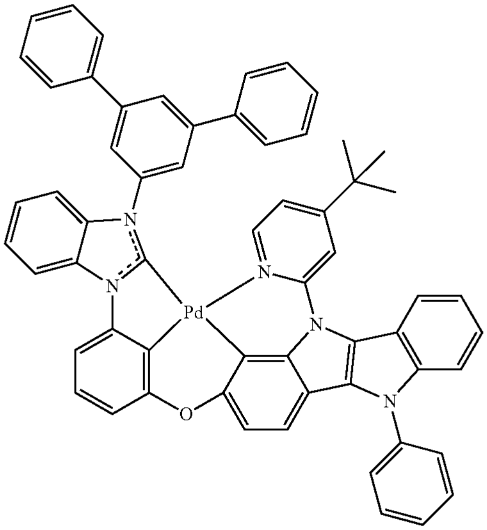

-continued
89
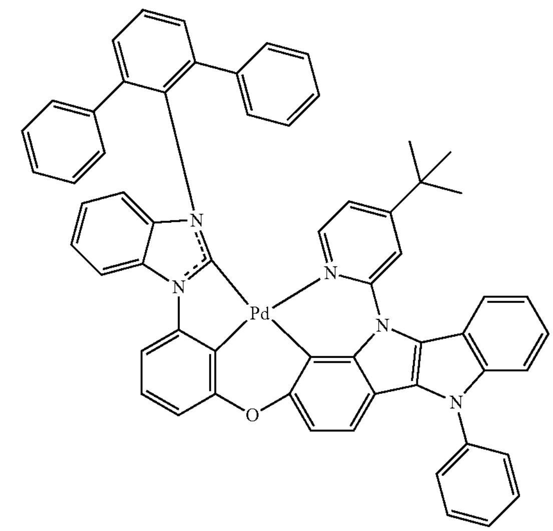
90
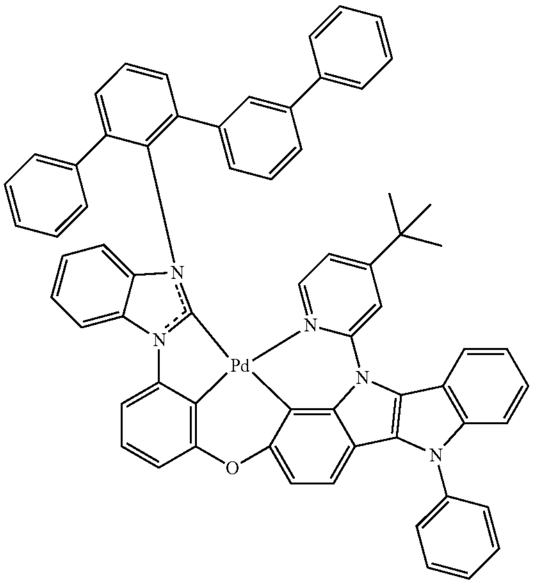
91
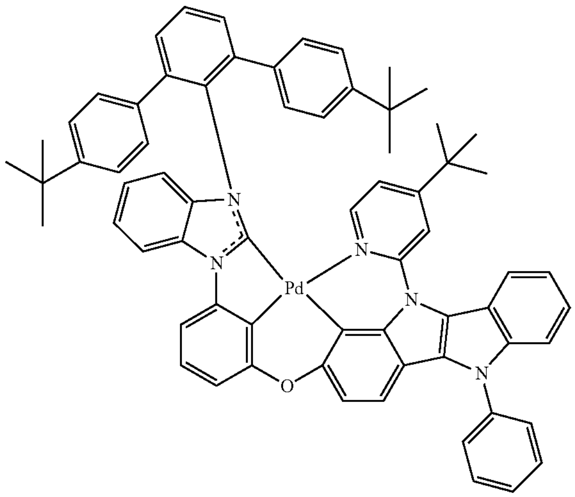
-continued
92
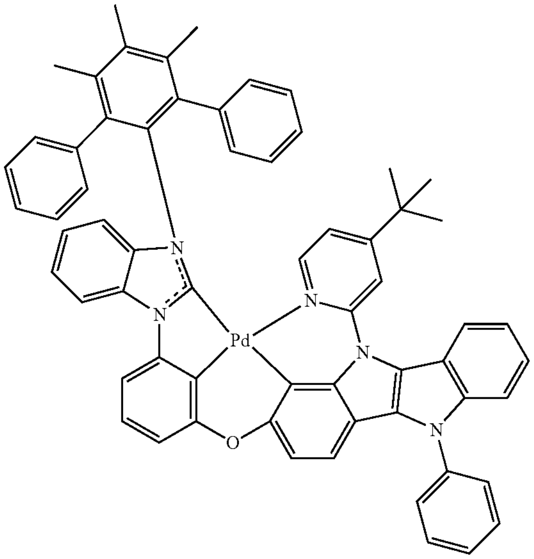
93
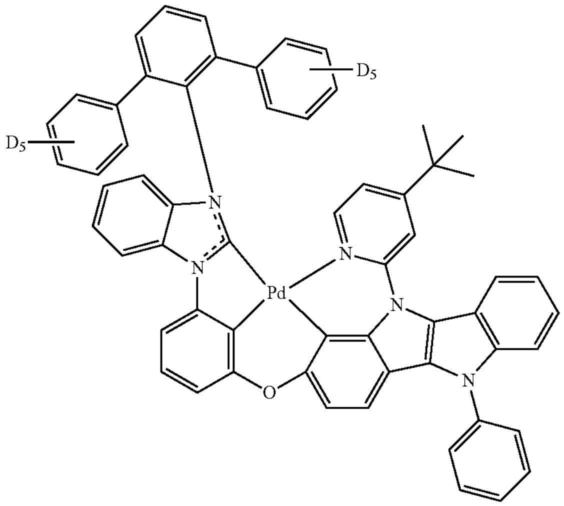

-continued
94
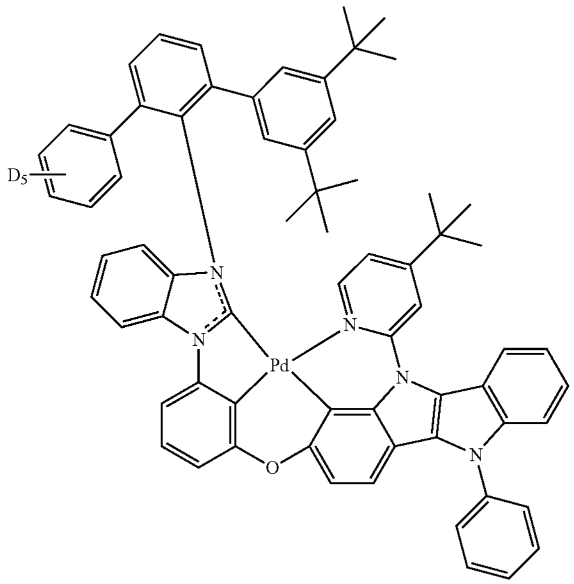
95
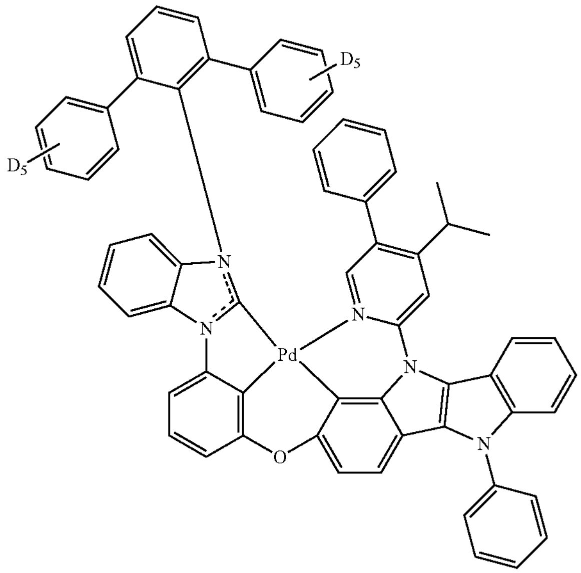
-continued
96
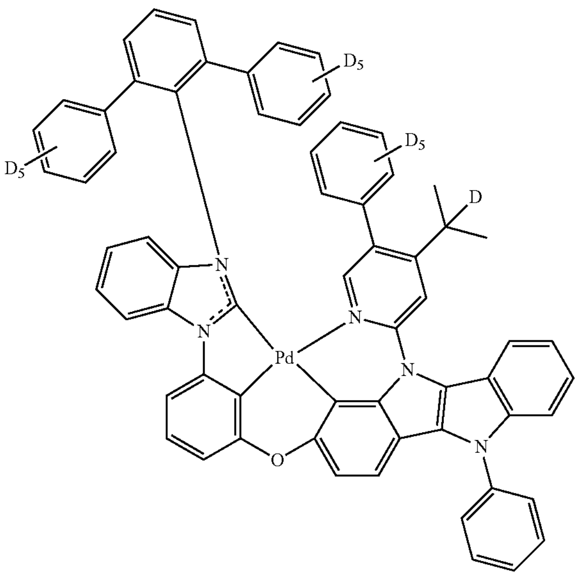
97
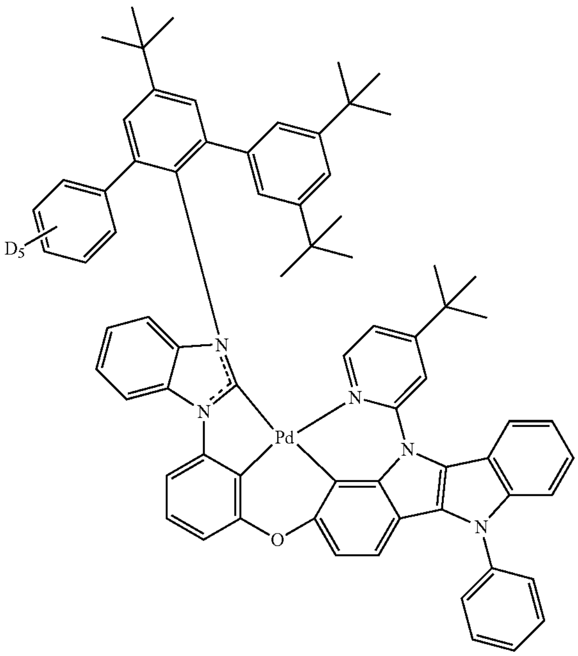

-continued
98
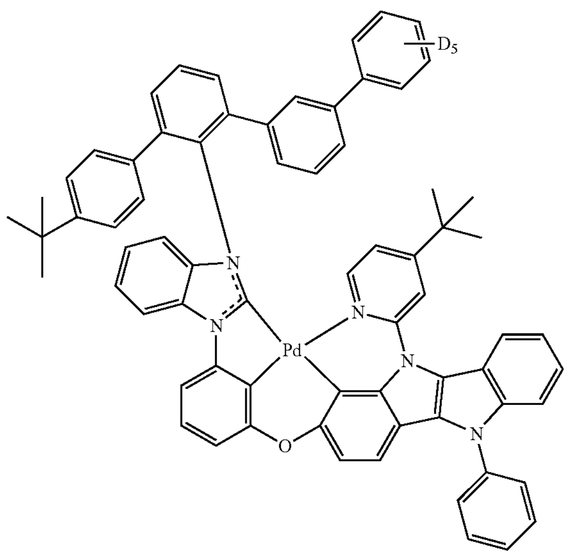
99
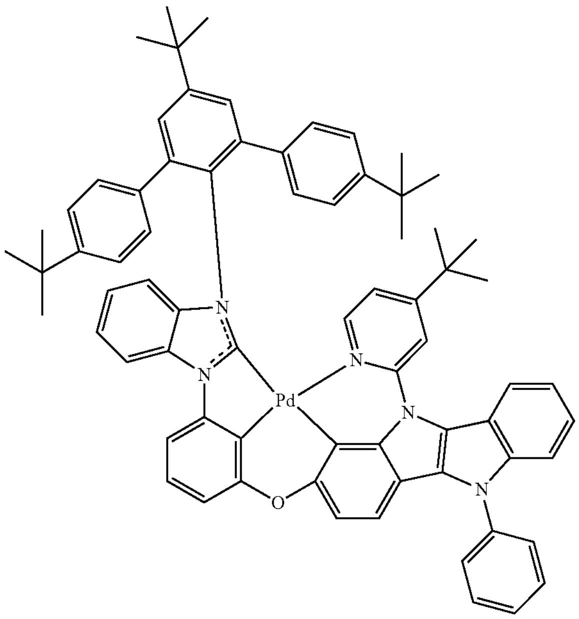
100
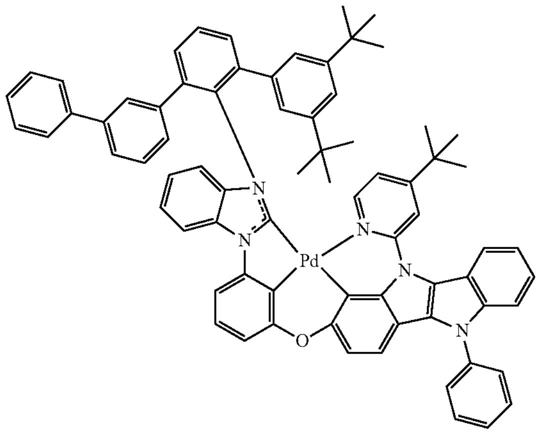
-continued
101
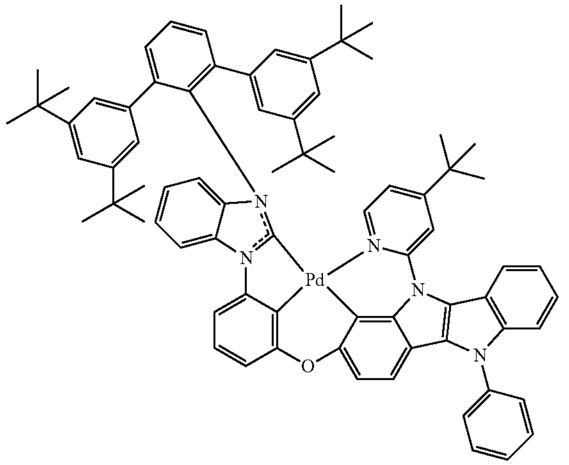
102
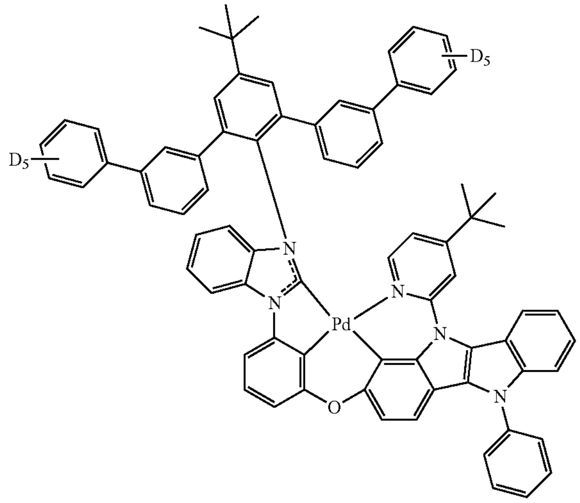
103
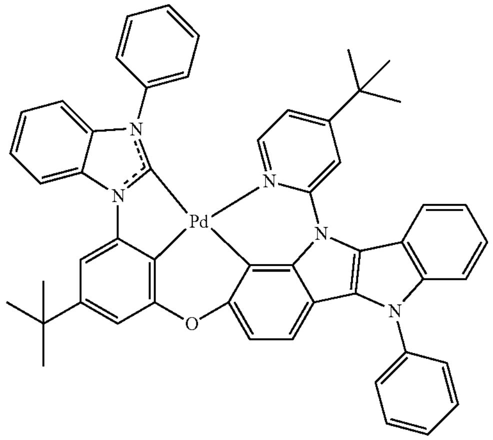

-continued
104
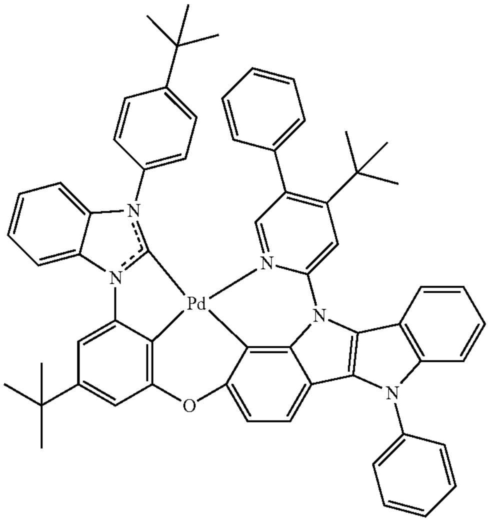
105
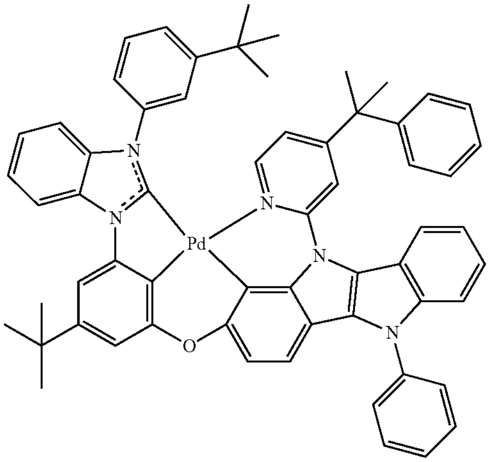
106
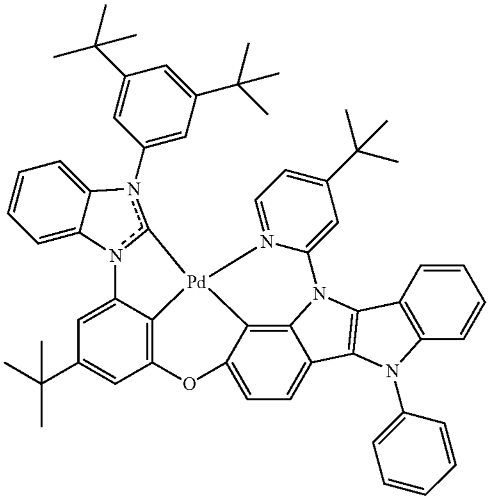
-continued
107
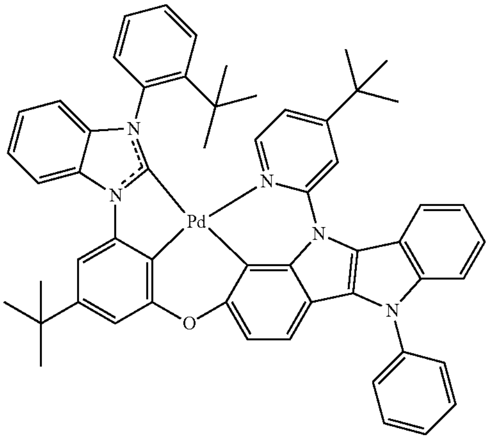
108
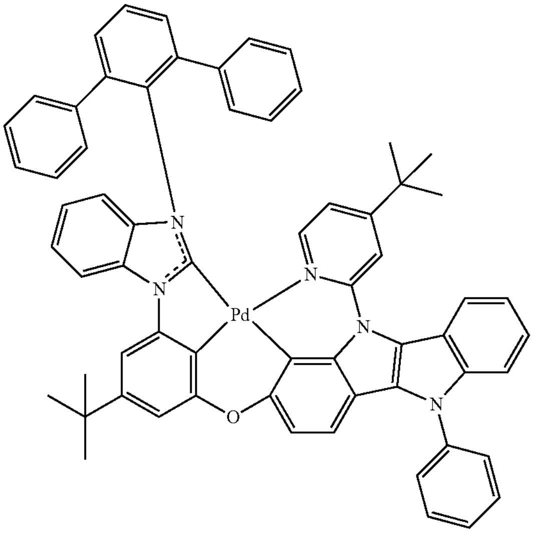
109
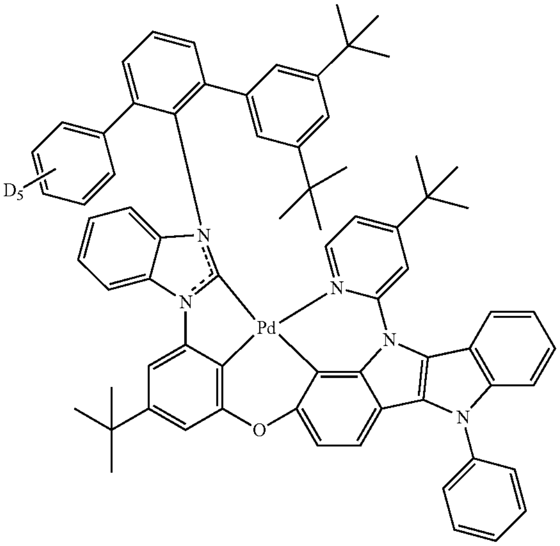

-continued
110
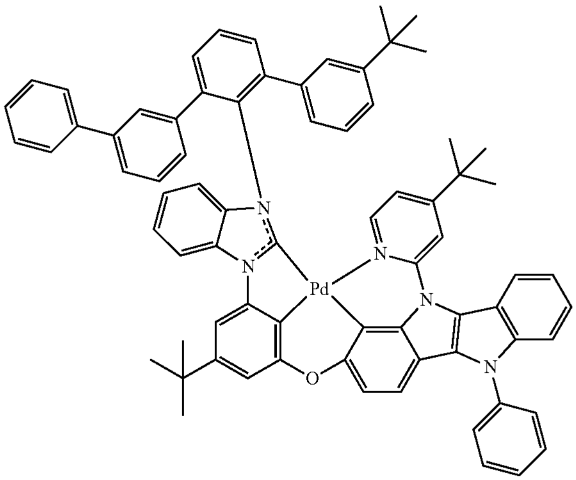
111
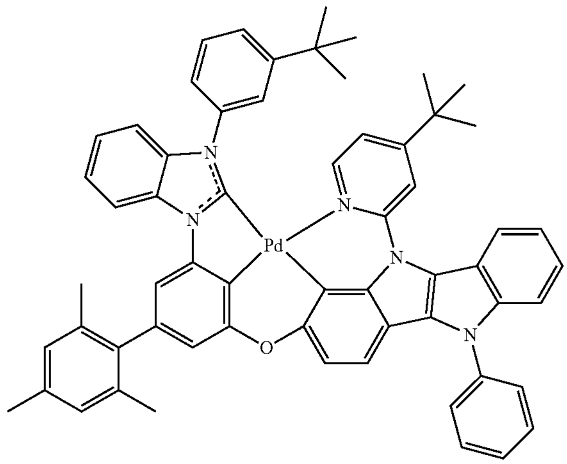
112
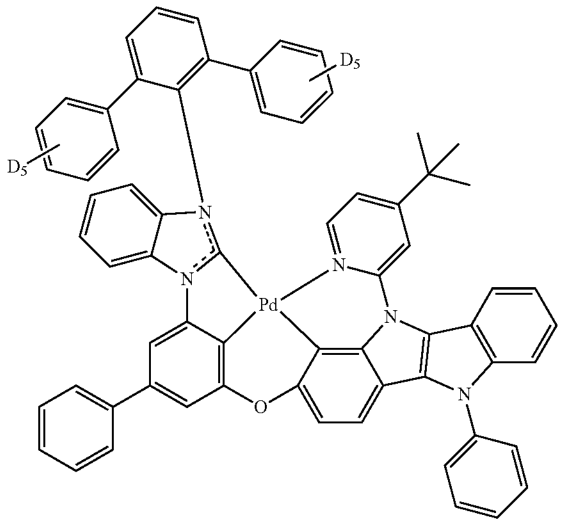
-continued
113
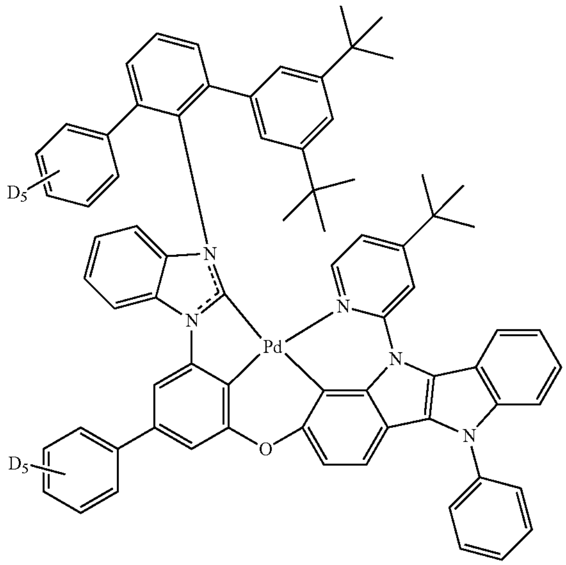
114
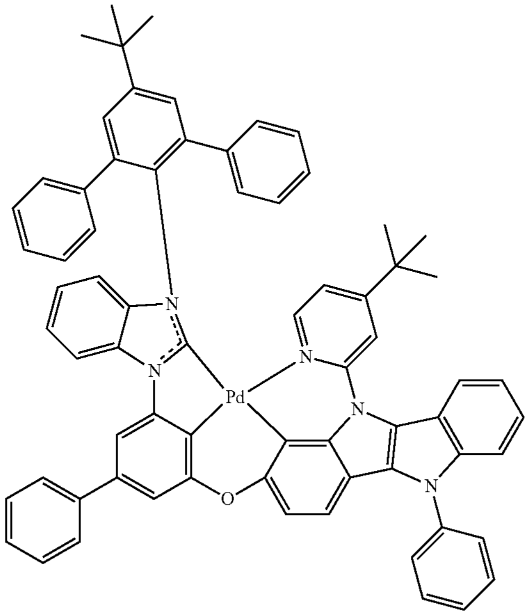
wherein in Compound Group 1, D is a deuterium atom.

12. An organometallic compound represented by Formula 1:

Formula 1

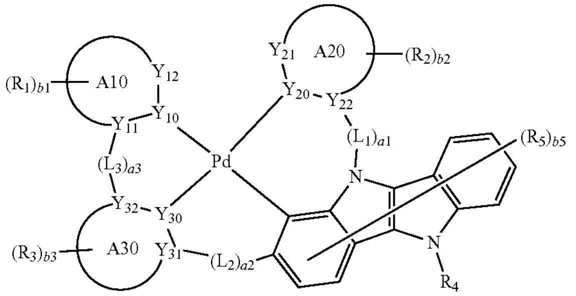

wherein in Formula 1, $Y_{10}$ to $Y_{12}$, $Y_{20}$ to $Y_{22}$, and $Y_{30}$ to $Y_{32}$ are each independently C or N, ring groups A10 to A30 are each independently a substituted or unsubstituted hydrocarbon ring group having 5 to 60 ring-forming carbon atoms, a substituted or unsubstituted aryl group having 6 to 60 ring-forming carbon atoms, or a substituted or unsubstituted heterocyclic group having 2 to 60 ring-forming carbon atoms, a1 to a3 are each independently an integer from 0 to 3, $L_1$ to $L_3$ are each independently a direct linkage, O, S, $—C(R_{a11})(R_{a12})—$, $—C(R_{a13})═$, $—C(R_{a14})═C(R_{a15})—$, $—C≡C—$, $—C(═O)—$, $—C(═S)—$, $—B(R_{a16})—$, $—N(R_{a17})—$, $—P(R_{a18})—$, $—Si(R_{a19})(R_{a20})—$, or $—Ge(R_{a21})(R_{a22})—$, b1 to b3 are each independently an integer from 0 to 8, b5 is an integer from 0 to 6, and $R_1$ to $R_5$ and $R_{a11}$ to $R_{a22}$ are each independently a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted alkynyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring.

13. The organometallic compound of claim 12, wherein Formula 1 is represented by Formula 2:

Formula 2

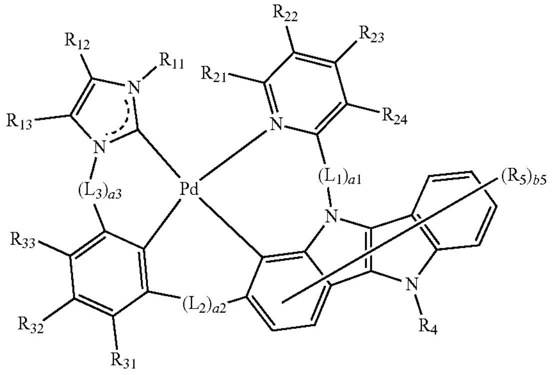

wherein in Formula 2, $R_{11}$ to $R_{13}$, $R_{21}$ to $R_{24}$, and $R_{31}$ to $R_{33}$ are each independently a hydrogen atom, a deuterium atom, a halogen atom, a cyano group, a nitro group, an amidino group, a sulfinyl group, a sulfonyl group, a carbonyl group, a phosphine group, a phosphine oxide group, a phosphine sulfide group, a substituted or unsubstituted boron group, a substituted or unsubstituted silyl group, a substituted or unsubstituted amine group, a substituted or unsubstituted oxy group, a substituted or unsubstituted thio group, a substituted or unsubstituted alkyl group having 1 to 60 carbon atoms, a substituted or unsubstituted alkenyl group having 2 to 60 carbon atoms, a substituted or unsubstituted aryl group having 6 to 60 ring-forming carbon atoms, or a substituted or unsubstituted heterocyclic group having 2 to 60 ring-forming carbon atoms, and/or bonded to an adjacent group to form a ring, and a1 to a3, $L_1$ to $L_3$, b5, $R_4$, and $R_5$ are the same as defined in Formula 1.

14. The organometallic compound of claim 13, wherein Formula 2 is represented by Formula 3:

Formula 3

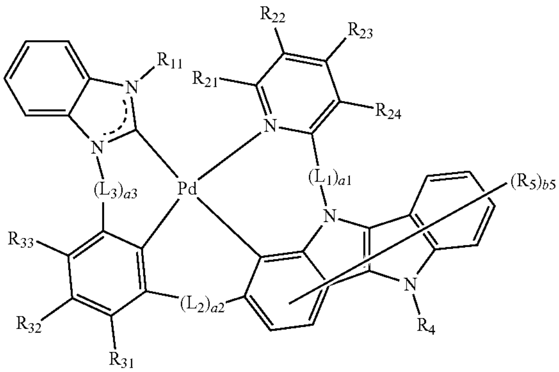

wherein in Formula 3, a1 to a3, $L_1$ to $L_3$, b5, $R_4$, $R_5$, $R_{11}$, $R_{21}$ to $R_{24}$, and $R_{31}$ to $R_{33}$ are the same as defined in Formula 2.

15. The organometallic compound of claim 12, wherein in Formula 1, $L_1$ and $L_3$ are each independently a direct linkage, and $L_2$ is O.

16. The organometallic compound of claim 12, wherein in Formula 1, $R_1$ to $R_5$ are each independently a hydrogen atom, a deuterium atom, a dimethylamine group, a trimethylsilyl group, a substituted or unsubstituted methyl group, a substituted or unsubstituted isopropyl group, a substituted or unsubstituted i-butyl group, a substituted or unsubstituted t-butyl group, or a substituted or unsubstituted phenyl group.

17. The organometallic compound of claim 12, wherein in Formula 1, $R_1$ to $R_5$ are each independently represented by any one selected from among R-1 to R-10:

R-1

$*-CH_3$

R-2

$*-CD_3$

R-3

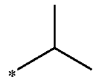

R-4

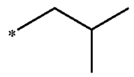

R-5

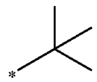

R-6

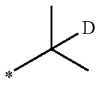

R-7

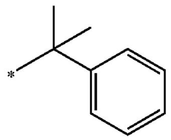

R-8

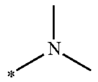

R-9

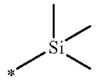

R-10

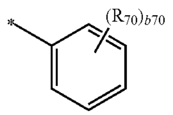

wherein in R-2 and R-6,

D is a deuterium atom, wherein in R-10, b70 is an integer from 0 to 5, and $R_{70}$ is a hydrogen atom, a deuterium atom, a substituted or unsubstituted alkyl group having 1 to 10 carbon atoms, or a substituted or unsubstituted aryl group having 6 to 30 ring-forming carbon atoms.

18. The organometallic compound of claim 12, wherein in Formula 1, one or more of $R_1$ to $R_5$ comprise a deuterium atom or a substituent containing a deuterium atom.

19. The organometallic compound of claim 12, wherein in Formula 1, one or more of $R_1$ to $R_5$ comprise a t-butyl group or a substituent containing a t-butyl group.

20. The organometallic compound of claim 12, wherein Formula 1 is represented by any one selected from among compounds of Compound Group 1:

Compound Group 1

1

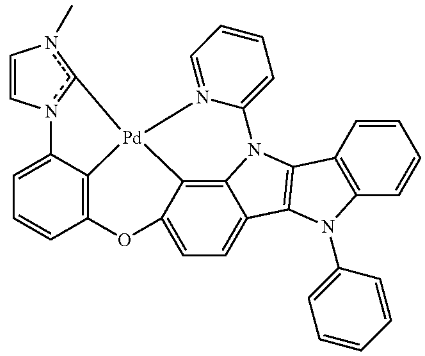

2

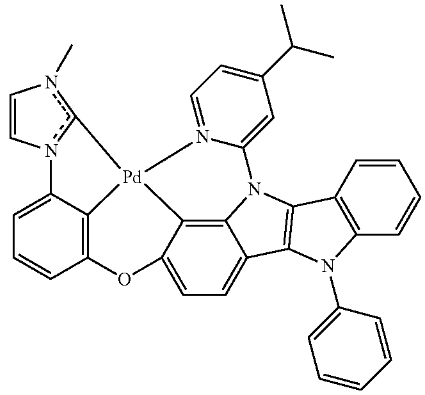

3

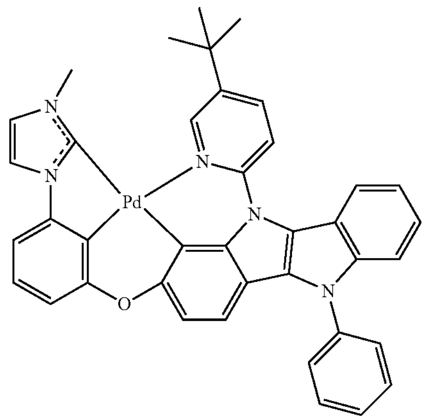

4

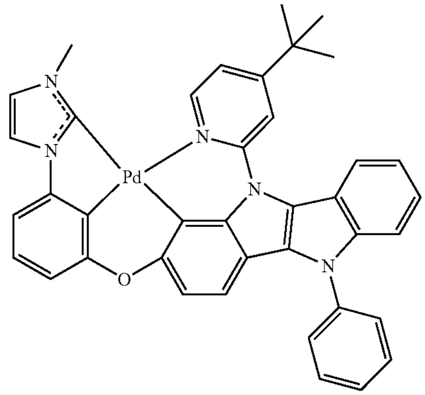

-continued
5
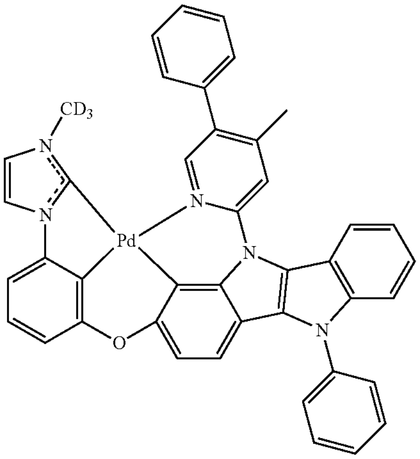
6
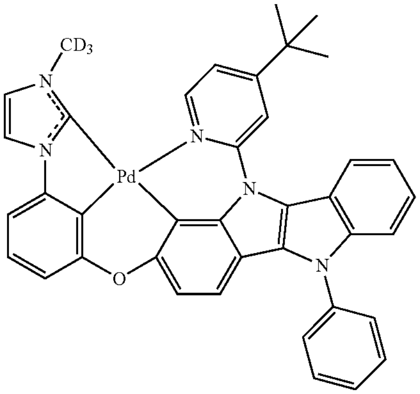
7
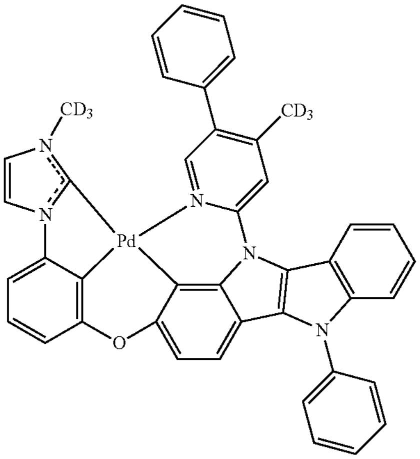
-continued
8
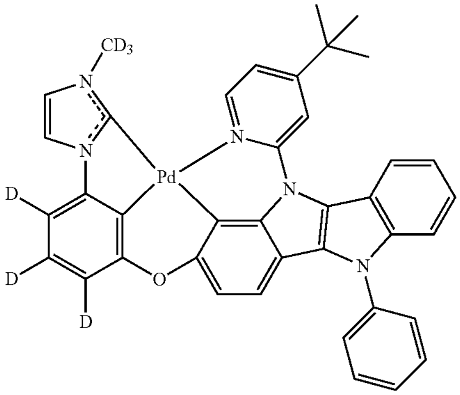
9
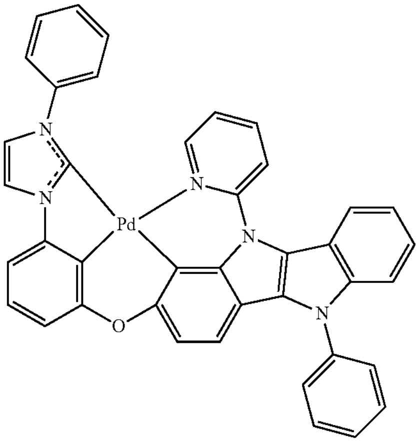
10
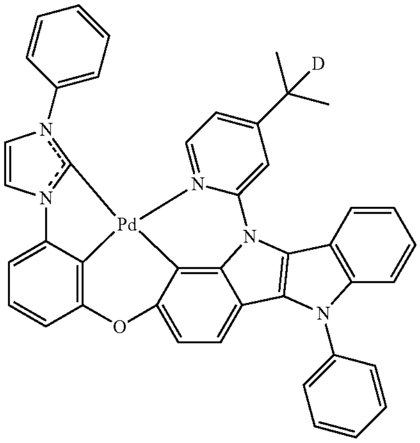

-continued
11
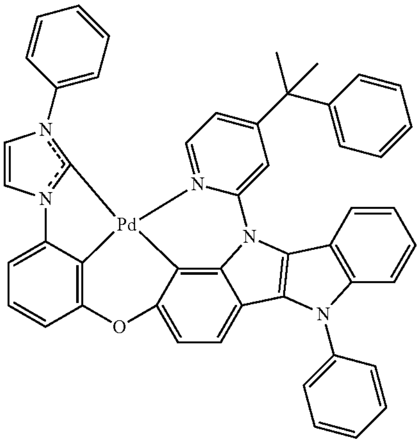
12
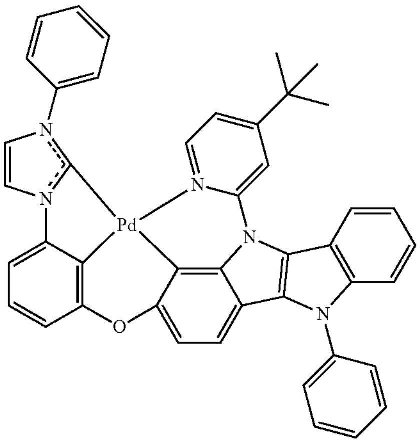
13
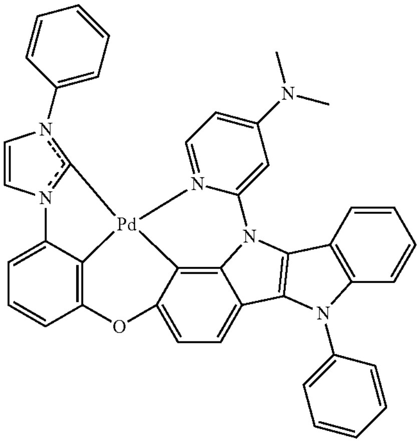
-continued
14
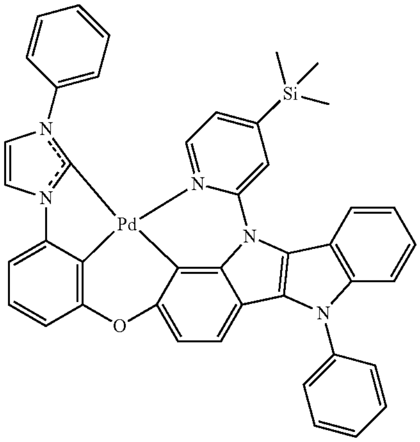
15
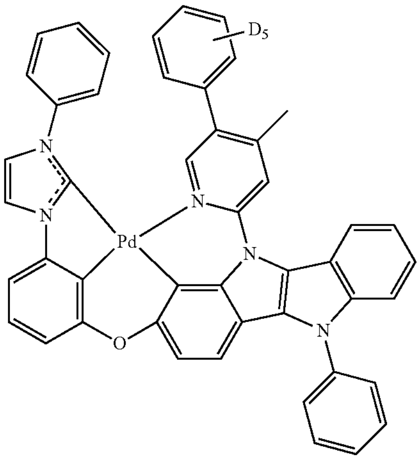
16
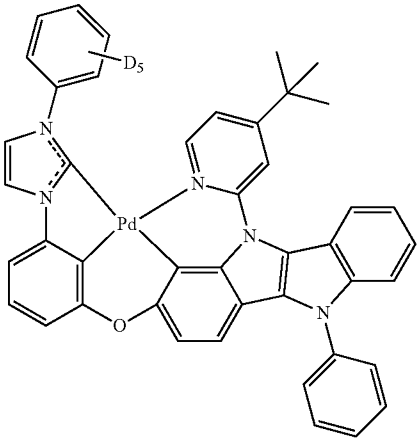

17
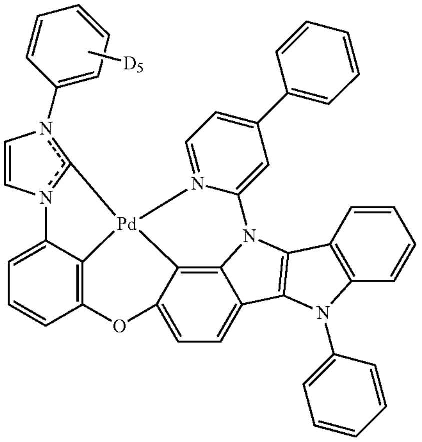
18
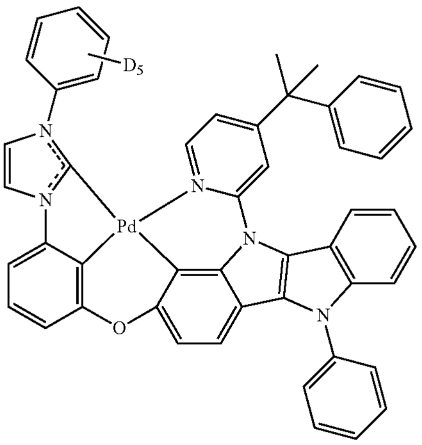
19
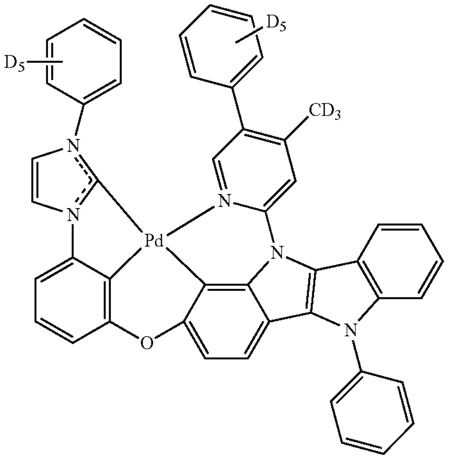
20
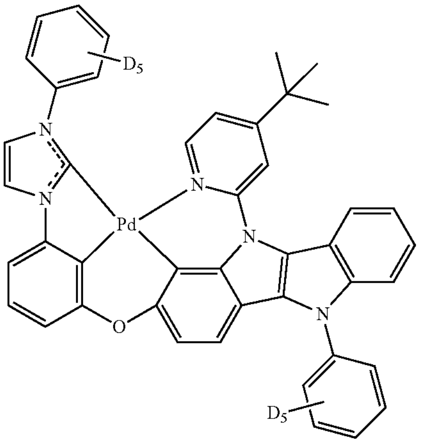
21
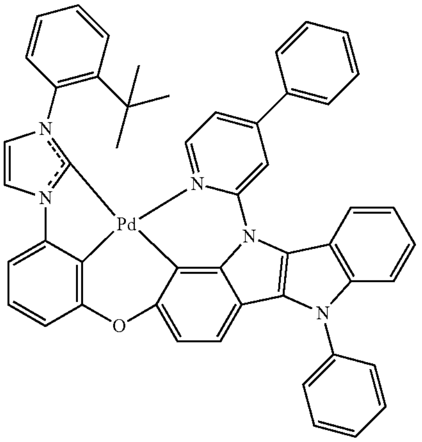
22
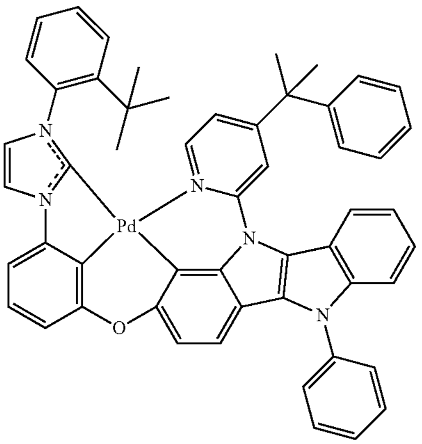

-continued
23
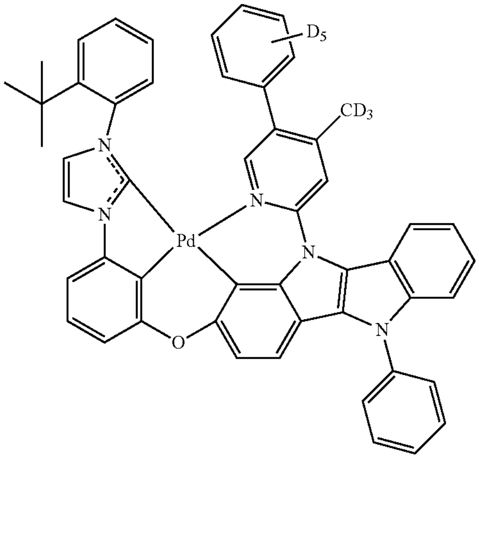
24
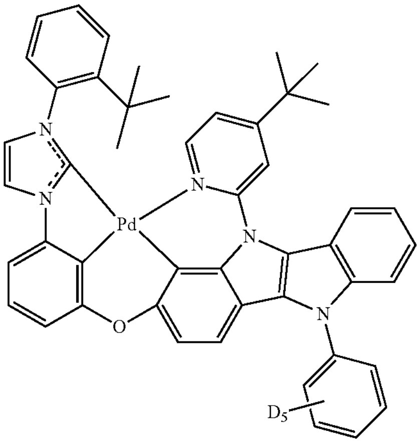
25
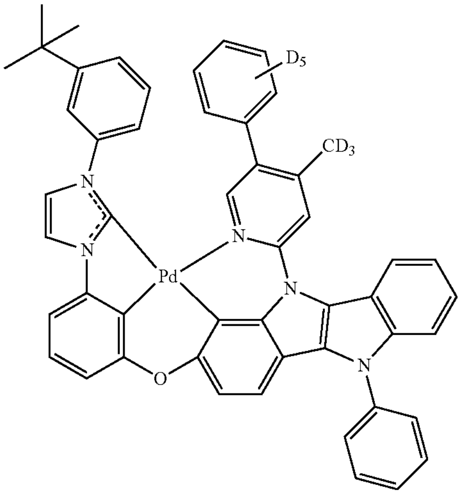
-continued
26
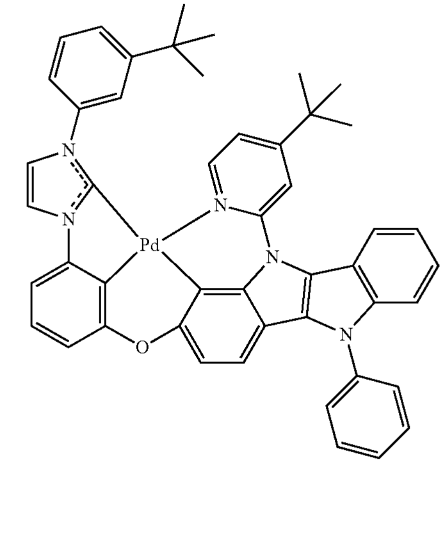
27
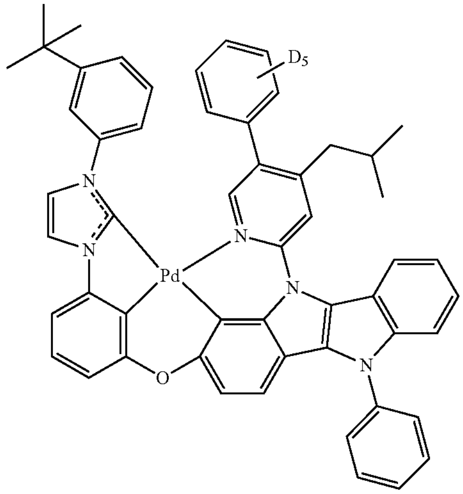
28
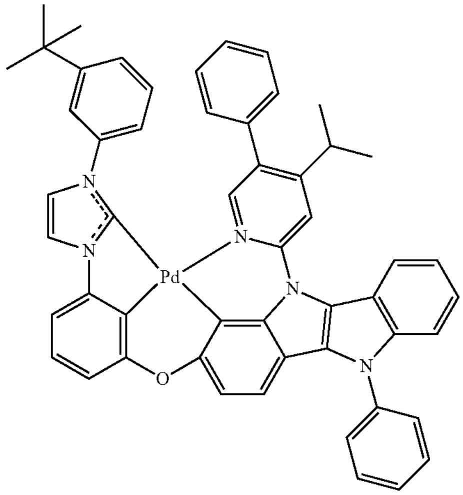

-continued
29
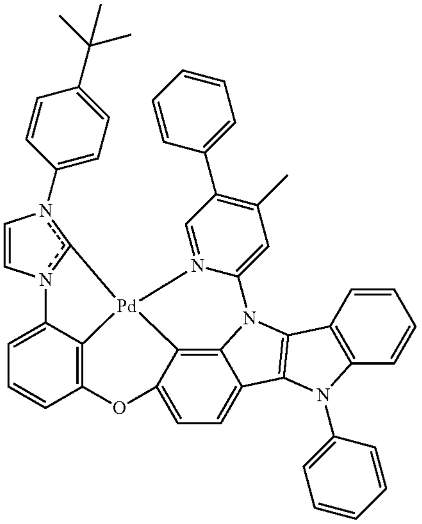
30
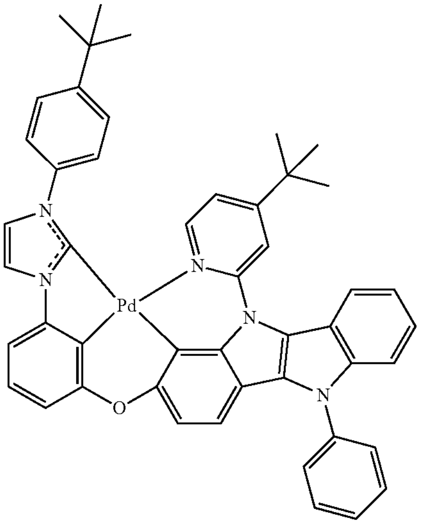
31
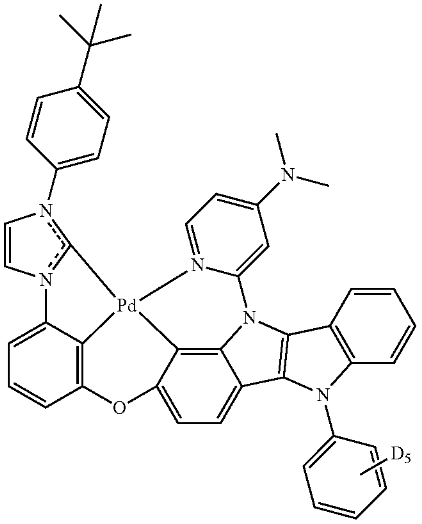
-continued
32
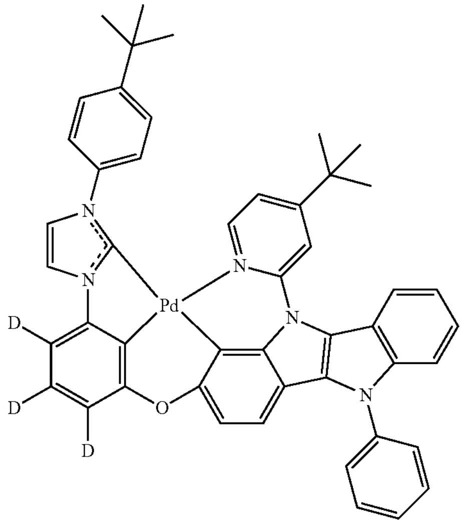
33
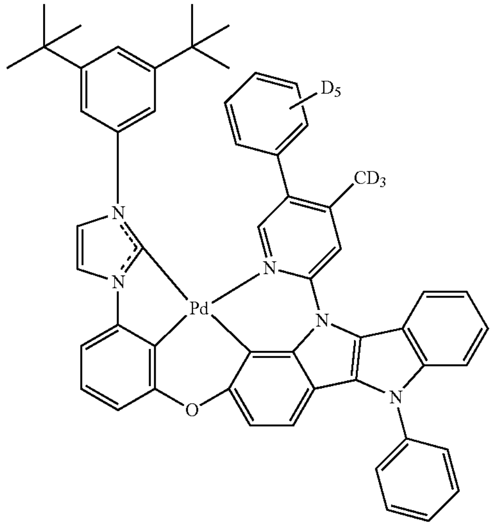
34
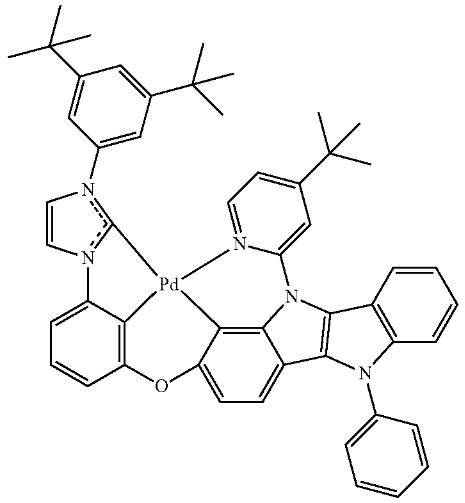

-continued
35
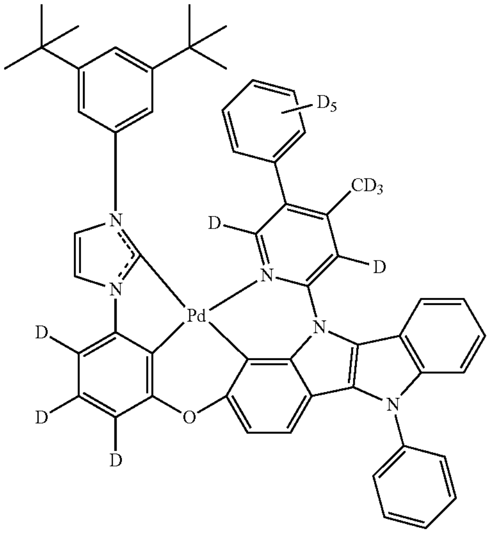
36
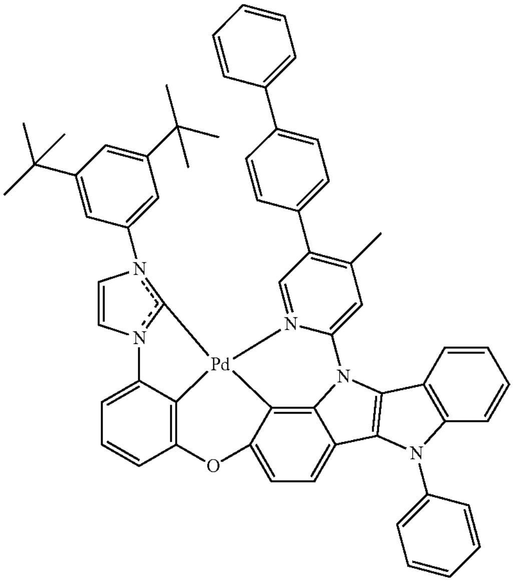
37
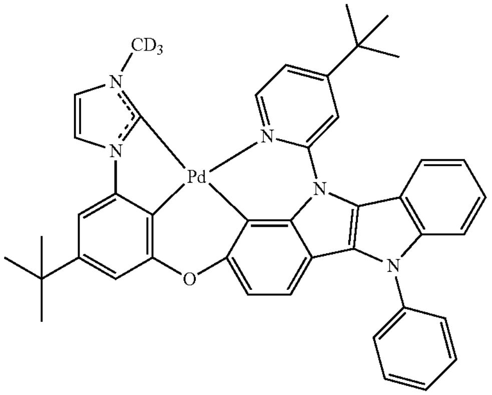
-continued
38
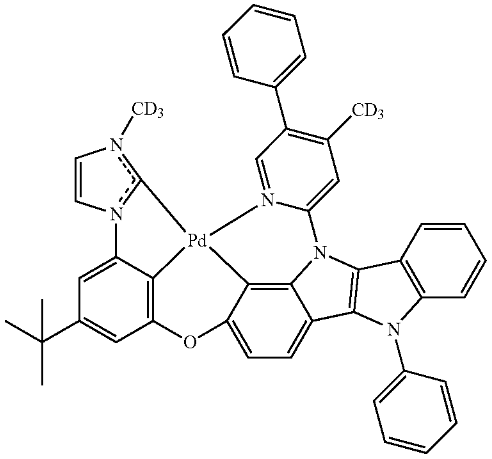
39
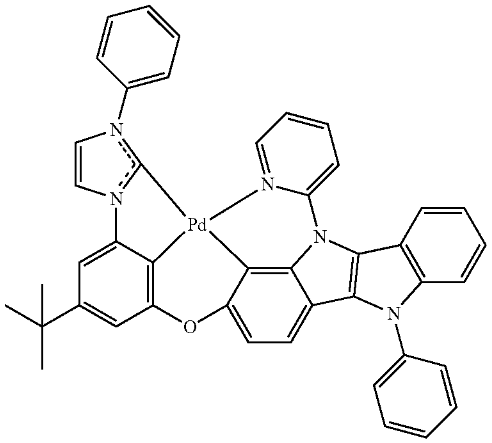
40
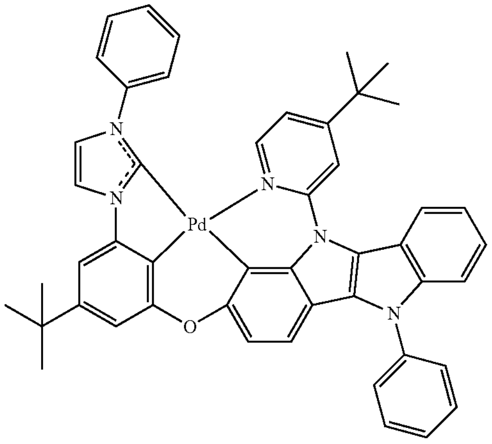

-continued
41
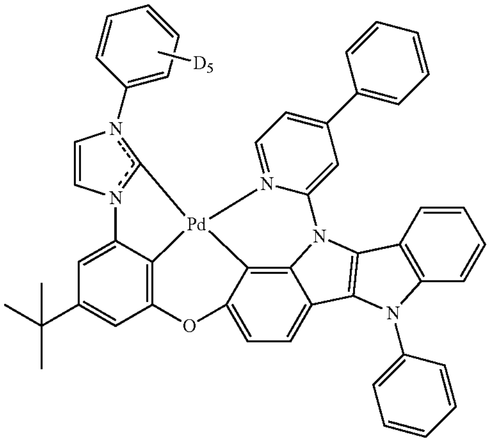
42
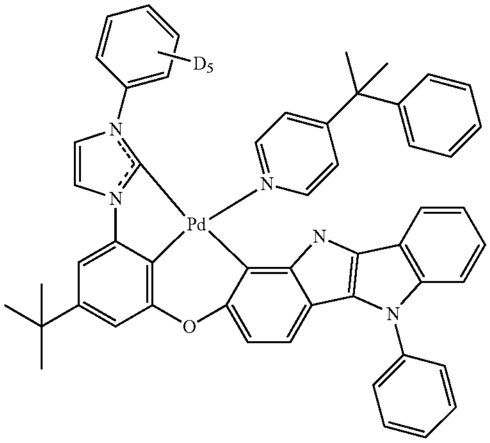
43
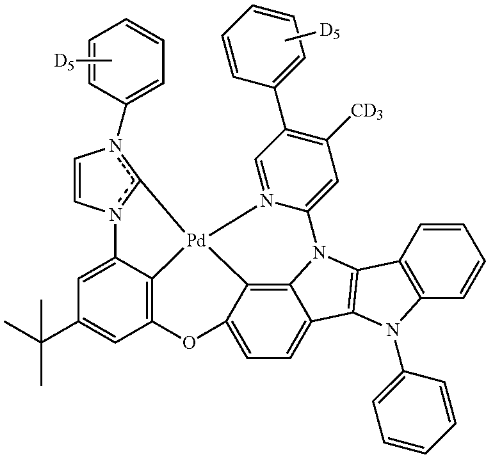
-continued
44
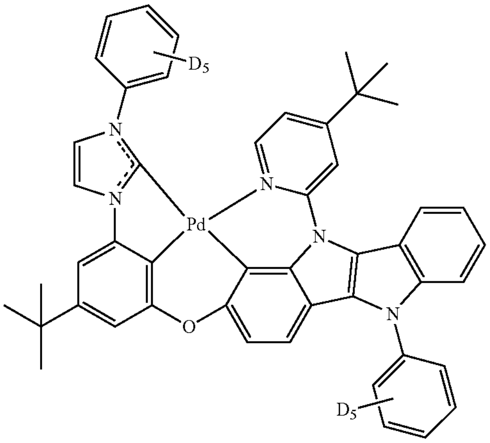
45
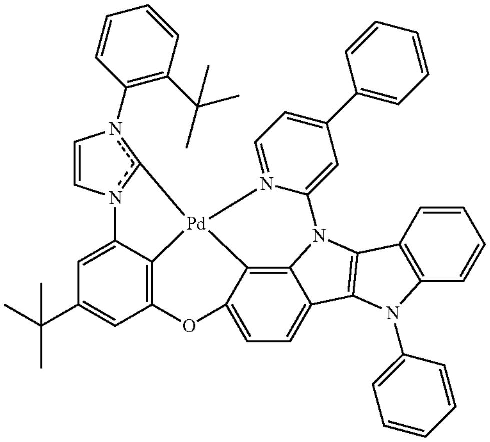
46
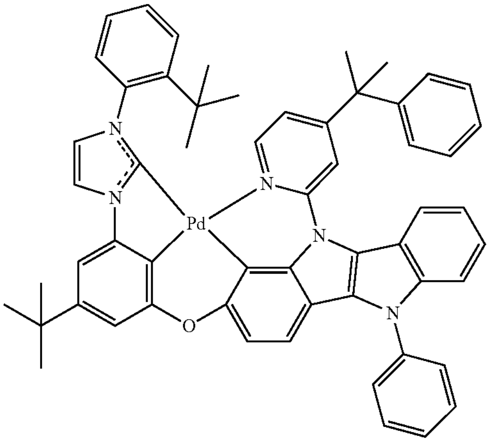

-continued
47
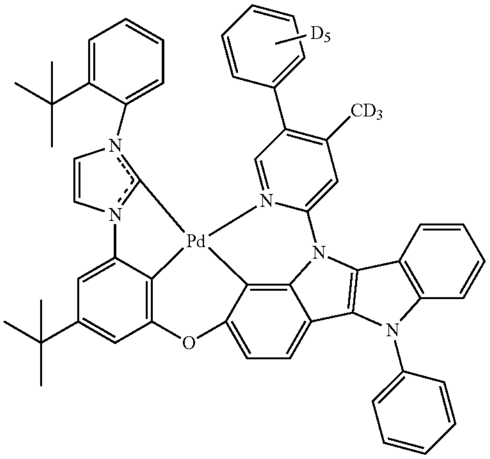
48
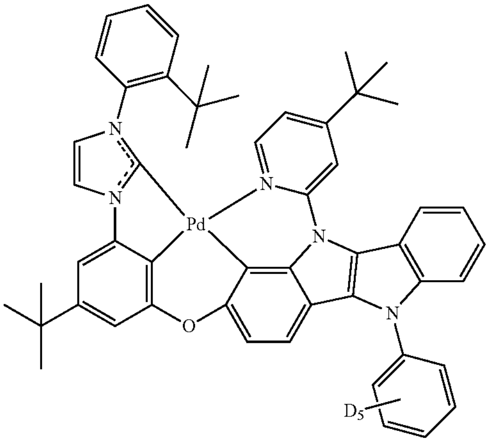
49
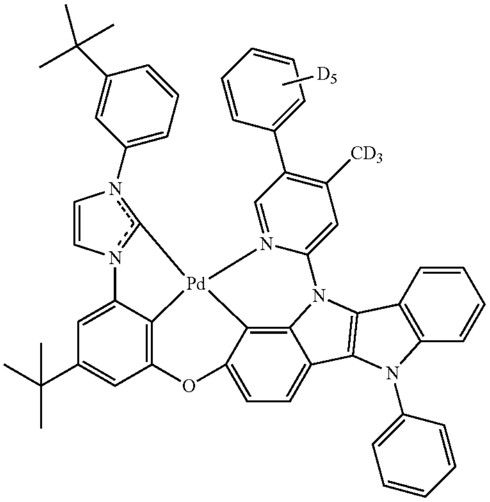
-continued
50
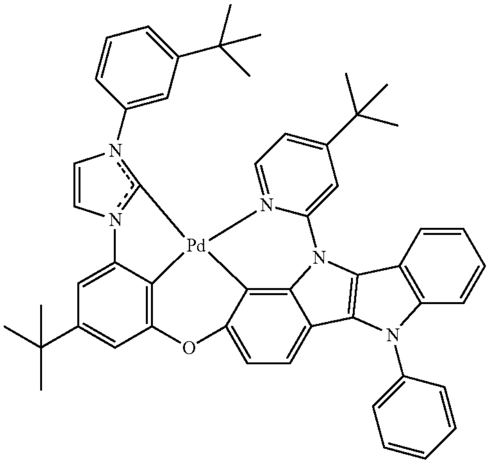
51
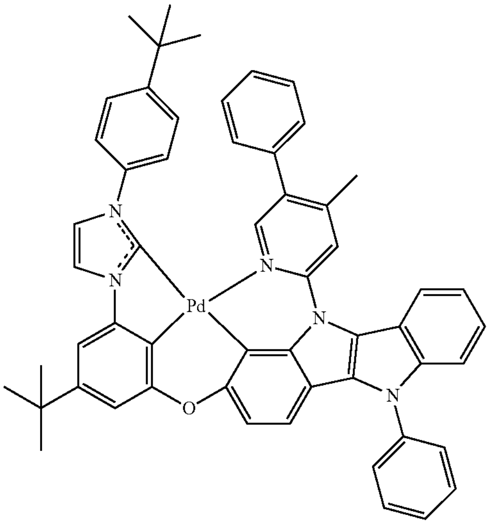
52
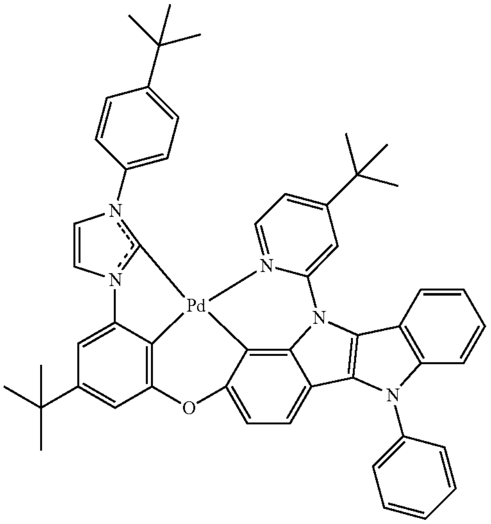

-continued
53
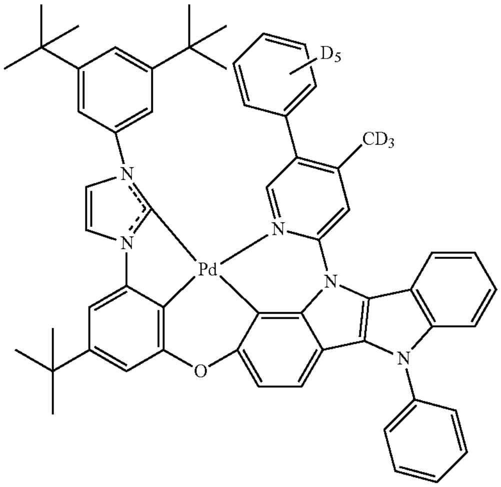
54
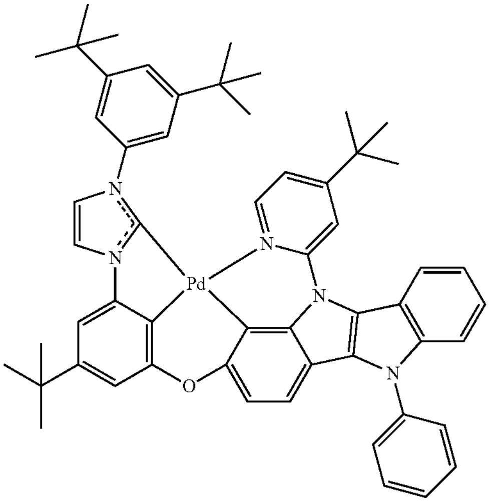
55
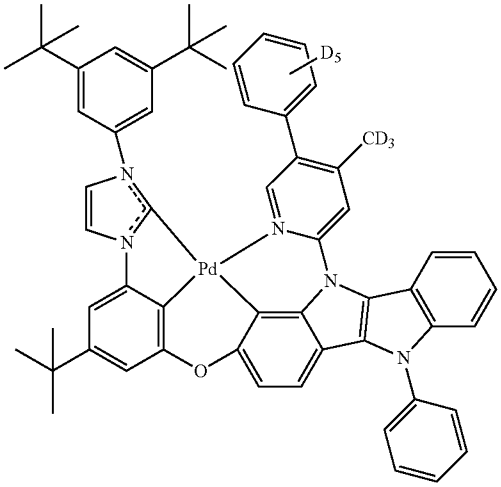
-continued
56
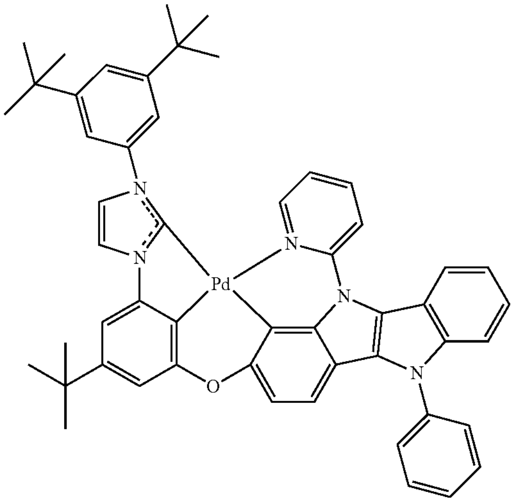
57
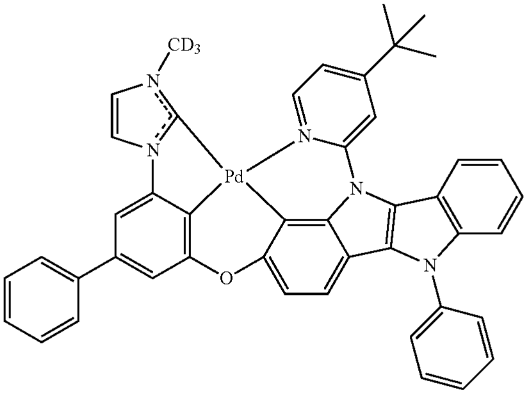
58
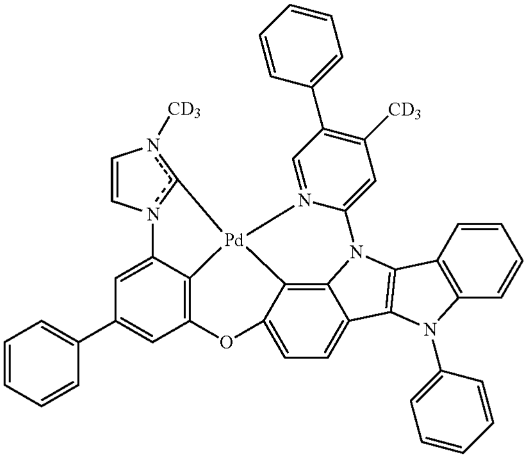

-continued
59
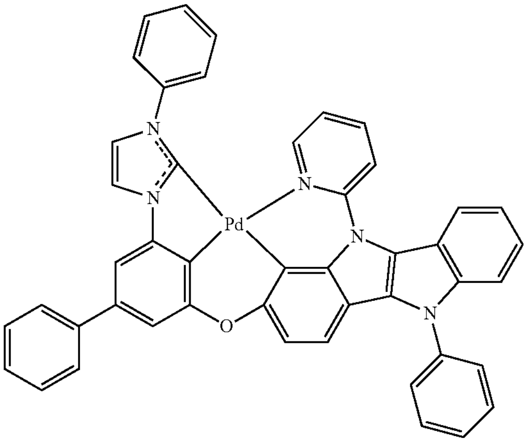
60
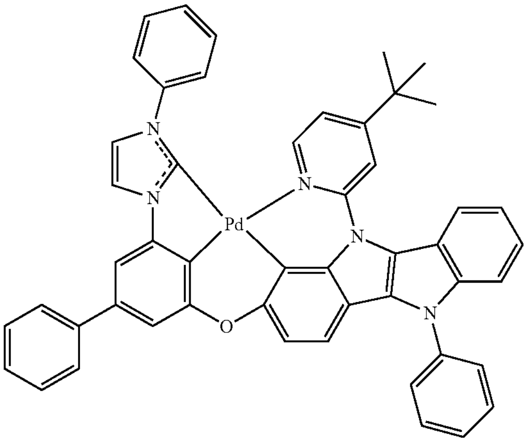
61
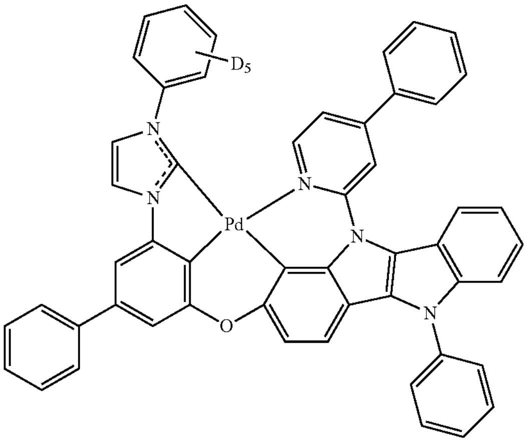
-continued
62
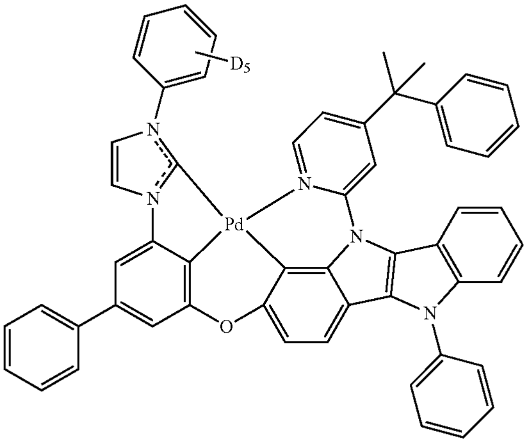
63
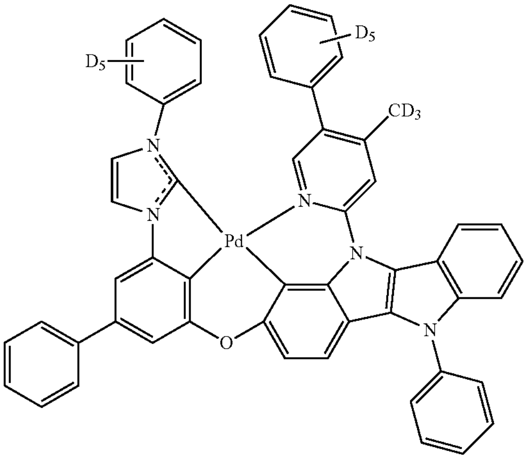
64
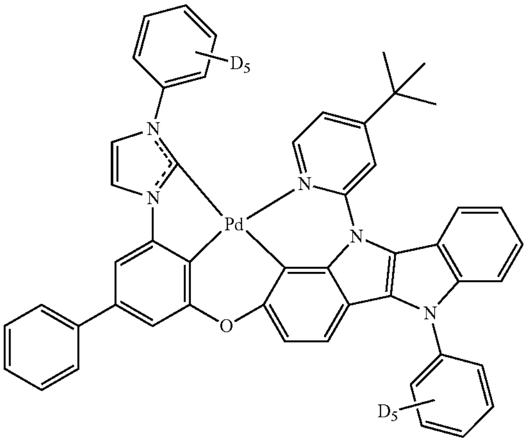

-continued
65
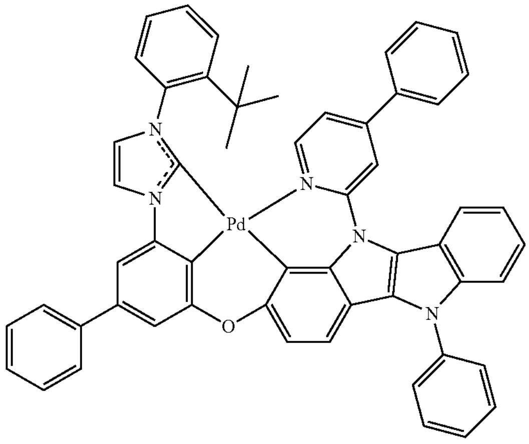
66
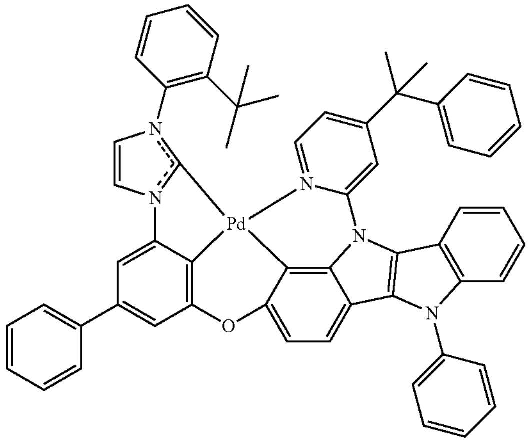
67
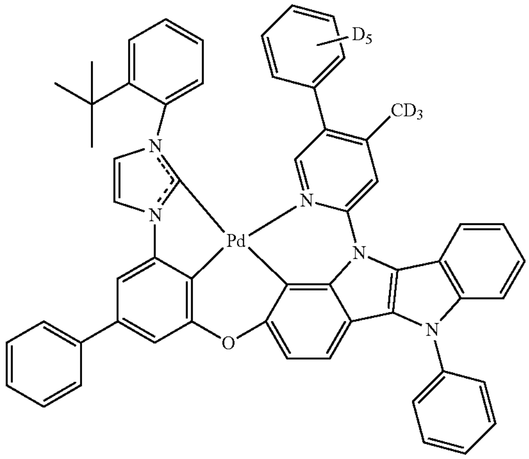
-continued
68
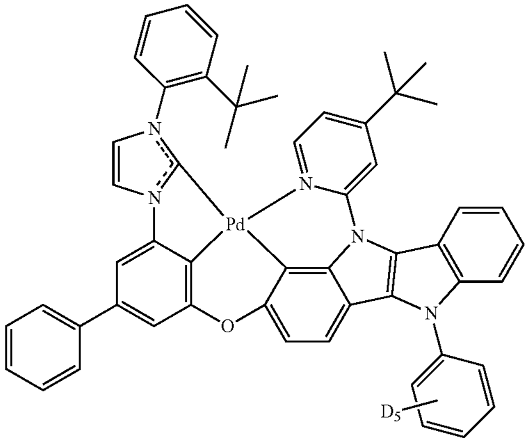
69
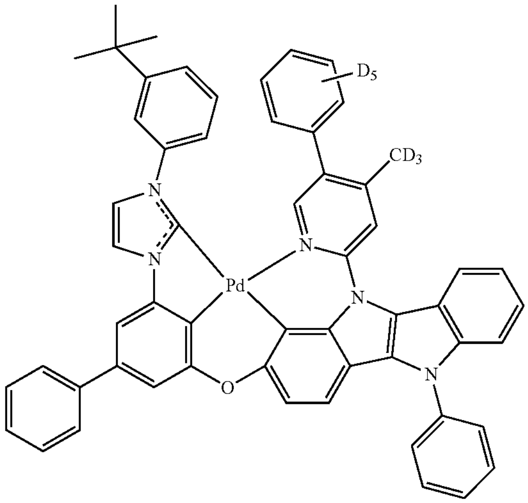
70
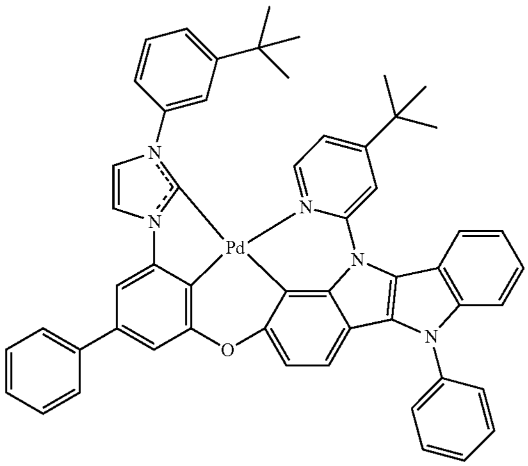

-continued
71
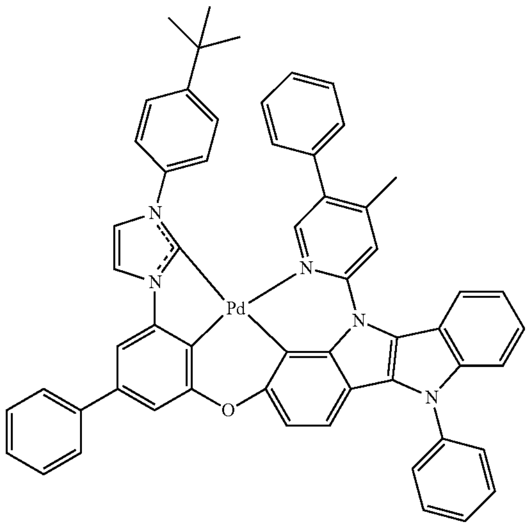
72
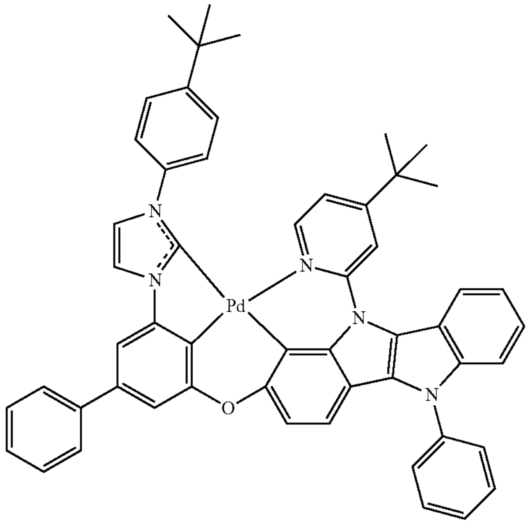
73
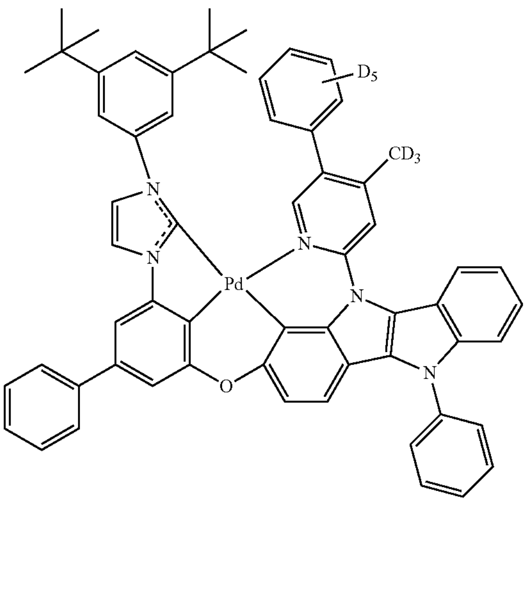
-continued
74
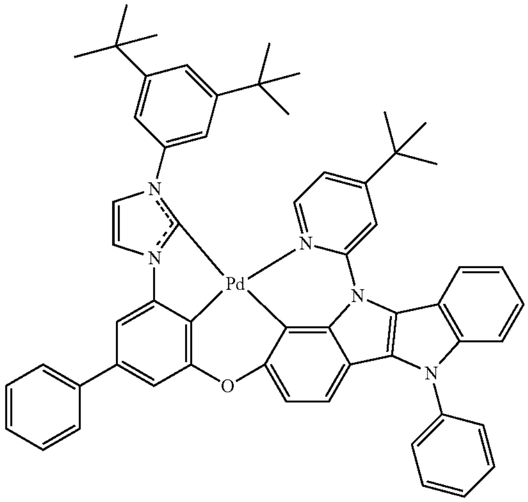
75
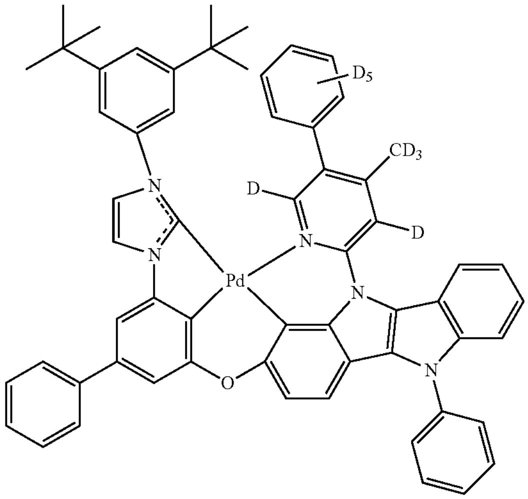
76
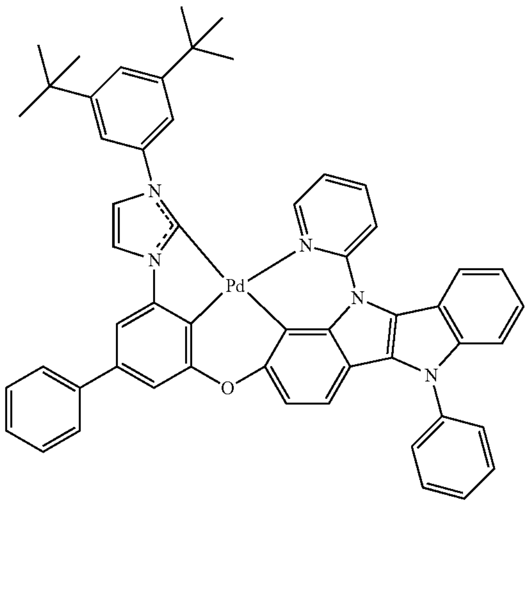

-continued
77
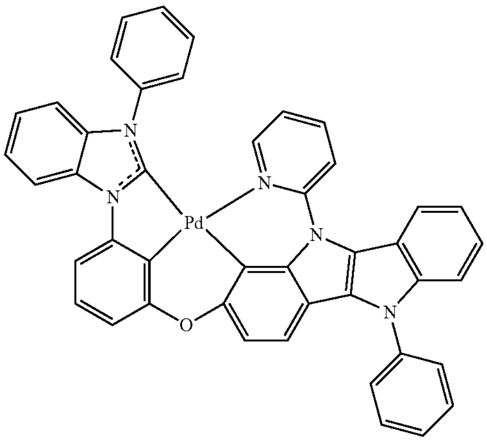
78
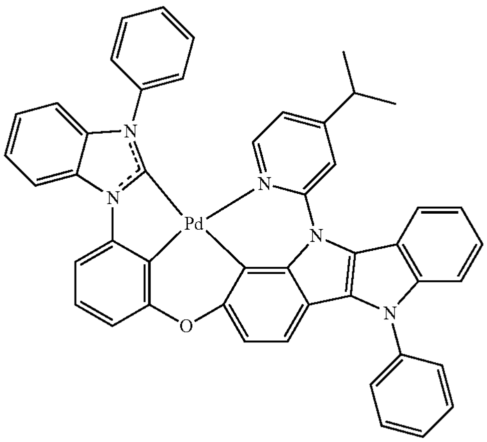
79
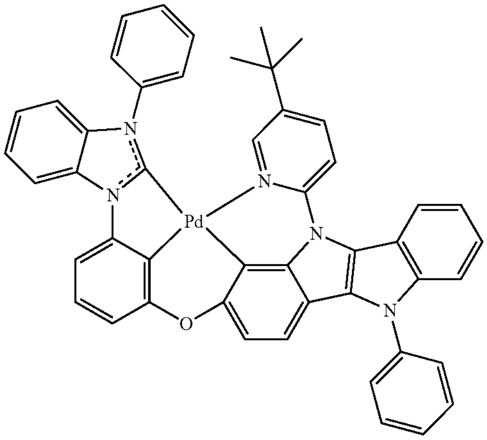
-continued
80
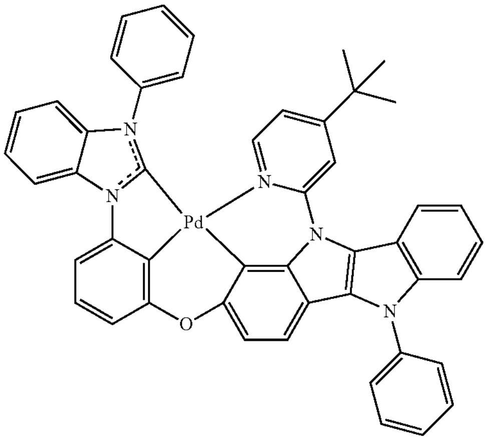
81
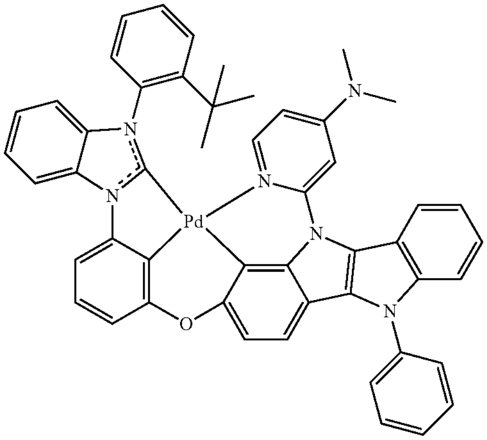
82
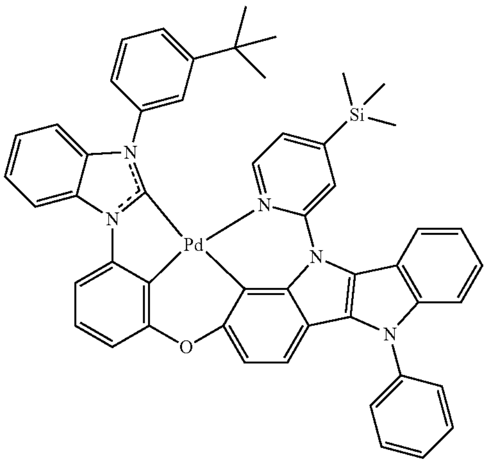

-continued
83
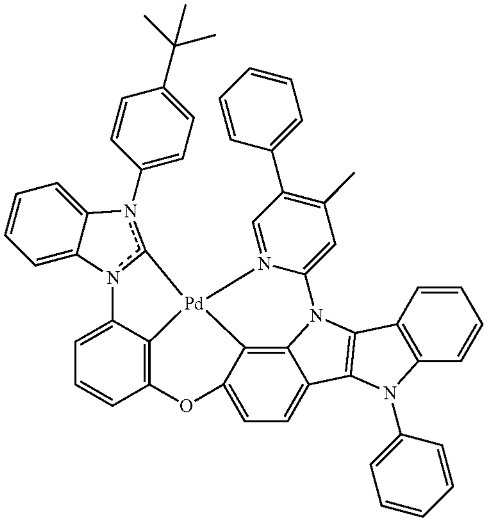
84
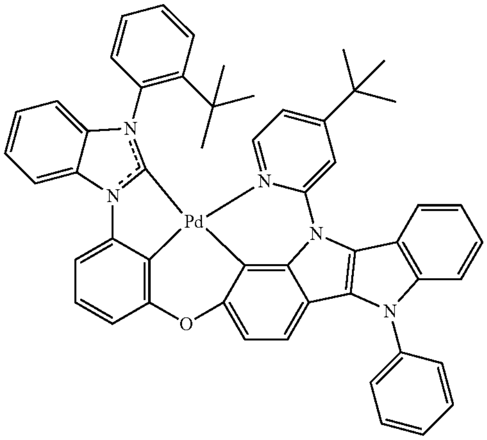
85
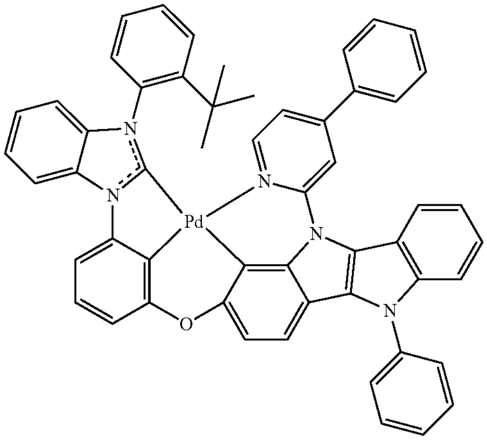
-continued
86
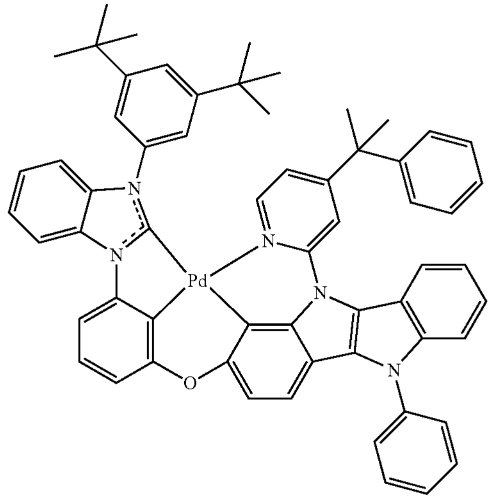
87
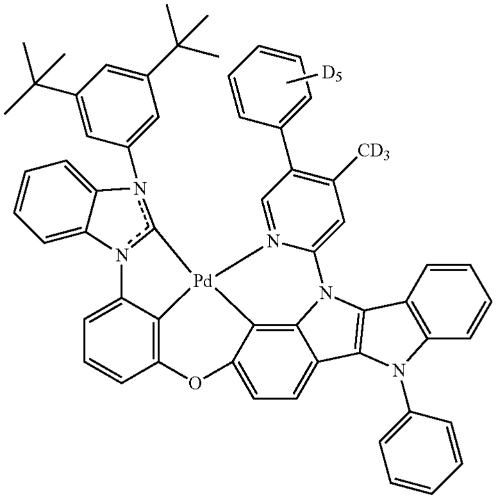
88
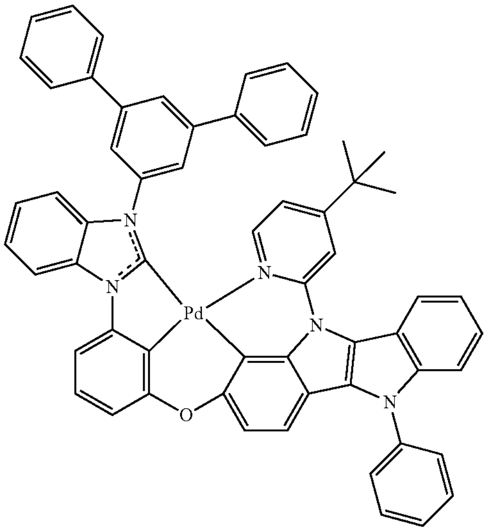

-continued
89
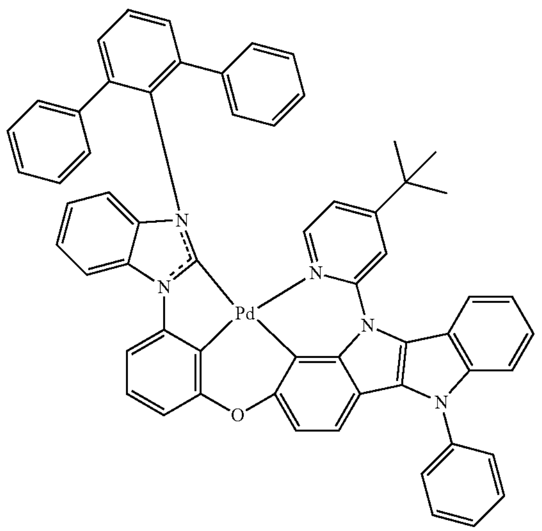
90
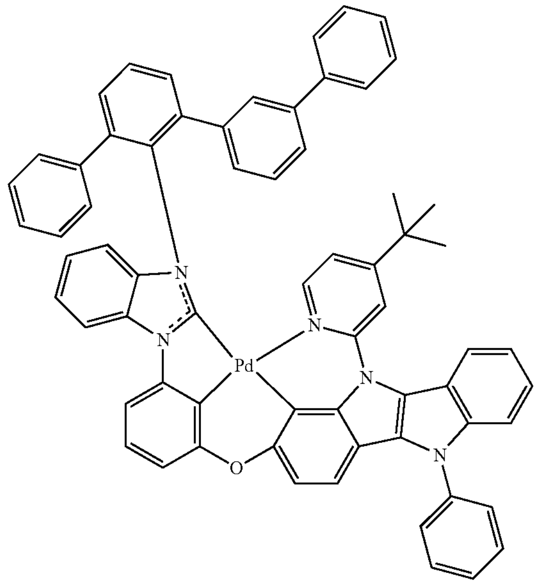
91
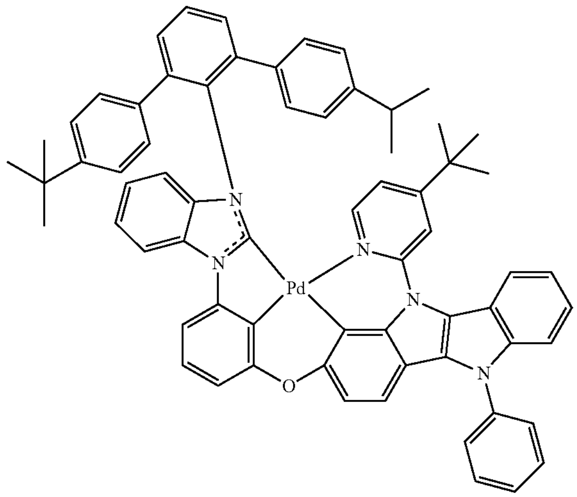
-continued
92
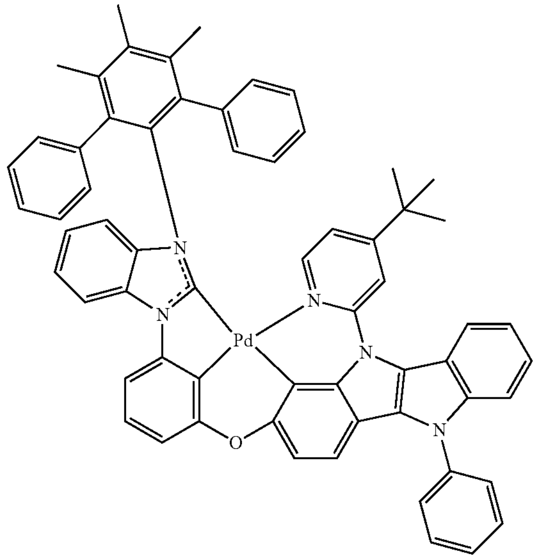
93
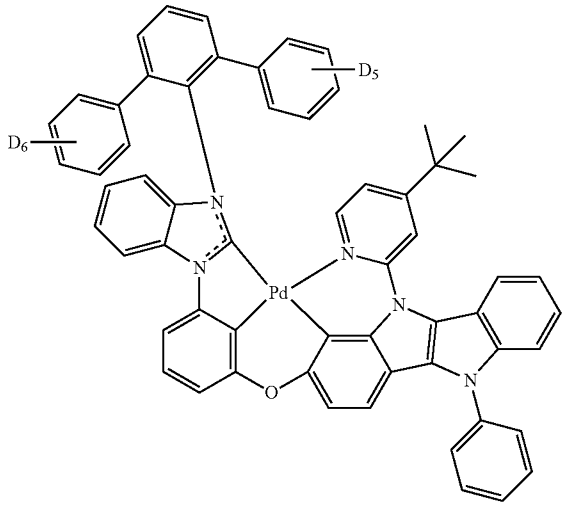

-continued
94
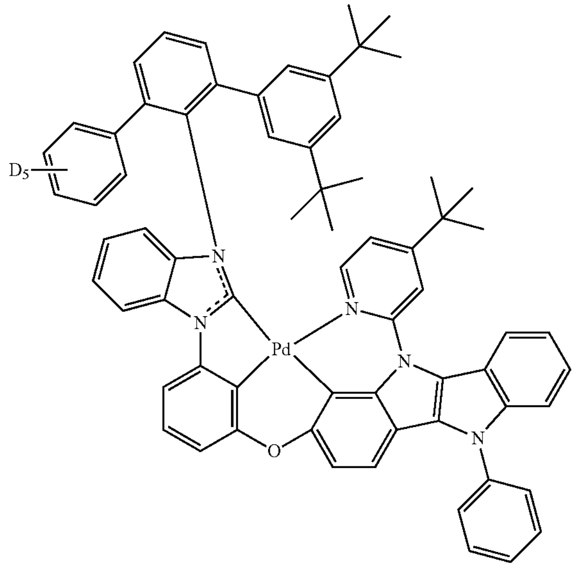
95
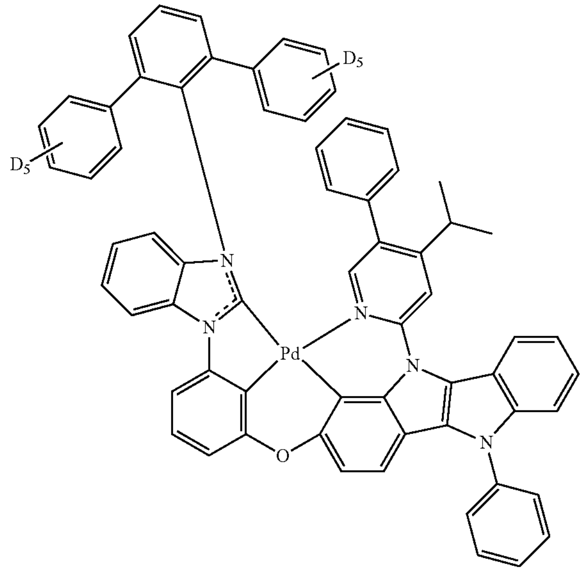
-continued
96
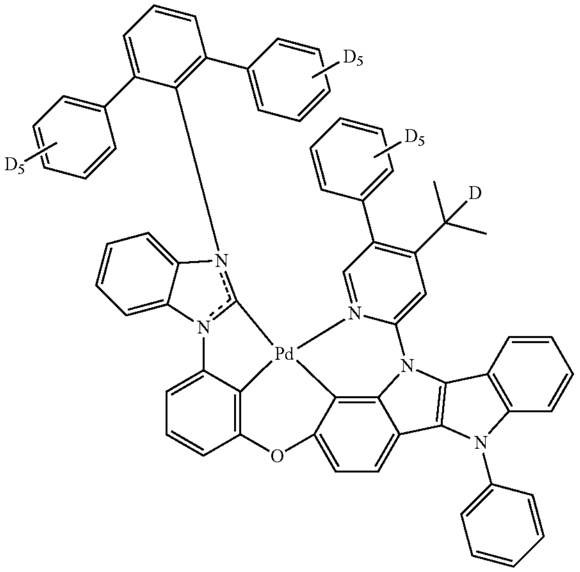
97
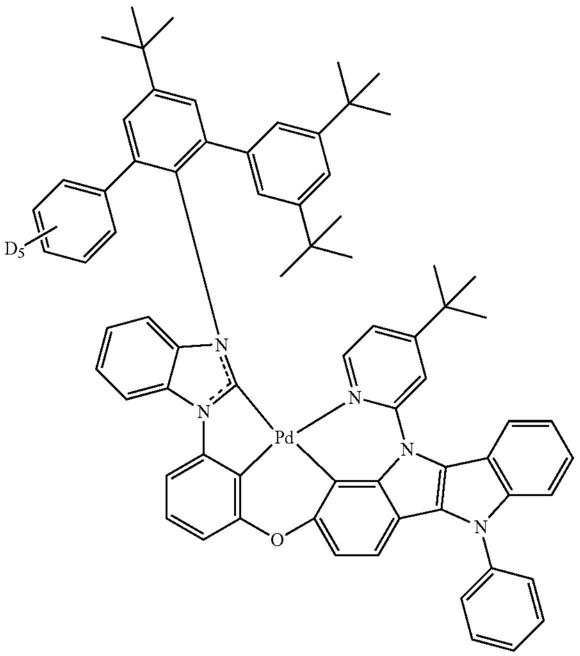

-continued
98
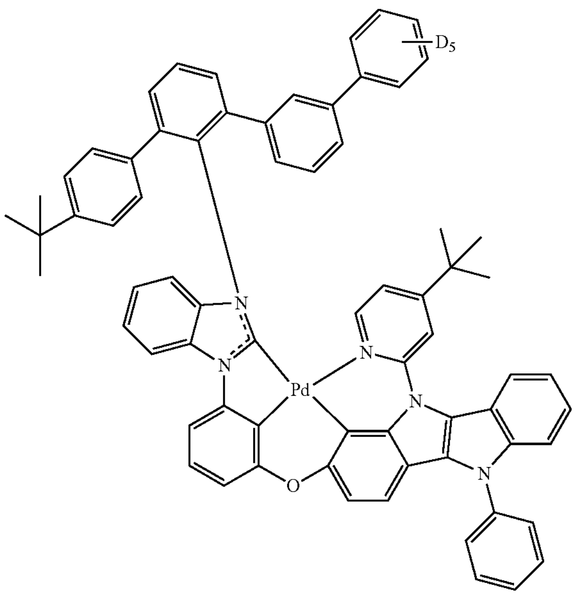
99
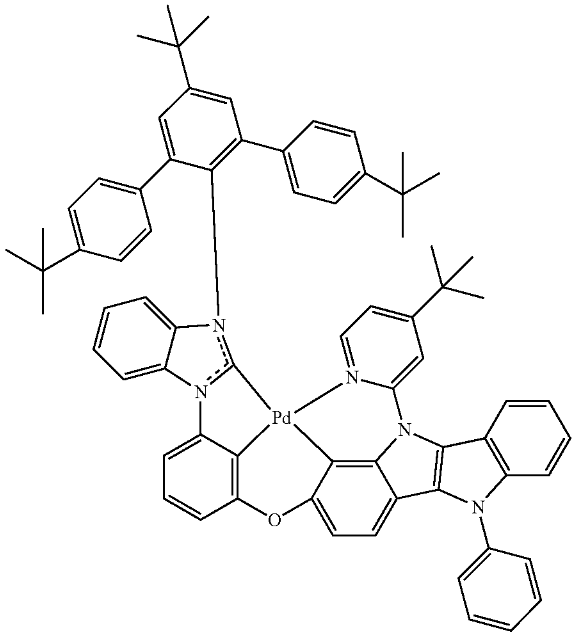
-continued
100
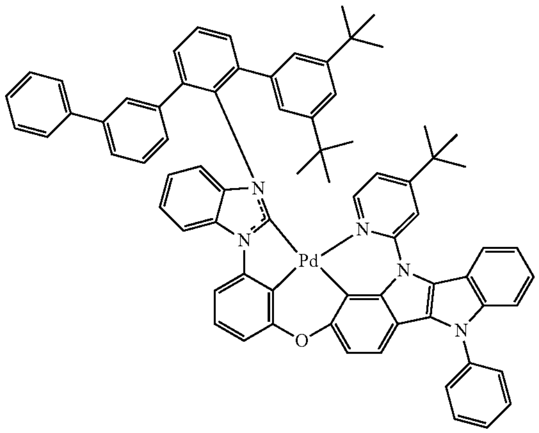
101
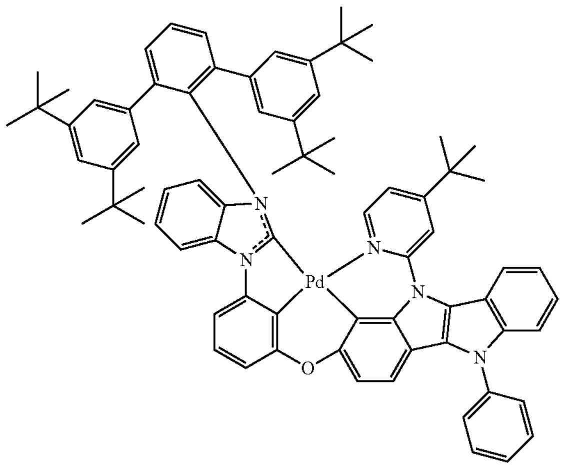
102
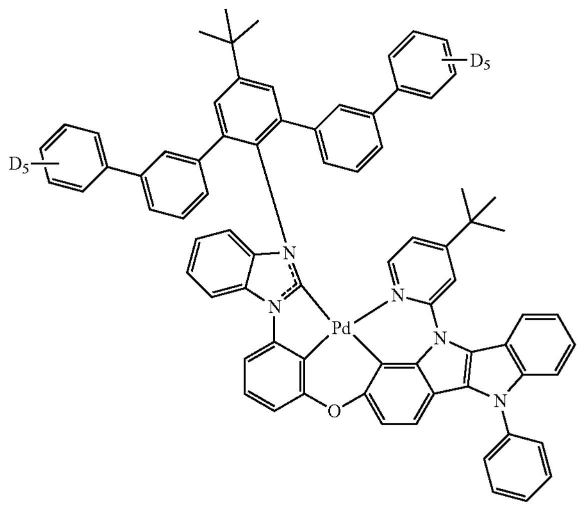

103
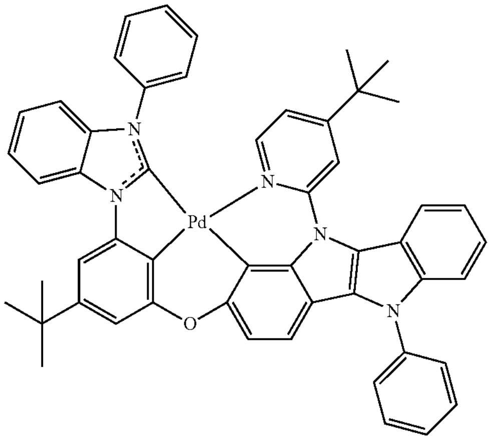
104
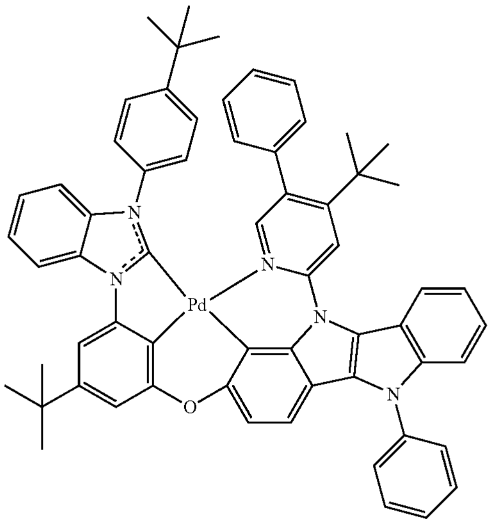
105
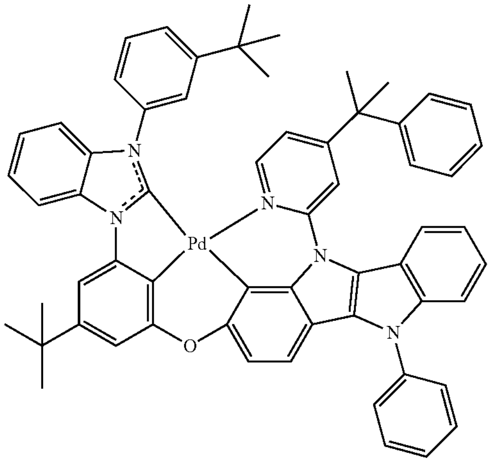
106
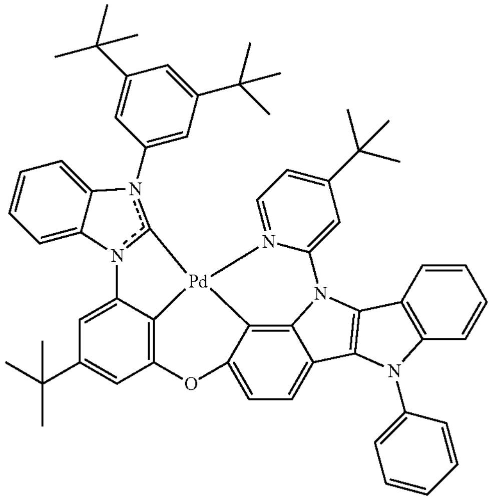
107
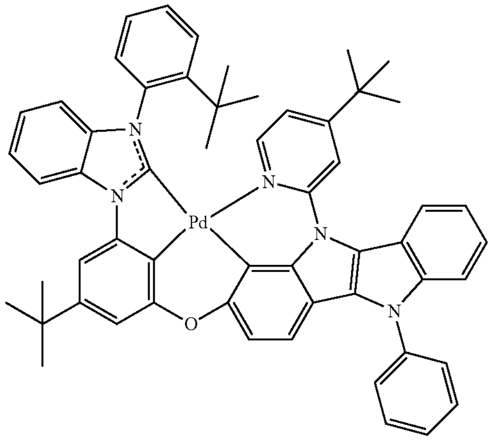
108
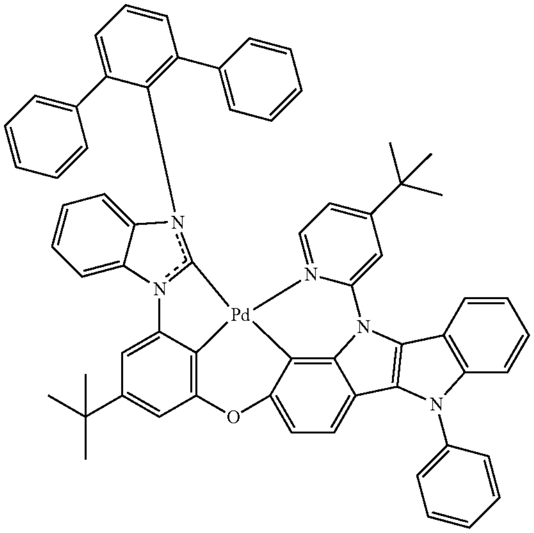

-continued
109
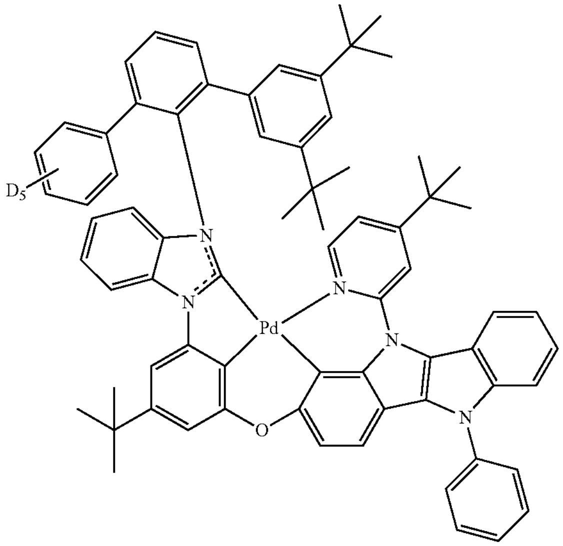
110
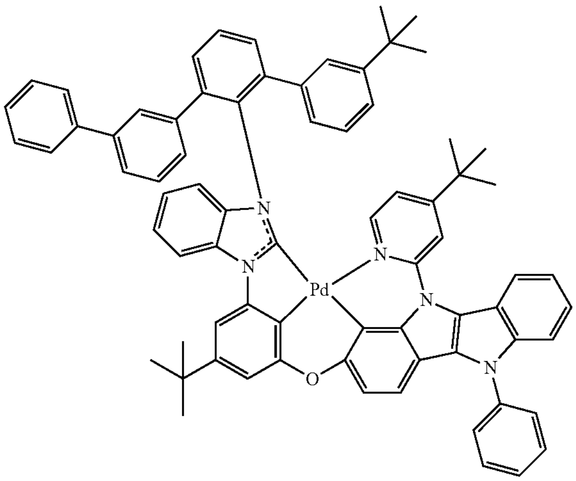
111
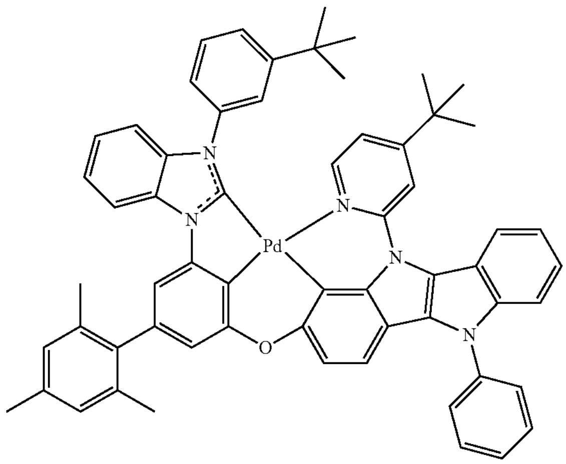
-continued
112
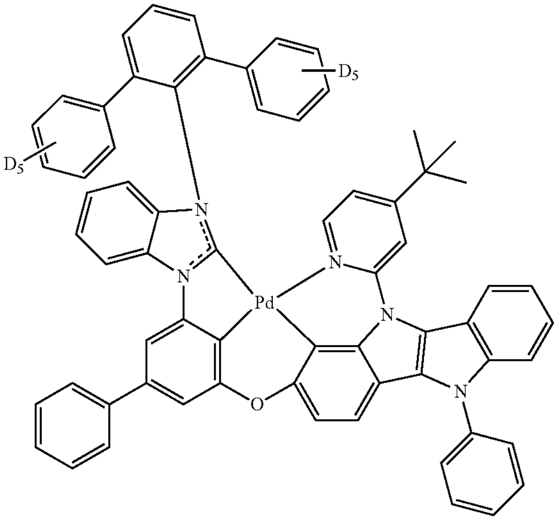
113
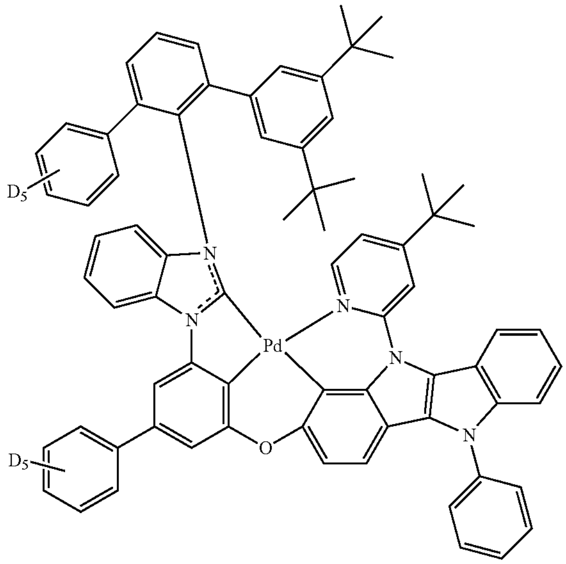

-continued
114
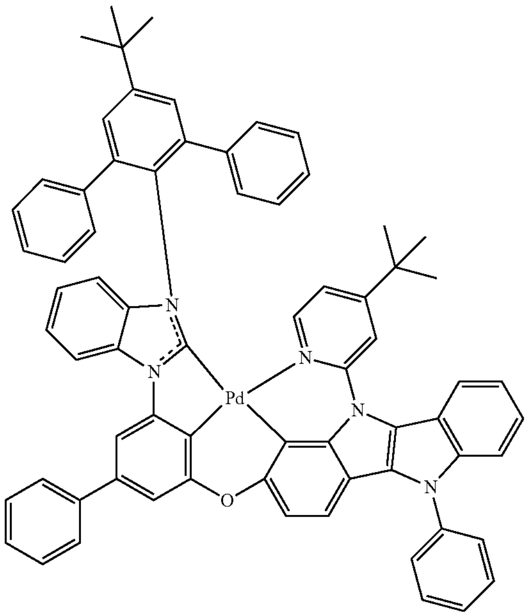
wherein in Compound Group 1, D is a deuterium atom.
* * * * *